(12) United States Patent
Shishido et al.

(10) Patent No.: US 7,623,091 B2
(45) Date of Patent: Nov. 24, 2009

(54) DISPLAY DEVICE, AND DRIVING METHOD AND ELECTRONIC APPARATUS OF THE DISPLAY DEVICE

(75) Inventors: Hideaki Shishido, Kanagawa (JP); Hajime Kimura, Kanagawa (JP); Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 655 days.

(21) Appl. No.: 11/410,198

(22) Filed: Apr. 24, 2006

(65) Prior Publication Data

US 2006/0244391 A1 Nov. 2, 2006

(30) Foreign Application Priority Data

May 2, 2005 (JP) ............................ 2005-133820

(51) Int. Cl.
G09G 3/28 (2006.01)
(52) U.S. Cl. .......................................... 345/60; 345/63
(58) Field of Classification Search .............. 345/60–63
See application file for complete search history.

(56) References Cited

U.S. PATENT DOCUMENTS

| | | | | |
|---|---|---|---|---|
| 4,070,663 A | 1/1978 | Kanatani et al. | ............ | 340/324 |
| 4,773,738 A | 9/1988 | Hayakawa et al. | .......... | 350/350 |
| 5,091,722 A | 2/1992 | Kitajima et al. | ............. | 340/784 |
| 5,200,846 A | 4/1993 | Hiroki et al. | .................. | 359/57 |
| 5,225,823 A | 7/1993 | Kanaly | ........................ | 340/793 |
| 5,302,966 A | 4/1994 | Stewart | ........................ | 345/76 |
| 5,349,366 A | 9/1994 | Yamazaki et al. | .............. | 345/92 |
| 5,414,442 A | 5/1995 | Yamazaki et al. | .............. | 345/89 |
| 5,424,752 A | 6/1995 | Yamazaki et al. | .............. | 345/92 |
| 5,471,225 A | 11/1995 | Parks | ........................... | 345/98 |
| 5,479,283 A | 12/1995 | Kaneko et al. | ................. | 359/79 |
| 5,583,534 A | 12/1996 | Katakura et al. | .............. | 345/97 |
| 5,600,169 A | 2/1997 | Burgener et al. | ............ | 257/352 |
| 5,642,129 A | 6/1997 | Zavracky et al. | ............ | 345/100 |
| 5,712,652 A | 1/1998 | Sato et al. | ...................... | 345/90 |
| 5,767,828 A | 6/1998 | McKnight | .................... | 345/89 |
| 5,798,746 A | 8/1998 | Koyama | ....................... | 345/98 |
| 5,969,710 A | 10/1999 | Doherty | ...................... | 345/148 |
| 5,986,640 A | 11/1999 | Baldwin et al. | .............. | 345/147 |

(Continued)

FOREIGN PATENT DOCUMENTS

EP 0 831 449 3/1998

(Continued)

OTHER PUBLICATIONS

Kim, C-S et al, "Reduction of Gray Level Disturbances in Plasma Display Panels," ISCAS 2004, pp. 941-944.

(Continued)

Primary Examiner—Amare Mengistu
Assistant Examiner—Joseph G Rodriguez
(74) Attorney, Agent, or Firm—Cook Alex Ltd.

(57) ABSTRACT

The present invention provides a driving method of a display device for expressing gray scales with n bits (n is an integer) by dividing one frame into a plurality of subframes. By this driving method, pseudo contours which occur in displaying images by a time gray scale method can be reduced.

14 Claims, 76 Drawing Sheets

U.S. PATENT DOCUMENTS

| | | | |
|---|---|---|---|
| 5,990,629 A | 11/1999 | Yamada et al. | 315/169.3 |
| 6,014,258 A | 1/2000 | Naka et al. | |
| 6,034,659 A | 3/2000 | Wald et al. | 345/76 |
| 6,040,819 A | 3/2000 | Someya | 345/147 |
| 6,091,203 A | 7/2000 | Kawashima et al. | 315/169.3 |
| 6,144,364 A | 11/2000 | Otobe et al. | 345/147 |
| 6,157,356 A | 12/2000 | Troutman | 345/82 |
| 6,215,466 B1 | 4/2001 | Yamazaki et al. | 345/89 |
| 6,222,512 B1 | 4/2001 | Tajima et al. | 345/63 |
| 6,229,506 B1 | 5/2001 | Dawson et al. | 345/82 |
| 6,229,508 B1 | 5/2001 | Kane | 345/82 |
| 6,249,265 B1 | 6/2001 | Tajima et al. | 345/63 |
| 6,292,159 B1 | 9/2001 | Someya et al. | 345/60 |
| 6,373,454 B1 | 4/2002 | Knapp et al. | 345/76 |
| 6,417,835 B1 | 7/2002 | Otobe et al. | 345/147 |
| 6,448,960 B1 | 9/2002 | Shigeta | 345/204 |
| 6,452,341 B1 | 9/2002 | Yamauchi et al. | 315/169.1 |
| 6,518,977 B1 | 2/2003 | Naka et al. | 345/690 |
| 6,542,138 B1 | 4/2003 | Shannon et al. | 345/76 |
| 6,552,701 B1 | 4/2003 | Tanaka | 345/63 |
| 6,563,480 B1 | 5/2003 | Nakamura | 345/82 |
| 6,563,486 B2 | 5/2003 | Otobe et al. | 345/147 |
| 6,724,377 B2 | 4/2004 | Ouchi et al. | |
| 6,778,152 B1 | 8/2004 | Huang | 345/60 |
| 6,885,385 B2 | 4/2005 | Ouchi et al. | |
| 7,057,584 B2 * | 6/2006 | Jeong | 345/60 |
| 2001/0022565 A1 | 9/2001 | Kimura | |
| 2001/0045923 A1 | 11/2001 | Otobe et al. | 345/63 |
| 2002/0047852 A1 | 4/2002 | Inukai et al. | 345/629 |
| 2003/0057423 A1 | 3/2003 | Shimoda et al. | 257/80 |
| 2003/0058195 A1 | 3/2003 | Adachi et al. | 345/67 |
| 2003/0197667 A1 | 10/2003 | Numao | |
| 2004/0263434 A1 | 12/2004 | Otobe et al. | 345/60 |
| 2007/0115223 A1 | 5/2007 | Kimura | |

FOREIGN PATENT DOCUMENTS

| | | |
|---|---|---|
| EP | 0 838 799 | 4/1998 |
| EP | 0 896 317 A2 | 2/1999 |
| EP | 1 184 833 | 3/2002 |
| EP | 1 187 087 | 3/2002 |
| JP | 07-049663 | 2/1995 |
| JP | 07-175439 | 7/1995 |
| JP | 07-271325 | 10/1995 |
| JP | 09-034399 | 2/1997 |
| JP | 09-172589 | 6/1997 |
| JP | 10-031455 | 2/1998 |
| JP | 10-171401 | 6/1998 |
| JP | 10-307561 | 11/1998 |
| JP | 2903984 | 3/1999 |
| JP | 11-305726 | 11/1999 |
| JP | 2001-042818 | 2/2001 |
| JP | 2001-324958 | 11/2001 |
| JP | 2002-108264 | 4/2002 |
| JP | 2004-151162 | 5/2004 |
| WO | WO 99/60557 | 11/1999 |
| WO | WO 99/65012 | 12/1999 |
| WO | WO 01/52229 A1 | 7/2001 |

OTHER PUBLICATIONS

European Search Report re application No. EP 06008231.0, dated Aug. 6, 2007.

Tagawa, A. et al, "A Novel Digital-Gray-Scale Driving Method with a Multiple Addressing Sequence for AM-OLED Displays," IDW '04, AMD3/OLED5-2, 2004, pp. 279-282.

Inukai, K. et al, "4.0-in. TFT-OLED Displays and a Novel Digital Driving Method," SID 00 Digest, pp. 924-927 (2000).

* cited by examiner pixel A gray scale level : 15
pixel B gray scale level : 16 pixel A gray scale level : 15
pixel B gray scale level : 16

FIG. 3

|  | SF1 | SF2 | SF3 | SF4 | SF5 | SF6 | SF7 | SF8 | SF9 | SF10 |
|---|---|---|---|---|---|---|---|---|---|---|
|  | 1 | 2 | 2 | 4 | 4 | 4 | 2 | 4 | 4 | 4 |
| 0 | × | × | × | × | × | × | × | × | × | × |
| 1 | ○ | × | × | × | × | × | × | × | × | × |
| 2 | × | ○ | × | × | × | × | × | × | × | × |
| 3 | ○ | ○ | × | × | × | × | × | × | × | × |
| 4 | × | × | ○ | × | × | × | ○ | × | × | × |
| 5 | ○ | × | ○ | × | × | × | ○ | × | × | × |
| 6 | × | ○ | ○ | × | × | × | ○ | × | × | × |
| 7 | ○ | ○ | ○ | × | × | × | ○ | × | × | × |
| 8 | × | × | × | ○ | × | × | × | ○ | × | × |
| 9 | ○ | × | × | ○ | × | × | × | ○ | × | × |
| 10 | × | ○ | × | ○ | × | × | × | ○ | × | × |
| 11 | ○ | ○ | × | ○ | × | × | × | ○ | × | × |
| 12 | × | × | ○ | ○ | × | × | ○ | ○ | × | × |
| 13 | ○ | × | ○ | ○ | × | × | ○ | ○ | × | × |
| 14 | × | ○ | ○ | ○ | × | × | ○ | ○ | × | × |
| 15 | ○ | ○ | ○ | ○ | × | × | ○ | ○ | × | × |
| 16 | × | × | × | ○ | ○ | × | × | ○ | ○ | × |
| 17 | ○ | × | × | ○ | ○ | × | × | ○ | ○ | × |
| 18 | × | ○ | × | ○ | ○ | × | × | ○ | ○ | × |
| 19 | ○ | ○ | × | ○ | ○ | × | × | ○ | ○ | × |
| 20 | × | × | ○ | ○ | ○ | × | ○ | ○ | ○ | × |
| 21 | ○ | × | ○ | ○ | ○ | × | ○ | ○ | ○ | × |
| 22 | × | ○ | ○ | ○ | ○ | × | ○ | ○ | ○ | × |
| 23 | ○ | ○ | ○ | ○ | ○ | × | ○ | ○ | ○ | × |
| 24 | × | × | × | ○ | ○ | ○ | × | ○ | ○ | ○ |
| 25 | ○ | × | × | ○ | ○ | ○ | × | ○ | ○ | ○ |
| 26 | × | ○ | × | ○ | ○ | ○ | × | ○ | ○ | ○ |
| 27 | ○ | ○ | × | ○ | ○ | ○ | × | ○ | ○ | ○ |
| 28 | × | × | ○ | ○ | ○ | ○ | ○ | ○ | ○ | ○ |
| 29 | ○ | × | ○ | ○ | ○ | ○ | ○ | ○ | ○ | ○ |
| 30 | × | ○ | ○ | ○ | ○ | ○ | ○ | ○ | ○ | ○ |
| 31 | ○ | ○ | ○ | ○ | ○ | ○ | ○ | ○ | ○ | ○ |

○ : lighting

× : non-lighting

FIG. 4 former subframe group | latter subframe group

| | SF1 | SF2 | SF3 | SF4 | SF5 | SF6 | SF7 | SF8 | SF9 | SF10 | SF11 | SF12 |
|---|---|---|---|---|---|---|---|---|---|---|---|---|
| | 1 | 2 | 4 | 8 | 8 | 8 | 2 | 2 | 4 | 8 | 8 | 8 |
| 0 | × | × | × | × | × | × | × | × | × | × | × | × |
| 1 | ○ | × | × | × | × | × | × | × | × | × | × | × |
| 2 | × | × | × | × | × | × | ○ | × | × | × | × | × |
| 3 | ○ | × | × | × | × | × | ○ | × | × | × | × | × |
| 4 | × | ○ | × | × | × | × | × | ○ | × | × | × | × |
| 5 | ○ | ○ | × | × | × | × | × | ○ | × | × | × | × |
| 6 | × | ○ | × | × | × | × | ○ | ○ | × | × | × | × |
| 7 | ○ | ○ | × | × | × | × | ○ | ○ | × | × | × | × |
| 8 | × | × | ○ | × | × | × | × | × | ○ | × | × | × |
| 9 | ○ | × | ○ | × | × | × | × | × | ○ | × | × | × |
| 10 | × | × | ○ | × | × | × | ○ | × | ○ | × | × | × |
| 11 | ○ | × | ○ | × | × | × | ○ | × | ○ | × | × | × |
| 12 | × | ○ | ○ | × | × | × | × | ○ | ○ | × | × | × |
| 13 | ○ | ○ | ○ | × | × | × | × | ○ | ○ | × | × | × |
| 14 | × | ○ | ○ | × | × | × | ○ | ○ | ○ | × | × | × |
| 15 | ○ | ○ | ○ | × | × | × | ○ | ○ | ○ | × | × | × |
| 16 | × | × | × | ○ | × | × | × | × | × | ○ | × | × |
| 17 | ○ | × | × | ○ | × | × | × | × | × | ○ | × | × |
| 18 | × | × | × | ○ | × | × | ○ | × | × | ○ | × | × |
| 19 | ○ | × | × | ○ | × | × | ○ | × | × | ○ | × | × |
| 20 | × | ○ | × | ○ | × | × | × | ○ | × | ○ | × | × |
| 21 | ○ | ○ | × | ○ | × | × | × | ○ | × | ○ | × | × |
| 22 | × | ○ | × | ○ | × | × | ○ | ○ | × | ○ | × | × |
| 23 | ○ | ○ | × | ○ | × | × | ○ | ○ | × | ○ | × | × |
| 24 | × | × | ○ | ○ | × | × | × | × | ○ | ○ | × | × |
| 25 | ○ | × | ○ | ○ | × | × | × | × | ○ | ○ | × | × |
| 26 | × | × | ○ | ○ | × | × | ○ | × | ○ | ○ | × | × |
| 27 | ○ | × | ○ | ○ | × | × | ○ | × | ○ | ○ | × | × |
| 28 | × | ○ | ○ | ○ | × | × | × | ○ | ○ | ○ | × | × |
| 29 | ○ | ○ | ○ | ○ | × | × | × | ○ | ○ | ○ | × | × |
| 30 | × | ○ | ○ | ○ | × | × | ○ | ○ | ○ | ○ | × | × |
| 31 | ○ | ○ | ○ | ○ | × | × | ○ | ○ | ○ | ○ | × | × |
| 32 | × | × | × | × | ○ | × | × | × | × | × | ○ | × |
| 33 | ○ | × | × | × | ○ | × | × | × | × | × | ○ | × |
| 34 | × | × | × | × | ○ | × | ○ | × | × | × | ○ | × |
| 35 | ○ | × | × | × | ○ | × | ○ | × | × | × | ○ | × |
| 36 | × | ○ | × | × | ○ | × | × | ○ | × | × | ○ | × |
| 37 | ○ | ○ | × | × | ○ | × | × | ○ | × | × | ○ | × |
| 38 | × | ○ | × | × | ○ | × | ○ | ○ | × | × | ○ | × |
| 39 | ○ | ○ | × | × | ○ | × | ○ | ○ | × | × | ○ | × |
| 40 | × | × | ○ | × | ○ | × | × | × | ○ | × | ○ | × |
| 41 | ○ | × | ○ | × | ○ | × | × | × | ○ | × | ○ | × |
| 42 | × | × | ○ | × | ○ | × | ○ | × | ○ | × | ○ | × |
| 43 | ○ | × | ○ | × | ○ | × | ○ | × | ○ | × | ○ | × |
| 44 | × | ○ | ○ | × | ○ | × | × | ○ | ○ | × | ○ | × |
| 45 | ○ | ○ | ○ | × | ○ | × | × | ○ | ○ | × | ○ | × |
| 46 | × | ○ | ○ | × | ○ | × | ○ | ○ | ○ | × | ○ | × |
| 47 | ○ | ○ | ○ | × | ○ | × | ○ | ○ | ○ | × | ○ | × |
| 48 | × | × | × | ○ | ○ | ○ | × | × | × | ○ | ○ | ○ |
| 49 | ○ | × | × | ○ | ○ | ○ | × | × | × | ○ | ○ | ○ |
| 50 | × | × | × | ○ | ○ | ○ | ○ | × | × | ○ | ○ | ○ |
| 51 | ○ | × | × | ○ | ○ | ○ | ○ | × | × | ○ | ○ | ○ |
| 52 | × | ○ | × | ○ | ○ | ○ | × | ○ | × | ○ | ○ | ○ |
| 53 | ○ | ○ | × | ○ | ○ | ○ | × | ○ | × | ○ | ○ | ○ |
| 54 | × | ○ | × | ○ | ○ | ○ | ○ | ○ | × | ○ | ○ | ○ |
| 55 | ○ | ○ | × | ○ | ○ | ○ | ○ | ○ | × | ○ | ○ | ○ |
| 56 | × | × | ○ | ○ | ○ | ○ | × | × | ○ | ○ | ○ | ○ |
| 57 | ○ | × | ○ | ○ | ○ | ○ | × | × | ○ | ○ | ○ | ○ |
| 58 | × | × | ○ | ○ | ○ | ○ | ○ | × | ○ | ○ | ○ | ○ |
| 59 | ○ | × | ○ | ○ | ○ | ○ | ○ | × | ○ | ○ | ○ | ○ |
| 60 | × | ○ | ○ | ○ | ○ | ○ | × | ○ | ○ | ○ | ○ | ○ |
| 61 | ○ | ○ | ○ | ○ | ○ | ○ | × | ○ | ○ | ○ | ○ | ○ |
| 62 | × | ○ | ○ | ○ | ○ | ○ | ○ | ○ | ○ | ○ | ○ | ○ |
| 63 | ○ | ○ | ○ | ○ | ○ | ○ | ○ | ○ | ○ | ○ | ○ | ○ | overlapped time gray scale method

○ : lighting

× : non-lighting

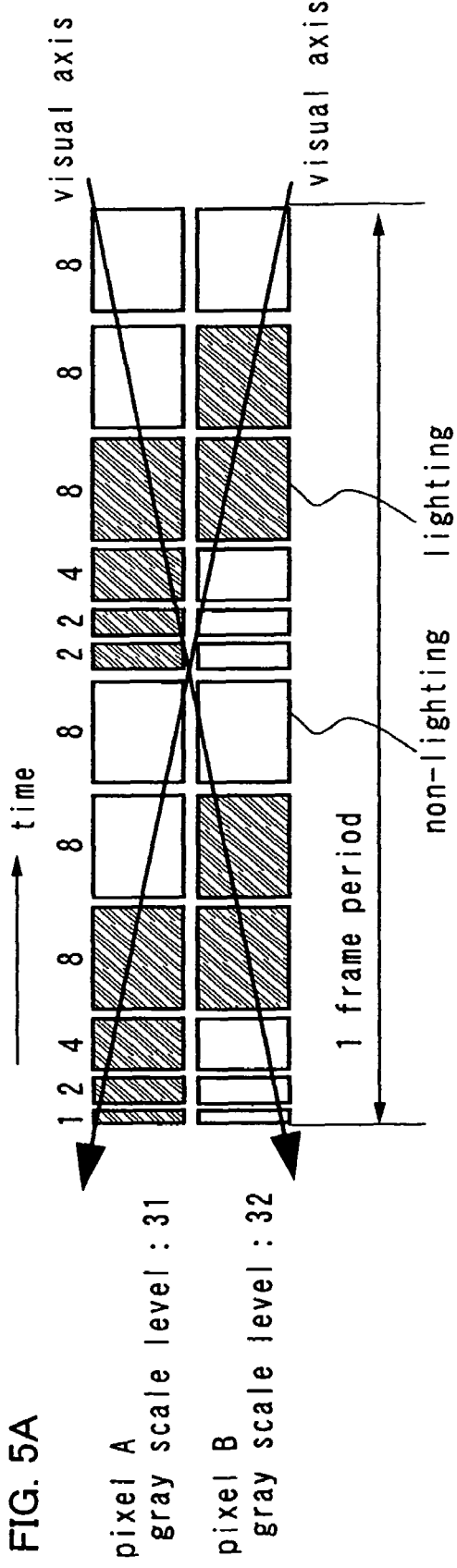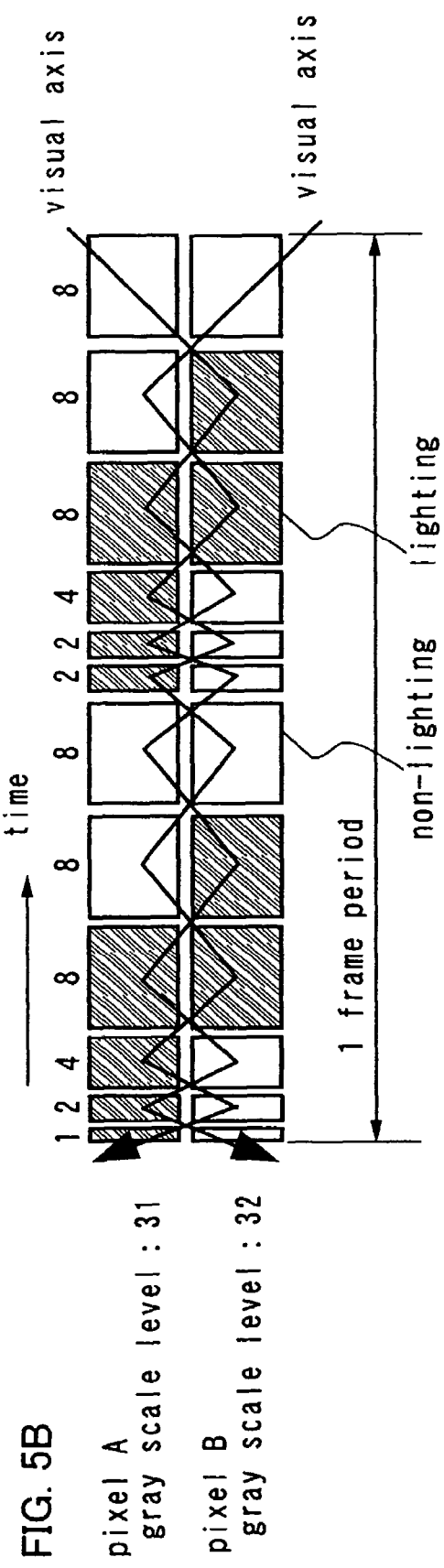

FIG. 6

| | SF1 | SF2 | SF3 | SF4 | SF5 | SF6 | SF7 | SF8 | SF9 | SF10 | SF11 |
|---|---|---|---|---|---|---|---|---|---|---|---|
| | 1 | 1 | 2 | 4 | 4 | 4 | 1 | 2 | 4 | 4 | 4 |
| 0 | × | × | × | × | × | × | × | × | × | × | × |
| 1 | ○ | × | × | × | × | × | × | × | × | × | × |
| 2 | × | ○ | × | × | × | × | ○ | × | × | × | × |
| 3 | ○ | ○ | × | × | × | × | ○ | × | × | × | × |
| 4 | × | × | ○ | × | × | × | × | ○ | × | × | × |
| 5 | ○ | × | ○ | × | × | × | × | ○ | × | × | × |
| 6 | × | ○ | ○ | × | × | × | ○ | ○ | × | × | × |
| 7 | ○ | ○ | ○ | × | × | × | ○ | ○ | × | × | × |
| 8 | × | × | × | ○ | × | × | × | × | ○ | × | × |
| 9 | ○ | × | × | ○ | × | × | × | × | ○ | × | × |
| 10 | × | ○ | × | ○ | × | × | ○ | × | ○ | × | × |
| 11 | ○ | ○ | × | ○ | × | × | ○ | × | ○ | × | × |
| 12 | × | × | ○ | ○ | × | × | × | ○ | ○ | × | × |
| 13 | ○ | × | ○ | ○ | × | × | × | ○ | ○ | × | × |
| 14 | × | ○ | ○ | ○ | × | × | ○ | ○ | ○ | × | × |
| 15 | ○ | ○ | ○ | ○ | × | × | ○ | ○ | ○ | × | × |
| 16 | × | × | × | ○ | ○ | × | × | × | ○ | ○ | × |
| 17 | ○ | × | × | ○ | ○ | × | × | × | ○ | ○ | × |
| 18 | × | ○ | × | ○ | ○ | × | ○ | × | ○ | ○ | × |
| 19 | ○ | ○ | × | ○ | ○ | × | ○ | × | ○ | ○ | × |
| 20 | × | × | ○ | ○ | ○ | × | × | ○ | ○ | ○ | × |
| 21 | ○ | × | ○ | ○ | ○ | × | × | ○ | ○ | ○ | × |
| 22 | × | ○ | ○ | ○ | ○ | × | ○ | ○ | ○ | ○ | × |
| 23 | ○ | ○ | ○ | ○ | ○ | × | ○ | × | ○ | ○ | × |
| 24 | × | × | × | ○ | ○ | ○ | × | × | ○ | ○ | ○ |
| 25 | ○ | × | × | ○ | ○ | ○ | × | × | ○ | ○ | ○ |
| 26 | × | ○ | × | ○ | ○ | ○ | ○ | × | ○ | ○ | ○ |
| 27 | ○ | ○ | × | ○ | ○ | ○ | ○ | × | ○ | ○ | ○ |
| 28 | × | × | ○ | ○ | ○ | ○ | × | ○ | ○ | ○ | ○ |
| 29 | ○ | × | ○ | ○ | ○ | ○ | × | ○ | ○ | ○ | ○ |
| 30 | × | ○ | ○ | ○ | ○ | ○ | ○ | ○ | ○ | ○ | ○ |
| 31 | ○ | ○ | ○ | ○ | ○ | ○ | ○ | ○ | ○ | ○ | ○ |

○ : lighting

× : non-lighting

FIG. 7

| | SF1 | SF2 | SF3 | SF4 | SF5 | SF6 | SF7 | SF8 | SF9 | SF10 | SF11 | SF12 |
|---|---|---|---|---|---|---|---|---|---|---|---|---|
| | 1 | 2 | 2 | 2 | 4 | 4 | 2 | 2 | 2 | 2 | 4 | 4 |
| 0 | × | × | × | × | × | × | × | × | × | × | × | × |
| 1 | ○ | × | × | × | × | × | × | × | × | × | × | × |
| 2 | × | × | × | × | × | × | ○ | × | × | × | × | × |
| 3 | ○ | × | × | × | × | × | ○ | × | × | × | × | × |
| 4 | × | ○ | × | × | × | × | × | ○ | × | × | × | × |
| 5 | ○ | ○ | × | × | × | × | × | ○ | × | × | × | × |
| 6 | × | ○ | × | × | × | × | ○ | ○ | × | × | × | × |
| 7 | ○ | ○ | × | × | × | × | ○ | ○ | × | × | × | × |
| 8 | × | ○ | ○ | × | × | × | × | ○ | ○ | × | × | × |
| 9 | ○ | ○ | ○ | × | × | × | × | ○ | ○ | × | × | × |
| 10 | × | ○ | ○ | × | × | × | ○ | ○ | ○ | × | × | × |
| 11 | ○ | ○ | ○ | × | × | × | ○ | ○ | ○ | × | × | × |
| 12 | × | ○ | ○ | ○ | × | × | × | ○ | ○ | ○ | × | × |
| 13 | ○ | ○ | ○ | ○ | × | × | × | ○ | ○ | ○ | × | × |
| 14 | × | ○ | ○ | ○ | × | × | ○ | ○ | ○ | ○ | × | × |
| 15 | ○ | ○ | ○ | ○ | × | × | ○ | ○ | ○ | ○ | × | × |
| 16 | × | × | × | × | ○ | ○ | × | × | × | × | ○ | ○ |
| 17 | ○ | × | × | × | ○ | ○ | × | × | × | × | ○ | ○ |
| 18 | × | × | × | × | ○ | ○ | ○ | × | × | × | ○ | ○ |
| 19 | ○ | × | × | × | ○ | ○ | ○ | × | × | × | ○ | ○ |
| 20 | × | ○ | × | × | ○ | ○ | × | ○ | × | × | ○ | ○ |
| 21 | ○ | ○ | × | × | ○ | ○ | × | ○ | × | × | ○ | ○ |
| 22 | × | ○ | × | × | ○ | ○ | ○ | ○ | × | × | ○ | ○ |
| 23 | ○ | ○ | × | × | ○ | ○ | ○ | ○ | × | × | ○ | ○ |
| 24 | × | ○ | ○ | × | ○ | ○ | × | ○ | ○ | × | ○ | ○ |
| 25 | ○ | ○ | ○ | × | ○ | ○ | × | ○ | ○ | × | ○ | ○ |
| 26 | × | ○ | ○ | × | ○ | ○ | ○ | ○ | ○ | × | ○ | ○ |
| 27 | ○ | ○ | ○ | × | ○ | ○ | ○ | ○ | ○ | × | ○ | ○ |
| 28 | × | ○ | ○ | ○ | ○ | ○ | × | ○ | ○ | ○ | ○ | ○ |
| 29 | ○ | ○ | ○ | ○ | ○ | ○ | × | ○ | ○ | ○ | ○ | ○ |
| 30 | × | ○ | ○ | ○ | ○ | ○ | ○ | ○ | ○ | ○ | ○ | ○ |
| 31 | ○ | ○ | ○ | ○ | ○ | ○ | ○ | ○ | ○ | ○ | ○ | ○ |

○ : lighting

× : non-lighting

FIG. 8

| | SF1 | SF2 | SF3 | SF4 | SF5 | SF6 | SF7 | SF8 | SF9 | SF10 | SF11 | SF12 |
|---|---|---|---|---|---|---|---|---|---|---|---|---|
| | 0.5 | 1 | 2 | 4 | 4 | 4 | 0.5 | 1 | 2 | 4 | 4 | 4 |
| 0 | × | × | × | × | × | × | × | × | × | × | × | × |
| 1 | ○ | × | × | × | × | × | ○ | × | × | × | × | × |
| 2 | × | ○ | × | × | × | × | × | ○ | × | × | × | × |
| 3 | ○ | ○ | × | × | × | × | ○ | ○ | × | × | × | × |
| 4 | × | × | ○ | × | × | × | × | × | ○ | × | × | × |
| 5 | ○ | × | ○ | × | × | × | ○ | × | ○ | × | × | × |
| 6 | × | ○ | ○ | × | × | × | × | ○ | ○ | × | × | × |
| 7 | ○ | ○ | ○ | × | × | × | ○ | ○ | ○ | × | × | × |
| 8 | × | × | × | ○ | × | × | × | × | × | ○ | × | × |
| 9 | ○ | × | × | ○ | × | × | ○ | × | × | ○ | × | × |
| 10 | × | ○ | × | ○ | × | × | × | ○ | × | ○ | × | × |
| 11 | ○ | ○ | × | ○ | × | × | ○ | ○ | × | ○ | × | × |
| 12 | × | × | ○ | ○ | × | × | × | × | ○ | ○ | × | × |
| 13 | ○ | × | ○ | ○ | × | × | ○ | × | ○ | ○ | × | × |
| 14 | × | ○ | ○ | ○ | × | × | × | ○ | ○ | ○ | × | × |
| 15 | ○ | ○ | ○ | ○ | × | × | ○ | ○ | ○ | ○ | × | × |
| 16 | × | × | × | ○ | ○ | × | × | × | × | ○ | ○ | × |
| 17 | ○ | × | × | ○ | ○ | × | ○ | × | × | ○ | ○ | × |
| 18 | × | ○ | × | ○ | ○ | × | × | ○ | × | ○ | ○ | × |
| 19 | ○ | ○ | × | ○ | ○ | × | ○ | ○ | × | ○ | ○ | × |
| 20 | × | × | ○ | ○ | ○ | × | × | × | ○ | ○ | ○ | × |
| 21 | ○ | × | ○ | ○ | ○ | × | ○ | × | ○ | ○ | ○ | × |
| 22 | × | ○ | ○ | ○ | ○ | × | × | ○ | ○ | ○ | ○ | × |
| 23 | ○ | ○ | ○ | ○ | ○ | × | ○ | ○ | ○ | ○ | ○ | × |
| 24 | × | × | × | ○ | ○ | ○ | × | × | × | ○ | ○ | ○ |
| 25 | ○ | × | × | ○ | ○ | ○ | ○ | × | × | ○ | ○ | ○ |
| 26 | × | ○ | × | ○ | ○ | ○ | × | ○ | × | ○ | ○ | ○ |
| 27 | ○ | ○ | × | ○ | ○ | ○ | ○ | ○ | × | ○ | ○ | ○ |
| 28 | × | × | ○ | ○ | ○ | ○ | × | × | ○ | ○ | ○ | ○ |
| 29 | ○ | × | ○ | ○ | ○ | ○ | ○ | × | ○ | ○ | ○ | ○ |
| 30 | × | ○ | ○ | ○ | ○ | ○ | × | ○ | ○ | ○ | ○ | ○ |
| 31 | ○ | ○ | ○ | ○ | ○ | ○ | ○ | ○ | ○ | ○ | ○ | ○ |

○ : lighting

× : non-lighting

FIG. 9

|    | SF1 | SF2 | SF3 | SF4 | SF5 | SF6 | SF7 | SF8 | SF9 | SF10 |
|    | 1   | 2   | 2   | 2   | 8   | 2   | 2   | 2   | 2   | 8    |
|----|-----|-----|-----|-----|-----|-----|-----|-----|-----|------|
| 0  | ×   | ×   | ×   | ×   | ×   | ×   | ×   | ×   | ×   | ×    |
| 1  | ○   | ×   | ×   | ×   | ×   | ×   | ×   | ×   | ×   | ×    |
| 2  | ×   | ×   | ×   | ×   | ×   | ○   | ×   | ×   | ×   | ×    |
| 3  | ○   | ×   | ×   | ×   | ×   | ○   | ×   | ×   | ×   | ×    |
| 4  | ×   | ○   | ×   | ×   | ×   | ×   | ○   | ×   | ×   | ×    |
| 5  | ○   | ○   | ×   | ×   | ×   | ×   | ○   | ×   | ×   | ×    |
| 6  | ×   | ○   | ×   | ×   | ×   | ○   | ○   | ×   | ×   | ×    |
| 7  | ○   | ○   | ×   | ×   | ×   | ○   | ○   | ×   | ×   | ×    |
| 8  | ×   | ○   | ○   | ×   | ×   | ×   | ○   | ○   | ×   | ×    |
| 9  | ○   | ○   | ○   | ×   | ×   | ×   | ○   | ○   | ×   | ×    |
| 10 | ×   | ○   | ○   | ×   | ×   | ○   | ○   | ○   | ×   | ×    |
| 11 | ○   | ○   | ○   | ×   | ×   | ○   | ○   | ○   | ×   | ×    |
| 12 | ×   | ○   | ○   | ○   | ×   | ×   | ○   | ○   | ○   | ×    |
| 13 | ○   | ○   | ○   | ○   | ×   | ×   | ○   | ○   | ○   | ×    |
| 14 | ×   | ○   | ○   | ○   | ×   | ○   | ○   | ○   | ○   | ×    |
| 15 | ○   | ○   | ○   | ○   | ×   | ○   | ○   | ○   | ○   | ×    |
| 16 | ×   | ×   | ×   | ×   | ○   | ×   | ×   | ×   | ×   | ○    |
| 17 | ○   | ×   | ×   | ×   | ○   | ×   | ×   | ×   | ×   | ○    |
| 18 | ×   | ×   | ×   | ×   | ○   | ○   | ×   | ×   | ×   | ○    |
| 19 | ○   | ×   | ×   | ×   | ○   | ○   | ×   | ×   | ×   | ○    |
| 20 | ×   | ○   | ×   | ×   | ○   | ×   | ○   | ×   | ×   | ○    |
| 21 | ○   | ○   | ×   | ×   | ○   | ×   | ○   | ×   | ×   | ○    |
| 22 | ×   | ○   | ×   | ×   | ○   | ○   | ○   | ×   | ×   | ○    |
| 23 | ○   | ○   | ×   | ×   | ○   | ○   | ○   | ×   | ×   | ○    |
| 24 | ×   | ○   | ○   | ×   | ○   | ×   | ○   | ○   | ×   | ○    |
| 25 | ○   | ○   | ○   | ×   | ○   | ×   | ○   | ○   | ×   | ○    |
| 26 | ×   | ○   | ○   | ×   | ○   | ○   | ○   | ○   | ×   | ○    |
| 27 | ○   | ○   | ○   | ×   | ○   | ○   | ○   | ○   | ×   | ○    |
| 28 | ×   | ○   | ○   | ○   | ○   | ×   | ○   | ○   | ○   | ○    |
| 29 | ○   | ○   | ○   | ○   | ○   | ×   | ○   | ○   | ○   | ○    |
| 30 | ×   | ○   | ○   | ○   | ○   | ○   | ○   | ○   | ○   | ○    |
| 31 | ○   | ○   | ○   | ○   | ○   | ○   | ○   | ○   | ○   | ○    |

○ : lighting

× : non-lighting

FIG. 11

|   | SF1 | SF2 | SF3 | SF4 | SF5 | SF6 | SF7 | SF8 | SF9 | SF10 |
|---|---|---|---|---|---|---|---|---|---|---|
|   | 1 | 2 | 2 | 4 | 4 | 2 | 2 | 6 | 4 | 4 |
| 0 | X | X | X | X | X | X | X | X | X | X |
| 1 | O | X | X | X | X | X | X | X | X | X |
| 2 | X | X | X | X | X | O | X | X | X | X |
| 3 | O | X | X | X | X | O | X | X | X | X |
| 4 | X | O | X | X | X | X | O | X | X | X |
| 5 | O | O | X | X | X | X | O | X | X | X |
| 6 | X | O | X | X | X | O | O | X | X | X |
| 7 | O | O | X | X | X | O | O | X | X | X |
| 8 | X | O | X | X | X | X | X | O | X | X |
| 9 | O | O | X | X | X | X | X | O | X | X |
| 10 | X | O | X | X | X | O | X | O | X | X |
| 11 | O | O | X | X | X | O | X | O | X | X |
| 12 | X | O | O | X | X | X | O | O | X | X |
| 13 | O | O | O | X | X | X | O | O | X | X |
| 14 | X | O | O | X | X | O | O | O | X | X |
| 15 | O | O | O | X | X | O | O | O | X | X |
| 16 | X | X | X | O | O | X | X | X | O | O |
| 17 | O | X | X | O | O | X | X | X | O | O |
| 18 | X | X | X | O | O | O | X | X | O | O |
| 19 | O | X | X | O | O | O | X | X | O | O |
| 20 | X | O | X | O | O | X | O | X | O | O |
| 21 | O | O | X | O | O | X | O | X | O | O |
| 22 | X | O | X | O | O | O | O | X | O | O |
| 23 | O | O | X | O | O | O | O | X | O | O |
| 24 | X | O | X | O | O | X | X | O | O | O |
| 25 | O | O | X | O | O | X | X | O | O | O |
| 26 | X | O | X | O | O | O | X | O | O | O |
| 27 | O | O | X | O | O | O | X | O | O | O |
| 28 | X | O | O | O | O | X | O | O | O | O |
| 29 | O | O | O | O | O | X | O | O | O | O |
| 30 | X | O | O | O | O | O | O | O | O | O |
| 31 | O | O | O | O | O | O | O | O | O | O |

O : lighting

X : non-lighting

FIG. 12

| | SF1 | SF2 | SF3 | SF4 | SF5 | SF6 | SF7 | SF8 | SF9 | SF10 | SF11 | SF12 |
|---|---|---|---|---|---|---|---|---|---|---|---|---|
| | 1 | 2 | 2 | 2 | 2 | 6 | 2 | 2 | 2 | 2 | 2 | 6 |
| 0 | X | X | X | X | X | X | X | X | X | X | X | X |
| 1 | O | X | X | X | X | X | X | X | X | X | X | X |
| 2 | X | X | X | X | X | X | O | X | X | X | X | X |
| 3 | O | X | X | X | X | X | O | X | X | X | X | X |
| 4 | X | O | X | X | X | X | X | O | X | X | X | X |
| 5 | O | O | X | X | X | X | X | O | X | X | X | X |
| 6 | X | O | X | X | X | X | O | O | X | X | X | X |
| 7 | O | O | X | X | X | X | O | O | X | X | X | X |
| 8 | X | O | O | X | X | X | X | O | O | X | X | X |
| 9 | O | O | O | X | X | X | X | O | O | X | X | X |
| 10 | X | O | O | X | X | X | O | O | O | X | X | X |
| 11 | O | O | O | X | X | X | O | O | O | X | X | X |
| 12 | X | O | O | O | X | X | X | O | O | O | X | X |
| 13 | O | O | O | O | X | X | X | O | O | O | X | X |
| 14 | X | O | O | O | X | X | O | O | O | O | X | X |
| 15 | O | O | O | O | X | X | O | O | O | O | X | X |
| 16 | X | X | X | X | O | O | X | X | X | X | O | O |
| 17 | O | X | X | X | O | O | X | X | X | X | O | O |
| 18 | X | X | X | X | O | O | O | X | X | X | O | O |
| 19 | O | X | X | X | O | O | O | X | X | X | O | O |
| 20 | X | O | X | X | O | O | X | O | X | X | O | O |
| 21 | O | O | X | X | O | O | X | O | X | X | O | O |
| 22 | X | O | X | X | O | O | O | O | X | X | O | O |
| 23 | O | O | X | X | O | O | O | O | X | X | O | O |
| 24 | X | O | O | X | O | O | X | O | O | X | O | O |
| 25 | O | O | O | X | O | O | X | O | O | X | O | O |
| 26 | X | O | O | X | O | O | O | O | O | X | O | O |
| 27 | O | O | O | X | O | O | O | O | O | X | O | O |
| 28 | X | O | O | O | O | O | X | O | O | O | O | O |
| 29 | O | O | O | O | O | O | X | O | O | O | O | O |
| 30 | X | O | O | O | O | O | O | O | O | O | O | O |
| 31 | O | O | O | O | O | O | O | O | O | O | O | O |

O : lighting

X : non-lighting

FIG. 13

|    | SF1 | SF2 | SF3 | SF4 | SF5 | SF6 | SF7 | SF8 | SF9 | SF10 | SF11 | SF12 |
|----|-----|-----|-----|-----|-----|-----|-----|-----|-----|------|------|------|
|    | 1   | 2   | 2   | 2   | 2   | 6   | 2   | 2   | 2   | 2    | 2    | 6    |
| 0  | ×   | ×   | ×   | ×   | ×   | ×   | ×   | ×   | ×   | ×    | ×    | ×    |
| 1  | ○   | ×   | ×   | ×   | ×   | ×   | ×   | ×   | ×   | ×    | ×    | ×    |
| 2  | ×   | ×   | ×   | ×   | ×   | ×   | ○   | ×   | ×   | ×    | ×    | ×    |
| 3  | ○   | ×   | ×   | ×   | ×   | ×   | ○   | ×   | ×   | ×    | ×    | ×    |
| 4  | ×   | ○   | ×   | ×   | ×   | ×   | ×   | ○   | ×   | ×    | ×    | ×    |
| 5  | ○   | ○   | ×   | ×   | ×   | ×   | ×   | ○   | ×   | ×    | ×    | ×    |
| 6  | ×   | ○   | ×   | ×   | ×   | ×   | ○   | ○   | ×   | ×    | ×    | ×    |
| 7  | ○   | ○   | ×   | ×   | ×   | ×   | ○   | ○   | ×   | ×    | ×    | ×    |
| 8  | ×   | ○   | ○   | ×   | ×   | ×   | ×   | ○   | ○   | ×    | ×    | ×    |
| 9  | ○   | ○   | ○   | ×   | ×   | ×   | ×   | ○   | ○   | ×    | ×    | ×    |
| 10 | ×   | ○   | ○   | ×   | ×   | ×   | ○   | ○   | ○   | ×    | ×    | ×    |
| 11 | ○   | ○   | ○   | ×   | ×   | ×   | ○   | ○   | ○   | ×    | ×    | ×    |
| 12 | ×   | ○   | ○   | ○   | ×   | ×   | ×   | ○   | ○   | ○    | ×    | ×    |
| 13 | ○   | ○   | ○   | ○   | ×   | ×   | ×   | ○   | ○   | ○    | ×    | ×    |
| 14 | ×   | ○   | ○   | ○   | ×   | ×   | ○   | ○   | ○   | ○    | ×    | ×    |
| 15 | ○   | ○   | ○   | ○   | ×   | ×   | ○   | ○   | ○   | ○    | ×    | ×    |
| 16 | ×   | ○   | ×   | ×   | ×   | ○   | ×   | ○   | ×   | ×    | ×    | ○    |
| 17 | ○   | ○   | ×   | ×   | ×   | ○   | ×   | ○   | ×   | ×    | ×    | ○    |
| 18 | ×   | ○   | ×   | ×   | ×   | ○   | ○   | ○   | ×   | ×    | ×    | ○    |
| 19 | ○   | ○   | ×   | ×   | ×   | ○   | ○   | ○   | ×   | ×    | ×    | ○    |
| 20 | ×   | ○   | ○   | ×   | ×   | ○   | ×   | ○   | ○   | ×    | ×    | ○    |
| 21 | ○   | ○   | ○   | ×   | ×   | ○   | ×   | ○   | ○   | ×    | ×    | ○    |
| 22 | ×   | ○   | ○   | ×   | ×   | ○   | ○   | ○   | ○   | ×    | ×    | ○    |
| 23 | ○   | ○   | ○   | ×   | ×   | ○   | ○   | ○   | ○   | ×    | ×    | ○    |
| 24 | ×   | ○   | ○   | ○   | ×   | ○   | ×   | ○   | ○   | ○    | ×    | ○    |
| 25 | ○   | ○   | ○   | ○   | ×   | ○   | ×   | ○   | ○   | ○    | ×    | ○    |
| 26 | ×   | ○   | ○   | ○   | ×   | ○   | ○   | ○   | ○   | ○    | ×    | ○    |
| 27 | ○   | ○   | ○   | ○   | ×   | ○   | ○   | ○   | ○   | ○    | ×    | ○    |
| 28 | ×   | ○   | ○   | ○   | ○   | ○   | ×   | ○   | ○   | ○    | ○    | ○    |
| 29 | ○   | ○   | ○   | ○   | ○   | ○   | ×   | ○   | ○   | ○    | ○    | ○    |
| 30 | ×   | ○   | ○   | ○   | ○   | ○   | ○   | ○   | ○   | ○    | ○    | ○    |
| 31 | ○   | ○   | ○   | ○   | ○   | ○   | ○   | ○   | ○   | ○    | ○    | ○    |

○ : lighting

× : non-lighting

FIG. 14

| | SF1 | SF2 | SF3 | SF4 | SF5 | SF6 | SF7 | SF8 | SF9 | SF10 |
|---|---|---|---|---|---|---|---|---|---|---|
| | 1 | 2 | 4 | 4 | 4 | 2 | 2 | 4 | 4 | 4 |
| 0 | X | X | X | X | X | X | X | X | X | X |
| 1 | O | X | X | X | X | X | X | X | X | X |
| 2 | X | X | X | X | X | O | X | X | X | X |
| 3 | O | X | X | X | X | O | X | X | X | X |
| 4 | X | O | X | X | X | X | O | X | X | X |
| 5 | O | O | X | X | X | X | O | X | X | X |
| 6 | X | O | X | X | X | O | O | X | X | X |
| 7 | O | O | X | X | X | O | O | X | X | X |
| 8 | X | X | O | X | X | X | X | O | X | X |
| 9 | O | X | O | X | X | X | X | O | X | X |
| 10 | X | X | O | X | X | O | X | O | X | X |
| 11 | O | X | O | X | X | O | X | O | X | X |
| 12 | X | O | O | X | X | X | O | O | X | X |
| 13 | O | O | O | X | X | X | O | O | X | X |
| 14 | X | O | O | X | X | O | O | O | X | X |
| 15 | O | O | O | X | X | O | O | O | X | X |
| 16 | X | X | O | O | X | X | X | O | O | X |
| 17 | O | X | O | O | X | X | X | O | O | X |
| 18 | X | X | O | O | X | O | X | O | O | X |
| 19 | O | X | O | O | X | O | X | O | O | X |
| 20 | X | O | O | O | X | X | O | O | O | X |
| 21 | O | O | O | O | X | X | O | O | O | X |
| 22 | X | O | O | O | X | O | O | O | O | X |
| 23 | O | O | O | O | X | O | O | O | O | X |
| 24 | X | X | O | O | O | X | X | O | O | O |
| 25 | O | X | O | O | O | X | X | O | O | O |
| 26 | X | X | O | O | O | O | X | O | O | O |
| 27 | O | X | O | O | O | O | X | O | O | O |
| 28 | X | O | O | O | O | X | O | O | O | O |
| 29 | O | O | O | O | O | X | O | O | O | O |
| 30 | X | O | O | O | O | O | O | O | O | O |
| 31 | O | O | O | O | O | O | O | O | O | O |

O : lighting

X : non-lighting

FIG. 15

|    | SF1 | SF2 | SF3 | SF4 | SF5 | SF6 | SF7 | SF8 | SF9 | SF10 |
|----|-----|-----|-----|-----|-----|-----|-----|-----|-----|------|
|    | 1   | 2   | 4   | 4   | 4   | 2   | 2   | 4   | 4   | 4    |
| 0  | ×   | ×   | ×   | ×   | ×   | ×   | ×   | ×   | ×   | ×    |
| 1  | ○   | ×   | ×   | ×   | ×   | ×   | ×   | ×   | ×   | ×    |
| 2  | ×   | ×   | ×   | ×   | ×   | ○   | ×   | ×   | ×   | ×    |
| 3  | ○   | ×   | ×   | ×   | ×   | ○   | ×   | ×   | ×   | ×    |
| 4  | ×   | ○   | ×   | ×   | ×   | ×   | ○   | ×   | ×   | ×    |
| 5  | ○   | ○   | ×   | ×   | ×   | ×   | ○   | ×   | ×   | ×    |
| 6  | ×   | ○   | ×   | ×   | ×   | ○   | ○   | ×   | ×   | ×    |
| 7  | ○   | ○   | ×   | ×   | ×   | ○   | ○   | ×   | ×   | ×    |
| 8  | ×   | ×   | ○   | ×   | ×   | ×   | ×   | ○   | ×   | ×    |
| 9  | ○   | ×   | ○   | ×   | ×   | ×   | ×   | ○   | ×   | ×    |
| 10 | ×   | ×   | ○   | ×   | ×   | ○   | ×   | ○   | ×   | ×    |
| 11 | ○   | ×   | ○   | ×   | ×   | ○   | ×   | ○   | ×   | ×    |
| 12 | ×   | ○   | ○   | ×   | ×   | ×   | ○   | ○   | ×   | ×    |
| 13 | ○   | ○   | ○   | ×   | ×   | ×   | ○   | ○   | ×   | ×    |
| 14 | ×   | ○   | ○   | ×   | ×   | ○   | ○   | ○   | ×   | ×    |
| 15 | ○   | ○   | ○   | ×   | ×   | ○   | ○   | ○   | ×   | ×    |
| 16 | ×   | ○   | ○   | ×   | ×   | ×   | ○   | ○   | ○   | ×    |
| 17 | ○   | ×   | ○   | ○   | ×   | ×   | ×   | ○   | ○   | ×    |
| 18 | ×   | ×   | ○   | ○   | ×   | ○   | ×   | ○   | ○   | ×    |
| 19 | ○   | ×   | ○   | ○   | ×   | ○   | ×   | ○   | ○   | ×    |
| 20 | ×   | ○   | ○   | ○   | ×   | ×   | ○   | ○   | ○   | ×    |
| 21 | ○   | ○   | ○   | ○   | ×   | ×   | ○   | ○   | ○   | ×    |
| 22 | ×   | ○   | ○   | ○   | ×   | ○   | ○   | ○   | ○   | ×    |
| 23 | ○   | ○   | ○   | ×   | ○   | ○   | ○   | ○   | ×   | ○    |
| 24 | ×   | ×   | ○   | ○   | ○   | ×   | ×   | ○   | ○   | ○    |
| 25 | ○   | ×   | ○   | ○   | ○   | ×   | ×   | ○   | ○   | ○    |
| 26 | ×   | ×   | ○   | ○   | ○   | ○   | ×   | ○   | ○   | ○    |
| 27 | ○   | ×   | ○   | ○   | ○   | ○   | ×   | ○   | ○   | ○    |
| 28 | ×   | ○   | ○   | ○   | ○   | ×   | ○   | ○   | ○   | ○    |
| 29 | ○   | ○   | ○   | ○   | ○   | ×   | ○   | ○   | ○   | ○    |
| 30 | ×   | ○   | ○   | ○   | ○   | ○   | ○   | ○   | ○   | ○    |
| 31 | ○   | ○   | ○   | ○   | ○   | ○   | ○   | ○   | ○   | ○    |

○ : lighting

× : non-lighting

FIG. 16

| | SF1 | SF2 | SF3 | SF4 | SF5 | SF6 | SF7 | SF8 | SF9 | SF10 |
|---|---|---|---|---|---|---|---|---|---|---|
| | 1 | 2 | 4 | 4 | 4 | 2 | 2 | 4 | 4 | 4 |
| 0 | × | × | × | × | × | × | × | × | × | × |
| 1 | ○ | × | × | × | × | × | × | × | × | × |
| 2 | × | × | × | × | × | ○ | × | × | × | × |
| 3 | ○ | × | × | × | × | ○ | × | × | × | × |
| 4 | × | ○ | × | × | × | × | ○ | × | × | × |
| 5 | ○ | ○ | × | × | × | × | ○ | × | × | × |
| 6 | × | ○ | × | × | × | ○ | ○ | × | × | × |
| 7 | ○ | ○ | × | × | × | ○ | ○ | × | × | × |
| 8 | × | × | ○ | × | × | × | × | ○ | × | × |
| 9 | ○ | × | ○ | × | × | × | × | ○ | × | × |
| 10 | × | × | ○ | × | × | ○ | × | ○ | × | × |
| 11 | ○ | × | ○ | × | × | ○ | × | ○ | × | × |
| 12 | × | ○ | ○ | × | × | × | ○ | ○ | × | × |
| 13 | ○ | ○ | ○ | × | × | × | ○ | ○ | × | × |
| 14 | × | ○ | ○ | × | × | ○ | ○ | ○ | × | × |
| 15 | ○ | ○ | ○ | × | × | ○ | ○ | ○ | × | × |
| 16 | × | × | ○ | ○ | × | × | × | ○ | ○ | × |
| 17 | ○ | × | ○ | ○ | × | × | × | ○ | ○ | × |
| 18 | × | × | ○ | ○ | × | ○ | × | ○ | ○ | × |
| 19 | ○ | × | ○ | ○ | × | ○ | × | ○ | ○ | × |
| 20 | × | ○ | ○ | ○ | × | × | ○ | ○ | ○ | × |
| 21 | ○ | ○ | ○ | ○ | × | × | ○ | ○ | ○ | × |
| 22 | × | ○ | ○ | ○ | × | ○ | ○ | ○ | ○ | × |
| 23 | ○ | ○ | ○ | ○ | × | ○ | ○ | ○ | ○ | × |
| 24 | × | × | ○ | ○ | ○ | × | × | ○ | ○ | ○ |
| 25 | ○ | × | ○ | ○ | ○ | × | × | ○ | ○ | ○ |
| 26 | × | × | ○ | ○ | ○ | ○ | × | ○ | ○ | ○ |
| 27 | ○ | × | ○ | ○ | ○ | ○ | × | ○ | ○ | ○ |
| 28 | × | ○ | ○ | ○ | ○ | × | ○ | ○ | ○ | ○ |
| 29 | ○ | ○ | ○ | ○ | ○ | × | ○ | ○ | ○ | ○ |
| 30 | × | ○ | ○ | ○ | ○ | ○ | ○ | ○ | ○ | ○ |
| 31 | ○ | ○ | ○ | ○ | ○ | ○ | ○ | ○ | ○ | ○ |

○ : lighting

× : non-lighting

FIG. 17

| | SF1 | SF2 | SF3 | SF4 | SF5 | SF6 | SF7 | SF8 | SF9 | SF10 |
| --- | --- | --- | --- | --- | --- | --- | --- | --- | --- | --- |
| | 1 | 2 | 2 | 4 | 4 | 2 | 2 | 6 | 4 | 4 |
| 0 | X | X | X | X | X | X | X | X | X | X |
| 1 | O | X | X | X | X | X | X | X | X | X |
| 2 | X | X | X | X | X | O | X | X | X | X |
| 3 | O | X | X | X | X | O | X | X | X | X |
| 4 | X | O | X | X | X | X | O | X | X | X |
| 5 | O | O | X | X | X | X | O | X | X | X |
| 6 | X | O | X | X | X | O | O | X | X | X |
| 7 | O | O | X | X | X | O | O | X | X | X |
| 8 | X | O | X | X | X | X | X | O | X | X |
| 9 | O | O | X | X | X | X | X | O | X | X |
| 10 | X | O | X | X | X | O | X | O | X | X |
| 11 | O | O | X | X | X | O | X | O | X | X |
| 12 | X | O | O | X | X | X | O | O | X | X |
| 13 | O | O | O | X | X | X | O | O | X | X |
| 14 | X | O | O | X | X | O | O | O | X | X |
| 15 | O | O | O | X | X | O | O | O | X | X |
| 16 | X | X | X | O | O | X | X | X | O | O |
| 17 | O | X | X | O | O | X | X | X | O | O |
| 18 | X | X | X | O | O | O | X | X | O | O |
| 19 | O | X | X | O | O | O | X | X | O | O |
| 20 | X | O | X | O | O | X | O | X | O | O |
| 21 | O | O | X | O | O | X | O | X | O | O |
| 22 | X | O | X | O | O | O | O | X | O | O |
| 23 | O | O | X | O | O | O | O | X | O | O |
| 24 | X | O | X | O | O | X | X | O | O | O |
| 25 | O | O | X | O | O | X | X | O | O | O |
| 26 | X | O | X | O | O | O | X | O | O | O |
| 27 | O | O | X | O | O | O | X | O | O | O |
| 28 | X | O | O | O | O | X | O | O | O | O |
| 29 | O | O | O | O | O | X | O | O | O | O |
| 30 | X | O | O | O | O | O | O | O | O | O |
| 31 | O | O | O | O | O | O | O | O | O | O |

O : lighting

X : non-lighting

FIG. 18

| γ-corrected 5-bit display | 6-bit display | SF1 | SF2 | SF3 | SF4 | SF5 | SF6 | SF7 | SF8 | SF9 | SF10 | SF11 | SF12 |
|---|---|---|---|---|---|---|---|---|---|---|---|---|---|
| | | 1 | 2 | 4 | 8 | 8 | 8 | 2 | 2 | 4 | 8 | 8 | 8 |
| 0 | 0 | X | X | X | X | X | X | X | X | X | X | X | X |
| 1 | 0 | X | X | X | X | X | X | X | X | X | X | X | X |
| 2 | 0 | X | X | X | X | X | X | X | X | X | X | X | X |
| 3 | 0 | X | X | X | X | X | X | X | X | X | X | X | X |
| 4 | 1 | O | X | X | X | X | X | X | X | X | X | X | X |
| 5 | 1 | O | X | X | X | X | X | X | X | X | X | X | X |
| 6 | 2 | X | X | X | X | X | X | O | X | X | X | X | X |
| 7 | 2 | X | X | X | X | X | X | O | X | X | X | X | X |
| 8 | 3 | O | X | X | X | X | X | O | X | X | X | X | X |
| 9 | 4 | X | O | X | X | X | X | X | O | X | X | X | X |
| 10 | 5 | O | O | X | X | X | X | X | O | X | X | X | X |
| 11 | 6 | X | O | X | X | X | X | O | O | X | X | X | X |
| 12 | 8 | X | X | O | X | X | X | X | X | O | X | X | X |
| 13 | 9 | O | X | O | X | X | X | X | X | O | X | X | X |
| 14 | 11 | O | X | O | X | X | X | O | X | O | X | X | X |
| 15 | 13 | O | O | O | X | X | X | X | O | O | X | X | X |
| 16 | 15 | O | O | O | X | X | X | O | O | O | X | X | X |
| 17 | 17 | O | X | X | O | X | X | X | X | X | O | X | X |
| 18 | 19 | O | X | X | O | X | X | O | X | X | O | X | X |
| 19 | 21 | O | O | X | O | X | X | X | X | O | O | X | X |
| 20 | 24 | X | X | O | O | X | X | X | X | O | O | X | X |
| 21 | 27 | O | X | O | O | X | X | O | X | O | O | X | X |
| 22 | 30 | X | O | O | O | X | X | O | O | O | O | X | X |
| 23 | 33 | O | X | X | O | O | X | X | X | X | O | O | X |
| 24 | 36 | X | O | X | O | O | X | X | O | X | O | O | X |
| 25 | 39 | O | O | X | O | O | X | O | O | X | O | O | X |
| 26 | 43 | O | X | O | O | O | X | O | X | O | O | O | X |
| 27 | 46 | X | O | O | O | O | X | O | O | O | O | O | X |
| 28 | 50 | X | X | X | O | O | O | O | X | X | O | O | O |
| 29 | 54 | X | O | X | O | O | O | O | X | O | O | O | O |
| 30 | 59 | O | X | O | O | O | O | O | X | O | O | O | O |
| 31 | 63 | O | O | O | O | O | O | O | O | O | O | O | O |

O : lighting

X : non-lighting

FIG. 20

| γ-corrected 5-bit display | 6-bit display | SF1 | SF2 | SF3 | SF4 | SF5 | SF6 | SF7 | SF8 | SF9 | SF10 | SF11 | SF12 |
|---|---|---|---|---|---|---|---|---|---|---|---|---|---|
| | | 1 | 2 | 4 | 8 | 8 | 8 | 2 | 2 | 4 | 8 | 8 | 8 |
| 0 | 0 | × | × | × | × | × | × | × | × | × | × | × | × |
| 1 | 1 | ○ | × | × | × | × | × | × | × | × | × | × | × |
| 2 | 2 | × | × | × | × | × | × | ○ | × | × | × | × | × |
| 3 | 3 | ○ | × | × | × | × | × | ○ | × | × | × | × | × |
| 4 | 4 | × | ○ | × | × | × | × | × | ○ | × | × | × | × |
| 5 | 5 | ○ | ○ | × | × | × | × | × | ○ | × | × | × | × |
| 6 | 6 | × | ○ | × | × | × | × | ○ | ○ | × | × | × | × |
| 7 | 7 | ○ | ○ | × | × | × | × | ○ | ○ | × | × | × | × |
| 8 | 8 | × | × | ○ | × | × | × | × | × | ○ | × | × | × |
| 9 | 9 | ○ | × | ○ | × | × | × | × | × | ○ | × | × | × |
| 10 | 10 | × | × | ○ | × | × | × | ○ | × | ○ | × | × | × |
| 11 | 11 | ○ | × | ○ | × | × | × | ○ | × | ○ | × | × | × |
| 12 | 12 | × | ○ | ○ | × | × | × | × | ○ | ○ | × | × | × |
| 13 | 13 | ○ | ○ | ○ | × | × | × | × | ○ | ○ | × | × | × |
| 14 | 14 | × | ○ | ○ | × | × | × | ○ | ○ | ○ | × | × | × |
| 15 | 15 | ○ | ○ | ○ | × | × | × | ○ | ○ | ○ | × | × | × |
| 16 | 16 | × | × | × | ○ | × | × | × | × | × | ○ | × | × |
| 17 | 17 | ○ | × | × | ○ | × | × | × | × | × | ○ | × | × |
| 18 | 19 | ○ | × | × | ○ | × | × | ○ | × | × | ○ | × | × |
| 19 | 21 | ○ | ○ | × | ○ | × | × | ○ | × | ○ | ○ | × | × |
| 20 | 24 | × | × | ○ | ○ | × | × | × | × | ○ | ○ | × | × |
| 21 | 27 | ○ | × | ○ | ○ | × | × | ○ | × | ○ | ○ | × | × |
| 22 | 30 | × | ○ | ○ | ○ | × | × | ○ | ○ | ○ | ○ | × | × |
| 23 | 33 | ○ | × | × | ○ | ○ | × | × | × | × | ○ | ○ | × |
| 24 | 36 | × | ○ | × | ○ | ○ | × | × | ○ | × | ○ | ○ | × |
| 25 | 39 | ○ | ○ | × | ○ | ○ | × | ○ | ○ | × | ○ | ○ | × |
| 26 | 43 | ○ | × | ○ | ○ | ○ | × | ○ | × | ○ | ○ | ○ | × |
| 27 | 46 | × | ○ | ○ | ○ | ○ | × | ○ | ○ | ○ | ○ | ○ | × |
| 28 | 50 | × | × | × | ○ | ○ | ○ | ○ | × | × | ○ | ○ | ○ |
| 29 | 54 | × | ○ | × | ○ | ○ | ○ | ○ | ○ | × | ○ | ○ | ○ |
| 30 | 59 | ○ | × | ○ | ○ | ○ | ○ | ○ | × | ○ | ○ | ○ | ○ |
| 31 | 63 | ○ | ○ | ○ | ○ | ○ | ○ | ○ | ○ | ○ | ○ | ○ | ○ |

○ : lighting
× : non-lighting

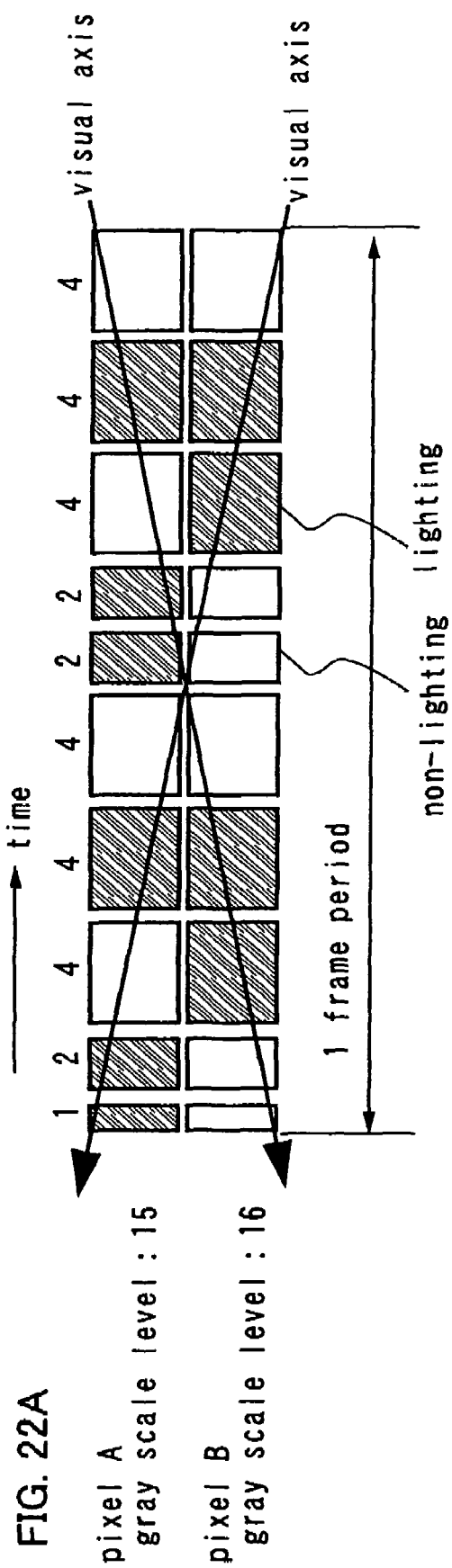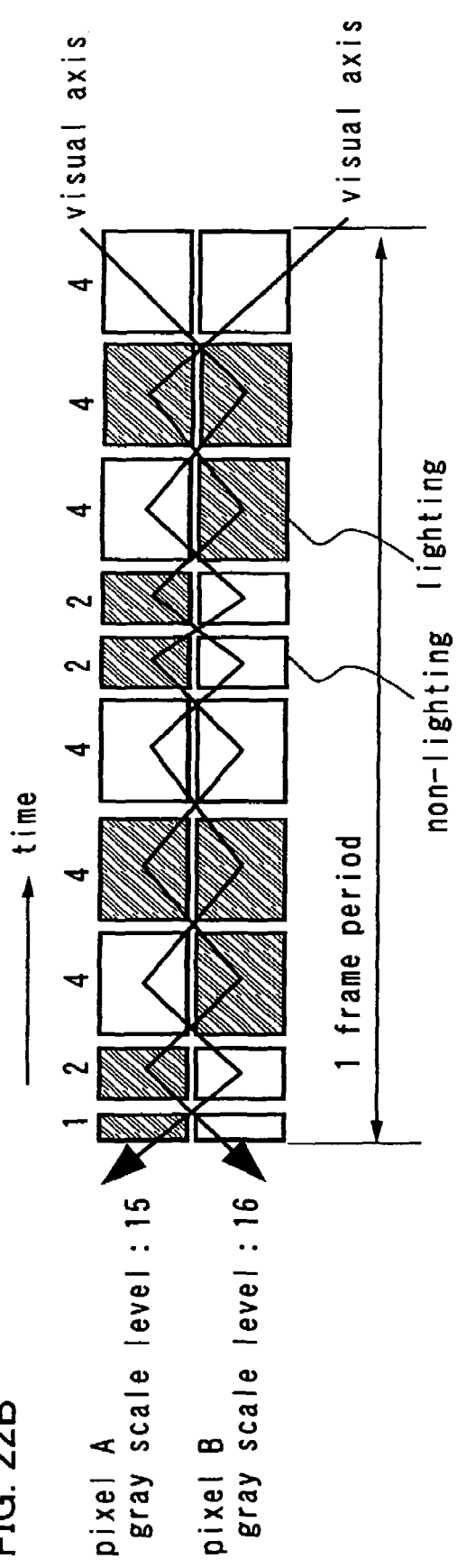

FIG. 24
 : a first bit group
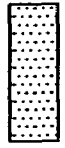 : a second bit group
 : a third bit group

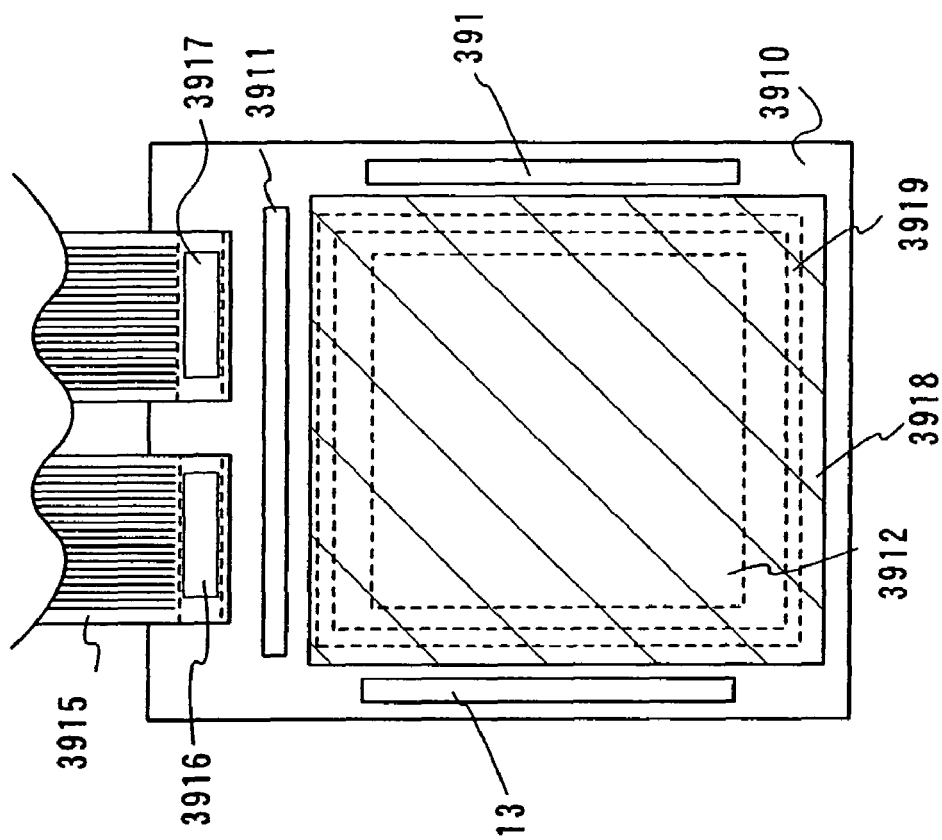
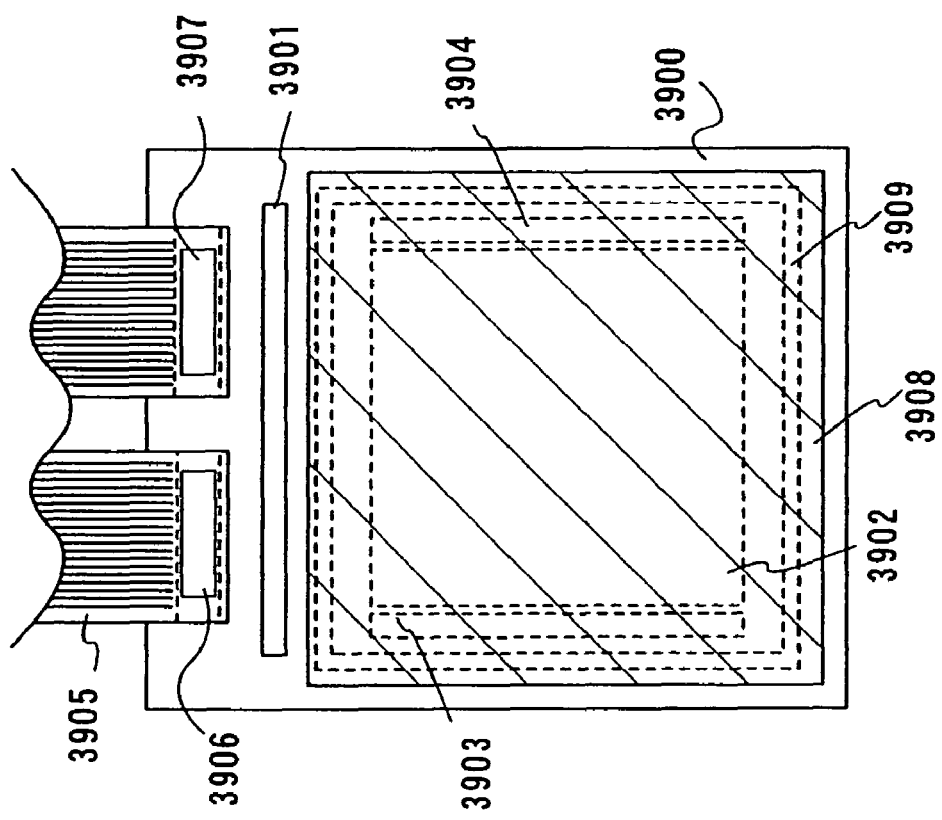
FIG. 42A
FIG. 42B

FIG. 46

|    | SF1 | SF2 | SF3 | SF4 | SF5 |
|----|-----|-----|-----|-----|-----|
|    | 1   | 2   | 4   | 8   | 16  |
| 0  | ×   | ×   | ×   | ×   | ×   |
| 1  | ○   | ×   | ×   | ×   | ×   |
| 2  | ×   | ○   | ×   | ×   | ×   |
| 3  | ○   | ○   | ×   | ×   | ×   |
| 4  | ×   | ×   | ○   | ×   | ×   |
| 5  | ○   | ×   | ○   | ×   | ×   |
| 6  | ×   | ○   | ○   | ×   | ×   |
| 7  | ○   | ○   | ○   | ×   | ×   |
| 8  | ×   | ×   | ×   | ○   | ×   |
| 9  | ○   | ×   | ×   | ○   | ×   |
| 10 | ×   | ○   | ×   | ○   | ×   |
| 11 | ○   | ○   | ×   | ○   | ×   |
| 12 | ×   | ×   | ○   | ○   | ×   |
| 13 | ○   | ×   | ○   | ○   | ×   |
| 14 | ×   | ○   | ○   | ○   | ×   |
| 15 | ○   | ○   | ○   | ○   | ×   |
| 16 | ×   | ×   | ×   | ×   | ○   |
| 17 | ○   | ×   | ×   | ×   | ○   |
| 18 | ×   | ○   | ×   | ×   | ○   |
| 19 | ○   | ○   | ×   | ×   | ○   |
| 20 | ×   | ×   | ○   | ×   | ○   |
| 21 | ○   | ×   | ○   | ×   | ○   |
| 22 | ×   | ○   | ○   | ×   | ○   |
| 23 | ○   | ○   | ○   | ×   | ○   |
| 24 | ×   | ×   | ×   | ○   | ○   |
| 25 | ○   | ×   | ×   | ○   | ○   |
| 26 | ×   | ○   | ×   | ○   | ○   |
| 27 | ○   | ○   | ×   | ○   | ○   |
| 28 | ×   | ×   | ○   | ○   | ○   |
| 29 | ○   | ×   | ○   | ○   | ○   |
| 30 | ×   | ○   | ○   | ○   | ○   |
| 31 | ○   | ○   | ○   | ○   | ○   |

○ : lighting

× : non-lighting

PRIOR ART

FIG. 47

| | SF1 | SF2 | SF3 | SF4 | SF5 | SF6 | SF7 | SF8 | SF9 | SF10 |
|---|---|---|---|---|---|---|---|---|---|---|
| | 0.5 | 1 | 2 | 4 | 8 | 0.5 | 1 | 2 | 4 | 8 |
| 0 | × | × | × | × | × | × | × | × | × | × |
| 1 | ○ | × | × | × | × | ○ | × | × | × | × |
| 2 | × | ○ | × | × | × | × | ○ | × | × | × |
| 3 | ○ | ○ | × | × | × | ○ | ○ | × | × | × |
| 4 | × | × | ○ | × | × | × | × | ○ | × | × |
| 5 | ○ | × | ○ | × | × | ○ | × | ○ | × | × |
| 6 | × | ○ | ○ | × | × | × | ○ | ○ | × | × |
| 7 | ○ | ○ | ○ | × | × | ○ | ○ | ○ | × | × |
| 8 | × | × | × | ○ | × | × | × | × | ○ | × |
| 9 | ○ | × | × | ○ | × | ○ | × | × | ○ | × |
| 10 | × | ○ | × | ○ | × | × | ○ | × | ○ | × |
| 11 | ○ | ○ | × | ○ | × | ○ | ○ | × | ○ | × |
| 12 | × | × | ○ | ○ | × | × | × | ○ | ○ | × |
| 13 | ○ | × | ○ | ○ | × | ○ | × | ○ | ○ | × |
| 14 | × | ○ | ○ | ○ | × | × | ○ | ○ | ○ | × |
| 15 | ○ | ○ | ○ | ○ | × | ○ | ○ | ○ | ○ | × |
| 16 | × | × | × | × | ○ | × | × | × | × | ○ |
| 17 | ○ | × | × | × | ○ | ○ | × | × | × | ○ |
| 18 | × | ○ | × | × | ○ | × | ○ | × | × | ○ |
| 19 | ○ | ○ | × | × | ○ | ○ | ○ | × | × | ○ |
| 20 | × | × | ○ | × | ○ | × | × | ○ | × | ○ |
| 21 | ○ | × | ○ | × | ○ | ○ | × | ○ | × | ○ |
| 22 | × | ○ | ○ | × | ○ | × | ○ | ○ | × | ○ |
| 23 | ○ | ○ | ○ | × | ○ | ○ | ○ | ○ | × | ○ |
| 24 | × | × | × | ○ | ○ | × | × | × | ○ | ○ |
| 25 | ○ | × | × | ○ | ○ | ○ | × | × | ○ | ○ |
| 26 | × | ○ | × | ○ | ○ | × | ○ | × | ○ | ○ |
| 27 | ○ | ○ | × | ○ | ○ | ○ | ○ | × | ○ | ○ |
| 28 | × | × | ○ | ○ | ○ | × | × | ○ | ○ | ○ |
| 29 | ○ | × | ○ | ○ | ○ | ○ | × | ○ | ○ | ○ |
| 30 | × | ○ | ○ | ○ | ○ | × | ○ | ○ | ○ | ○ |
| 31 | ○ | ○ | ○ | ○ | ○ | ○ | ○ | ○ | ○ | ○ |

○ : lighting

× : non-lighting

PRIOR ART

FIG. 48

| | SF1 | SF2 | SF3 | SF4 | SF5 | SF6 |
| | 1 | 2 | 4 | 8 | 16 | 32 |
|---|---|---|---|---|---|---|
| 0 | × | × | × | × | × | × |
| 1 | O | × | × | × | × | × |
| 2 | × | O | × | × | × | × |
| 3 | O | O | × | × | × | × |
| 4 | × | × | O | × | × | × |
| 5 | O | × | O | × | × | × |
| 6 | × | O | O | × | × | × |
| 7 | O | O | O | × | × | × |
| 8 | × | × | × | O | × | × |
| 9 | O | × | × | O | × | × |
| 10 | × | O | × | O | × | × |
| 11 | O | O | × | O | × | × |
| 12 | × | × | O | O | × | × |
| 13 | O | × | O | O | × | × |
| 14 | × | O | O | O | × | × |
| 15 | O | O | O | O | × | × |
| 16 | × | × | × | × | O | × |
| 17 | O | × | × | × | O | × |
| 18 | × | O | × | × | O | × |
| 19 | O | O | × | × | O | × |
| 20 | × | × | O | × | O | × |
| 21 | O | × | O | × | O | × |
| 22 | × | O | O | × | O | × |
| 23 | O | O | O | × | O | × |
| 24 | × | × | × | O | O | × |
| 25 | O | × | × | O | O | × |
| 26 | × | O | × | O | O | × |
| 27 | O | O | × | O | O | × |
| 28 | × | × | O | O | O | × |
| 29 | O | × | O | O | O | × |
| 30 | × | O | O | O | O | × |
| 31 | O | O | O | O | O | × |
| 32 | × | × | × | × | × | O |
| 33 | O | × | × | × | × | O |
| 34 | × | O | × | × | × | O |
| 35 | O | O | × | × | × | O |
| 36 | × | × | O | × | × | O |
| 37 | O | × | O | × | × | O |
| 38 | × | O | O | × | × | O |
| 39 | O | O | O | × | × | O |
| 40 | × | × | × | O | × | O |
| 41 | O | × | × | O | × | O |
| 42 | × | O | × | O | × | O |
| 43 | O | O | × | O | × | O |
| 44 | × | × | O | O | × | O |
| 45 | O | × | O | O | × | O |
| 46 | × | O | O | O | × | O |
| 47 | O | O | O | O | × | O |
| 48 | × | × | × | × | O | O |
| 49 | O | × | × | × | O | O |
| 50 | × | O | × | × | O | O |
| 51 | O | O | × | × | O | O |
| 52 | × | × | O | × | O | O |
| 53 | O | × | O | × | O | O |
| 54 | × | O | O | × | O | O |
| 55 | O | O | O | × | O | O |
| 56 | × | × | × | O | O | O |
| 57 | O | × | × | O | O | O |
| 58 | × | O | × | O | O | O |
| 59 | O | O | × | O | O | O |
| 60 | × | × | O | O | O | O |
| 61 | O | × | O | O | O | O |
| 62 | × | O | O | O | O | O |
| 63 | O | O | O | O | O | O |

O : lighting

× : non-lighting

PRIOR ART

FIG. 49

| | SF1 | SF2 | SF3 | SF4 | SF5 | SF6 | SF7 | SF8 | SF9 | SF10 | SF11 | SF12 |
|---|---|---|---|---|---|---|---|---|---|---|---|---|
| | 0.5 | 1 | 2 | 4 | 8 | 16 | 0.5 | 1 | 2 | 4 | 8 | 16 |
| 0 | × | × | × | × | × | × | × | × | × | × | × | × |
| 1 | ○ | × | × | × | × | × | ○ | × | × | × | × | × |
| 2 | × | ○ | × | × | × | × | × | ○ | × | × | × | × |
| 3 | ○ | ○ | × | × | × | × | ○ | ○ | × | × | × | × |
| 4 | × | × | ○ | × | × | × | × | × | ○ | × | × | × |
| 5 | ○ | × | ○ | × | × | × | ○ | × | ○ | × | × | × |
| 6 | × | ○ | ○ | × | × | × | × | ○ | ○ | × | × | × |
| 7 | ○ | ○ | ○ | × | × | × | ○ | ○ | ○ | × | × | × |
| 8 | × | × | × | ○ | × | × | × | × | × | ○ | × | × |
| 9 | ○ | × | × | ○ | × | × | ○ | × | × | ○ | × | × |
| 10 | × | ○ | × | ○ | × | × | × | ○ | × | ○ | × | × |
| 11 | ○ | ○ | × | ○ | × | × | ○ | ○ | × | ○ | × | × |
| 12 | × | × | ○ | ○ | × | × | × | × | ○ | ○ | × | × |
| 13 | ○ | × | ○ | ○ | × | × | ○ | × | ○ | ○ | × | × |
| 14 | × | ○ | ○ | ○ | × | × | × | ○ | ○ | ○ | × | × |
| 15 | ○ | ○ | ○ | ○ | × | × | ○ | ○ | ○ | ○ | × | × |
| 16 | × | × | × | × | ○ | × | × | × | × | × | ○ | × |
| 17 | ○ | × | × | × | ○ | × | ○ | × | × | × | ○ | × |
| 18 | × | ○ | × | × | ○ | × | × | ○ | × | × | ○ | × |
| 19 | ○ | ○ | × | × | ○ | × | ○ | ○ | × | × | ○ | × |
| 20 | × | × | ○ | × | ○ | × | × | × | ○ | × | ○ | × |
| 21 | ○ | × | ○ | × | ○ | × | ○ | × | ○ | × | ○ | × |
| 22 | × | ○ | ○ | × | ○ | × | × | ○ | ○ | × | ○ | × |
| 23 | ○ | ○ | ○ | × | ○ | × | ○ | ○ | ○ | × | ○ | × |
| 24 | × | × | × | ○ | ○ | × | × | × | × | ○ | ○ | × |
| 25 | ○ | × | × | ○ | ○ | × | ○ | × | × | ○ | ○ | × |
| 26 | × | ○ | × | ○ | ○ | × | × | ○ | × | ○ | ○ | × |
| 27 | ○ | ○ | × | ○ | ○ | × | ○ | ○ | × | ○ | ○ | × |
| 28 | × | × | ○ | ○ | ○ | × | × | × | ○ | ○ | ○ | × |
| 29 | ○ | × | ○ | ○ | ○ | × | ○ | × | ○ | ○ | ○ | × |
| 30 | × | ○ | ○ | ○ | ○ | × | × | ○ | ○ | ○ | ○ | × |
| 31 | ○ | ○ | ○ | ○ | ○ | × | ○ | ○ | ○ | ○ | ○ | × |
| 32 | × | × | × | × | × | ○ | × | × | × | × | × | ○ |
| 33 | ○ | × | × | × | × | ○ | ○ | × | × | × | × | ○ |
| 34 | × | ○ | × | × | × | ○ | × | ○ | × | × | × | ○ |
| 35 | ○ | ○ | × | × | × | ○ | ○ | ○ | × | × | × | ○ |
| 36 | × | × | ○ | × | × | ○ | × | × | ○ | × | × | ○ |
| 37 | ○ | × | ○ | × | × | ○ | ○ | × | ○ | × | × | ○ |
| 38 | × | ○ | ○ | × | × | ○ | × | ○ | ○ | × | × | ○ |
| 39 | ○ | ○ | ○ | × | × | ○ | ○ | ○ | ○ | × | × | ○ |
| 40 | × | × | × | ○ | × | ○ | × | × | × | ○ | × | ○ |
| 41 | ○ | × | × | ○ | × | ○ | ○ | × | × | ○ | × | ○ |
| 42 | × | ○ | × | ○ | × | ○ | × | ○ | × | ○ | × | ○ |
| 43 | ○ | ○ | × | ○ | × | ○ | ○ | ○ | × | ○ | × | ○ |
| 44 | × | × | ○ | ○ | × | ○ | × | × | ○ | ○ | × | ○ |
| 45 | ○ | × | ○ | ○ | × | ○ | ○ | × | ○ | ○ | × | ○ |
| 46 | × | ○ | ○ | ○ | × | ○ | × | ○ | ○ | ○ | × | ○ |
| 47 | ○ | ○ | ○ | ○ | × | ○ | ○ | ○ | ○ | ○ | × | ○ |
| 48 | × | × | × | × | ○ | ○ | × | × | × | × | ○ | ○ |
| 49 | ○ | × | × | × | ○ | ○ | ○ | × | × | × | ○ | ○ |
| 50 | × | ○ | × | × | ○ | ○ | × | ○ | × | × | ○ | ○ |
| 51 | ○ | ○ | × | × | ○ | ○ | ○ | ○ | × | × | ○ | ○ |
| 52 | × | × | ○ | × | ○ | ○ | × | × | ○ | × | ○ | ○ |
| 53 | ○ | × | ○ | × | ○ | ○ | ○ | × | ○ | × | ○ | ○ |
| 54 | × | ○ | ○ | × | ○ | ○ | × | ○ | ○ | × | ○ | ○ |
| 55 | ○ | ○ | ○ | × | ○ | ○ | ○ | ○ | ○ | × | ○ | ○ |
| 56 | × | × | × | ○ | ○ | ○ | × | × | × | ○ | ○ | ○ |
| 57 | ○ | × | × | ○ | ○ | ○ | ○ | × | × | ○ | ○ | ○ |
| 58 | × | ○ | × | ○ | ○ | ○ | × | ○ | × | ○ | ○ | ○ |
| 59 | ○ | ○ | × | ○ | ○ | ○ | ○ | ○ | × | ○ | ○ | ○ |
| 60 | × | × | ○ | ○ | ○ | ○ | × | × | ○ | ○ | ○ | ○ |
| 61 | ○ | × | ○ | ○ | ○ | ○ | ○ | × | ○ | ○ | ○ | ○ |
| 62 | × | ○ | ○ | ○ | ○ | ○ | × | ○ | ○ | ○ | ○ | ○ |
| 63 | ○ | ○ | ○ | ○ | ○ | ○ | ○ | ○ | ○ | ○ | ○ | ○ |

○ : lighting
× : non-lighting

PRIOR ART

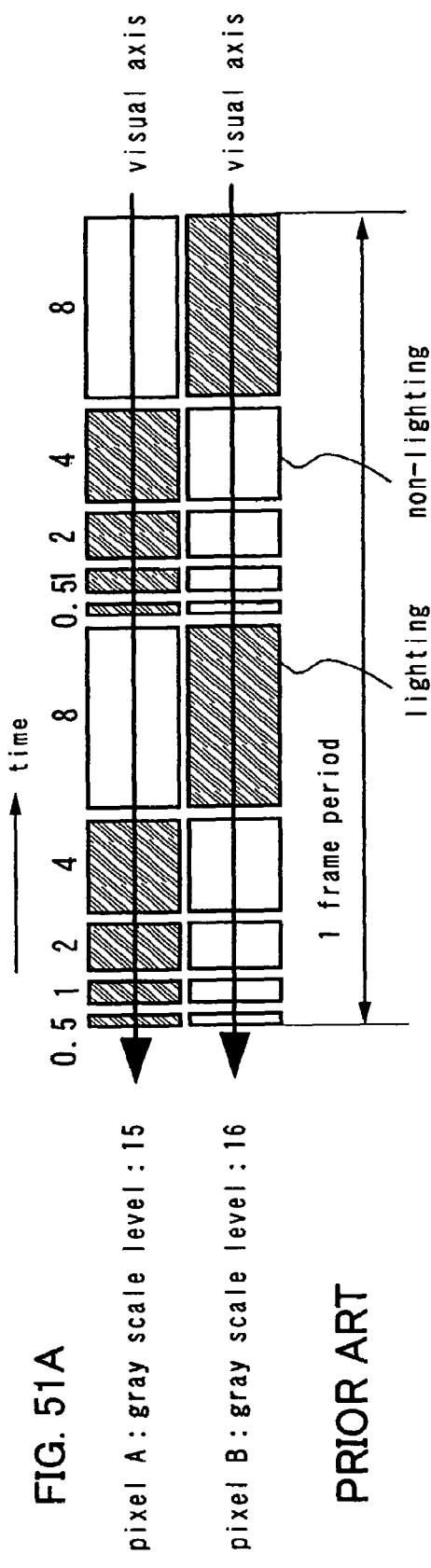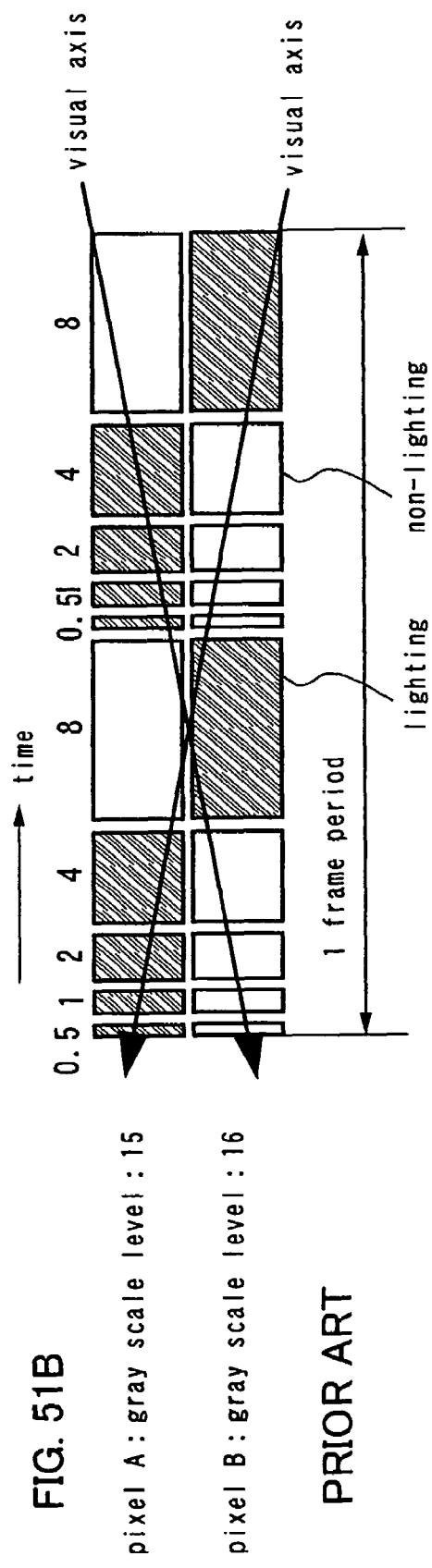
FIG. 51A
pixel A : gray scale level : 15
pixel B : gray scale level : 16
PRIOR ART
FIG. 51B
pixel A : gray scale level : 15
pixel B : gray scale level : 16
PRIOR ART

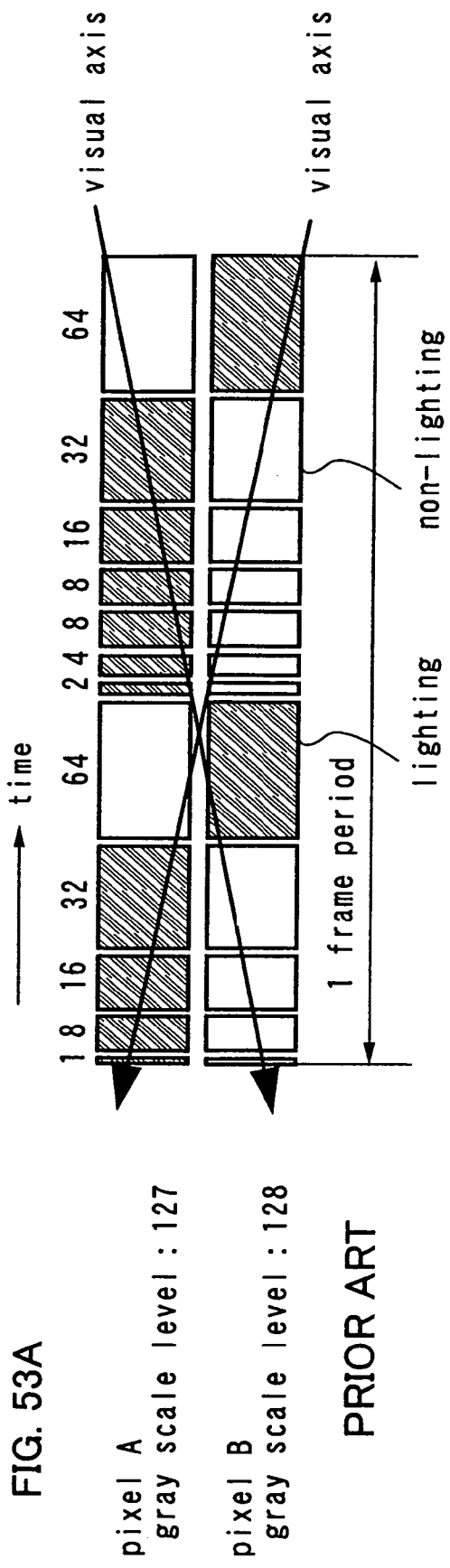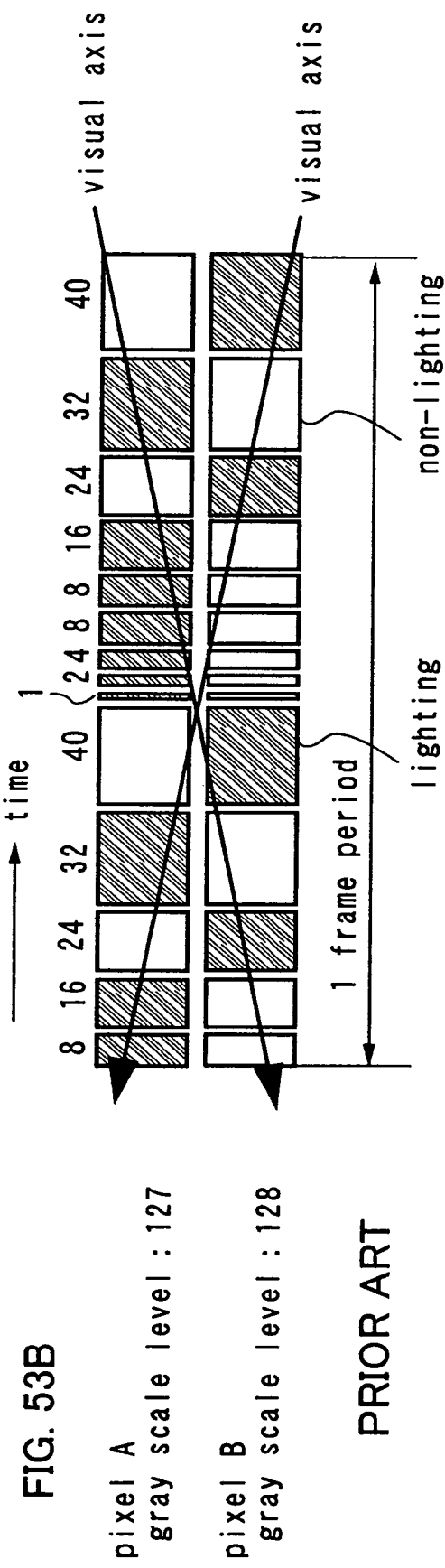

FIG. 54

| | SF1 | SF2 | SF3 | SF4 | SF5 | SF6 | SF7 | SF8 | SF9 | SF10 |
|---|---|---|---|---|---|---|---|---|---|---|
| | 2 | 4 | 1 | 4 | 4 | 2 | 4 | 4 | 2 | 4 |
| 0 | × | × | × | × | × | × | × | × | × | × |
| 1 | × | × | ○ | × | × | × | × | × | × | × |
| 2 | × | × | × | × | × | × | × | × | ○ | × |
| 3 | × | × | ○ | × | × | × | × | × | ○ | × |
| 4 | ○ | × | × | × | × | ○ | × | × | × | × |
| 5 | ○ | × | ○ | × | × | ○ | × | × | × | × |
| 6 | ○ | × | × | × | × | ○ | × | × | ○ | × |
| 7 | ○ | × | ○ | × | × | ○ | × | × | ○ | × |
| 8 | × | ○ | × | × | × | × | ○ | × | × | × |
| 9 | × | ○ | ○ | × | × | × | ○ | × | × | × |
| 10 | × | ○ | × | × | × | × | ○ | × | ○ | × |
| 11 | × | ○ | ○ | × | × | × | ○ | × | ○ | × |
| 12 | ○ | ○ | × | × | × | ○ | ○ | × | × | × |
| 13 | ○ | ○ | ○ | × | × | ○ | ○ | × | × | × |
| 14 | ○ | ○ | × | × | × | ○ | ○ | × | ○ | × |
| 15 | ○ | ○ | ○ | × | × | ○ | ○ | × | ○ | × |
| 16 | × | ○ | × | ○ | × | × | ○ | ○ | × | × |
| 17 | × | ○ | ○ | ○ | × | × | ○ | ○ | × | × |
| 18 | × | ○ | × | ○ | × | × | ○ | ○ | ○ | × |
| 19 | × | ○ | ○ | ○ | × | × | ○ | ○ | ○ | × |
| 20 | ○ | ○ | × | ○ | × | ○ | ○ | ○ | × | × |
| 21 | ○ | ○ | ○ | ○ | × | ○ | ○ | ○ | × | × |
| 22 | ○ | ○ | × | ○ | × | ○ | ○ | ○ | ○ | × |
| 23 | ○ | ○ | ○ | ○ | × | ○ | ○ | ○ | ○ | × |
| 24 | × | ○ | × | ○ | ○ | × | ○ | ○ | × | ○ |
| 25 | × | ○ | ○ | ○ | ○ | × | ○ | ○ | × | ○ |
| 26 | × | ○ | × | ○ | ○ | × | ○ | ○ | ○ | ○ |
| 27 | × | ○ | ○ | ○ | ○ | × | ○ | ○ | ○ | ○ |
| 28 | ○ | ○ | × | ○ | ○ | ○ | ○ | ○ | × | ○ |
| 29 | ○ | ○ | ○ | ○ | ○ | ○ | ○ | ○ | × | ○ |
| 30 | ○ | ○ | × | ○ | ○ | ○ | ○ | ○ | ○ | ○ |
| 31 | ○ | ○ | ○ | ○ | ○ | ○ | ○ | ○ | ○ | ○ |

○ : lighting

× : non-lighting

FIG. 55

|  | SF1 | SF2 | SF3 | SF4 | SF5 | SF6 | SF7 | SF8 | SF9 | SF10 |
|---|---|---|---|---|---|---|---|---|---|---|
|  | 1 | 2 | 4 | 3 | 5 | 2 | 2 | 4 | 3 | 5 |
| 0 | X | X | X | X | X | X | X | X | X | X |
| 1 | O | X | X | X | X | X | X | X | X | X |
| 2 | X | X | X | X | X | O | X | X | X | X |
| 3 | O | X | X | X | X | O | X | X | X | X |
| 4 | X | O | X | X | X | X | O | X | X | X |
| 5 | O | O | X | X | X | X | O | X | X | X |
| 6 | X | O | X | X | X | O | O | X | X | X |
| 7 | O | O | X | X | X | O | O | X | X | X |
| 8 | X | X | O | X | X | X | X | O | X | X |
| 9 | O | X | O | X | X | X | X | O | X | X |
| 10 | X | X | O | X | X | O | X | O | X | X |
| 11 | O | X | O | X | X | O | X | O | X | X |
| 12 | X | O | O | X | X | X | O | O | X | X |
| 13 | O | O | O | X | X | X | O | O | X | X |
| 14 | X | O | O | X | X | O | O | O | X | X |
| 15 | O | O | O | X | X | O | O | O | X | X |
| 16 | X | X | O | O | X | O | X | O | O | X |
| 17 | O | X | O | O | X | O | X | O | O | X |
| 18 | X | O | O | O | X | X | O | O | O | X |
| 19 | O | O | O | O | X | X | O | O | O | X |
| 20 | X | O | O | O | X | O | O | O | O | X |
| 21 | O | O | O | O | X | O | O | O | O | X |
| 22 | X | O | O | X | O | X | O | O | X | O |
| 23 | O | O | O | X | O | X | O | O | X | O |
| 24 | X | O | O | X | O | O | O | O | X | O |
| 25 | O | O | O | X | O | O | O | O | X | O |
| 26 | X | X | O | O | O | O | X | O | O | O |
| 27 | O | X | O | O | O | O | X | O | O | O |
| 28 | X | O | O | O | O | X | O | O | O | O |
| 29 | O | O | O | O | O | X | O | O | O | O |
| 30 | X | O | O | O | O | O | O | O | O | O |
| 31 | O | O | O | O | O | O | O | O | O | O |

O : lighting
X : non-lighting

FIG. 56

|    | SF1 | SF2 | SF3 | SF4 | SF5 | SF6 | SF7 | SF8 | SF9 | SF10 | SF11 | SF12 |
|----|-----|-----|-----|-----|-----|-----|-----|-----|-----|------|------|------|
|    | 1   | 2   | 4   | 8   | 10  | 12  | 2   | 2   | 4   | 8    | 10   | 12   |
| 0  | X | X | X | X | X | X | X | X | X | X | X | X |
| 1  | X | X | X | X | X | X | X | X | X | X | X | X |
| 2  | X | X | X | X | X | X | X | X | X | X | X | X |
| 3  | X | X | X | X | X | X | X | X | X | X | X | X |
| 4  | O | X | X | X | X | X | X | X | X | X | X | X |
| 5  | O | X | X | X | X | X | X | X | X | X | X | X |
| 6  | X | X | X | X | X | X | O | X | X | X | X | X |
| 7  | O | X | X | X | X | X | O | X | X | X | X | X |
| 8  | X | O | X | X | X | X | X | O | X | X | X | X |
| 9  | O | O | X | X | X | X | X | O | X | X | X | X |
| 10 | X | O | X | X | X | X | O | O | X | X | X | X |
| 11 | X | X | O | X | X | X | X | X | O | X | X | X |
| 12 | O | X | O | X | X | X | X | X | O | X | X | X |
| 13 | X | X | O | X | X | X | O | X | O | X | X | X |
| 14 | O | X | O | X | X | X | O | O | O | X | X | X |
| 15 | X | O | O | X | X | X | X | O | O | X | X | X |
| 16 | X | O | O | X | X | X | O | O | O | X | X | X |
| 17 | X | X | X | O | X | X | X | X | X | O | X | X |
| 18 | X | X | X | O | X | X | O | X | X | O | X | X |
| 19 | O | O | X | O | X | X | X | O | X | O | X | X |
| 20 | X | X | O | O | X | X | X | X | O | O | X | X |
| 21 | O | X | O | O | X | X | O | X | O | O | X | X |
| 22 | O | O | O | O | X | X | O | O | O | O | X | X |
| 23 | X | X | X | O | O | X | X | X | X | O | O | X |
| 24 | O | X | X | O | O | X | O | X | X | O | O | X |
| 25 | X | X | O | O | O | X | X | X | O | O | O | X |
| 26 | X | O | O | O | O | X | X | O | O | O | O | X |
| 27 | O | O | O | O | X | X | O | O | O | O | O | X |
| 28 | X | X | X | O | O | O | X | X | O | O | O | O |
| 29 | O | O | O | O | O | O | X | X | O | O | O | O |
| 30 | X | X | O | O | O | O | O | X | O | O | O | O |
| 31 | O | O | O | O | O | O | O | O | O | O | O | O |

O : lighting

X : non-lighting

FIG. 63
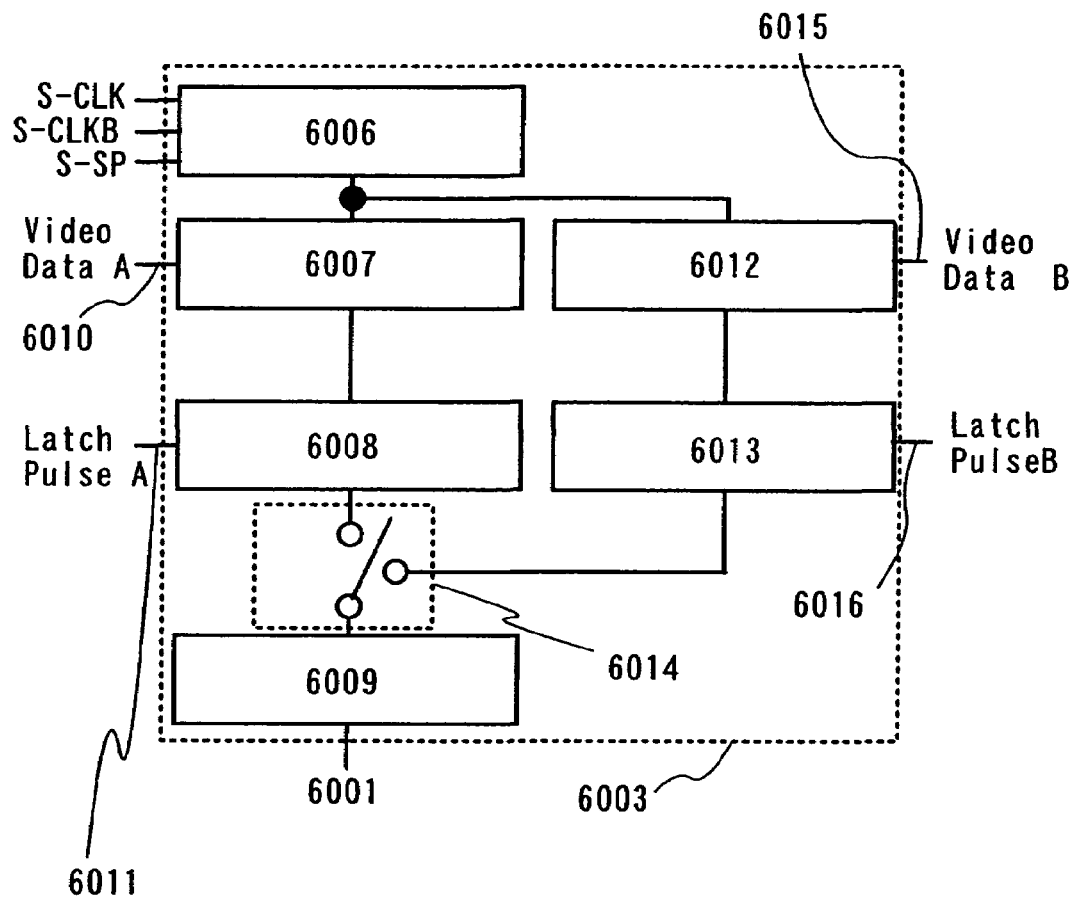
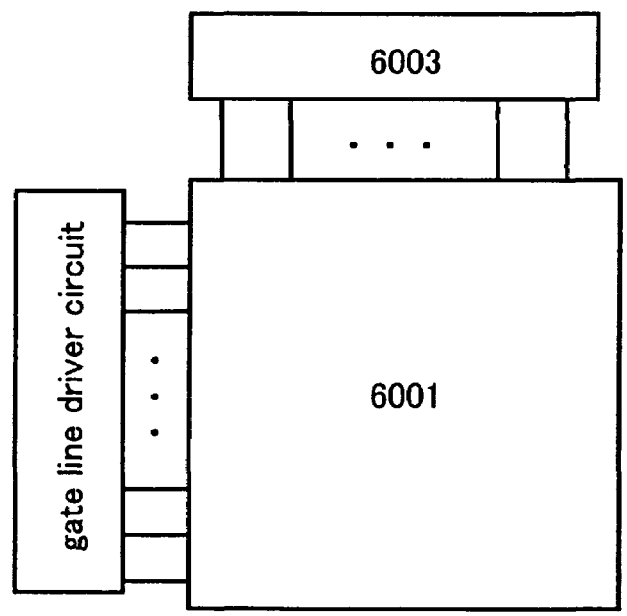

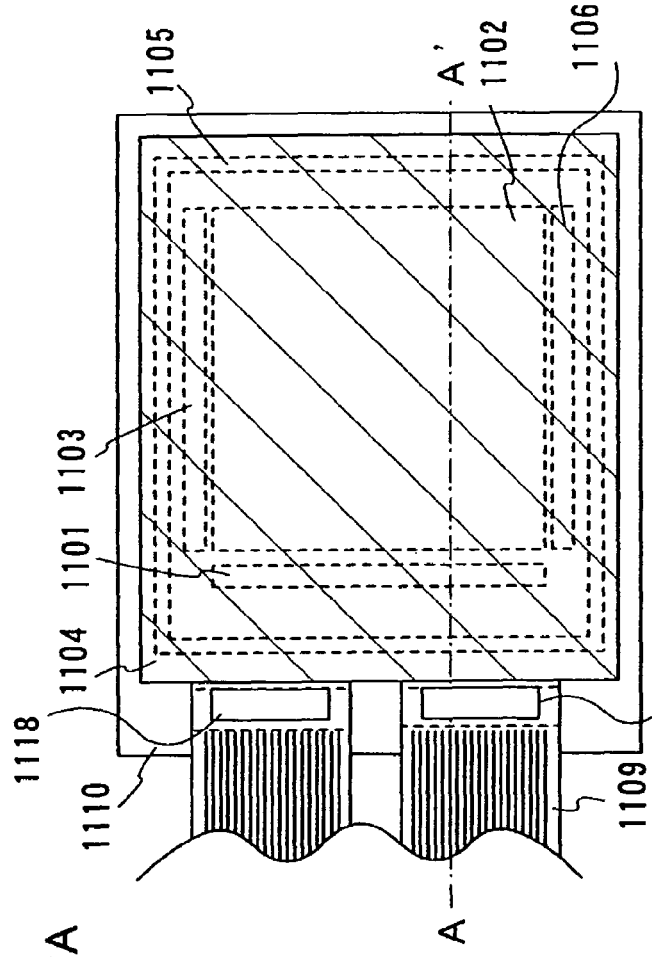
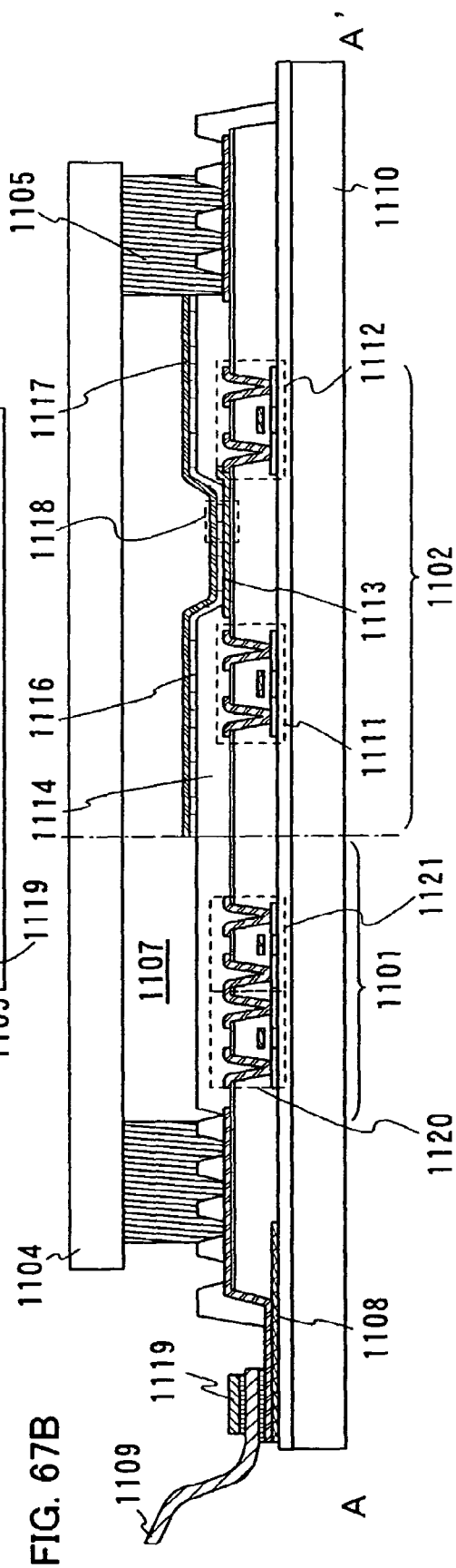
FIG. 67A
FIG. 67B

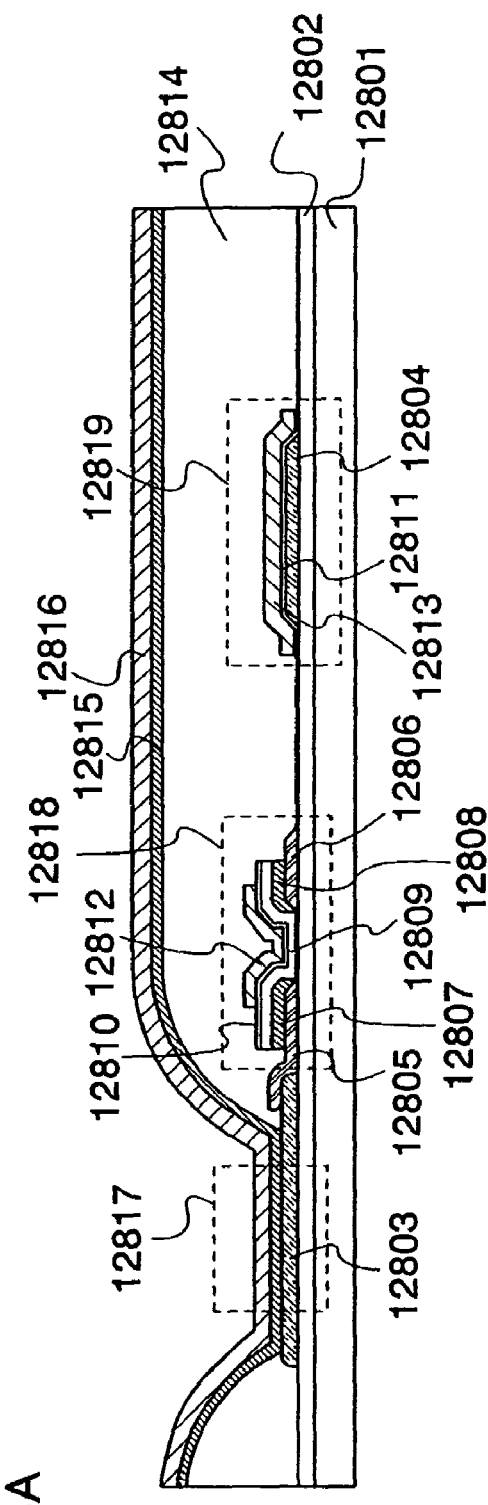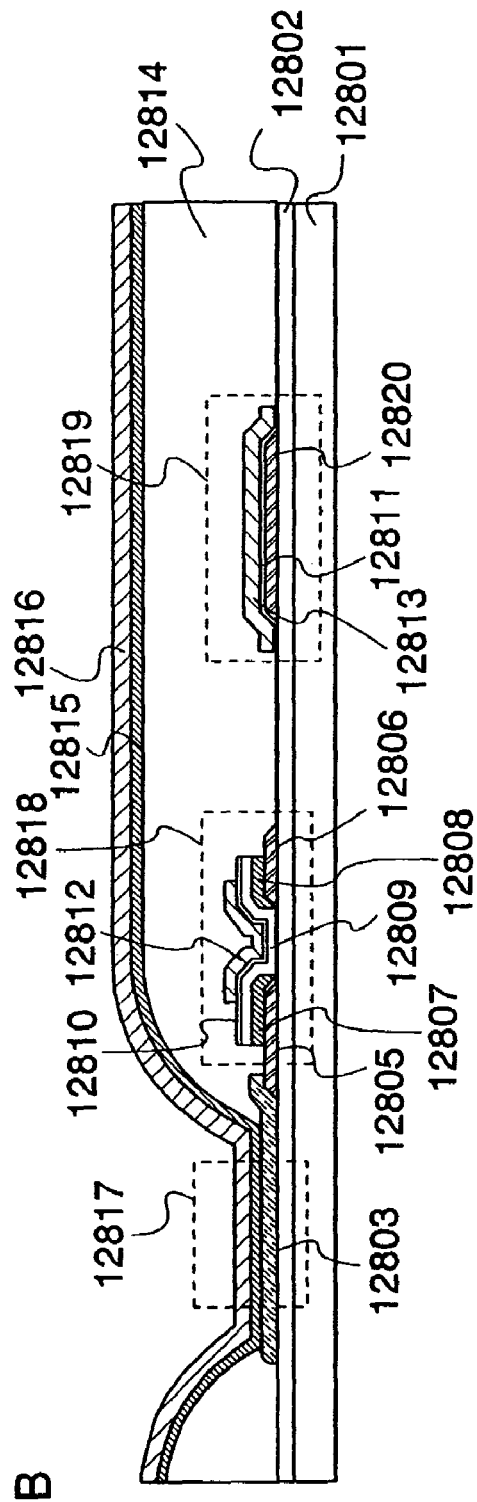
FIG. 74A
FIG. 74B

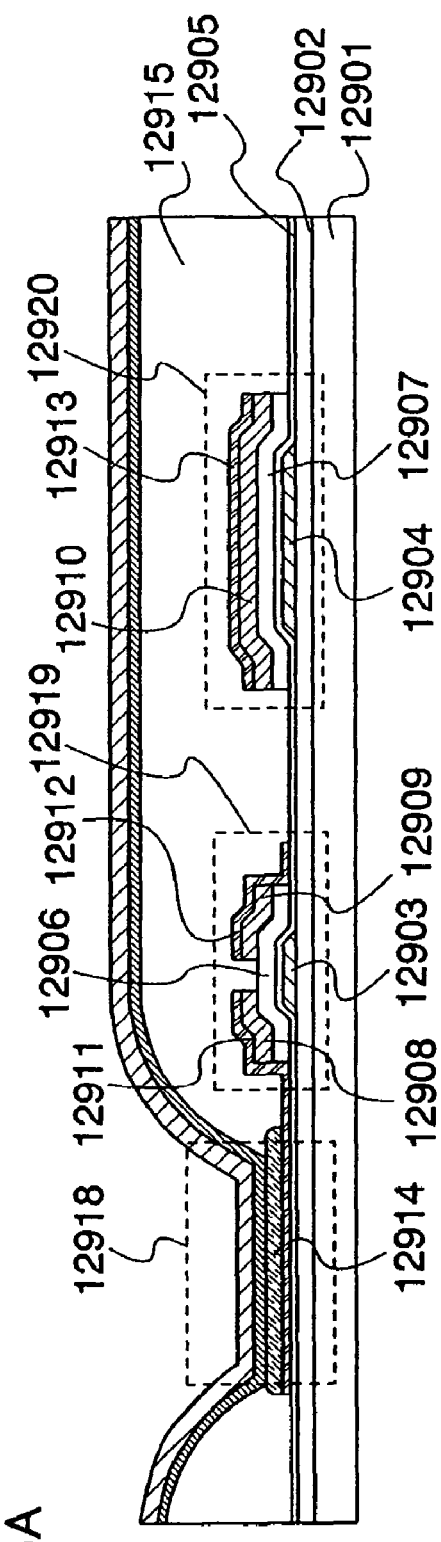
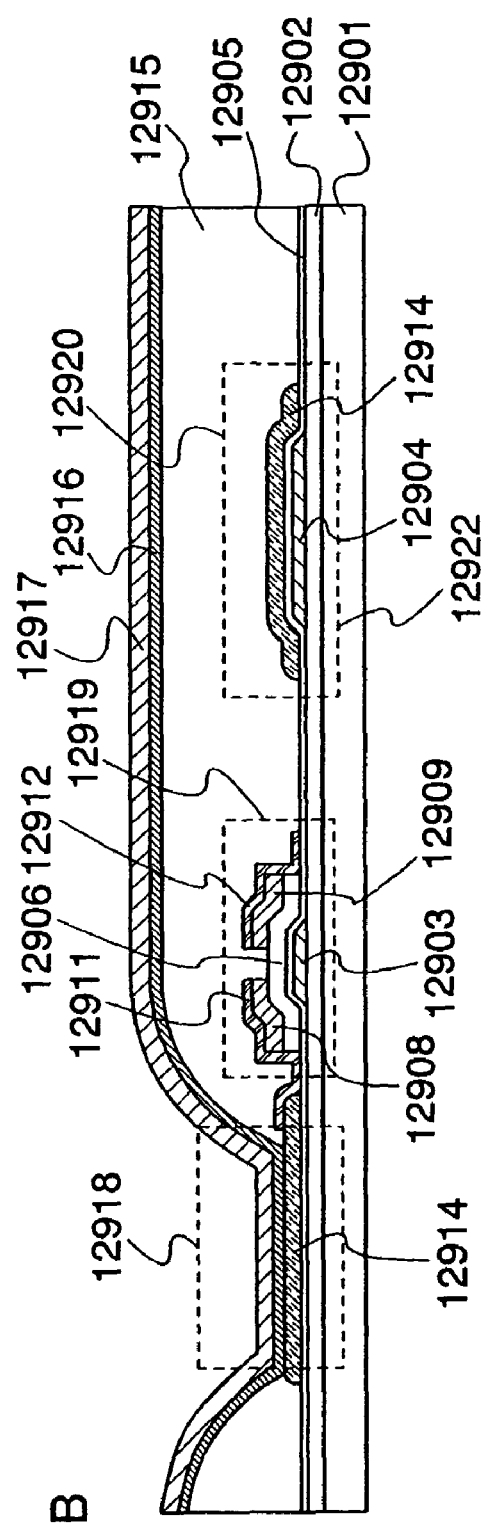

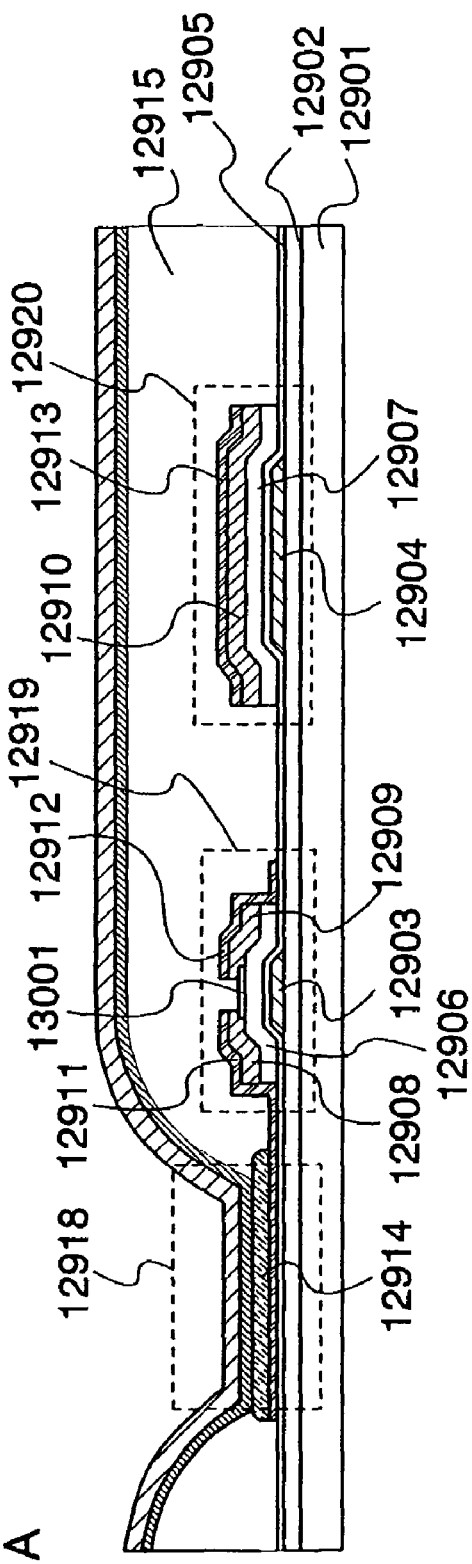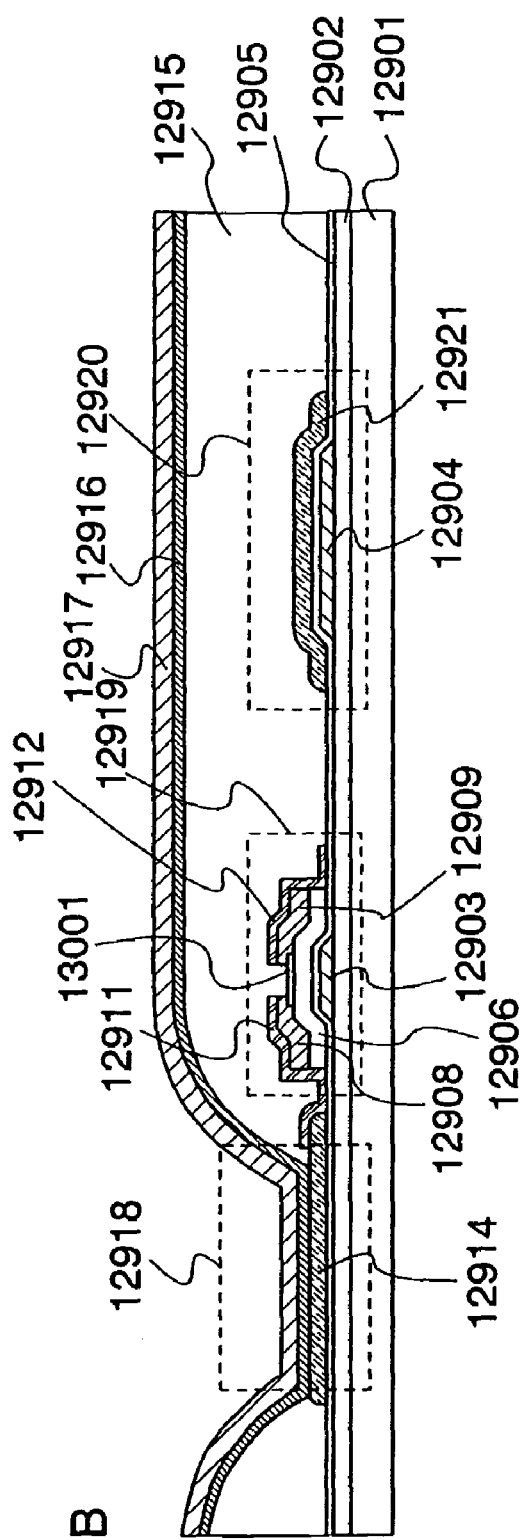
FIG. 76A
FIG. 76B

DISPLAY DEVICE, AND DRIVING METHOD AND ELECTRONIC APPARATUS OF THE DISPLAY DEVICE

BACKGROUND OF THE INVENTION

1. Field of the Invention

The present invention relates to a display device and a driving method thereof. In particular, the invention relates to a display device using a time gray scale method.

2. Description of the Related Art

In recent years, a so-called self-luminous display device is attracting attention, which has pixels each formed with a light-emitting element such as a light-emitting diode (LED). As a light-emitting element used in such a self-luminous display device, there is an organic light-emitting diode (also called an OLED (Organic Light-Emitting Diode), an organic EL element, an electroluminescence (EL) element, or the like), which has been attracting attention and used for an EL display or the like. Since the light-emitting element such as an OLED is a self-luminous type, it is advantageous as compared to a liquid crystal display in that high visibility of pixels is ensured, no backlight is required, high response speed is achieved, and the like. The luminance of a light-emitting element is controlled by the amount of current flowing therein.

As a method of controlling gray scales (luminance) in such a display device, there are a digital gray scale method and an analog gray scale method. In the digital gray scale method, gray scales are expressed by controlling on/off of a light-emitting element in a digital manner. On the other hand, as for the analog gray scale method, there are a method of controlling the light-emission intensity of a light-emitting element in an analog manner, and a method of controlling the light-emission time of a light-emitting element in an analog manner.

In the digital gray scale method, only two states of a light-emitting element can be selected, which are a lighting state and a non-lighting state; therefore, only two gray scales can be expressed. Thus, the digital gray scale method is used in combination with another method to achieve multi-gray scale display. As a method for achieving multi-gray scales, a time gray scale method is often used in combination.

As examples of a display where gray scales are expressed by digitally controlling a lighting state of pixels in combination with the time gray scale method, there are an EL display using a digital gray scale method, a plasma display, and the like.

The time gray scale method is a method of expressing gray scales by controlling the length of a lighting period or the number of lighting operations. That is, one frame is divided into a plurality of subframes, and each subframe is weighted in the number of lighting operations, the length of lighting periods, or the like, so that the total weight (the sum of the lighting operations or the sum of the lighting periods) is varied between different gray scales, thereby expressing gray scales. It is known that display defects called pseudo contours (or false contours) occur when using such a time gray scale method. Thus, countermeasures against such display defects have been examined (see Patent Document 1).

Pseudo contours can be reduced by increasing the frame frequency. As one of the methods, there is a method by which the length of a subframe is reduced to half so that the number of subframes in one frame can be doubled. This is substantially synonymous with doubling the frame frequency (see Patent Document 2). Such a method is called a double-speed frame method in this specification.

Here, considered is a case of displaying 5-bit gray scales (32 gray scales). First, FIG. 46 shows a selection method of subframes with a conventional time gray scale method, which specifically shows whether pixels are lighted or not in each subframe for expressing each gray scale. In FIG. 46, one frame is divided into five subframes (SF1 to SF5), which respectively have lighting periods with the following length: SF1=1, SF2=2, SF3=4, SF4=8, and SF5=16. That is, each lighting period has a squared length of a lighting period in the previous subframe. Note that a gray-scale level of 1 corresponds to a lighting period as long as 1. By combining these lighting periods, display with 32 gray scales (5-bit gray scales) can be performed.

Here, description is made on how to see FIG. 46. Pixels are lighted in subframes indicated by ○ marks whereas pixels are not lighted in subframes indicated by x marks. By selecting subframes for lighting pixels for each gray scale, gray scales can be expressed. For example, in order to express a gray-scale level of 0, pixels are not lighted in SF1 to SF 5. In order to express a gray-scale level of 1, pixels are not lighted in SF2 to SF 5 whereas they are lighted in SF1. In order to express a gray-scale level of 7, pixels are not lighted in SF4 and SF5 whereas they are lighted in SF1 to SF3.

Next, FIG. 47 shows an example where a double-speed frame method is applied to the method in FIG. 46. By equally dividing each subframe in FIG. 46 into two, 10 subframes (SF1 to SF10) are obtained, which respectively have lighting periods with the following length: SF1=0.5, SF2=1, SF3=2, SF4=4, SF5=8, SF6=0.5, SF7=1, SF8=2, SF9=4, and SF10=8. Accordingly, the frame frequency is substantially doubled.

Furthermore, the same principle can be applied to the case of displaying 6-bit gray scales (64 gray scales). FIG. 49 shows an example where a double-speed frame method is applied to a subframe structure as shown in FIG. 48 where 6-bit gray scales are expressed by a time gray scale method. By equally dividing each subframe in FIG. 48 into two, 12 subframes (SF1 to SF12) are obtained, which respectively have lighting periods with the following length: SF1=0.5, SF2=1, SF3=2, SF4=4, SF5=8, SF6=16, SF7=0.5, SF8=1, SF9=2, SF10=4, SF11=8, and SF12=16. Note that a gray-scale level of 1 corresponds to a lighting period as long as 1. As in the case of displaying 5-bit gray scales, gray scales are expressed by selecting subframes for lighting pixels.

By equally dividing each subframe into two in this manner, the frame frequency can be substantially doubled.

In addition, as another method of increasing the frame frequency, there is a method disclosed in Patent Document 3.

Patent Document 3 discloses a case of displaying 8-bit gray scales (256 gray scales) as shown in FIGS. 1 and 4. FIGS. 50A and 50B illustrate a method of selecting subframes in this case. In order to display 8-bit gray scales with the conventional time gray scale method, one frame is divided into eight subframes, and a lighting period in each subframe is set to have a squared length of a lighting period in the previous subframe, such that 1, 2, 4, 8, 16, 32, 64, and 128. On the other hand, FIG. 4 according to Patent Document 3 shows an example where only four subframes (selected in decreasing order of lighting periods) are divided among the eight subframes. FIG. 50A shows a method of selecting subframes in this case.

FIG. 1 according to Patent Document 3 shows an example where 256 gray scales are expressed not by setting a lighting period in each subframe to have a squared length of a lighting period in the previous subframe, but by using such an arithmetical sequence that a difference between adjacent bits is 16 among 5 high-order bits such that 1, 2, 4, 8, 16, 32, 48, 64, and 80. Thus, only five subframes (selected in decreasing order of lighting periods) are divided. FIG. 50B shows a method of selecting subframes in this case.

By using such methods, the frame frequency can be substantially increased.

[Patent Document 1] Japanese Patent No. 2903984
[Patent Document 2] Japanese Patent Laid-Open No. 2004-151162
[Patent Document 3] Japanese Patent Laid-Open No. 2001-42818

However, even in using the double-speed frame method, pseudo contours are caused depending on which of the subframes are selected for lighting pixels (i.e., if selected subframes are very different between adjacent gray scales).

First, considered is a case of displaying 5-bit gray scales. For example, with the subframes shown in FIG. 47, a gray-scale level of 15 is expressed in a pixel A while a gray-scale level of 16 is expressed in the adjacent pixel B. FIGS. 51A and 51B show the lighting/non-lighting states of the pixels in each subframe in this case. FIG. 51A shows a case where only the pixel A or only the pixel B is seen by a human with his/her eyes being fixed. In this case, pseudo contours do not occur because human eyes can perceive brightness by the total amount of brightness that his/her visual axis catches. Thus, human eyes perceive that the gray-scale level is 15 (=4+2+1+ 0.5+4+2+1+0.5) in the pixel A, while the gray-scale level is 16 (=8+) in the pixel B. That is, an accurate gray-scale level can be perceived by human eyes.

On the other hand, FIG. 51B shows a case where the visual axis moves from the pixel A to the pixel B or from the pixel B to the pixel A. In this case, depending on the movement of the visual axis, the human eyes perceive that the gray-scale level is 15.5 (=4+2+1+0.5+8) or 23.5 (=8+8+4+2+1+0.5) sometimes. Although it is originally supposed that the gray-scale levels are perceived as 15 and 16, the gray-scale levels are actually perceived as 15.5 or 23.5, thereby pseudo contours occur.

Next, FIG. 52 shows an example of displaying 6-bit gray scales (64 gray scales). For example, assuming that a gray-scale level of 31 is expressed in a pixel A while a gray-scale level of 32 is expressed in the adjacent pixel B, human eyes perceive that the gray-scale level is 31.5 (=8+4++21+0.5+16) or 47.5 (=16+16+8+4+2+1+0.5) sometimes, depending on the movement of the visual axis as in the case of a 5-bit gray scale display. Although it is originally supposed that the gray-scale levels are perceived as 31 and 32, the gray-scale levels are actually perceived as 31.5 or 47.5, thereby pseudo contours occur.

Furthermore, FIG. 53A shows the case of FIG. 50A, and FIG. 53B shows the case of FIG. 50B. For example, assuming that a gray-scale level of 127 is expressed in a pixel A, while a gray-scale level of 128 is expressed in the adjacent pixel B, the gray-scale levels are perceived as being different from what they are supposed to be, depending on the movement of the visual axis, similarly to the examples described heretofore. For example, in the case of FIG. 53A, human eyes perceive that the gray-scale level is 121 (=64+32+16+8+1) or 134 (=32+16+8+8+4+2+64) sometimes. In the case of FIG. 53B, human eyes perceive that the gray-scale level is 120 (=40+24+32+16+8) or 134 (=32+16+8+8+4+2+40+24) sometimes. In either case, although it is originally supposed that the gray-scale levels are perceived as 127 and 128, the gray-scale levels are actually perceived as being different from what they are supposed to be, thereby pseudo contours occur.

In addition, when using the double-speed frame method, the number of subframes is increased; therefore, the duty ratio (ratio of lighting periods to one frame) is decreased accordingly. Thus, in order to keep the same average luminance as in the case of not using the double-speed frame method, a voltage applied to a light emitting-element is required to be increased, which results in the increased power consumption, lower reliability of the light-emitting element, and the like.

SUMMARY OF THE INVENTION

In view of the foregoing problems, it is an object of the invention to provide a display device and a driving method thereof, which is capable of reducing pseudo contours with a small number of subframes.

In order to solve the foregoing problems, the invention provides a driving method as follows.

One aspect of the invention is to provide a driving method of a display device for expressing gray scales by dividing one frame into a plurality of subframes, which includes the steps of, in the case of expressing gray scales with n bits (n is an integer): classifying bits which represent the binary digits of gray scales into three kinds of bit groups, that is, a first bit group, a second bit group, and a third bit group; dividing the one frame into two subframe groups; dividing a (a is an integer, where 0<a<n) subframes corresponding to the bits belonging to the first bit group into three or more, so as to arrange the divided subframes in the two subframe groups in roughly equal ratio; dividing b (b is an integer, where 0<b<n) subframes corresponding to the bits belonging to the second bit group into two, so as to arrange the divided subframes in the respective subframe groups one by one; and arranging c (c is an integer, where 0=c<n, and a+b+c=n) subframes corresponding to the bits belonging to the third bit group in at least one of the two subframe groups in one frame. The arranging order of a plurality of subframes corresponding to the bits belonging to the first bit group, and the arranging order of a plurality of subframes corresponding to the bits belonging to the second bit group are about equal between the two subframe groups in one frame. In a part or all of the plurality of subframes corresponding to the bits belonging to the first bit group and the plurality of subframes corresponding to the bits belonging to the second bit group, gray scales are expressed by sequentially adding weighted lighting periods, in each of the two subframe groups in one frame. "Roughly equal ratio" means such a case that, on the assumption that subframes are divided into x so as to be arranged in the respective subframe groups in a ratio of y to z (z=x−y:y>z), the ratio of z to y (i.e., z/y) is 0.5 or more. That is, when a certain subframe is divided into three, the divided subframes may be arranged in the respective subframe groups in a ratio of 1:2. Needless to say, the ratio may be completely equal within the range of 1=z/y=0.5. Preferably, the ratio is within the range of 1=z/y=0.65, or more preferably, 1=z/y=0.8.

One aspect of the invention is to provide a driving method of a display device for expressing gray scales by dividing one frame into a plurality of subframes, which includes the steps of, in the case of expressing gray scales with n bits (n is an integer): classifying bits which represent the binary digits of gray scales into three kinds of bit groups, that is, a first bit group, a second bit group, and a third bit group; dividing the one frame into k (k is an integer, where k=3) subframe groups; dividing a (a is an integer, where 0<a<n) subframes corresponding to the bits belonging to the first bit group into (k+1) or more, so as to arrange the divided subframes in the k subframe groups in roughly equal ratio; dividing b (b is an integer, where 0<b<n) subframes corresponding to the bits belonging to the second bit group into k, so as to arrange the divided subframes in the respective subframe groups one by one; and dividing c (c is an integer, where 0≦c<n, and a+b+c=n) subframes corresponding to the bits belonging to the third bit group into (k−1) or less or not dividing, and arranging the divided or undivided subframes in at least one of the k subframe groups in one frame. The arranging order of a plurality of subframes corresponding to the bits belonging to the first bit group, and the arranging order of a plurality of subframes corresponding to the bits belonging to the second bit group are about equal between the k subframe groups in one frame. In a part or all of the plurality of subframes corresponding to the bits belonging to the first bit group and the plurality of subframes corresponding to the bits belonging to the second bit group, gray scales are expressed by sequentially adding weighted lighting periods, in each of the k subframe groups in one frame. "Roughly equal ratio" means such a case that, on the assumption that subframes are divided and arranged in the respective subframe groups with a maximum number of y and a minimum number of Z, the ratio of z to y (i.e., z/y) is 0.5 or more. That is, when a certain subframe is divided into four and arranged in three subframe groups, the four subframes may be arranged in the respective subframe groups in a ratio of 1:2:2 (i.e., z=1 and y=2). Needless to say, the ratio may be completely equal within the range of $1=z/y=0.5$. Preferably, the ratio is within the range of $1=z/y=0.65$, or more preferably, $1=z/y=0.8$.

Here, a subframe group means a group including a plurality of subframes. Note that when one frame is divided into a plurality of subframe groups, the number of subframes which constitute each subframe group is not limited; however, each subframe group preferably has about an equal number of subframes. In addition, the length of lighting periods in each subframe group is not limited; however, the length of lighting periods is preferably about equal between each subframe group.

In addition, in this specification, bits which represent the binary digits of gray scales are classified into three kinds of bit groups, that is, a first bit group, a second bit group, and a third bit group. These three kinds of bit groups are classified depending on the division number of subframes corresponding to each bit of the gray scales. That is, it is defined here that the first bit group is a group having bits (subframes corresponding to the bits indicative of gray scales) which are divided into a larger number than the number of the subframe groups; the second bit group is a group having bits (subframes corresponding to the bits indicative of gray scales) which are divided into an equal number to the number of the subframe groups; and the third bit group is a group having bits (subframes corresponding to the bits indicative of gray scales) which are divided into a less number than the number of the subframe groups. Therefore, it is not always true that that a high-order bit (large-weighted bit) belongs to the first bit group, a middle-order bit (middle-weighted bit) belongs to the second bit group, and a low-order bit (small-weighted bit) belongs to the third bit group. For example, even a high-order bit may belong to the second bit group if a subframe corresponding to the bit is divided into an equal number to the total number of subframe groups whereas it may belong to the third bit group if a subframe corresponding to the bit is divided into a smaller number than the total number of the subframe groups. Similarly, even a low-order bit may belong to the first bit group if a subframe corresponding to the bit is divided into a larger number than the total number of the subframe groups whereas it may belong to the second bit group if a subframe corresponding to the bit is divided into an equal number to the total number of the subframe groups.

Note that "to divide a subframe" means to divide the length of a lighting period in the subframe.

In addition, when it is said that "the arranging order of a plurality of subframes corresponding to the bits belonging to the first bit group, and the arranging order of a plurality of subframes corresponding to the bits belonging to the second bit group are about equal between each subframe group", it means not only a case a case where the arranging order of the subframes is completely equal, but there is also a case where subframes corresponding to the bits belonging to the third bit group are interposed between the plurality of subframes corresponding to the bits belonging to the first bit group and the plurality of subframes corresponding to the bits belonging to the second bit group.

Note also that in the invention, gray scales are expressed by sequentially adding lighting periods (or the number of lighting operations in a predetermined time) in a part or all of the subframes corresponding to the bits belonging to the first bit group and the second bit group, in each of the subframe groups. That is, the number of subframes selected for lighting pixels is increased in accordance with the increased gray scales. Therefore, a subframe which is selected for lighting pixels in order to express a low gray scale is continuously selected to express higher gray scales than that. Such a gray scale expression method is called an overlapped time gray scale method in this specification. Note that the overlapped time gray scale method is applied to subframes having an equal length of lighting periods among the subframes corresponding to the bits belonging to the first bit group and the second bit group, in each subframe group. However, the invention is not limited to this.

Note also that various kinds of transistors can be used as the transistor of the invention. Therefore, transistors applicable to the invention are not limited to a certain type. Thus, the invention may employ a thin film transistor (TFT) using a non-single crystalline semiconductor film typified by amorphous silicon or polycrystalline silicon, a MOS transistor formed with a semiconductor substrate or an SOI substrate, a junction transistor, a bipolar transistor, a transistor formed with a compound semiconductor such as ZnO or a-InGaZnO, a transistor formed with an organic semiconductor or a carbon nanotube, or other transistors. In addition, a substrate over which transistors are formed is not limited to a certain type, and various kinds of substrates can be used. Accordingly, transistors can be formed over a single crystalline substrate, an SOI substrate, a glass substrate, a plastic substrate, a paper substrate, a cellophane substrate, a quartz substrate, or the like. Alternatively, after forming transistors over a substrate, the transistors may be transposed onto another substrate.

In the invention, connection means/includes electrical connection. Therefore, in the disclosed structure of the invention, other elements (e.g., switch, transistor, capacitor, inductor, resistor, diode, or the like) may be interposed between a predetermined connection as long as it enables electrical connection.

In the invention, a semiconductor device means a device having a circuit including semiconductor elements (e.g., transistor, diode, and the like). Further, a semiconductor device includes all devices which can function by utilizing the semiconductor characteristics. In addition, a display device means a device having display elements (e.g., liquid crystal elements, light-emitting elements, or the like). Further, the display device also includes a display panel where a plurality of pixels each including a liquid crystal element or an EL element are formed together with a peripheral driver circuit for driving the pixels. Further, such a display panel may have a flexible printed circuit (FPC) or a printed wiring board (PWB) connected thereto. In addition, a light-emitting device means a display device having self-luminous display elements such as EL elements or elements used for an FED. A liquid crystal display device means a display device having liquid crystal elements.

Note that it is difficult to distinguish a source and drain of a transistor because of its structure. Further, potential levels of the source and drain may be reversed depending on the operation of a circuit. Accordingly, in this specification, a source and drain are not specifically distinguished, and they are just described as a first electrode and a second electrode. For example, if the first electrode is a source, the second electrode is a drain, and vice versa, when the first electrode is a drain, the second electrode is a source.

The invention enables a reduction of pseudo contours. Therefore, display quality can be improved to provide a clear image. In addition, the duty ratio is improved as compared to the case of using the conventional double-speed frame method, which results in a suppressed voltage applied to a light-emitting element. Thus, power consumption can be reduced and degradation of the light-emitting element can be suppressed.

BRIEF DESCRIPTION OF DRAWINGS

In the accompanying drawing,

FIG. 3 shows an exemplary selection method of subframes by the driving method of the invention;

FIG. 4 shows an exemplary selection method of subframes by the driving method of the invention;

FIGS. 5A and 5B show the reason by which pseudo contours are reduced with the driving method of the invention;

FIG. 6 shows an exemplary selection method of subframes by the driving method of the invention;

FIG. 7 shows an exemplary selection method of subframes by the driving method of the invention;

FIG. 8 shows an exemplary selection method of subframes by the driving method of the invention;

FIG. 9 shows an exemplary selection method of subframes by the driving method of the invention;

FIG. 11 shows an exemplary selection method of subframes by the driving method of the invention;

FIG. 12 shows an exemplary selection method of subframes by the driving method of the invention;

FIG. 13 shows an exemplary selection method of subframes by the driving method of the invention;

FIG. 14 shows an exemplary selection method of subframes by the driving method of the invention;

FIG. 15 shows an exemplary selection method of subframes by the driving method of the invention;

FIG. 16 shows an exemplary selection method of subframes by the driving method of the invention;

FIG. 17 shows an exemplary selection method of subframes by the driving method of the invention;

FIG. 18 shows an exemplary selection method of subframes in the case where gamma correction is performed by the driving method of the invention;

FIG. 20 shows an exemplary selection method of subframes in the case where gamma correction is performed by the driving method of the invention;

FIGS. 22A and 22B show the reason by which pseudo contours are reduced with the driving method of the invention;

FIG. 24 shows the exemplary arranging order of subframes in the driving method of the invention;

FIGS. 42A and 42B show exemplary display panels each using the driving method of the invention;

FIG. 46 shows a selection method of subframes by a conventional time gray scale method;

FIG. 47 shows an exemplary selection method of subframes by a conventional double-speed frame method;

FIG. 48 shows a selection method of subframes by a conventional time gray scale method;

FIG. 49 shows an exemplary selection method of subframes by a conventional double-speed frame method;

FIGS. 51A and 51B show the reason by which pseudo contours are caused when using a conventional double-speed frame method;

FIGS. 53A and 53B show the reason by which pseudo contours caused when using a conventional double-speed frame method;

FIG. 54 shows an exemplary selection method of subframes by the driving method of the invention;

FIG. 55 shows an exemplary selection method of subframes by the driving method of the invention;

FIG. 56 shows an exemplary selection method of subframes in the case where gamma correction is performed by the driving method of the invention;

FIG. 63 shows an exemplary signal line driver circuit having a plurality of latch circuits;

FIGS. 67A and 67B illustrate a display panel having the pixel structure of the invention;

FIGS. 74A and 74B show partial cross sections of a display panel;

FIGS. 75A and 75B show partial cross sections of a display panel; and

FIGS. 76A and 76B show partial cross sections of a display panel.

DETAILED DESCRIPTION OF THE INVENTION

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein.

Embodiment Mode 1

In this embodiment mode, description is made on an example where the driving method of the invention is applied to a case of displaying 5-bit gray scales (32 gray scales) and a case of displaying 6-bit gray scales (64 gray scales).

In the driving method of this embodiment mode, a conventional time gray scale method is used, and a subframe corresponding to bits belonging to a first bit group is divided into four, a subframe corresponding to bits belonging to a second bit group are divided into two, and a subframe corresponding to bits belonging to a third bit group is not divided. One frame is divided into a first subframe group and a second subframe group, and the four divided bits belonging to the first bit group are arranged in the respective subframe groups two by two. In addition, the two divided bits belonging to the second bit group are arranged in the respective subframes one by one, while the bits belonging to the third group are arranged in either one or both of the two subframe groups. At this time, the arranging order of the subframes corresponding to the bits belonging to the first bit group and the second bit group is set roughly equal between each subframe group. Note that the bits belonging to the third bit group may be considered that they are not divided or they are once divided into two but then integrated into one subframe again. Note that the overlapped time gray scale method may be applied to subframes having an equal length of lighting periods in each subframe group, among the subframes corresponding to the bits belonging to the first bit group and the second bit group. That is, the number of subframes selected for lighting pixels is increased in accordance with the increased gray scales.

Figure 1:
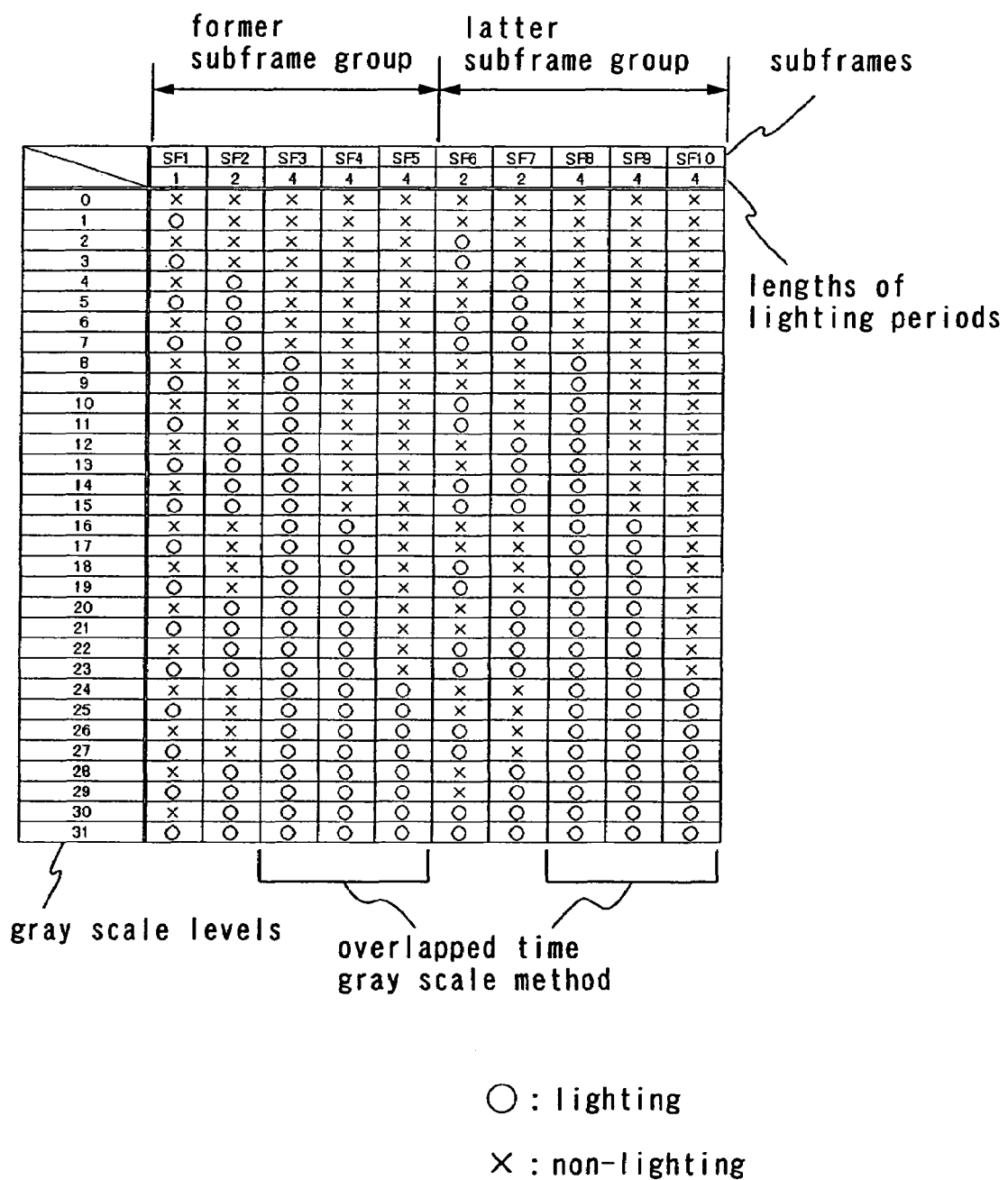
FIG. 1 shows an exemplary selection method of subframes by the driving method of the invention.

First, considered is a case of displaying 5-bit gray scales (32 gray scales). First, description is made on a selection method of subframes for expressing each gray scale, that is, whether pixels are lighted or not in order to express each gray scale in each subframe. FIG. 1 shows an exemplary selection method of subframes in accordance with the invention in the case of expressing 5-bit gray scales. Referring concurrently to the conventional time gray scale method (FIG. 46), FIG. 1 shows an example where one bit is assigned to a first bit group, two bits are assigned to a second bit group, and two bits are assigned to a third bit group. That is, SF5 is assigned to the bit belonging to the first bit group, SF3 and SF4 are assigned to the bits belonging to the second bit group, and SF1 and SF2 are assigned to the bits belonging to the third bit group. Then, SF5 is equally divided into four, SF3 and SF4 are equally divided into two respectively, and SF1 and SF2 are not divided. Next, the four divided bits belonging to the first bit group are arranged in the two subframe groups two by two, the two divided bits belonging to the second bit group are arranged in the respective subframe groups one by one, and the bits belonging to the third bit group are arranged in the respective subframe groups. That is, the bits belonging to the first bit group are arranged in SF4, SF5, SF9, and SF10 in FIG. 1, the bits belonging to the second bit group are arranged in SF2, SF3, SF7, and SF8 in FIG. 1, and the bits belonging to the third bit group are arranged in SF1 and SF6 in FIG. 1. As a result, a total of 10 subframes are obtained, which respectively have lighting periods with the following length: SF1=1, SF2=2, SF3=4, SF4=4, SF5=4, SF6=2, SF7=2, SF8=4, SF9=4, and SF10=4. Since the length of each lighting period in SF3 to SF5 and SF8 to SF10 is all 4 in FIG. 1, the overlapped time gray scale method may be applied to each of SF3 to SF5 and SF8 to SF10.

By dividing each subframe in this manner, the number of subframes can be kept the same as that of a conventional double-speed frame method. Accordingly, the frame frequency can be kept the same as that of the conventional double-speed frame method, which means the frame frequency can be substantially doubled.

Next, description is made on an exemplary method of expressing gray scales, that is, a selection method of each subframe. In particular, it is desirable that subframes having an equal length of lighting periods be selected in accordance with the following regularity.

First, description is made on an example of subframes to which the overlapped time gray scale method is applied. As for the SF3 to SF5 arranged in the first subframe group and the SF8 to SF10 arranged in the second subframe group, SF3 and SF8, SF4 and SF9, and SF5 and SF10 are respectively selected at the same time for lighting pixels, so that the number of subframes selected for lighting pixels is increased in accordance with the increased gray scales. That is, in the first subframe group, SF3, SF4, and SF5 are sequentially selected for lighting pixels in accordance with the increased gray scales. Similarly, in the second subframe group, SF8, SF9, and SF10 are sequentially selected for lighting pixels in accordance with the increased gray scales. Therefore, subframes corresponding to the same bit (SF3 and SF8, SF4 and SF9, and SF5 and SF10) are selected at the same time for lighting pixels. Thus, SF3 and SF8 are constantly selected for lighting pixels in order to express a gray-scale level of 8 or higher, SF4 and SF9 are constantly selected for lighting pixels in order to express a gray-scale level of 16 or higher, and SF5 and SF10 are constantly selected for lighting pixels in order to express a gray-scale level of 24 or higher. Therefore, a subframe which is selected for lighting pixels in order to express a low gray scale is continuously selected at higher gray scales than that.

Next, description is made on subframes to which the overlapped time gray scale method is not applied. As for the SF1, SF2, SF6, and SF7 to which the overlapped time gray scale method is not applied, gray scales are expressed by selecting each subframe for lighting pixels or not. Noted that among SF2, SF6, and SF7 each having a lighting period as long as 2, SF2 and SF7 are selected for lighting pixels at the same time. This is because SF2 and SF7 are formed by dividing a subframe, which originally has a lighting period as long as 4, into two. Note that the subframes selected for lighting pixels at the same time are not limited to these. For example, SF2 and SF6 may be selected for lighting pixels at the same time.

Accordingly, in the case of expressing a gray-scale level of 2, for example, SF6 is selected for lighting pixels among SF2, SF6, and SF7 each having a lighting period as long as 2. In the case of expressing a gray-scale level of 4, SF2 and SF7 are selected for lighting pixels at the same time among SF2, SF6, and SF7 each having a lighting period as long as 2. In the case of expressing a gray-scale level of 8, SF3 and SF8 are selected for lighting pixels at the same time among SF3 to SF5 and SF8 to SF10 each having a lighting period as long as 4. In the case of expressing a gray-scale level of 16, SF3, SF4, SF8, and SF9 are selected for lighting pixels among SF3 to SF5 and SF8 to SF10 each having a lighting period as long as 4. In the case of expressing a gray-scale level higher than the examples above, subframes are selected for lighting pixels or not in a similar manner.

Figure 2A:
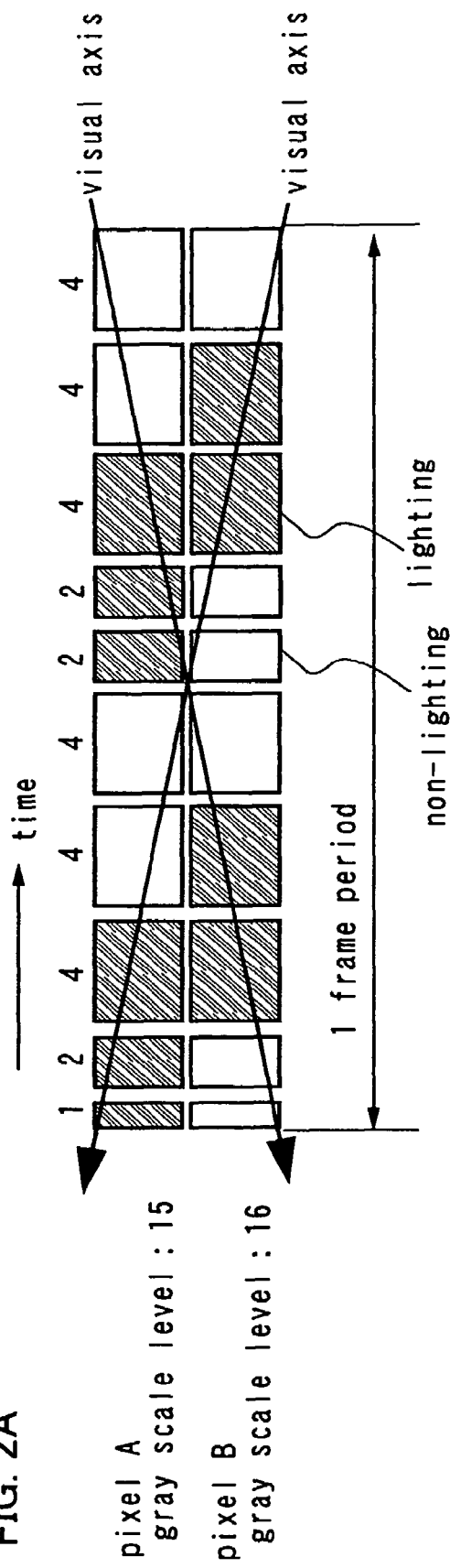
FIGS. 2A and 2B show the reason by which pseudo contours are reduced with the driving method of the invention.
Figure 2B:
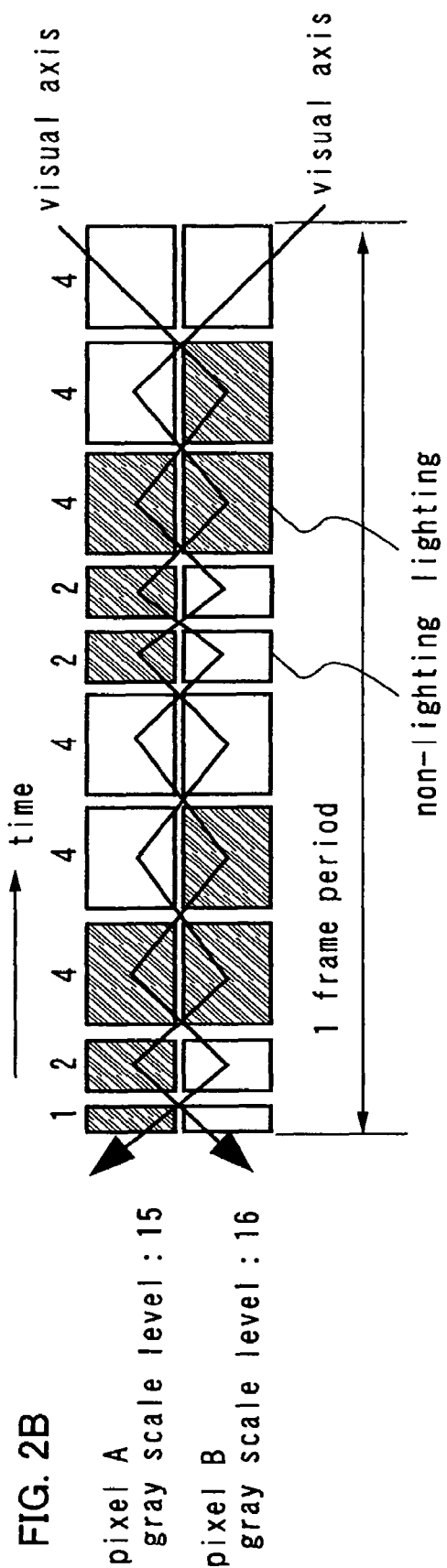

With the driving method of the invention, pseudo contours can be reduced. For example, it is assumed that a gray-scale level of 15 is displayed in a pixel A while a gray-scale level of 16 is displayed in the adjacent pixel B in FIG. 1. FIGS. 2A and 2B show the lighting/non-lighting states of pixels in each subframe in this case. Here, if the visual axis moves, human eyes perceive that the gray-scale level is 15 (=4+4+4+2+1) or 16 (=4+2+2+4+4) sometimes, depending on the movement of the visual axis. FIG. 2A shows this case. It is proved that the gray-scale levels, which are originally supposed to be perceived as 15 and 16, are achieved. Thus, pseudo contours are reduced.

FIG. 2B shows a case where the visual axis moves quickly. Supposing that the visual axis moves quickly, human eyes perceive that the gray-scale level is 15 (=4+2+4+4+1) or 16 (=4+4+2+4+2) sometimes, depending on the movement of the visual axis. This proves that the gray-scale levels, which are originally supposed to be perceived as 15 and 16, are achieved. Thus, pseudo contours are reduced.

Note that although the length of a lighting period in each subframe (or the number of lighting operations in a predetermined time, namely, the quantity of weight) is set as 1, 2, and 4, the invention is not limited to such values. In addition, although the length of a lighting period in each subframe is set as SF1=1, SF2=2, SF3=4, SF4=4, SF5=4, SF6=2, SF7=2, SF8=4, SF9=4, and SF10=4, each subframe is not requited to have the corresponding length of the lighting period.

In addition, a selection method of each subframe is not limited to this. For example, in the case of expressing a gray-scale level of 4, SF2 and SF7 are selected for lighting pixels at the same time among SF2, SF6, and SF7 each having a lighting period as long as 2; however, SF2 and SF6 may be selected for lighting pixels at the same time.

In addition, if it is said that "the arranging order of a plurality of subframes corresponding to the bits belonging to the first bit group and the second bit group is about equal between each subframe group", it means not only a case where the arranging order of the subframes is completely equal, but there is also a case where subframes corresponding to the bits belonging to the third bit group are interposed between the plurality of subframes corresponding to the bits belonging to the first bit group and the plurality of subframes corresponding to the bits belonging to the second bit group. Accordingly, the position of the subframes corresponding to the bits belonging to the third bit group may be different between the first subframe group and the second subframe group as long as the arranging order of the subframes corresponding to the bits belonging to the first bit group and the second bit group is not changed. FIG. 54 shows an example of this case. Referring concurrently to the conventional time gray scale method (FIG. 46), FIG. 54 shows an example where SF1 and SF2 assigned with the bits belonging to the third bit group are replaced by SF3 and SF9 respectively.

Although FIG. 1 shows an example where the subframes corresponding to the bits belonging to the third bit group are arranged in the two subframe groups respectively, the invention is not limited to this. Both of the two subframes may be arranged in either one of the two subframe groups. For example, FIG. 3 shows an example where two bits belonging to the third bit group are arranged in the first subframe group. Referring concurrently to the conventional time gray scale method (FIG. 46), FIG. 3 shows an example where SF1 and SF2 assigned with the bits belonging to the third bit group are arranged in the first subframe group. That is, the bits belonging to the third bit group are arranged in SF1 and SF2 in FIG. 3 respectively.

Note that the length of a lighting period may change depending on the total number of gray scales (the number of bits), the total number of subframes, or the like. Therefore, even if the length of a lighting period is not changed, the length of the actual lighting period (e.g., length of μs) may change if the total number of gray scales (the number of bits) or the total number of subframes is changed.

Note also that a lighting period corresponds to the time when pixels are continuously lighted, while the number of lighting operations corresponds to the number of blinks in a predetermined time. As a typical display device which employs the number of lighting operations, there is a plasma display. As a typical display device which employs the lighting period, there is an organic EL display.

Next, considered is a case of displaying 6-bit gray scales (64 gray-scales). FIG. 4 shows an exemplary method of selecting subframes in accordance with invention in the case of expressing gray scales with 6 bits.

Referring concurrently to the conventional time gray scale method (FIG. 46), FIG. 4 shows an example where one bit is assigned to a first bit group, three bits are assigned to a second bit group, and two bits are assigned to a third bit group. In addition, SF6 is assigned to the bit belonging to the first bit group, SF3, SF4, and SF5 are assigned to the bits belonging to the second bit group, and SF1 and SF2 are assigned to the bits belonging to the third bit group. Then, SF6 is equally divided into four, SF3, SF4, and SF5 are equally divided into two respectively, and SF1 and SF2 are not divided. Next, the four divided bits belonging to the first bit group are arranged in the two subframe groups two by two, the two divided bits belonging to the second bit group are arranged in the respective subframe groups one by one, and the bits belonging to the third bit group are arranged in the respective subframe groups. That is, the bits belonging to the first bit group are arranged in SF5, SF6, SF11, and SF12 in FIG. 4, the bits belonging to the second bit group are arranged in SF2, SF3, SF4, SF8, SF9, and SF10 in FIG. 4, and the bits belonging to the third bit group are arranged in SF1 and SF7 in FIG. 4. As a result, a total of 12 subframes are obtained, which respectively have lighting periods with the following length: SF1=1, SF2=2, SF3=4, SF4=8, SF5=8, SF6=8, SF7=2, SF8=2, SF9=4, SF10=8, SF11=8, and SF12=8. Since the length of each lighting period in SF4 to SF6 and SF10 to SF12 is all 8 in FIG. 4, the overlapped time gray scale method may be applied to each of SF4 to SF6 and SF10 to SF12.

By using the driving method of the invention as in the case of expressing 5-bit gray scales, pseudo contours can be reduced. For example, it is assumed that a gray-scale level of 31 is displayed in a pixel A while a gray-scale level of 32 is displayed in the adjacent pixel B with the subframes shown in FIG. 4. 5A and 5B show the lighting/non-lighting states of pixels in each subframe. Here, if the visual axis moves, human eyes perceive that the gray-scale level is 31 (=8+8+8+4+2+1) or 32 (=8+4+2+2+8+8) sometimes, depending on the movement of the visual axis. FIG. 5A shows this case. It is proved that the gray-scale levels, which are originally supposed to be perceived as 31 and 32, are achieved. Thus, pseudo contours are reduced.

FIG. 5B shows a case where the visual axis moves quickly. Supposing that the visual axis moves quickly, human eyes perceive that the gray-scale level is 27 (=8+4+2+8+4+1) or 36 (=8+8+2+8+8+2) sometimes, depending on the movement of the visual axis. Although it is originally supposed that the gray-scale levels are perceived as 31 and 32, the gray-scale levels are actually perceived as 27 or 36, thereby pseudo contours occur. However, since a deviation in gray scales is small as compared to the case of using the conventional double-speed frame method (FIG. 49), pseudo contours can be reduced.

Note that although the length of a lighting period in each subframe (or the number of lighting operations in a predetermined time, namely, the quantity of weight) is set as 1, 2, 4, and 8, the invention is not limited to such values. In addition, although the length of a lighting period in each subframe is set as SF1=1, SF2=2, SF3=4, SF4=8, SF5=8, SF6=8, SF7=2, SF8=2, SF9=4, SF10=8, SF11=8, and SF12=8, each subframe is not required to have the corresponding length of the lighting period. In addition, the selection method of subframes is not limited to FIG. 4.

Note also that in this embodiment mode, the number of bits assigned to each bit group is not limited to the examples described heretofore. However, it is desirable that at least one bit be assigned to each of the first bit group and the second bit group.

For example, FIG. 6 shows an example of expressing 5-bit gray scales, where one bit is assigned to a first bit group, three bits are assigned to a second bit group, and one bit is assigned to a third bit group. Referring concurrently to the conventional time gray scale method (FIG. 46), SF5 is assigned to the bit belonging to the first bit group, SF2 to SF4 are assigned to the bits belonging to the second bit group, and SF1 is assigned to the bit belonging to the third bit group. Then, SF5 is divided into four, SF2 to SF4 are divided into two respectively, and SF1 is not divided. Next, the four divided bits belonging to the first bit group are arranged in the two subframe groups two by two, the two divided bits belonging to the second bit group are arranged in the respective subframe groups one by one, and the bit belonging to the third bit group is arranged in one of the subframe groups. That is, the bits belonging to the first bit group are arranged in SF5, SF6, SF10, and SF11 in FIG. 6, the bits belonging to the second bit group are arranged in SF2 to SF4 and SF7 to SF9 in FIG. 6, and the bit belonging to the third bit group is arranged in SF1 in FIG. 6. As a result, a total of 11 subframes are obtained, which respectively have lighting periods with the following length: SF1=1, SF2=1, SF3=2, SF4=4, SF5=4, SF6=4, SF7=1, SF8=2, SF9=4, SF10=4, and SF11=4. Since the length of each lighting period in SF4 to SF6 and SF9 to SF11 is all 4 in FIG. 6, the overlapped time gray scale method may be applied to each of SF4 to SF6 and SF9 to SF11.

Furthermore, FIG. 7 shows an example of expressing 5-bit gray scales, where two bits are assigned to a first bit group, one bit is assigned to a second bit group, and two bits are assigned to a third bit group. Referring concurrently to the conventional time gray scale method (FIG. 46), SF4 and SF5 are assigned to the bits belonging to the first bit group, SF3 is assigned to the bit belonging to the second bit group, and SF1 and SF2 are assigned to the bits belonging to the third bit group. Then, SF4 and SF5 are divided into four respectively, SF3 is divided into two, and SF1 and SF2 are not divided. Next, the four divided bits belonging to the first bit group are arranged in the two subframe groups two by two, the two divided bits belonging to the second bit group are arranged in the respective subframe groups one by one, and the bits belonging to the third bit group are arranged in the respective subframe groups. That is, the bits belonging to the first bit group are arranged in SF3 to SF6 and SF9 to SF12 in FIG. 7, the bits belonging to the second bit group are arranged in SF2 and SF8 in FIG. 7, and the bits belonging to the third bit group are arranged in SF1 and SF7 in FIG. 7. As a result, a total of 12 subframes are obtained, which respectively have lighting periods with the following length: SF1=1, SF2=2, SF3=2, SF4=2, SF5=4, SF6=4, SF7=1, SF8=2, SF9=2, SF10=2, SF11=4, and SF12=4. Since the length of each lighting period in SF2 to SF4 and SF8 to SF10 is all 2 in FIG. 7, the overlapped time gray scale method may be applied to each of SF2 to SF4 and SF8 to SF10.

Furthermore, FIG. 8 shows an example of expressing 5-bit gray scales, where one bit is assigned to a first bit group, four bits are assigned to a second bit group, and 0 bit is assigned to a third bit group. Referring concurrently to the conventional time gray scale method (FIG. 46), SF5 is assigned to the bit belonging to the first bit group, while the other subframes SF1 to SF4 are assigned to the bits belonging to the second bit group. Then, SF5 is divided into four, and the other subframes SF1 to SF4 are divided into two respectively. Next, the four divided bits belonging to the first bit group are arranged in the two subframe groups two by two, the two divided bits belonging to the second bit group are arranged in the respective subframe groups one by one. That is, the bits belonging to the first bit group are arranged in SF5, SF6, SF11, and SF12 in FIG. 8, and the bits belonging to the second bit group are arranged in SF1 to SF4 and SF7 to SF10 in FIG. 8. As a result, a total of 12 subframes are obtained, which respectively have lighting periods with the following length: SF1=0.5, SF2=1, SF3=2, SF4=4, SF5=4, SF6=4, SF7=0.5, SF8=1, SF9=2, SF10=4, SF11=4, and SF12=4. Since the length of each lighting period in SF4 to SF6 and SF10 to SF12 is all 4 in FIG. 8, the overlapped time gray scale method is applied to each of SF4 to SF6 and SF10 to SF12.

Note that FIG. 8 can be regarded as a structure where the bit belonging to the third bit group in FIG. 6 is divided and arranged in the first subframe group and the second subframe group respectively. As a result, the frame frequency can be regarded as being increased substantially as for the bits belonging to the third bit group. Thus, human eyes will be subjected to tricks as if the pseudo contours are reduced.

Note that although the most significant bit (the largest-weighted bit) is selected as the bit belonging to the first bit group in this embodiment mode, the bit belonging to the first bit group is not limited to this and any bit may be selected as the bit belonging to the first bit group. Similarly, any bit may be selected as the bit belonging to the second bit group or the third bit group.

For example, FIG. 9 shows an example of displaying 5-bit gray scales, where the second highest-order bit is selected as the bit belonging to a first bit group. Referring concurrently to the conventional time gray scale method (FIG. 46), one bit is assigned to a first bit group, two bits are assigned to a second bit group, and two bits are assigned to a third bit group. SF4 corresponding to the second highest-order bit is assigned to the bit belonging to the first bit group, SF3 and SF5 are assigned to the bits belonging to the second bit group, and SF1 and SF2 are assigned to the bits belonging to the third bit group. Then, SF4 is divided into four, SF3 and SF5 are divided into two respectively, and SF1 and SF2 are riot divided. Next, the four divided bits belonging to the first bit group are arranged in the two subframe groups two by two, the two divided bits belonging to the second bit group are arranged in the respective subframe groups one by one, and the bits belonging to the third bit group are arranged in the respective subframe groups. That is, the bits belonging to the first bit group are arranged in SF3, SF4, SF8, and SF9 in FIG. 9, the bits belonging to the second bit group are arranged in SF2, SF5, SF7, and SF10 in FIG. 9, and the bits belonging to the third bit group are arranged in SF1 and SF6 in FIG. 9. As a result, a total of 10 subframes are obtained, which respectively have lighting periods with the following length: SF1=1, SF2=2, SF3=2, SF4=2, SF5=8, SF6=2, SF7=2, SF8=2, SF9=2, and SF10=8. Since the length of each lighting period in SF2 to SF4 and SF7 to SF9 is all 2 in FIG. 9, the overlapped time gray scale method is applied to each of both SF2 to SF4 and SF7 to SF9.

Note that as shown in the example in FIG. 9, the subframe corresponding to the most significant bit will belong to the second bit group if the subframe is divided into an equal number to the total number of subframe groups.

Note also that although this embodiment mode illustrates an example of using the conventional time gray scale method, where a subframe corresponding to the bit belonging to the first bit group is divided into four, the division number of a subframe corresponding to the bit belonging to the first bit group is not limited to this as long as it is larger than the number of subframe groups. That is, in the case where the number of subframe groups is two, the division number is required to be at least three. For example, the subframe corresponding to the bit belonging to the first bit group may be divided into three, and arranged in the two subframe groups in a ratio of 2 to 1. Note that the subframe corresponding to the bit belonging to the first bit group is desirably divided into multiples of the number of subframe groups. That is, if the total number of subframe groups is 2, the subframe corresponding to the bit belonging to the first bit group is desirably divided into (2×m) (m is an integer, where m=2). This is because the divided bits corresponding to the bit belonging to the first bit group can be arranged in the respective subframe groups in equal ratio, thereby flickers and pseudo contours can be prevented. For example, the subframe corresponding to the bit belonging to the first bit group may be divided into six. However, the invention is not limited to such number.

Although this embodiment mode illustrates an example of using the conventional time gray scale method, where all the subframes corresponding to the bits belonging to the first bit group are divided into four, it is not necessary to divide the subframes corresponding to the bits belonging to the first bit group into equal number to each other. That is, the division number of each subframe may be different in the first bit group.

Figure 10:
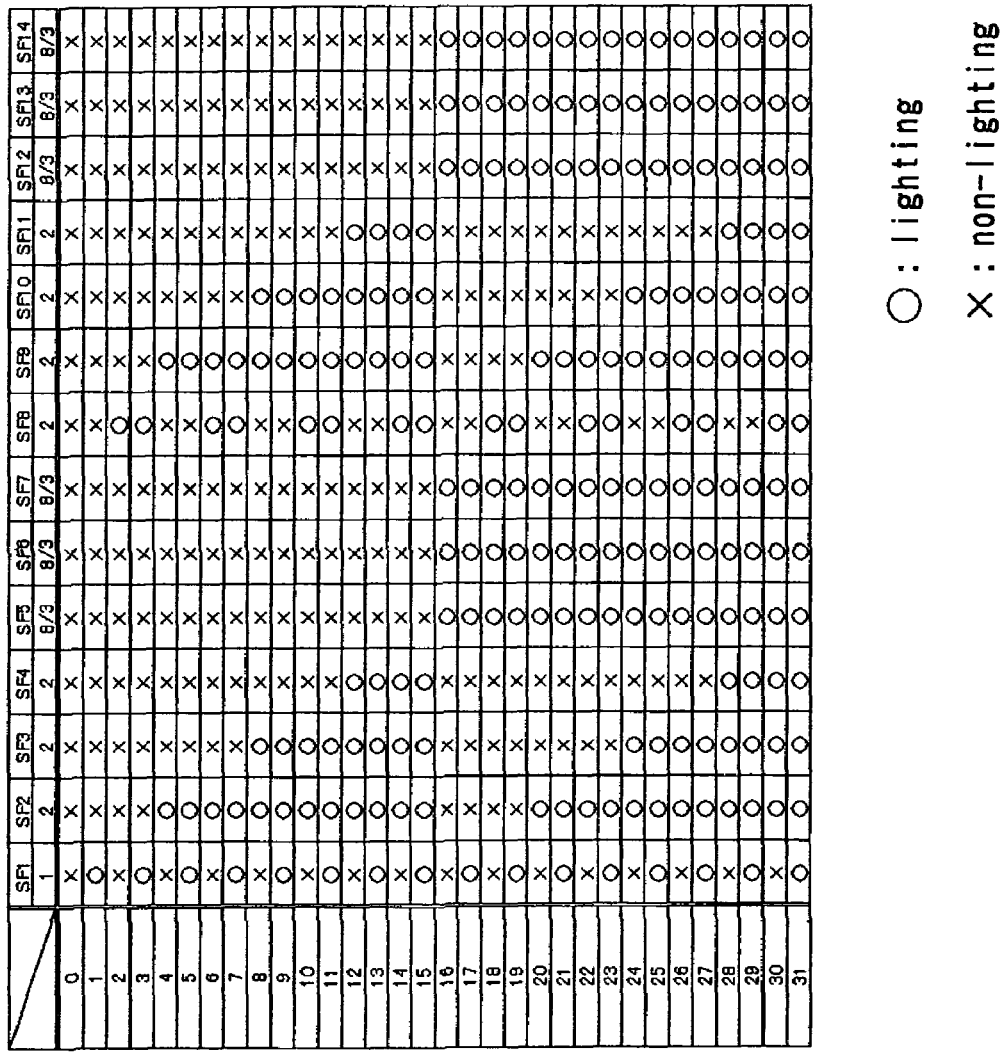
FIG. 10 shows an exemplary selection method of subframes by the driving method of the invention.

For example, referring concurrently to the conventional time gray scale method (FIG. 46), FIG. 10 shows an example similar to FIG. 7, where SF4 and SF5 are assigned to the bits belonging to the first bit group, SF3 is assigned to the bit belonging to the second bit group, SF1 and SF2 are assigned to the bits belonging to the third bit group, and SF4 which is assigned to the bit belonging to the first bit group is divided into four, while SF5 which is also assigned to the bit belonging to the first bit group is divided into six. First, SF4 and SF5 assigned to the bits belonging to the first bit group are divided into four and six respectively. Then, the six divided bits belonging to the first bit group are arranged in the two subframe groups three by three, while the four divided bits belonging to the first bit group are arranged in the two subframe groups two by two. That is, the six divided bits belonging to the first bit group are arranged in SF5 to SF7 and SF12 to SF14 in FIG. 10, while the four divided bits belonging to the first bit group are arranged in SF3, SF4, SF10, and SF11 in FIG. 10. As a result, a total of 14 subframes are obtained, which respectively have lighting periods with the following length: SF1=1, SF2=2, SF3=2, SF4=2, SF5=8/3, SF6=8/3, SF7=8/3, SF8=2, SF9=2, SF10=2, SF11=2, SF12=8/3, SF13=8/3, and SF14=8/3. Since the length of each lighting period in SF2 to SF4 and SF9 to SF11 is all 2 in FIG. 10, the overlapped time gray scale method may be applied to each of SF2 to SF4 and SF9 to SF11.

Although this embodiment mode illustrates an example of using the conventional time gray scale method, where a subframe corresponding to the bit belonging to the first bit group is equally divided into four, and a subframe corresponding to the bit belonging to the second bit group is equally divided into two, the invention is not limited to such numbers. In addition, the subframe is not necessarily divided into equal length.

For example, referring concurrently to the conventional time gray scale method (FIG. 46), in the case of displaying 5-bit gray scales, a lighting period (having a length of 8) of the subframe (SF4) corresponding to the bit belonging to the second bit group may be divided into two subframes which respectively have lighting periods as long as 2 and 6. FIG. 11 shows an example of this case. In FIG. 11, SF4 assigned to the bit belonging to the second bit group is divided into two subframes which respectively have lighting periods as long as 2 and 6. Then, the subframe having the lighting period of 2 is arranged in SF3 while the subframe having the lighting period of 6 is arranged in SF8. Since the length of each lighting period in SF2 and SF3 is all 2 in FIG. 11, the overlapped time gray scale method is applied to SF2 and SF3.

Although this embodiment mode illustrates an example where the arranging order of subframes corresponding to bits belonging to the first bit group and the second bit group is about equal between the two subframe groups, the invention is not limited to the case where such arranging order is completely equal between the two subframe groups. The arranging order of several subframes may be different between the two subframe groups. For example, SF8 and SF9 may be exchanged with each other in FIG. 1. That is, such arranging order may be employed that SF1, SF2, SF3, SF4, SF5, SF6, SF7, SF9, SF8, and SF10.

Note that the invention may be implemented by combining the descriptions made heretofore with each other, for example, on the number of bits assigned to each bit group, bits selected as the bits belonging to each bit group, the division number of a bit belonging to the first bit group, the width of each divided subframe, and the arranging order of subframes.

For example, FIGS. 12 and 13 show examples of displaying 5-bit gray scales where, referring concurrently to the conventional time gray scale method (FIG. 46), two bits are assigned to the first bit group, one bit is assigned to the second bit group, and two bits are assigned to the third bit group. In addition, one of the bits belonging to the first bit group is changed in division width. Referring concurrently to the conventional time gray scale method (FIG. 46), SF4 and SF5 are assigned to the bits belonging to the first bit group, SF3 is assigned to the bit belonging to the second bit group, and SF1 and SF2 are assigned to the bits belonging to the third bit group. Then, SF4 and SF5 are divided into four respectively. At this time, a lighting period (a length of 8) of SF4 is divided in a ratio of 2:2:2:2, while a lighting period (a length of 16) of SF5 is divided in a ratio of 2:6:2:6. In addition, SF3 is divided into two and SF1 and SF2 are not divided. Then, the four divided bits belonging to the first bit group are arranged in the two subframe groups two by two, the two divided bits belonging to the second bit group are arranged in the respective subframe groups one by one, and the bits belonging to the third bit group are arranged in the respective subframe groups. That is, among the bits belonging to the first bit group, the bits obtained by dividing SF4 are arranged in SF3, SF4, SF9, and SF10 in FIGS. 12 and 13, and the bits obtained by dividing SF5 to have a lighting period of 2 are arranged in SF5 and SF11 in FIGS. 12 and 13, while the bits obtained by dividing SF5 to have a lighting period of 6 are arranged in SF6 and SF12 in FIGS. 12 and 13. In addition, the bits belonging to the second bit group are arranged in SF2 and SF8 in FIGS. 12 and 13, and the bits belonging to the third bit group are arranged in SF1 and SF7 in FIGS. 12 and 13. As a result, a total of 12 subframes are obtained, which respectively have lighting periods with the following length: SF1=1, SF2=2, SF3=2, SF4=2, SF5=2, SF6=6, SF7=2, SF8=2, SF9=2, SF10=2, SF11=2, and SF12=6.

Here, description is made on subframes to which the overlapped time gray scale method is applied. Since the length of each lighting period in SF2 to SF5 and SF8 to SF11 is all 2 in FIGS. 12 and 13, the overlapped time gray scale method is applied to these subframes. At this time, the overlapped time gray scale method is not necessarily applied to all of the subframes having an equal length of lighting periods. For example, the overlapped time gray scale method may be applied to each of SF2 to SF4 and SF8 to SF10 as shown in FIG. 12, or applied to each of SF2 to SF5 and SF8 to SF11 as shown in FIG. 13.

Although this embodiment mode illustrates an example where the overlapped time gray scale method is applied to subframes having an equal length of lighting periods among the subframes corresponding to the bits belonging to the first bit group and the second bit group, the subframes which can employ the overlapped time gray scale method are not limited to the ones having an equal length of lighting periods. The overlapped time gray scale method may be applied to subframes having a different length of lighting periods as well.

For example, FIG. 55 shows an example where the division width of the bit belonging to the first bit group is changed from that of FIG. 1. Referring concurrently to the conventional time gray scale method (FIG. 46), FIG. 55 shows an example where SF5 corresponding to the bit belonging to the first bit group is divided into four subframes which respectively have lighting periods as long as 3, 5, 3, and 5 (a total length is 16), and then the subframes each having a lighting period of 3 are arranged in SF4 and SF9 in FIG. 55, while the subframes each having a lighting period of 5 are arranged in SF5 and SF10 in FIG. 55. As a result, a total of 10 subframes are obtained, which respectively have lighting periods with the following length: SF1=1, SF2=2, SF3=4, SF4=3, SF5=5, SF6=2, SF7=2, SF8=4, SF9=3, and SF10=5. Although each of SF3 and SF5 and SF8 and SF10 have different length of lighting periods, the overlapped time gray scale method is applied to each of them.

Description has been made heretofore on the case of expressing 5-bit or 6-bit gray scales by using the driving method of the invention. With the invention, gray scales with various numbers of bits can be expressed in a similar manner. For example, in the case of expressing gray scales with n bits (n is an integer), a total of n subframes are required when using the conventional time gray scale method. In addition, a subframe corresponding to the most significant bit has a lighting period as long as $2^{n-1}$. Meanwhile, on the assumption that in the conventional time gray scale method, the number of bits belonging to the first bit group, which are to be divided into L (L is an integer, where L=3), is a (a is an integer, where $0<a<n$), the number of bits belonging to the second bit group, which are to be divided into two, is b (b is an integer, where $0<b<n$), and the number of bits belonging to the third bit group, which are to be undivided, is c (c is an integer, where $0=c<n$, and $a+b+c=n$), a total of $(L\times a+2\times b+c)$ subframes are required in the driving method of the invention. In addition, if the most significant bit is selected as the bit belonging to the first bit group and a subframe corresponding to this bit is equally divided into L, each lighting period of the L subframes corresponding to this bit is as long as $(2^{n-1}/L)$. For example, in the case of FIG. 1, since n=5, L=4, a=1, b=2, and c=2, the total number of subframes is 10(=4×1+2×2+2), and each lighting period of the subframes after divided, which correspond to the bit belonging to the first bit group, is as long as $2^{5-1}/4=4$. Similarly, in the case of FIG. 4, since n=6, L=4, a=1, b=3, and c=2, the total number of subframes is 12 (=4× 1+2×3+2), and each lighting period of the subframes after divided, which correspond to the bit belonging to the first bit group, is as long as $2^{6-1}/4=8$. Similarly, in the case of FIG. 7, since n=5, L=4, a=2, b=1, and c=2, the total number of subframes is 12 (=4×2+2×1+2), and each lighting period of the subframes after divided, which correspond to the bit belonging to the first bit group, is as long as $2^{5-1}/4=4$.

In this manner, by using the driving method of the invention, reduction in pseudo contours, display with a larger number of gray scales and the like can be achieved without the need of increasing the frame frequency.

Note that there is a case where a plurality of selection methods of subframes can be employed for expressing one gray scale. Therefore, the selection method of subframes may be changed in expressing a certain gray scale depending on either time or each place. That is, the selection method of subframes may be changed depending on either time or each pixel. Further, it may be changed depending on both time and each pixel.

For example, when expressing a certain gray scale, different selection methods of subframes may be used in odd-numbered frames and even-numbered frames. FIGS. 14 and 15 show examples in the case of displaying 5-bit gray scales. For example, gray scales may be expressed by a selection method of subframes shown in FIG. 14 in odd-numbered frames whereas gray scales may be expressed by a selection method of subframes shown in FIG. 15 in even-numbered frames. FIGS. 14 and 15 are different in that the gray-scale levels of 16 and 23 are expressed by selecting different subframes. In displaying 5-bit gray scales, pseudo contours tend to occur at the gray-scale levels of 16 and 23. Thus, by changing the selection method of subframes between the odd-numbered frames and even-numbered frames in expressing a gray-scale level which is likely to cause pseudo contours, pseudo contours can be reduced.

Although FIGS. 14 and 15 show examples where the selection method of subframes is changed for the gray-scale levels which are likely to cause pseudo contours, the selection method of subframes may be changed for an arbitrary gray-scale level.

In addition, FIGS. 16 and 17 show another example. Gray scales may be expressed by a selection method of subframes shown in FIG. 16 in odd-numbered frames whereas gray scales may be expressed by a selection method of subframes shown in FIG. 17 in even-numbered frames. FIGS. 16 and 17 are different in that SF3 and SF8 have different length of lighting periods and different selection methods of subframes are used.

Alternatively, the selection method of subframes may be changed between the case of displaying pixels in odd-numbered rows and pixels in even-numbered rows in order to display a certain gray scale. Further alternatively, the selection method of subframes may be changed between the case of displaying pixels in odd-numbered columns and pixels in even-numbered columns in order to display a certain gray scale.

Note that the driving method of the invention may be combined with other gray scale expression methods. For example, the driving method of the invention may be combined with an area gray scale method. An area gray scale method is a method of expressing gray scales by dividing one pixel into a plurality of subpixels and changing lighting areas. Therefore, pseudo contours can be further reduced.

Description has been made heretofore on the case where a lighting period increases in linear proportion to the increased gray scales. In this embodiment mode, description is made on the case of applying gamma correction. Gamma correction refers to a method of nonlinearly increasing the lighting period in accordance with the increased gray scales. When luminance increases linearly, it is difficult for human eyes to perceive that the luminance has become higher proportionally. It is even more difficult for human eyes to perceive the difference in luminance as the luminance becomes higher. Therefore, in order that the human eyes can perceive the difference in luminance, a lighting period is required to be lengthened in accordance with the increased gray scales, that is, gamma correction is required to be performed. Note that the relation between the luminance and gray scales in performing gamma correction can be expressed by the following Formula (1): $y=Ax^\gamma$ (where the gray-scale level is x and the luminance is y) . . . (1). Note that A is a constant for normalizing the luminance y to be within the range of $0=y=1$, while γ which is an exponent of the gray-scale level x is a parameter indicating the degree of gamma correction.

As the simplest method for performing gamma correction, there is a method by which display is carried out with preparation of a larger number of bits (gray scales) than the number of bits (gray scales) which are actually displayed. For example, in the case of displaying 6-bit gray scales (64 gray scales), display is performed with preparation of 8-bit gray scales (256 gray scales). When actually displaying an image, display is carried out with 6-bit gray scales (64 gray scales) so that the luminance and gray scales have a nonlinear relationship. Accordingly, gamma correction can be performed.

Figure 19A:
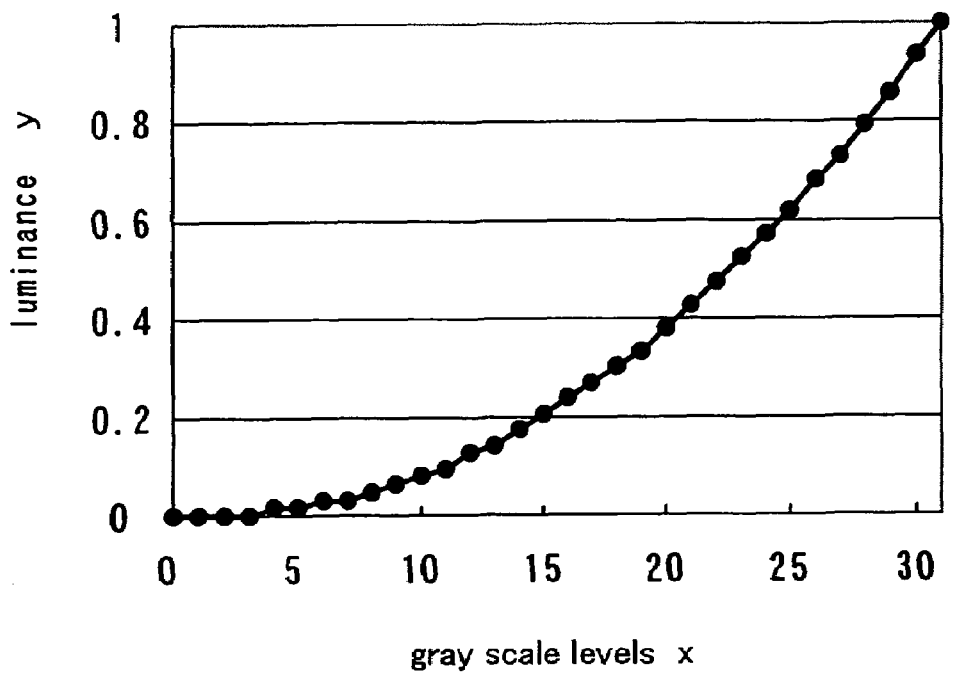
FIGS. 19A and 19B show the relation between gray scales and luminance in the case where gamma correction is performed by the driving method of the invention.
Figure 19B:
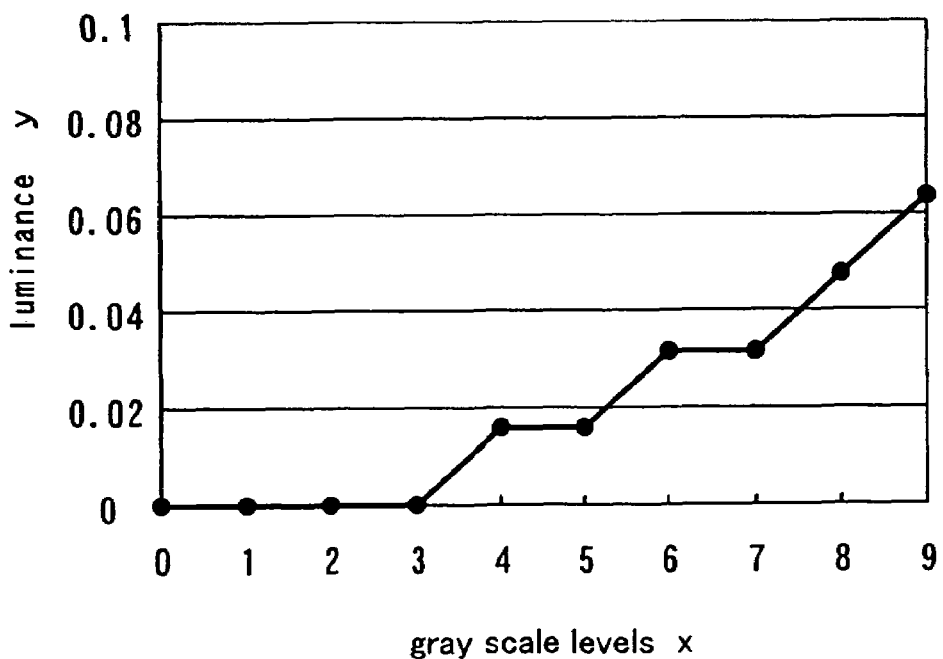

As an example, FIG. 18 shows a selection method of subframes in the case of displaying an image with preparation of 6-bit gray scales in order to display 5-bit gray scales by performing gamma correction. FIG. 18 shows a selection method of subframes in the case of displaying an image with 5-bit gray scales by performing gamma correction so that γ=2.2 is satisfied at all the gray-scale levels. Note that γ=2.2 is the value which can best correct the characteristics of the human visual perception, with which human eyes can perceive the most appropriate difference in luminance even when the luminance becomes higher. Referring to FIG. 18, up to a gray-scale level of 3 in displaying 5-bit gray scales with gamma correction, display is actually carried out by the selection method of subframes for displaying a gray-scale level of 0 in the case of 6-bit gray scales. Similarly, at a gray-scale level of 4 in displaying 5-bit gray scales with gamma correction, display is actually carried out by a selection method of subframes for displaying a gray-scale level of 1 in the case of 6-bit gray scales, and at a gray-scale level of 6 in displaying 5 bit-gray scales with gamma correction, display is actually performed by a selection method of subframes for displaying a gray-scale level of 2 in the case of 6 bit-gray scales. FIGS. 19A and 19B are graphs showing the relation between the gray-scale level x and the luminance y. FIG. 19A is a graph showing the relation between the gray-scale level x and the luminance y at all gray-scale levels, while FIG. 19B is a graph showing the relation between the gray-scale level x and the luminance y at low gray-scale levels. In this manner, display may be performed in accordance with a correspondence table between 5-bit gray scales to be applied with gamma correction and 6-bit gray scales. Accordingly, gamma correction which can satisfy γ=2.2 can be performed.

Note that as is evident from FIG. 19B, the gray-scale levels of 0 to 3, 4 to 5, and 6 to 7 are each displayed with the same luminance in the case of FIG. 18. This is because, since the number of gray scales is not enough in the case of displaying 6-bit gray scales, difference in luminance cannot be expressed fully. As a countermeasure against this, the following two methods can be considered.

The first method is a method of further increasing the number of bits which can be displayed. That is, display is carried out with preparation of not 6-bit gray scales, but 7-bit or more gray scales, and preferably 8-bit or more gray scales. As a result, a smooth image can be displayed even in the low gray scale regions (regions having low luminance).

Figure 21A:
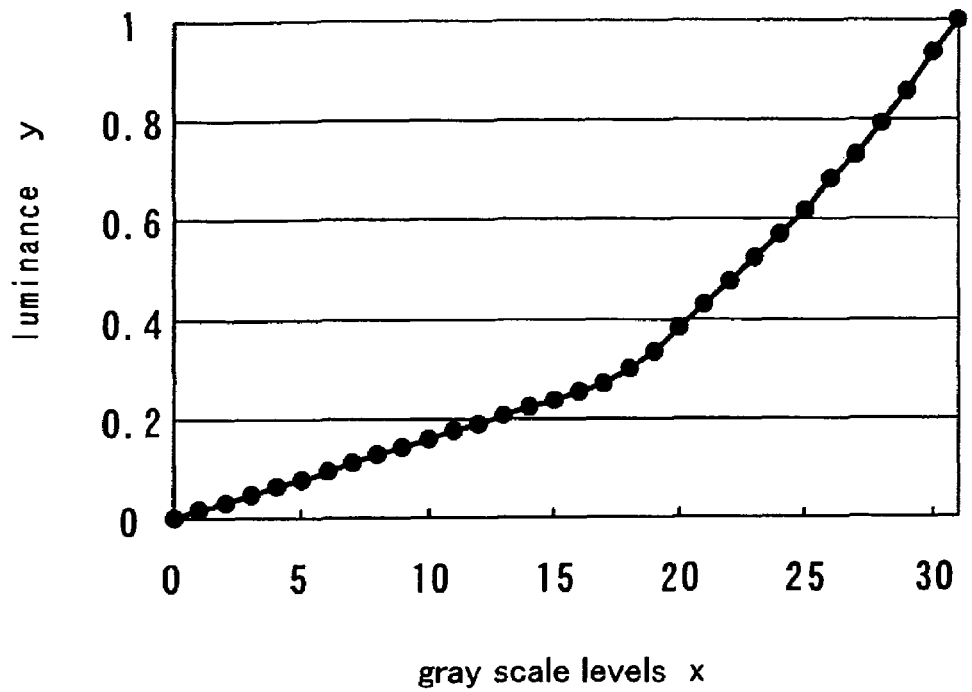
FIGS. 21A and 21B show the relation between gray scales and luminance in the case where gamma correction is performed by the driving method of the invention.
Figure 21B:
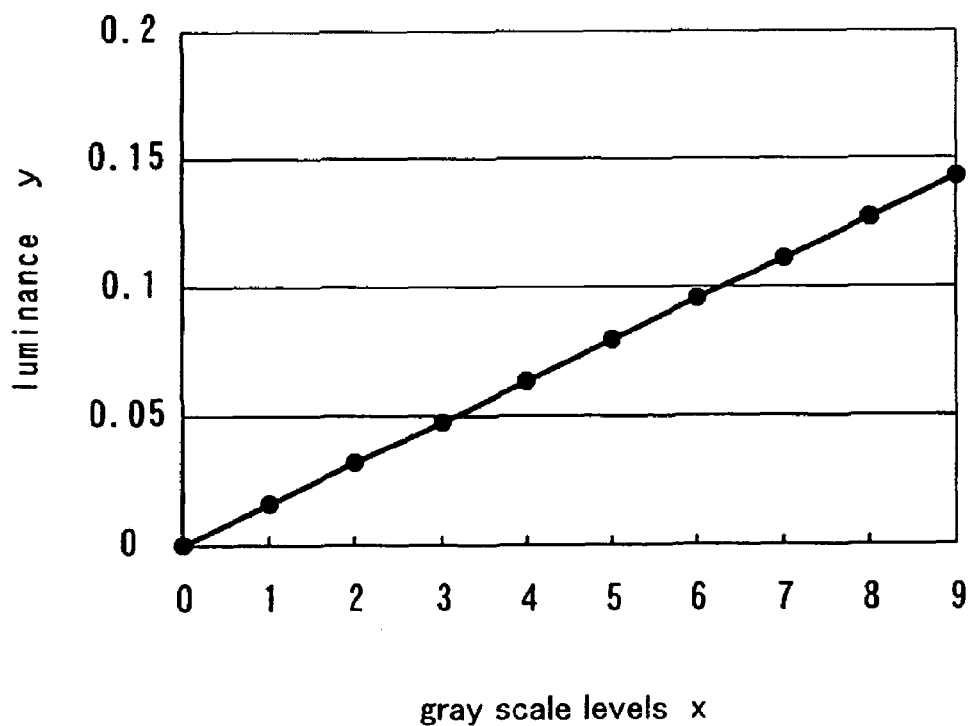

The second method is a method of displaying a smooth image by not satisfying γ=2.2 in the low gray scale regions, but by linearly changing the luminance. FIG. 20 shows a selection method of subframes in this case. In FIG. 20, in order to display a gray scale level of up to 17, the same selection method of subframes is used between the cases of 5-bit gray scales and 6-bit gray scales. However, at a gray-scale level of 18 in displaying 5-bit gray scales with gamma correction, pixels are actually lighted by a selection method of subframes for displaying a gray-scale level of 19 in the case of 6-bit gray scales. Similarly, at a gray-scale level of 19 in displaying 5-bit gray scales with gamma correction, display is actually carried out by a selection method of subframes for displaying a gray-scale level of 21 in the case of 6-bit gray scales, and at a gray-scale level of 20 in displaying 5-bit gray scales with gamma correction, display is actually carried out by a selection method of subframes for displaying a gray-scale level of 24 in the case of 6-bit gray scales. FIGS. 21A and 21B show the relation between the gray-scale level x and the luminance y. FIG. 21A is a graph showing the relation between the gray-scale level x and the luminance y at all gray-scale levels, while 21B is a graph showing the relation between the gray-scale level x and the luminance y at low gray-scale levels. In the low gray scale regions, the luminance changes linearly. By performing such gamma correction, a smoother image can be displayed in the low gray scale regions.

That is, by changing the luminance in linear proportion to the gray scale levels in the low gray scale regions while changing the luminance in nonlinear proportion to the gray scale levels in other gray scale regions, a smoother image can be displayed in the low gray scale regions.

Figure 57:
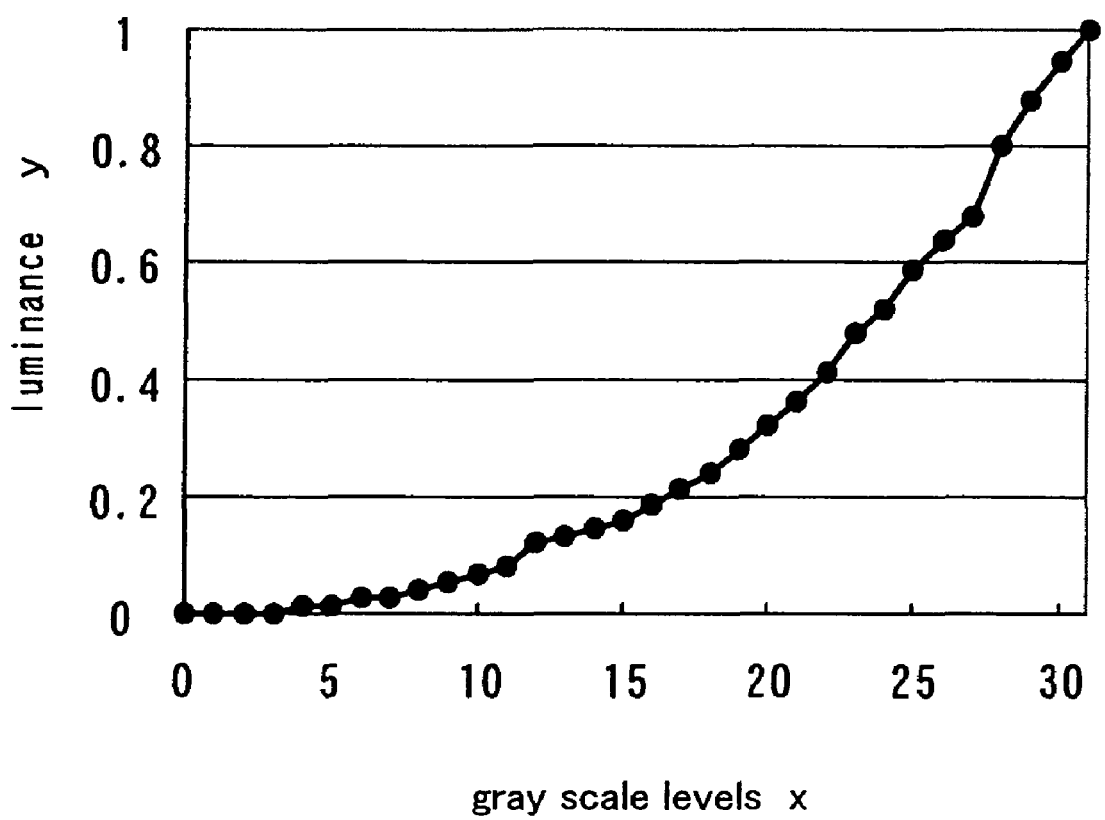
FIG. 57 shows the relation between gray scales and luminance in the case where gamma correction is performed by the driving method of the invention.

Note that gamma correction may be performed by lengthening a lighting period of each subframe. For example, FIG. 56 shows a selection method of subframes in the case of performing gamma correction by lengthening a lighting period of each subframe which employs the overlapped time gray scale method. In FIG. 56, each lighting period in SF4 to SF6 and SF10 to SF12 which employ the overlapped time gray scale method is increased by a length of 2. FIG. 57 shows a graph showing the relation between the gray-scale level x and the luminance y in this case. Gamma correction may be carried out by such a method. Note that the luminance in the low gray scale regions may be changed either linearly or nonlinearly.

Note also that the correspondence table between the 5-bit gray scales to be applied with gamma correction and the 6-bit gray scales may be appropriately modified. By modifying the correspondence table, degree of gamma correction (i.e., the value of γ) can be easily changed. Accordingly, the invention is not limited to γ=2.2.

Furthermore, the invention is not particularly limited to the number of bits (e.g., p bits, where p is an integer) to be actually displayed, and the number of bits to be applied with gamma correction (e.g., q bits, where q is an integer). In the case of displaying bits by performing gamma correction, the number of bits (p) is desirably set as large as possible in order to express gray scales smoothly. However, if the number p is set too large, a problem may arise such that the number of subframes is increased accordingly. Thus, the relation between the number of bits (q) and (p) desirably satisfies: q+2=p=q+5. Accordingly, gray scales can be smoothly expressed while suppressing the number of subframes.

Description has been made heretofore on the gray scale expression method, that is, the selection method of subframes. Next, description is made on the arranging order of subframes. Here, description is made on the case of expressing 5-bit gray scales (FIG. 1) as an example; however, the invention can be applied to other drawings as well.

First, the most basic structure of one frame has such arranging order as SF1, SF2, SF3, SF4, SF5, SF6, SF7, SF8, SF9, and SF10. In this arranging order of subframes, a subframe with the shortest lighting period is arranged in the first position. Then, subframes which do not employ the overlapped time gray scale method are arranged in order of the increasing lighting periods. Then, subframes which employ the overlapped time gray scale method are arranged in order from the earlier selection timing of lighting pixels. FIG. 1 corresponds to this arranging order of subframes.

On the other hand, one frame may have a structure with a reverse arranging order to the above structure, such that SF10, SF9, SF8, SF7, SF6, SF5, SF4, SF3, SF2, and SF1. In this arranging order of subframes, a subframe with the longest lighting period is arranged in the first position. Then, subframes which employ the overlapped time gray scale method are arranged in order from the later selection timing of lighting pixels (i.e., a subframe selected for lighting pixels first is set in the last position). Then, subframes which do not employ the overlapped time gray scale method are arranged in order of the decreasing lighting periods.

Note that the subframes that employ the overlapped time gray scale method may be arranged in order from the earlier start timing of lighting pixels (e.g., SF3, SF4, and SF5, and SF8, SF9, and SF10), or may be arranged in reverse order thereof (e.g., SF5, SF4, and SF3, and SF10, SF9, and SF8). Alternatively, the subframes may be arranged starting from the middle (e.g., SF4, SF3, and SF5, and SF9, SF8, and SF10).

For example, FIG. 22 shows a case of expressing 5-bit gray scales, where SF1, SF2, SF4, SF3, SF5, SF6, SF7, SF9, SF8, and SF10 are arranged in this order. It is assumed that a gray-scale level of 15 is displayed in a pixel A while a gray-scale level of 16 is displayed in a pixel B. Here, if the visual axis moves, human eyes perceive that the gray-scale level is 15 (=4+4+4+2+1) or 16 (=4+2+2+4+4) sometimes, depending on the movement of the visual axis. FIG. 22A shows this case. It is proved that the gray-scale levels, which are originally supposed to be perceived as 15 and 16, are achieved. Thus, pseudo contours are reduced.

FIG. 22B shows a case where the visual axis moves quickly. Supposing that the visual axis moves quickly, human eyes perceive that the gray-scale level is 15 (=4+4+2+4+1) or 16 (=4+2+4+4+2) sometimes, depending on the movement of the visual axis. It is proved that the gray-scale levels, which are originally supposed to be perceived as 15 and 16, are achieved. Thus, pseudo contours are reduced.

In this manner, by arranging the subframes which employ the overlapped time gray scale method in order from the middle subframe to be followed by the other subframes, pseudo contours can be reduced. In addition, pseudo contours which would occur at the timing when one frame switches to a subsequent subframe can be reduced. Thus, so-called moving image pseudo contours can be reduced.

Next, description is made on a case where subframes corresponding to the bits belonging to the second bit group or the third bit group are interposed between subframes corresponding to the bits belonging to the first bit group. For example, subframes are arranged in such order as SF1, SF3, SF4, SF2, SF5, SF6, SF8, SF9, SF7, and SF10, where SF2 corresponding to the bit belonging to the second bit group is interposed between SF4 and SF5 corresponding to the bits belonging to the first bit group, and SF7 corresponding to the bit belonging to the second bit group is interposed between SF9 and SF10 corresponding to the bits belonging to the first bit group. Note that the position for interposing subframes corresponding to the bits belonging to the second bit group or the third bit group is not limited to this. In addition, the number of subframes to be interposed is not limited to this.

Note that when subframes corresponding to the bits belonging to the second bit group or the third bit group are interposed between subframes corresponding to the bits belonging to the first bit group, human eyes will be subjected to tricks as if the pseudo contours are reduced.

Note also that in the case of interposing subframes corresponding to the bits belonging to the second bit group or the third bit group between subframes corresponding to the bits belonging to the first bit group, pseudo contours can be further reduced by interposing a subframe whose lighting period is the nearest to the lighting periods of the subframes corresponding to the bits belonging to the first bit group. For example, in the most basic arranging order of SF1, SF2, SF3, SF4, SF5, SF6, SF7, SF8, SF9, and SF10, when interposing subframes whose lighting periods (the total lighting period is 8: SF3 and SF8) are the nearest to the bits belonging to the first bit group, between the subframes corresponding to the bits belonging to the first bit group (the total lighting period is 16: SF4, SF5, SF9, and SF10), pseudo contours can be reduced as shown in FIGS. 22A and 22B.

Next, description is made on a case where one of the subframes corresponding to the bits belonging to the first bit group and one of the subframes corresponding to the bits belonging to the second bit group or the third bit group are exchanged with each other. For example, subframes are arranged in such order as SF1, SF4, SF3, SF2, SF5, SF6, SF9, SF8, SF7, and SF10, by exchanging SF4 corresponding to the bit belonging to the first bit group with SF2 corresponding to the bit belonging to the second bit group, as well as exchanging SF9 corresponding to the bit belonging to the first bit group with SF7 corresponding to the bit belonging to the second bit group. Note that the position of the exchanged subframes is not limited to this. Further, the number of the exchanged subframes is not limited to this.

In this manner, by exchanging the position of a subframe corresponding to a bit belonging to the first bit group with a subframe corresponding to a bit belonging to the second bit group or the third bit group, human eyes will be subjected to tricks as if the pseudo contours are reduced.

Figure 23A:
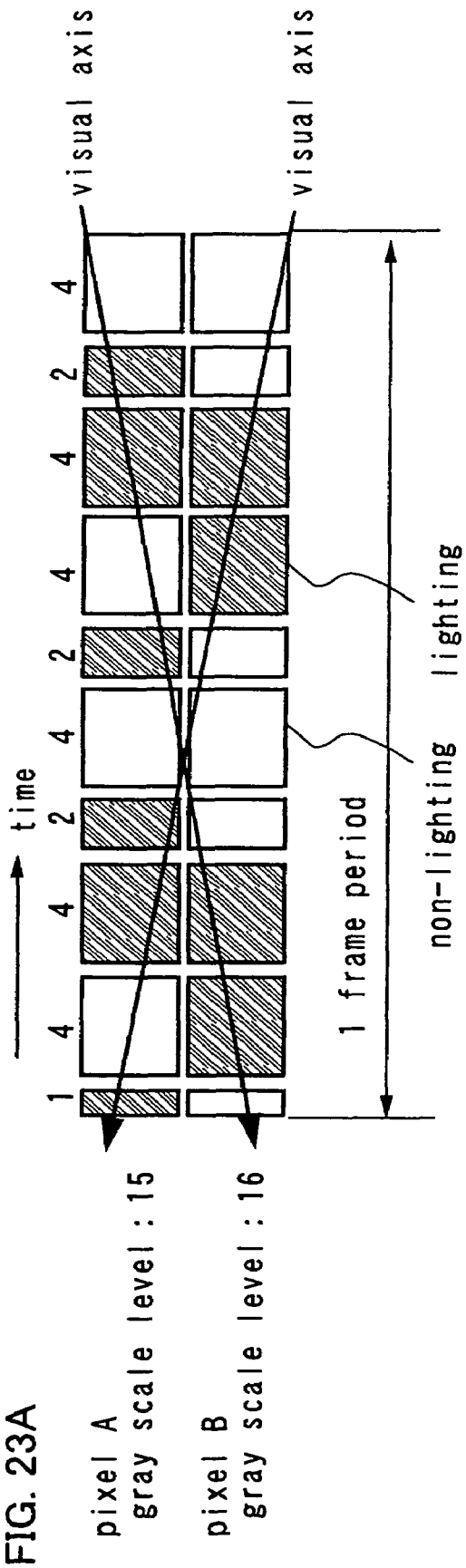
FIGS. 23A and 23B show the reason by which pseudo contours are reduced with the driving method of the invention.
Figure 23B:
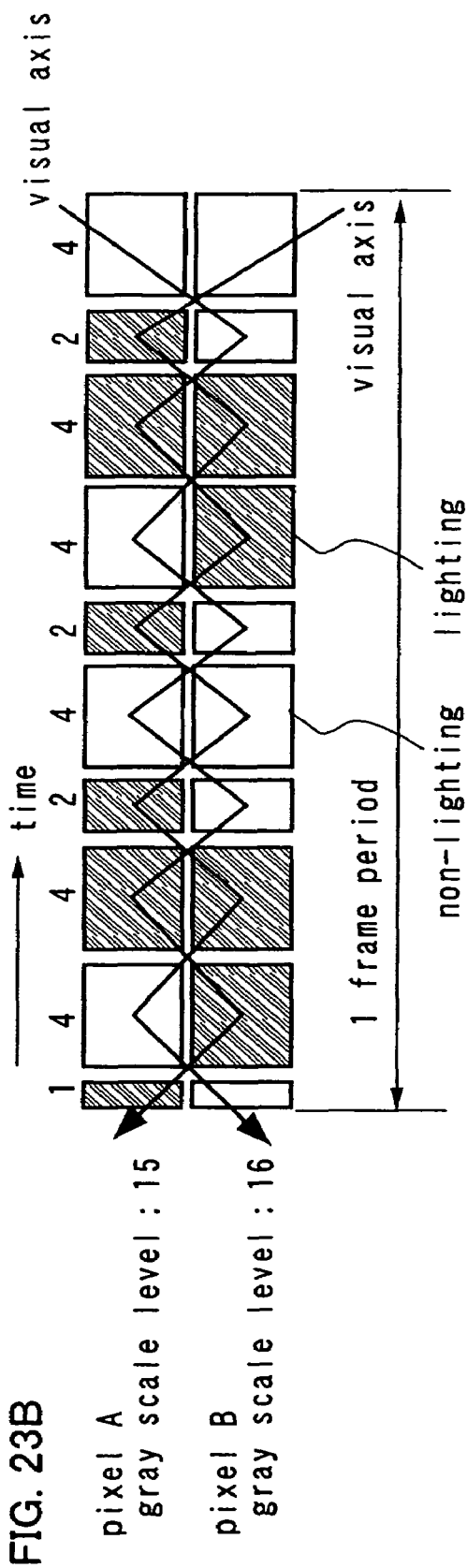

Here, FIGS. 23A and 23B show a case of expressing 5-bit gray scales, where subframes are arranged in such order as SF1, SF4, SF3, SF2, SF5, SF6, SF9, SF8, SF7, and SF10. It is assumed that a gray-scale level of 15 is displayed in a pixel A while a gray-scale level of 16 is displayed in a pixel B. Here, if the visual axis moves, human eyes perceive that the gray-scale level is 15 (=4+4+2+4+1) or 16 (=2+4+2+4+4) sometimes, depending on the movement of the visual axis. FIG. 23A shows this case. It is proved that the gray-scale levels, which are originally supposed to be perceived as 15 and 16, are achieved. Thus, pseudo contours are reduced.

FIG. 23B shows a case where the visual axis moves quickly. Supposing that the visual axis moves quickly, human eyes perceive that the gray-scale level is 15 (=2+4+4+4+1) or 16 (=4+4+2+2+4) sometimes, depending on the movement of the visual axis. This proves that the gray-scale levels, which are originally supposed to be perceived as 15 and 16, are achieved. Thus, pseudo contours are reduced.

In this manner, in the case of interposing subframes corresponding to the bits belonging to the second bit group or the third bit group between any subframes corresponding to the bits belonging to the first bit group, or in the case of exchanging a subframe corresponding to the bit belonging to the first bit group with a subframe corresponding to the bit belonging to the second bit group or the third bit group, the arranging order of all the subframes may be determined in such a manner that the arranging order of the subframes corresponding to the bits belonging to the first bit group are determined first, and then the subframes corresponding to the bits belonging to the second bit group or the third bit group are interposed therebetween.

At this time, the subframes corresponding to the bits belonging to the second bit group or the third bit group may be arranged in order of the increasing lighting periods or in reverse order thereof. Alternatively, such subframes may be arranged starting from the middle subframe to be followed by the other subframes. Further alternatively, the subframes may be arranged totally at random. As a result, human eyes will be subjected to tricks as if the pseudo contours are reduced.

Note that, in the case of interposing subframes corresponding to the bits belonging to the second bit group or the third bit group between subframes corresponding to the bits belonging to the first bit group, the number of subframes to be interposed is not limited.

In addition, the arranging order of all the subframes may be determined in such a manner that the order of subframes corresponding to the bits belonging to the second bit group or the third bit group is determined first and then subframes corresponding to the bits belonging to the first bit group are interposed therebetween.

In this manner, by interposing subframes corresponding to the bits belonging to the second bit group or the third bit group between subframes corresponding to the bits belonging to the first bit group, the subframes can be prevented from being arranged unevenly. As a result, human eyes will be subjected to tricks as if the pseudo contours are reduced.

FIG. 24 shows exemplary patterns of the arranging order of subframes in the case of FIG. 1.

As a first pattern, SF1, SF2, SF3, SF4, SF5, SF6, SF7, SF8, SF9, and SF10 are arranged in this order. In this arrangement of subframes, a subframe having the shortest lighting period is arranged in the first position in each subframe group, and then subframes which do not employ the overlapped time gray scale are arranged in order of the increasing lighting periods. Then, subframes which employ the overlapped time gray scale are arranged in order from the earlier selection timing of lighting pixels.

As a second pattern, SF10, SF9, SF8, SF7, SF6, SF5, SF4, SF3, SF2, and SF1 are arranged in this order. In this arrangement of subframes, a subframe having the longest lighting period is arranged in the first position, and then subframes which employ the overlapped time gray scale method are arranged in order from the later selection timing of lighting pixels. Then, subframes which do not employ the overlapped time gray scale method are arranged in order of the decreasing lighting periods.

As a third pattern, SF1, SF2, SF5, SF4, SF3, SF6, SF7, SF10, SF9, and SF8 are arranged in this order. The third pattern is obtained by, based on the first pattern, arranging SF3, SF4 and SF5, and SF8, SF9 and SF10, which employ the overlapped time gray scale method, in order from the later selection timing of lighting pixels.

As a fourth pattern, SF1, SF2, SF4, SF3, SF5, SF6, SF7, SF9, SF8, and SF10 are arranged in this order. The fourth pattern is obtained by, based on the first pattern, arranging SF3, SF4 and SF5, and SF8, SF9 and SF10, which employ the overlapped time gray scale method, such that the middle subframe is arranged in the first position first, followed by the other subframes.

As a fifth pattern, SF6, SF7, SF8, SF9, SF10, SF1, SF2, SF3, SF4, and SF5 are arranged in this order. The fifth pattern is obtained by, based on the first pattern, exchanging the position of the first subframe group with the second subframe group.

As a sixth pattern, SF1, SF3, SF4, SF2, SF5, SF6, SF8, SF9, SF7, and SF10 are arranged in this order. The sixth pattern is obtained by, based on the first pattern, interposing one of the subframes corresponding to the bits belonging to the second bit group between the subframes corresponding to the bits belonging to the first bit group.

As a seventh pattern, SF2, SF3, SF4, SF1, SF5, SF7, SF8, SF9, SF6, and SF10 are arranged in this order. The seventh pattern is obtained by, based on the first pattern, interposing the subframes corresponding to the bits belonging to the third bit group between the subframes corresponding to the bits belonging to the first bit group.

As an eighth pattern, SF1, SF4, SF3, SF2, SF5, SF6, SF9, SF8, SF7, and SF10 are arranged in this order. The eighth pattern is obtained by, based on the first pattern, exchanging one of the subframes corresponding to the bits belonging to the first bit group with one of the subframes corresponding to the bits belonging to the second bit group.

As a ninth pattern, SF4, SF2, SF3, SF1, SF5, SF9, SF7, SF8, SF6, and SF10 are arranged in this order. The ninth pattern is obtained by, based on the first pattern, exchanging one of the subframes corresponding to the bits belonging to the first bit group with one of the subframes corresponding to the bits belonging to the third bit group.

As a tenth pattern, SF2, SF3, SF1, SF4, SF5, SF7, SF8, SF6, SF9, and SF10 are arranged in this order. The tenth pattern is obtained by, based on the first pattern, interposing the subframes corresponding to the bits belonging to the third bit group between the subframes corresponding to the bits belonging to the first bit group and the subframes corresponding to the bits belonging to the second bit group.

As an eleventh pattern, SF2, SF4, SF3, SF5, SF1, SF7, SF9, SF8, SF10, and SF6 are arranged in this order. The eleventh pattern is obtained by randomly arranging the subframes corresponding to the bits belonging to the first bit group, the second bit group, and the third bit group.

As shown in the exemplary patterns above, it is desirable that in at least one of the plurality of subframe groups, all the subframes corresponding to the bits belonging to the first bit group be selected for lighting pixels, and then all the subframes corresponding to the bits belonging to the second bit group and the third bit group be selected for lighting pixels.

In addition, it is desirable that in at least one of the plurality of subframe groups, all the subframes corresponding to the bits belonging to the second bit group or the third bit group be selected for lighting pixels, and then all the subframes corresponding to the bits belonging to the first bit group be selected for lighting pixels.

In addition, it is desirable that in at least one of the plurality of subframe groups, one of the plurality of subframes corresponding to the bits belonging to the first bit group be selected for lighting pixels, and then one of the plurality of subframes corresponding to the bits belonging to second bit group or the third bit group be selected for lighting pixels, and then another subframe among the plurality of subframes corresponding to the bits belonging to the first bit group be selected for lighting pixels.

In addition, it is desirable that in each of the subframe groups, one of the plurality of subframes corresponding to the bits belonging to the second or the third group be selected for lighting pixels, and then at least one of the plurality of subframes corresponding to the bits belonging to the first bit group be selected for lighting pixels, and then another subframe among the plurality of subframes corresponding to the bits belonging to the second bit group or the third bit group be selected for lighting pixels.

Note that the arranging order of subframes may be changed depending on time. For example, the arranging order of subframes may be changed between the first frame and the second frame. Alternatively, the arranging order of subframes may be changed in each place. For example, the arranging order of subframes may be changed between the pixel A and the pixel B. Further, the arranging order of subframes may be changed by combination of them such that the arranging order of subframes changes depending on both time and place.

Embodiment Mode 2

In Embodiment Mode 1, description is made on the case where one frame is divided into two subframe groups. However, the driving method of the invention enables one frame to be divided into three or more subframe groups. Therefore, this embodiment mode illustrates an example where one frame is divided into three or more subframe groups. Note that the number of subframes is not limited to 2 or 3, and may be appropriately determined.

In the exemplary driving method of this embodiment mode, which uses a conventional time gray scale method, a subframe corresponding to bits belonging to the first bit group is divided into six, a subframe corresponding to bits belonging to the second bit group is divided into three, and a subframe corresponding to bits belonging to the third bit group is not divided. Then, one frame is divided into three subframe groups. The six divided bits belonging to the first bit group are arranged in the three subframe groups two by two, the three divided bits belonging to the second bit group are arranged in the respective subframe groups one by one, and the respective bits belonging to the third bit group are arranged in at least one of the three subframe groups. At this time, the arranging order of the subframes corresponding to the bits belonging to the first bit group and the second bit group are set equal between each subframe group. Note that the bits belonging to the third bit group may be considered that they are not divided or they are once divided into three but then integrated into one subframe again. Note also that the overlapped time gray scale method may be applied to subframes having an equal length of lighting periods in each subframe group, among the subframes corresponding to the bits belonging to the first bit group and the second bit group.

Figure 25:
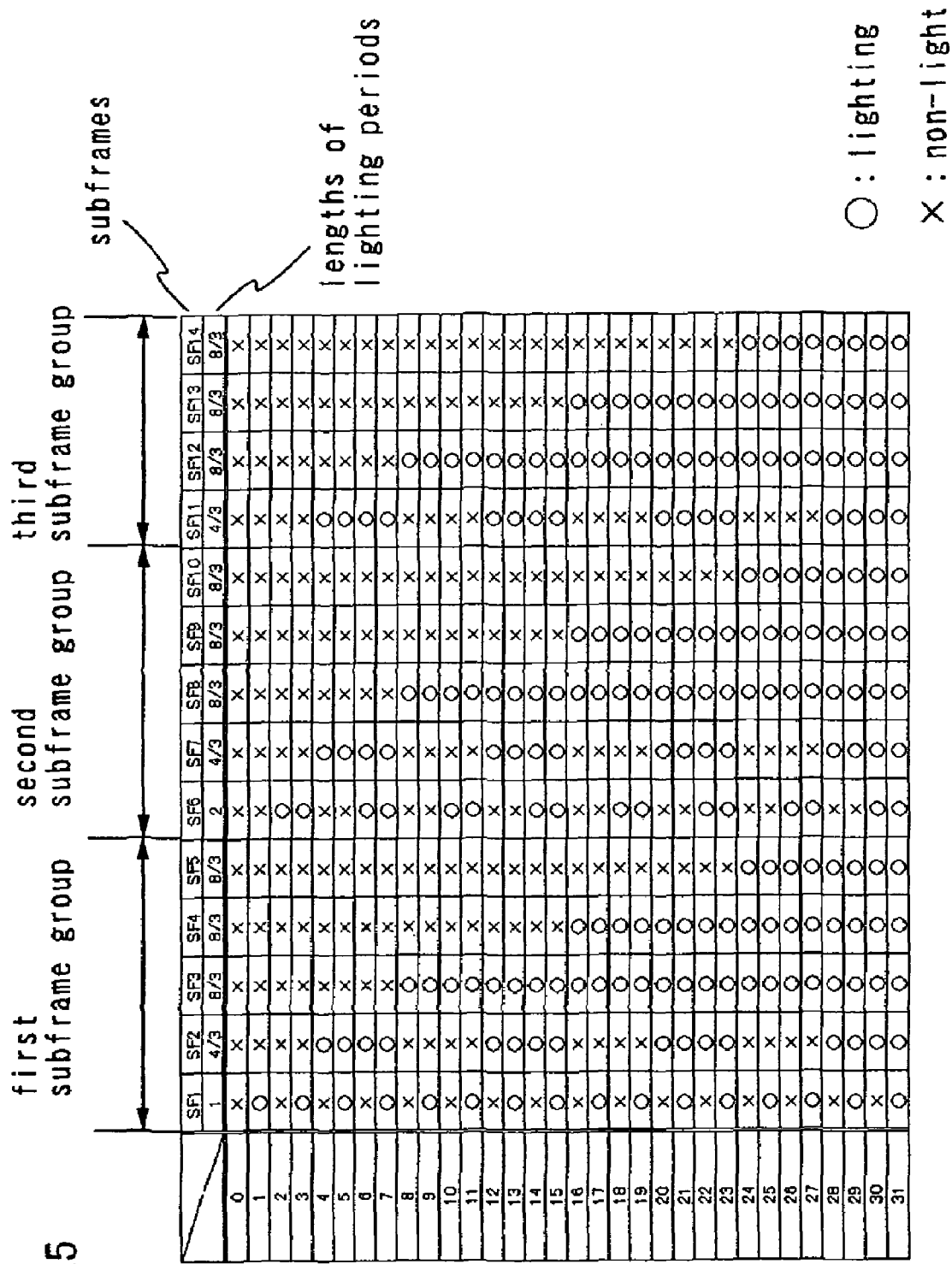
FIG. 25 shows an exemplary selection method of subframes by the driving method of the invention.

For example, FIG. 25 shows an example of displaying 5-bit gray scales. Referring concurrently to the conventional time gray scale method (FIG. 46), FIG. 25 shows an example where one bit is assigned to a first bit group, two bits are assigned to a second bit group, and two bits are assigned to a third bit group. In addition, SF5 is assigned to the bit belonging to the first bit group, SF3 and SF4 are assigned to the bits belonging to the second bit group, and SF1 and SF2 are assigned to the bits belonging to the third bit group. Then, SF5 is equally divided into six, SF3 and SF4 are equally divided into three respectively, and SF1 and SF2 are not divided.

Next, the six divided bits belonging to the first bit group are arranged in the three subframe groups two by two, the three divided bits belonging to the second bit group are arranged in the respective subframe groups one by one, and the bits belonging to the third bit group are arranged in at least one of the three subframe groups. That is, the bits belonging to the first bit group are arranged in SF4, SF5, SF9, SF10, SF13, and SF14 in FIG. 25, the bits belonging to the second bit group are arranged in SF2, SF3, SF7, SF8, SF11, and SF12 in FIG. 25, and the bits belonging to the third bit group are arranged in SF1 and SF6 in FIG. 25. As a result, a total of 14 subframes are obtained, which respectively have lighting periods with the following length: SF1=1, SF2=4/3, SF3=8/3, SF4=8/3, SF5=8/3, SF6=2, SF7=4/3, SF8=8/3, SF9=8/3, SF10=8/3, SF11=4/3, SF12=8/3, SF13=8/3, and SF14=8/3. Since the length of each lighting period in SF3 to SF5, SF8 to SF10, and SF12 to SF14 is all 8/3 in FIG. 25, the overlapped time gray scale method is applied to each of SF3 to SF5, SF8 to SF10, and SF12 to SF14.

By dividing each subframe in this manner, the frame frequency can be substantially increased to be more than three times as large.

Note that the length of a lighting period in each subframe (or the number of lighting operations in a predetermined time, namely, the quantity of weight) is not limited to this. In addition, each subframe is not required to have the corresponding length of the lighting period. Further, the selection method of subframes is not limited to this.

Note also that although the subframes corresponding to the bits belonging to the third bit group are not divided in this embodiment mode, they may be divided into a less number than the total number of the subframe groups.

Figure 26:
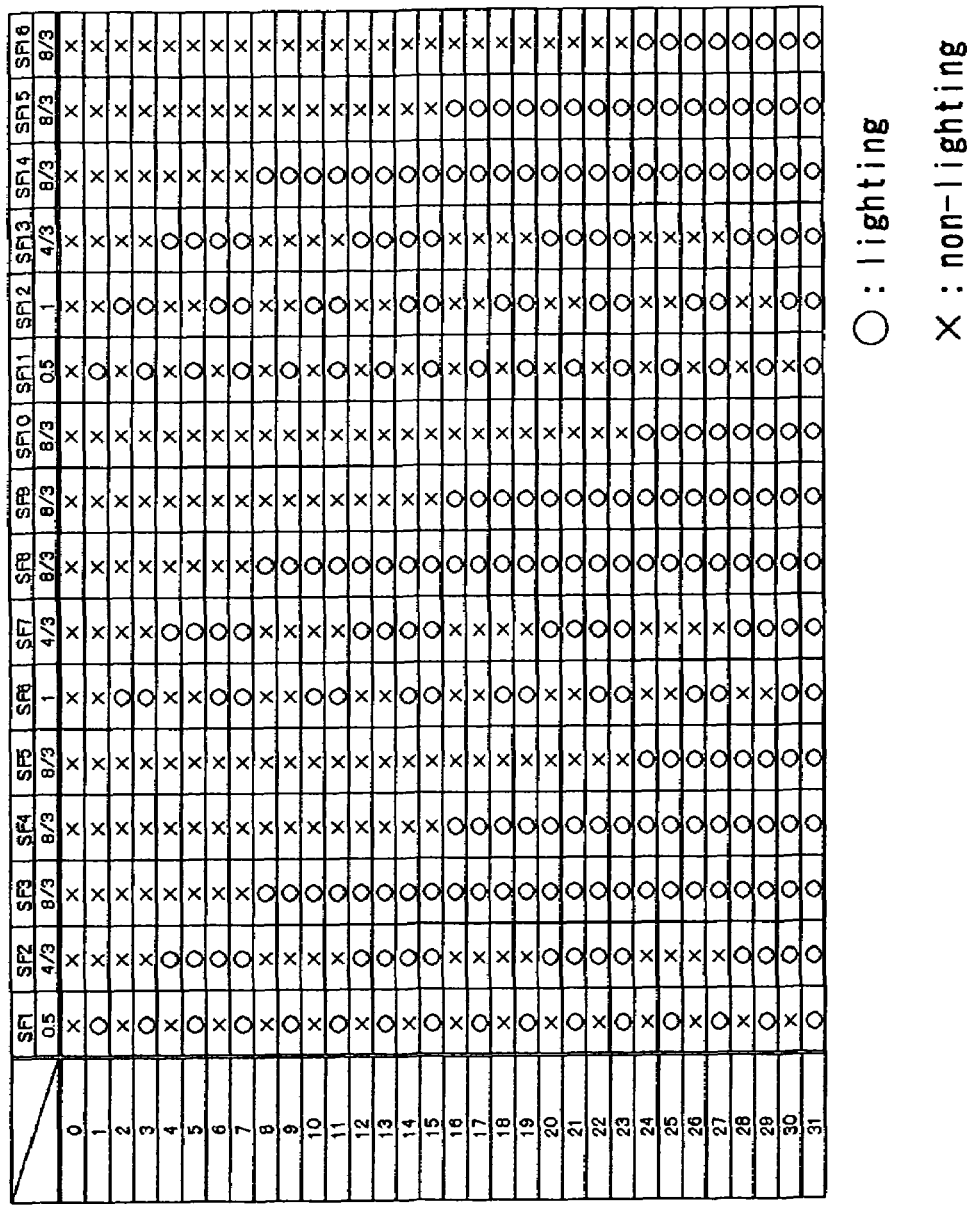
FIG. 26 shows an exemplary selection method of subframes by the driving method of the invention.

For example, FIG. 26 shows an example where SF1 and SF6, which are assigned to the bits belonging to the third bit group in FIG. 25, are further divided into two respectively. In FIG. 26, SF1 and SF6 in FIG. 25 are further divided into two respectively, which are arranged in SF1, SF6, SF11, and SF12 in FIG. 26. As a result, a total of 16 subframes are obtained, which respectively have lighting periods with the following length: SF1=0.5, SF2=4/3, SF3=8/3, SF4=8/3, SF5=8/3, SF6=1, SF7=4/3, SF8=8/3, SF9=8/3, SF10=8/3, SF11=0.5, SF12=1, SF13=4/3, SF14=8/3, SF15=8/3, and SF16=8/3. Since the length of each lighting period in SF3 to SF5, SF8 to SF10, and SF14 to SF16 is all 8/3 in FIG. 26, the overlapped time gray scale method is applied to each of SF3 to SF5, SF8 to SF10, and SF14 to SF16. Note that subframe groups in which the divided bits belonging to the third bit group are arranged are not limited to these.

Note that in this embodiment mode, the number of bits to be assigned to each bit group is not limited to the examples described heretofore. However, it is preferable that at least one bit be assigned to each of the first bit group and the second bit group.

Although the most significant bit is selected as the bit belonging to the first bit group in this embodiment mode, the bit belonging to the first bit group is not limited to this and any bit may be selected as the bit belonging to the first bit group. Similarly, any bit may be selected as the bit belonging to the second bit group or the third bit group.

Although this embodiment mode illustrates an example where the subframe corresponding to the bit belonging to the first bit group is divided into six, the division number of the subframe corresponding to the bit belonging to the first bit group is not limited to this. For example, the subframe corresponding to the bit belonging to the first bit group may be divided into five and arranged in the three subframe groups in a ratio of 2:2:1. Note that the subframe corresponding to the bit belonging to the first bit group is desirably divided into multiples of the total number of subframe groups. That is, when the total number of subframe groups is three, the subframe corresponding to the bit belonging to the first bit group is desirably divided into (3×m) (m is an integer, where m=2). This is because the divided bits corresponding to the bit belonging to the first bit group can be arranged in the respective subframe groups in equal ratio, thereby flickers and pseudo contours can be prevented. For example, a subframe corresponding to the bit belonging to the first bit group may be divided into nine. However, the invention is not limited to such number.

Note that although this embodiment mode illustrates an example of using the conventional time gray scale method, where all the subframes corresponding to the bits belonging to the first bit group are divided into six, not all the subframes corresponding to the bits belonging to the first bit group are required to be divided into equal number to each other. That is, the division number of each subframe may be different in the first bit group. Similarly, as for the bits belonging to the third bit group, not all the subframes corresponding to the bits belonging to the third bit group are required to be divided into equal number to each other.

Note also that although this embodiment mode illustrates an example of using the conventional time gray scale method, where the subframe corresponding to the bit belonging to the first bit group is equally divided into six, and the subframe corresponding to the bit belonging to the second bit group is equally divided into three, the invention is not limited to such numbers. In addition, the subframe is not necessarily divided to have an equal width. For example, referring concurrently to the conventional time gray scale method (FIG. 46), in the case of displaying 5-bit gray scales, the subframe (SF5) corresponding to the bit belonging to the first bit group (having a length of 16) may be divided into six, which respectively have lighting periods as long as 2, 2, 4, 2, 3, and 3.

The arranging order of subframes corresponding to the bits belonging to the first bit group and the second bit group is equal among the three subframe groups in this embodiment mode. However, the arranging order of subframes is not requited to be completely equal. Several subframes may be arranged in different order in each of the three subframe groups. For example, in the case of FIG. 25, SF7 and SF8 may be exchanged with each other as well as SF11 and SF12. That is, the subframes may be arranged in such order as SF1, SF2, SF3, SF4, SF5, SF6, SF8, SF7, SF9, SF10, SF12, SF11, SF13, and SF14.

Note that the descriptions made heretofore may be combined with each other, such as the number of bits to be assigned to each bit group, a bit to be selected as the bit belonging to each bit group, the division number of the bits belonging to the first bit group and the third bit group respectively, the division width of each subframe, and the arranging order of subframes.

Note also that the descriptions made heretofore on the number of bits to be assigned to each bit group, a bit to be selected as the bit belonging each bit group, the division number of the bits belonging to the first bit group and the third bit group respectively, the division width of each subframe, and the arranging order of subframes may be applied to the case where the number of subframe groups is three or more.

Now, considered is a general case where one frame is divided into k (k is an integer, where k=3) subframe groups. In this case, with the conventional time gray scale method, a subframe corresponding to a bit belonging to a first bit group is divided into (k+1) or more, a subframe corresponding to a bit belonging to a second bit group is divided into k, and a subframe corresponding to a bit belonging to a third bit group is divided into (k−1) or less or not divided. Then, the divided bits belonging to the first bit group are arranged in the k subframe groups in roughly equal ratio. The divided bits belonging to the second bit group are arranged in the respective subframe groups one by one; and the respective bits belonging to the third bit group are arranged in at least one of the k subframe groups. At this time, the arranging order of subframes corresponding to the bits belonging to the first bit group and the second bit group are set about equal between each of the k subframe groups.

At this time, in the case of expressing gray scales with n bits (n is an integer), a total of n subframes are required in the conventional time gray scale method. In addition, a lighting period in the subframe corresponding to the most significant bit is as long as $2^{n-1}$. Meanwhile, when assuming in the conventional time gray scale method that the number of bits belonging to the first bit group, which are to be divided into $L_1$ ($L_1$ is an integer, where $L_1$=k+1), is a (a is an integer, where 0<a<n), the number of bits belonging to the second bit group, which are to be divided into k, is b (b is an integer, where 0<b<n), and the number of bits belonging to the third bit group, which are to be divided into $L_2$ ($L_2$ is an integer, where 1<$L_2$=k−1) or to be undivided, is c (c is an integer, where 0=c<n, and a+b+c=n), the total number of subframes in using the driving method of the invention is ($L_1$×a+k×b+$L_2$×c). In addition, in the case where the most significant bit is selected as the bit belonging to the first bit group, and a subframe corresponding to this bit is equally divided into $L_1$, each lighting period of the $L_1$ subframes corresponding to this bit is as long as ($2^{n-1}/L_1$). For example, in the case of FIG. 25, since k=3, n=5, $L_1$=6, $L_2$=1, a=1, b=2, and c=2, the total number of subframes is 14 (=6×1+3×2+1×2), and each lighting period of the subframes after divided, which correspond to the bit belonging to the first bit group, is as long as $2^{5-1}/6$=8/3.

Note that the description in this embodiment mode corresponds to the case where Embodiment Mode 1 is applied to the other number of subframe groups. Therefore, this embodiment mode can be freely implemented in combination with Embodiment Mode 1.

Embodiment Mode 3

In this embodiment mode, description is made on an exemplary timing chart. In this specification, timing chart means a time-series chart which shows the selection state of pixels in one frame period. Although the selection method of subframes in FIG. 1 is used as an example here, the invention is not limited to this. Thus, the invention can be easily applied to other selection methods of subframes, the other number of gray scales, and the like.

In addition, although the subframes are arranged in order from SF1, SF2, SF3, SF4, SF5, SF6, SF7, SF8, FS9, and SF10 as an example, the invention is not limited to this and can be applied to other arranging order as well.

In the timing chart, the horizontal axis indicates the time, and time passes in the right direction. In addition, the vertical axis indicates the row number of pixels which are arranged in matrix. In this embodiment mode, pixels in one row are addressed ("to address" means to write a luminance signal into a pixel circuit having a memory function) at the same time (line sequential driving). In the case of performing the line sequential driving, addressing of one image is completed by sequentially selecting pixels from the first row to the last row and writing a desired signal voltage to each pixel in each selection period. In the timing chart, a period in which the aforementioned addressing is performed is indicated by slanting lines inside the rectangles. With such a timing chart, changes of the selected rows can be expressed in time sequence. In addition, a period in which one image is addressed is to be called an address period or a signal writing period.

Figure 27:
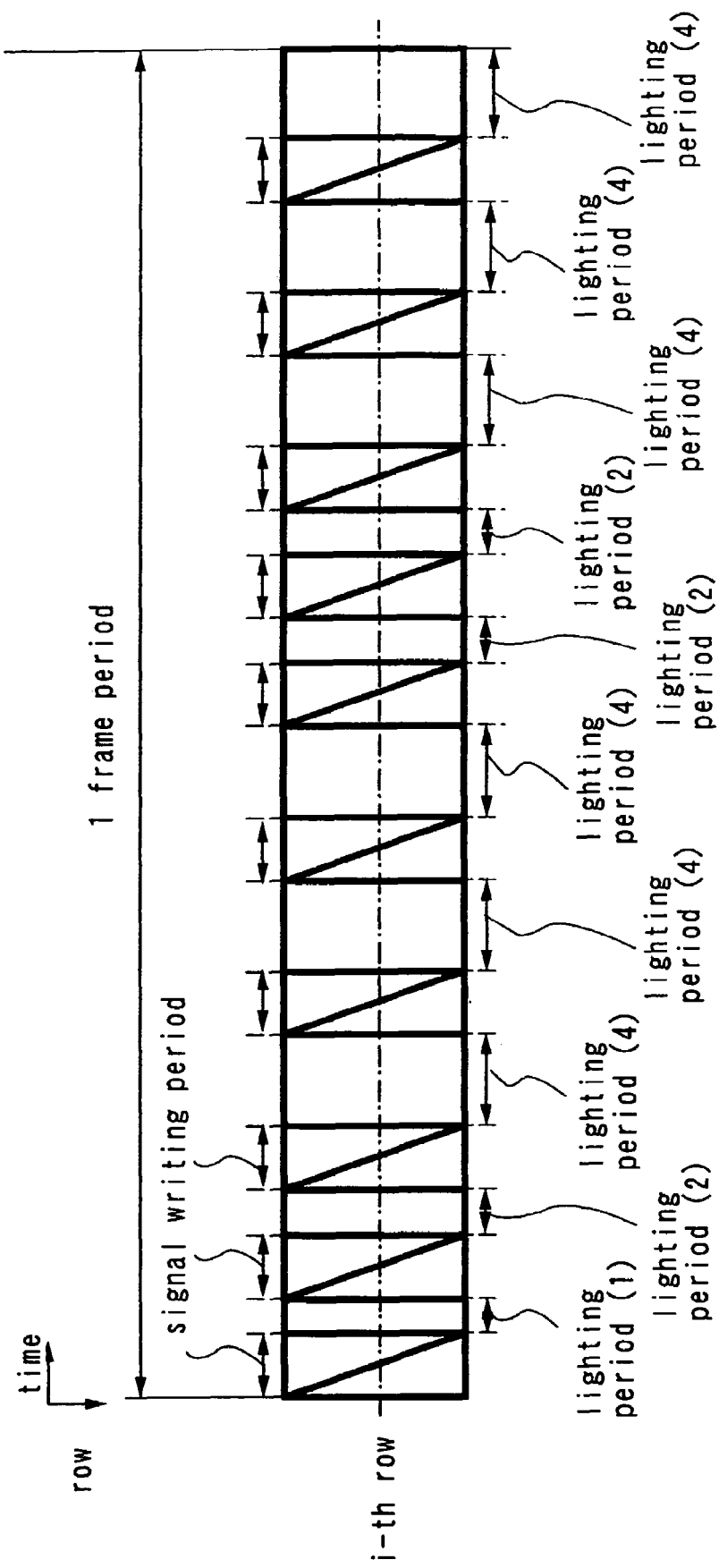
FIG. 27 shows an exemplary timing chart in the case where signal writing periods and lighting periods of pixels are separately provided.

First, FIG. 27 shows a timing chart in the case where address periods and lighting periods are separately provided. In a first address period, a signal of a subframe 1 is written into pixels. In this period, the pixels are not lighted. When the address period terminates, a lighting period starts to light the pixels. The lighting period at this time has a length of 1. Next, a second address period starts, and a signal of a subframe 2 is written into pixels. In this period, the pixels are not lighted. When the address period terminates, a lighting period starts to light the pixels. The lighting period at this time has a length of 2.

By repeating such operations, the lighting periods are arranged in the following order of length: 1, 2, 4, 4, 4, 2, 2, 4, 4, and 4, which constitute one frame.

Figure 28:
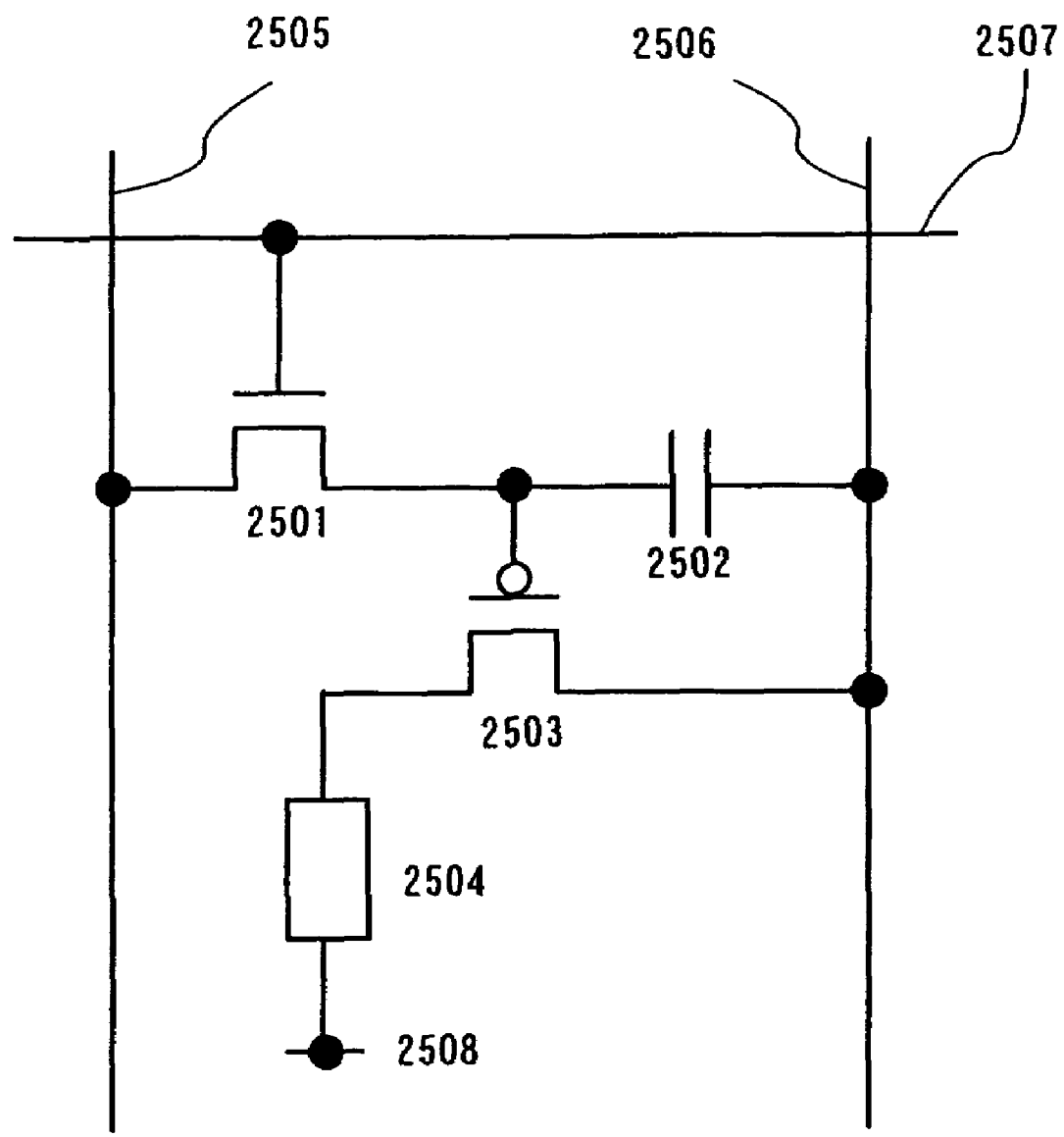
FIG. 28 shows an exemplary pixel configuration in the case where signal writing periods and lighting periods of pixels are separately provided.

FIG. 28 shows a pixel configuration of this embodiment mode, where one pixel includes two transistors and one holding capacitor. A pixel shown in FIG. 28 includes a first transistor 2501, a second transistor 2503, a holding capacitor 2502, a display element 2504, a signal line 2505, a gate line 2507, a first power supply line 2506, and a second power supply line 2508.

A gate electrode of the first transistor 2501 is connected to the gate line 2507, a first electrode thereof is connected to the signal line 2505, and a second electrode thereof is connected to a second electrode of the holding capacitor 2502 and a gate electrode of the second transistor 2503. A first electrode of the second transistor 2503 is connected to the first power supply line 2506, and a second electrode thereof is connected to a first electrode of the display element 2504. A first electrode of the holding capacitor 2502 is connected to the first power supply line 2506. A second electrode of the display element 2504 is connected to the second power supply line 2508.

Note that the first transistor 2501 functions as a switch for connecting the signal line 2505 to the second electrode of the holding capacitor 2502 in order to input into the holding capacitor 2502 a signal which is inputted to the signal line 2505. Since the first transistor 2501 can select the pixel to be in a signal writing state (selection state) or a holding state, the first transistor 2501 functions as a selection transistor.

Note that the second transistor 2503 has a function to supply a current to the display element 2504. Thus, the second transistor 2503 functions as a driving transistor.

Note also that the holding transistor 2502 has a function to hold a source-gate voltage of the second transistor 2503 when the pixel is in a holding state, and to keep the constant luminance of the display element 2504 until the next address period.

Next, the operation of the pixel configuration shown in FIG. 28 is described. First, in a signal writing period, a potential of the gate line 2507 is set higher than the highest potential of the signal line 2505 or a potential of the first power supply line 2506 to select the gate line 2507, so that the first transistor 2501 is turned on and a signal is inputted from the signal line 2505 to the holding capacitor 2502.

Note that in the signal writing period, potentials of the first power supply line 2506 and the second power supply line 2508 are controlled so as not to apply voltage to the display element 2504. For example, the second power supply line 2508 may be set in a floating state. Alternatively, the potential of the second power supply line 2508 may be set about equal to or higher than the potential of the first power supply line

2506. Accordingly, the display element 2504 can be prevented from being lighted in the signal writing period.

Next, in a lighting period, potentials of the first power supply line 2506 and the second power supply line 2508 are controlled so as to apply a voltage to the display element 2504. For example, the potential of the second power supply line 2508 may be set lower than the potential of the first power supply line 2506. Accordingly, a current flowing in the second transistor 2503 is controlled in accordance with the signal which has been held in the holding capacitor 2502 in the signal writing period, so that a current flows from the first power supply line 2506 to the second power supply line 2508 through the display element 2504. As a result, the display element 2504 emits light.

The operation of the first transistor 2501 is described in detail below. Note that all transistors in this specification are assumed as enhancement mode transistors. However, the invention is not limited to these.

The state of the first transistor 2501 is determined by a potential relationship between the gate line 2507 and the signal line 2505. Since the first transistor 2501 is a simple switch, it is preferably operated in the linear region. Since the first transistor 2501 is an n-channel transistor, it operates in the linear region if the potential of the gate line 2507 at the time when the first transistor 2501 is on is higher than the highest potential of the signal line 2505 by the amount of the threshold voltage of the first transistor 2501 or more. A potential of the gate line 2507 at the time when the first transistor is off may be about equal to the lowest potential of the signal line 2505 or lower than that by a certain degree. When the potential of the gate line 2507 at the time when the first transistor 2507 is off is set lower than the lowest potential of the signal line 2505 by a certain degree, a leakage current value of the first transistor 2501 in off state can be reduced, which is preferable in that a potential fluctuation of the holding capacitor 2502 in a holding state can be suppressed.

The operation of the second transistor 2503 is described below in detail. With the condition that the potential of the second power supply line 2508 is set lower than that of the first power supply line 2506, a source-gate voltage (Vgs) of the second transistor 2503 is determined by the potential of the first power supply line 2506 and a gate voltage of the second transistor 2503 to which a potential of the signal line 2505 is written. In addition, a source-drain voltage (Vds) of the second transistor 2503 is determined by a potential of the first power supply line 2506 and a potential of a pixel electrode 2509. The potential of the pixel electrode 2509 is determined by the characteristics of the second transistor 2503 and the display element 2504, and potentials of the first power supply line 2506 and the second power supply line 2508. That is, the state of the second transistor 2503 is determined by potentials of the signal line 2505, the first power supply line 2506, and the second power supply line 2508, and the characteristics of the display element 2504 and the second transistor 2503.

If the second transistor 2503 operates in the saturation region while the display element 2504 emits light, there are the following advantages. First of all, even if Vds fluctuates, the current supplied to the second transistor 2503 does not change. Therefore, even if potentials supplied to each pixel vary due to the wiring resistance of the power supply line, and Vds varies, luminance does not vary. Further, even if Vds changes resulting from the characteristic change of the display element 2504, the current flowing in the second transistor 2503 does not change, and thus a constant current can be supplied to the display element. That is, stable display which is insensitive to changes in Vds can be obtained.

If the second transistor 2503 operates in the linear region while the display element 2504 emits light, there are the following advantages. First of all, since the second transistor 2503 is used as just a switch, variations of the second transistor 2503 between each pixel can be disregarded. As a result, uniform and clear display can be provided. Further, since few voltage is applied to the second transistor 2503, almost all the voltages between the first power supply line 2506 and the second power supply line 2508 are applied to opposite electrodes of the display element. As a result, a voltage applied to the display element can be set low, and thus power consumption as a display device can be suppressed.

The description above is made based on FIG. 28 with the assumption that the first transistor 2501 is an n-channel transistor and a second transistor 2503 is a p-channel transistor. However, the conductivity of the transistors is not limited, and the first transistor 2501 may be a p-channel transistor and the second transistor 2503 may be an n-channel transistor Alternatively, both of the transistors may be p-channel transistors or n-channel transistors. Voltage of each signal line and power supply line may be set so as to obtain the aforementioned operating state of each transistor. For example, in the case where a p-channel transistor is used as the first transistor 2501, a potential of the gate line 2507 at the time when the first transistor 2501 is on may be set lower than the lowest potential of the signal line 2505 by the amount of the threshold voltage of the first transistor or more, while a potential of the gate line 2507 at the time when the first transistor 2501 is off may be set about equal to the highest potential of the signal line 2505 or higher than the potential by a certain degree. Meanwhile, in the case where an n-channel transistor is used as the second transistor 2503, potentials of the signal line 2505 and the power supply lines may be set to operate the second transistor in the desired operating region with the condition that the second power supply line 2508 has a higher potential than the first power supply line 2506.

The aforementioned driving method in which address periods and lighting periods are separately provided can be preferably applied to a plasma display. Note that in the case of using the driving method for a plasma display, an initialization operation or the like is required. However, such an operation is omitted in FIG. 27 for simplicity of description.

Furthermore, the driving method can be preferably applied to an EL display (an organic EL display, an inorganic EL display, a display including an element containing both an organic material and an inorganic material, or the like), a field emission display, a display using a digital micromirror device (DMD), or the like.

Figure 29:
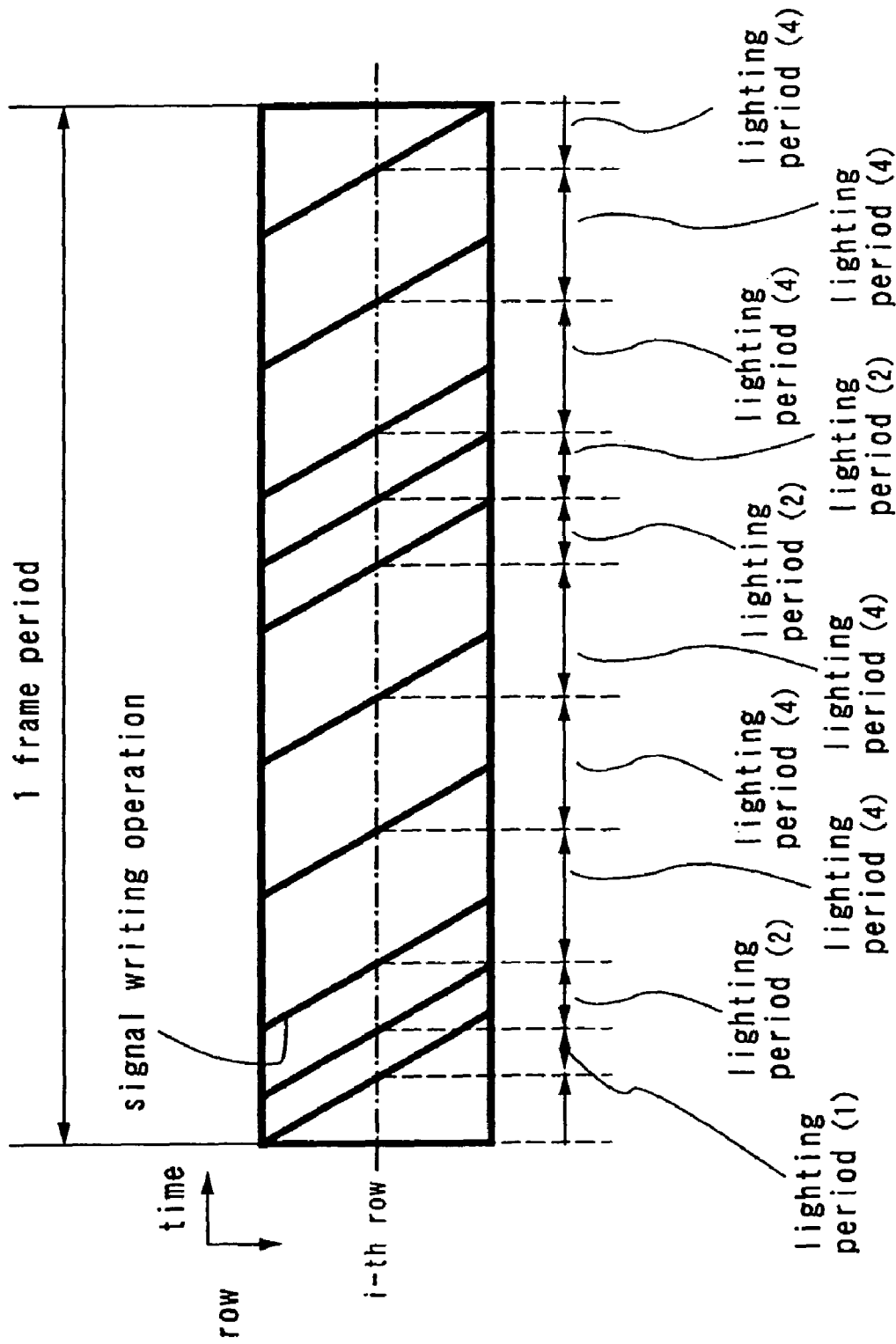
FIG. 29 shows an exemplary timing chart in the case where signal writing periods and lighting periods of pixels are not separated from each other.

Next, FIG. 29 shows a timing chart in the case where address periods and lighting periods are not separated from each other. Upon starting a signal writing operation in each row, a lighting period starts.

When signal writing is completed and a predetermined lighting period has terminated in a certain row, signal writing of a subsequent subframe starts. By repeating such operations, lighting periods are arranged in the following order of length: 1, 2, 4, 4, 2, 2, 4, 4, and 4.

In the case where address periods and lighting periods are not separated from each other, pixels can continue to be lighted even in the address periods; therefore, potentials of the first power supply line 2506 and the second power supply line 2508 are not required to be changed between each address period and lighting period, and thus the potentials may be constant. If the potentials are constant, power is not consumed for charging/discharging a capacitive load, which would be required in the case of changing potentials, thus the overall power consumption can be suppressed. Further, since there is no electromagnetic noise generated due to fluctuation of potentials, high reliability can be achieved. Note that the potentials are not required to be constant. For example, the potentials of the first power supply line 2506 and the second power supply line 2508 may be appropriately changed in one frame in order to control the luminance of the display element to express gray scales.

In the case where address periods and lighting periods are not separated from each other, a lighting period of each subframe is controlled by starting a subsequent address period instead of controlling the length of a lighting period, using potentials of the first power supply line 2506 and the second power supply line 2508. In order to achieve such a function, a pixel configuration as shown in FIG. 30 is considered, for example.

Figure 30:
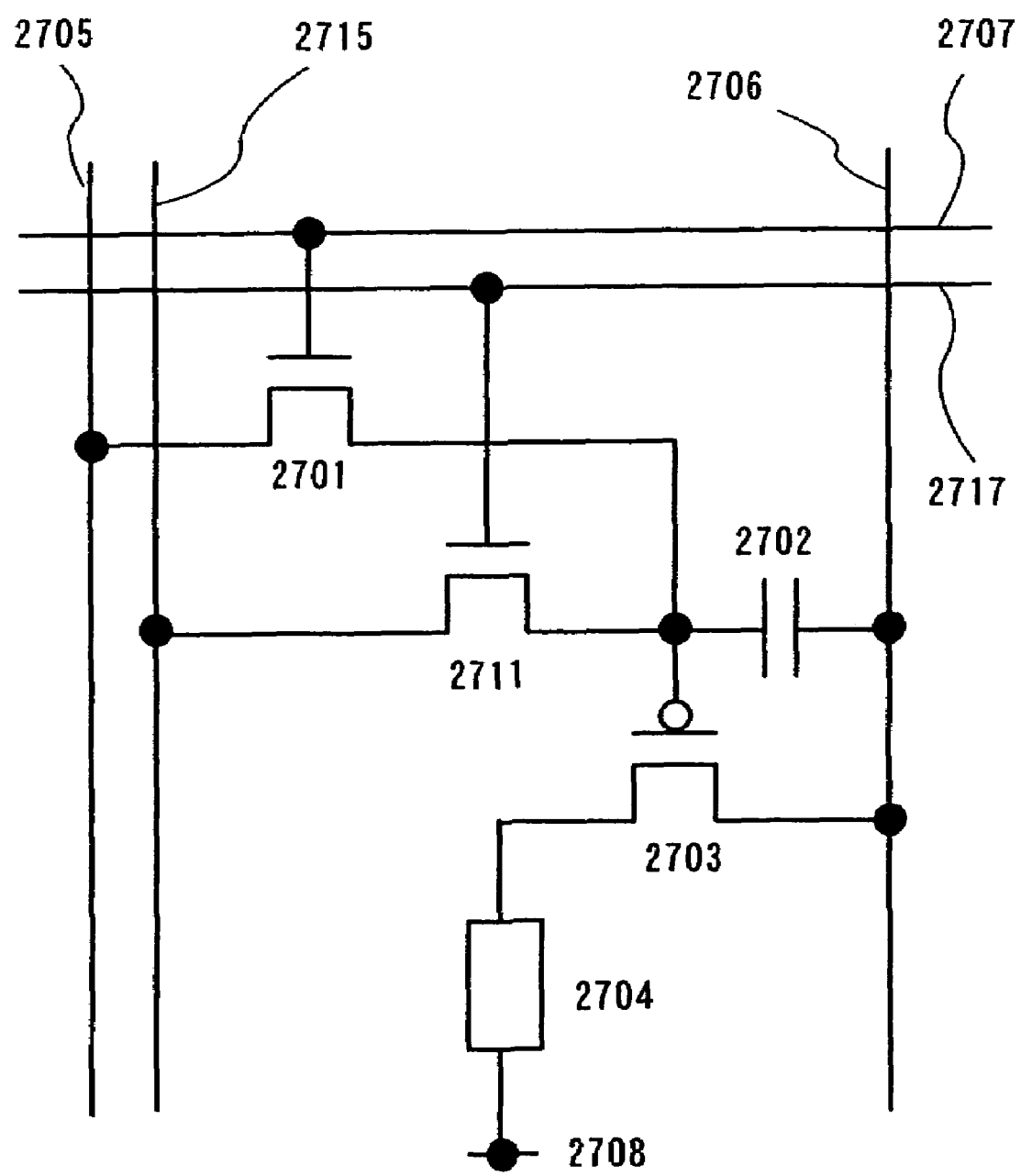
FIG. 30 shows an exemplary pixel configuration in the case where signal writing periods and lighting periods of pixels are not separated from each other.

FIG. 30 shows a pixel configuration where address periods and lighting periods are not separated from each other. A pixel shown in FIG. 30 includes a first transistor 2701, a second transistor 2711, a third transistor 2703, a holding capacitor 2702, a display element 2704, a first signal line 2705, a second signal line 2715, a first gate line 2707, a second gate line 2717, a first power supply line 2706, and a second power supply line 2708.

A gate electrode of the first transistor 2701 is connected to the first gate line 2707, a first electrode thereof is connected to the first signal line 2705, and a second electrode thereof is connected to a second electrode of the holding capacitor 2702, a second electrode of the second transistor 2711, and a gate electrode of the third transistor 2703. A gate electrode of the second transistor 2711 is connected to the second gate line 2717, and a first electrode thereof is connected to the second signal line 2715. A first electrode of the third transistor 2703 is connected to the first power supply line 2706, and a second electrode thereof is connected to a first electrode of the display element 2704. A first electrode of the holding capacitor 2702 is connected to the first power supply line 2706. A second electrode of the display element 2704 is connected to the second power supply line 2708.

Note that the first transistor 2701 functions as a switch for connecting the first signal line 2705 to the second electrode of the holding capacitor 2702 in order to input into the holding capacitor 2702 a signal which is inputted to the first signal line 2705.

Note also that the second transistor 2711 functions as a switch for connecting the second signal line 2715 to the second electrode of the holding capacitor 2702 in order to input into the holding capacitor 2702 a signal which is input from the second signal line 2715.

Since the pixel can be selected to be in a selection state or a holding state by the first transistor 2701 and the second transistor 2711, the first transistor 2701 and the second transistor 2711 function as selection transistors.

Note that the third transistor 2703 has a function to supply a current to the display element 2704. Thus, the third transistor 2703 functions as a driving transistor.

Note also that the holding capacitor 2702 has a function to hold a source-gate voltage of the third transistor 2703 when the pixel is in the holding state, and to keep the constant luminance of the display element 2704 until the next address period.

Next, the operation of the pixel configuration shown in FIG. 30 is described. First, a first signal writing operation starts. A potential of the first gate line 2707 is set higher than the highest potential of the first signal line 2705 or a potential of the first power supply line 2706 to select the first gate line 2707, so that the first transistor 2701 is turned on and a signal is inputted from the first signal line 2705 to the holding capacitor 2702. Accordingly, a current of the third transistor 2703 is controlled in accordance with the signal which has been held in the holding capacitor 2702, so that a current flows from the first power supply line 2706 to the second power supply line 2708 through the display element 2704. As a result, the display element 2704 emits light.

After a predetermined lighting period has terminated, a signal writing operation in a subsequent subframe (a second signal writing operation) starts. By setting a potential of the second gate line 2717 to be higher than the highest potential of the second signal line 2715 or a potential of the first power supply line 2706 to select the second gate line 2717, the second transistor 2711 is turned on and a signal is inputted from the second signal line 2715 to the holding capacitor 2702. Accordingly, a current of the third transistor 2703 is controlled in accordance with the signal which has been held in the holding capacitor 2702, so that a current flows from the first power supply line 2706 to the second power supply line 2708 through the display element 2704. As a result, the display element 2704 emits light.

The operation of the first transistor 2701 and the second transistor 2711 is described in detail below.

The state of the first transistor 2701 is determined by a potential relationship between the first gate line 2707 and the first signal line 2705. Since the first transistor 2701 is a simple switch, it is preferably operated in the linear region. Since the first transistor 2701 is an n-channel transistor, it operates in the linear region if the potential of the first gate line 2707 at the time when the first transistor 2701 is on is higher than the highest potential of the first signal line 2505 by the amount of the threshold voltage of the first transistor 2701 or more. A potential of the first gate line 2707 at the time when the first transistor 2701 is off may be about equal to the lowest potential of the first signal line 2705 or lower than that by a certain degree. When the potential of the first gate line 2707 at the time when the first transistor 1701 is off is set lower than the lowest potential of the first signal line 2705 by a certain degree, a leakage current value of the first transistor 2701 in off state can be reduced, which is preferable in that a potential fluctuation of the holding capacitor 2702 in a holding state can be suppressed.

The second transistor 2711 is operated similarly to the first transistor 2701 although it is different from the first transistor 2701 in that a source or drain region thereof is connected to the second signal line 2715, while a gate electrode thereof is connected to the second gate line 2717.

The first gate line 2707 and the second gate line 2717 can be controlled independently of each other. Similarly, the first signal line 2705 and the second signal line 2715 can be controlled independently of each other. Thus, since signals can be inputted to pixels in two rows at the same time, the driving method as shown in FIG. 29 can be performed.

Note that although an example shown herein employs two selection transistors in one pixel, the number of selection transistors and the number of signal lines connected thereto are not limited in this embodiment mode. With a larger number of selection transistors and a larger number of signal lines connected thereto, the number of pixels to be addressed at the same time can be increased; therefore, a subframe having a shorter lighting period than an address period can be set. As a result, a larger number of gray scales can be expressed, and thus an image with higher quality can be displayed.

Figure 58:
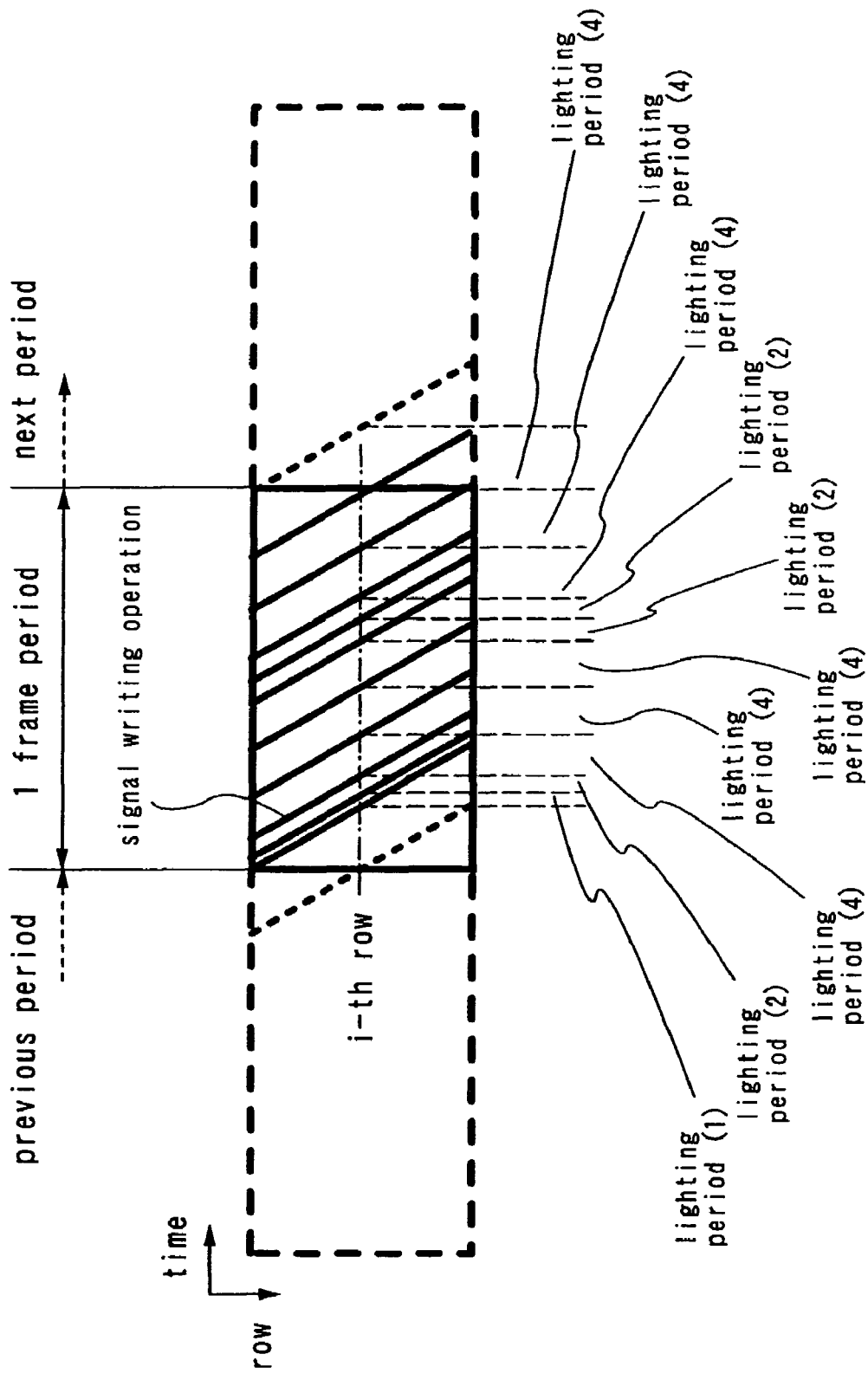
FIG. 58 shows a timing chart of the driving method of the invention.

For example, FIG. 58 shows a timing chart in the case of providing four selection transistors and four signal lines connected thereto. Comparing the timing chart in FIG. 58 with the timing chart in FIG. 29 which shows the case of providing two selection transistors and two signal lines connected thereto, the ratio of lighting periods of subframes, the arranging order of the subframes, and the time required for one address operation (length indicated in the horizontal axis by the width of slanting lines which shows the selection state of pixels) are the same, whereas the length of time required for one frame can be suppressed in the timing chart in FIG. 58. This is because the length of one subframe relatively to the time required for address operation can be shortened with the increased number of gate lines which can be selected at the same time. That is, provided that one frame has the same length, a larger number of gray scales can be expressed and an image with higher quality can be displayed in the timing chart in FIG. 59.

Such a driving method can be preferably applied to a plasma display. Note that in the case of using the driving method for a plasma display, an initialization operation or the like is required. However, such an operation is omitted in FIG. 58 for simplicity of description.

Furthermore, the driving method can be preferably applied to an EL display, a field emission display, a display using a digital micromirror device (DMD), or the like.

Figure 31:
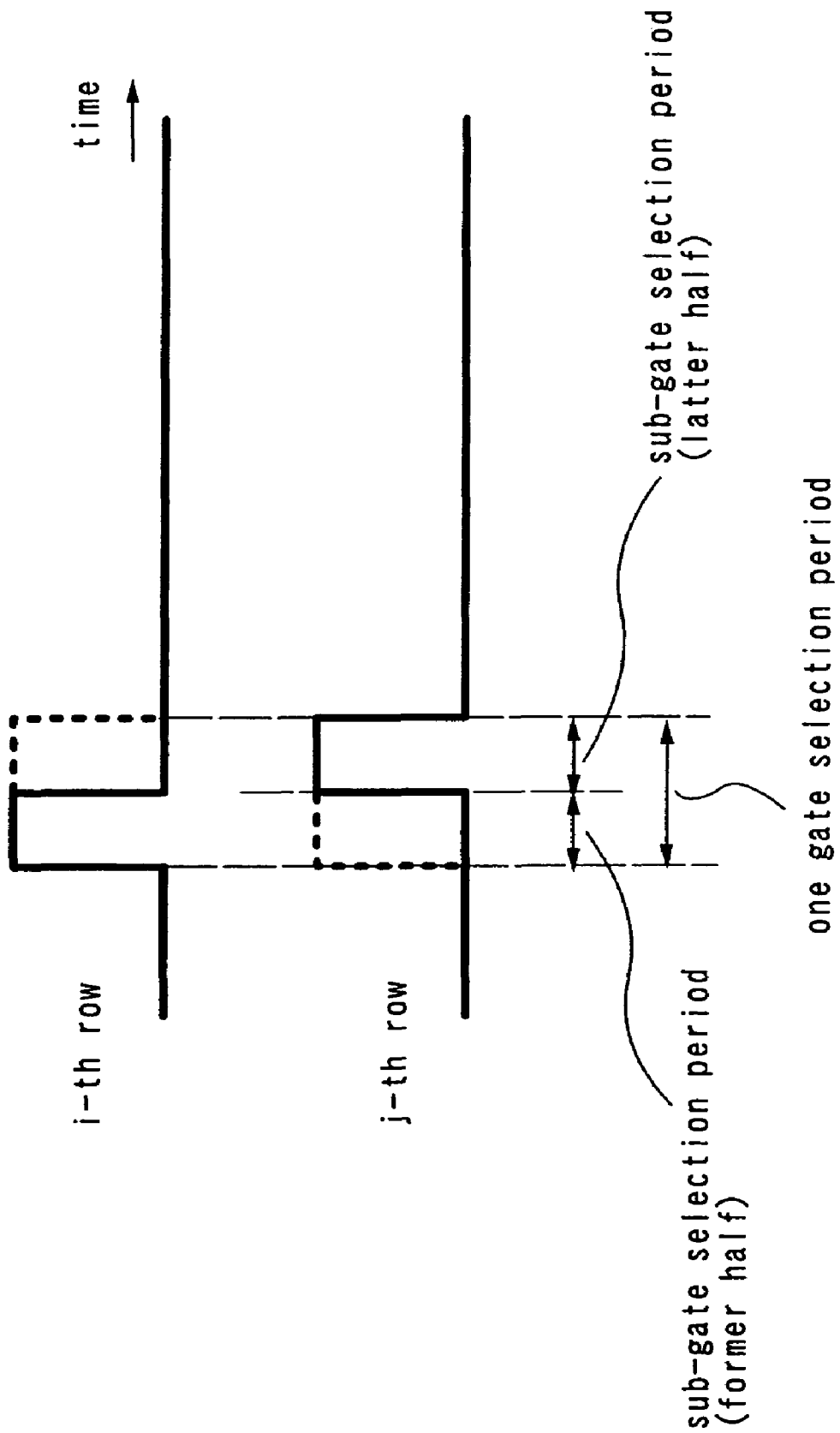
FIG. 31 shows exemplary signal waveforms of gate signal lines for selecting two rows in one gate selection period.

Note that the driving method as shown in FIG. 29 can be performed by using the circuit shown in FIG. 28. FIG. 31 shows signal waveforms of gate lines. As shown in FIG. 31, one gate selection period is divided into two. Each gate line is selected by being set at a high potential in each of the divided selection periods, so that a signal corresponding to the period is inputted to the first signal line 2705. For example, in a certain gate selection period, an i-th row is selected in the first half of the period and a j-th row is selected in the second half of the period. In the next gate selection period, an (i+1)-th row is selected in the first half of the period and a (j+1)-th row is selected in the second half of the period. In this manner, such a sequential scan operation can be performed as if two rows are selected at the same time in one gate selection period.

Note that the details of such a driving method are disclosed in Japanese Patent Laid-Open No. 2001-324958 and the like, the content of which can be combined with the invention.

Figure 59:
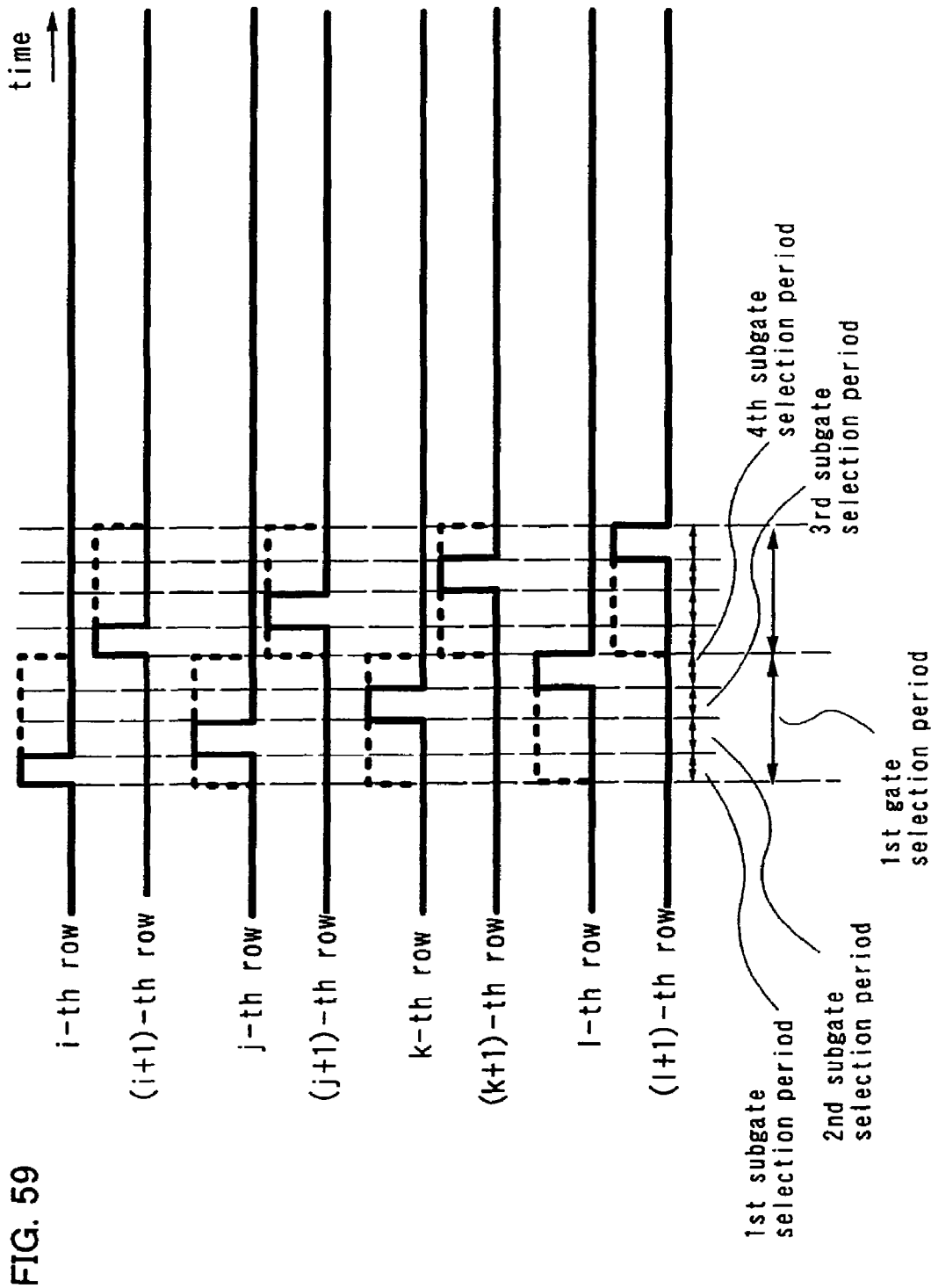
FIG. 59 shows a timing chart of the driving method of the invention.

Note that pixels can be driven with the timing chart as shown in FIG. 58 by using the circuit shown in FIG. 28. FIG. 59 shows a timing chart of gate selection signals in that case. As shown in FIG. 59, one gate selection period is divided into four. Each gate line is selected by being set at a high potential in each of the divided selection periods, so that a signal corresponding to the period is inputted to the first signal line 2705. For example, in a certain gate selection period, an i-th row is selected in the first subgate selection period, a j-th row is selected in the second subgate selection period, a k-th row is selected in the third subgate selection period, and an l-th row is selected in the fourth subgate selection period. In the next gate selection period, an (i+1)-th row is selected in the first subgate selection period, an (j+1)-th row is selected in the second subgate selection period, a (k+1)-th row is selected in the third subgate selection period, and an (l+1)-th row is selected in the fourth subgate selection period. In this manner, such a sequential scan operation can be performed as if two rows are selected at the same time in one gate selection period.

Although FIG. 59 shows an example where one gate selection period is divided into four, the division number of a gate selection period is not limited in this embodiment mode, thus the gate selection period may be divided into any number. When one gate selection period is divided into n (n is a natural number not less than 2), such a scan operation can be performed as if n rows are selected at the same time in one gate selection period.

Note that the details of such a driving method are disclosed in Japanese Patent Laid-Open No. 2002-108264, Japanese Patent Laid-Open No. 2004-4501, and the like, the content of which can be combined with the invention.

Description is made below on special effects which are obtained in the case of performing the time gray scale display with the method described in Embodiment Mode 1 or 2, in combination with a timing chart where address periods and lighting periods are not separated from each other. For example, assumed is a case where address periods and lighting periods are separately provided, and bits are divided and rearranged with the method described in Embodiment Mode 1 or 2. At this time, the number of address periods in one frame (total address period in one frame) simply increases. That is, the ratio of lighting periods relatively to one frame (duty ratio) becomes lower as compared to that before the bits are divided.

In general, it is said that the luminance of light blinking at a time resolution or less, which can be perceived by human eyes, is proportional to the cumulative amount of light. That is, if the instantaneous luminance of a display element is constant, the luminance of the display element in performing the time gray scale method becomes higher as the duty ratio is higher. Meanwhile, if the duty ratio is low, the instantaneous luminance is required to be increased in order to obtain the same luminance as that in the case where the duty ratio is high. As a result, a voltage applied to the display element or the frequency of an AC voltage is required to be increased, resulting in the increased power consumption. In addition, since a high stress is applied to the display element in such a case, the reliability of the element is decreased.

However, when using a timing chart in which address periods and lighting periods are not separated from each other, the duty ratio can be kept high even when the number of address periods is increased. That is, since the duty ratio can be kept high, the instantaneous luminance of a display element can be suppressed, which results in the reduced power consumption, increased reliability of the display element, and suppressed degradation of the display element.

Furthermore, from another point or view, an advantageous effect with regard to a reduction in pseudo contours can be obtained in addition to the effects obtained with the method used in Embodiment Mode 1 or 2. As described above, pseudo contours are caused by a difference in light-emission patterns in adjacent gray scales. This is because pseudo contours appear as more noticeable when there is a bigger time gap between the light-emission timing of the adjacent gray scales. That is, in the case where address periods and lighting periods are not separated from each other, it becomes possible that upon termination of a certain subframe, a lighting period of a subsequent subframe starts; therefore, the time gap between the light-emission timing of the adjacent gray scales can be minimized.

Accordingly, in the case of performing the time gray scale display by the method described in Embodiment Mode 1 or 2, in combination with the timing chart in which address periods and lighting periods are not separated from each other, quite advantageous effects can be obtained such as the reduced power consumption, improved reliability, and further suppressed pseudo contours.

Figure 32:
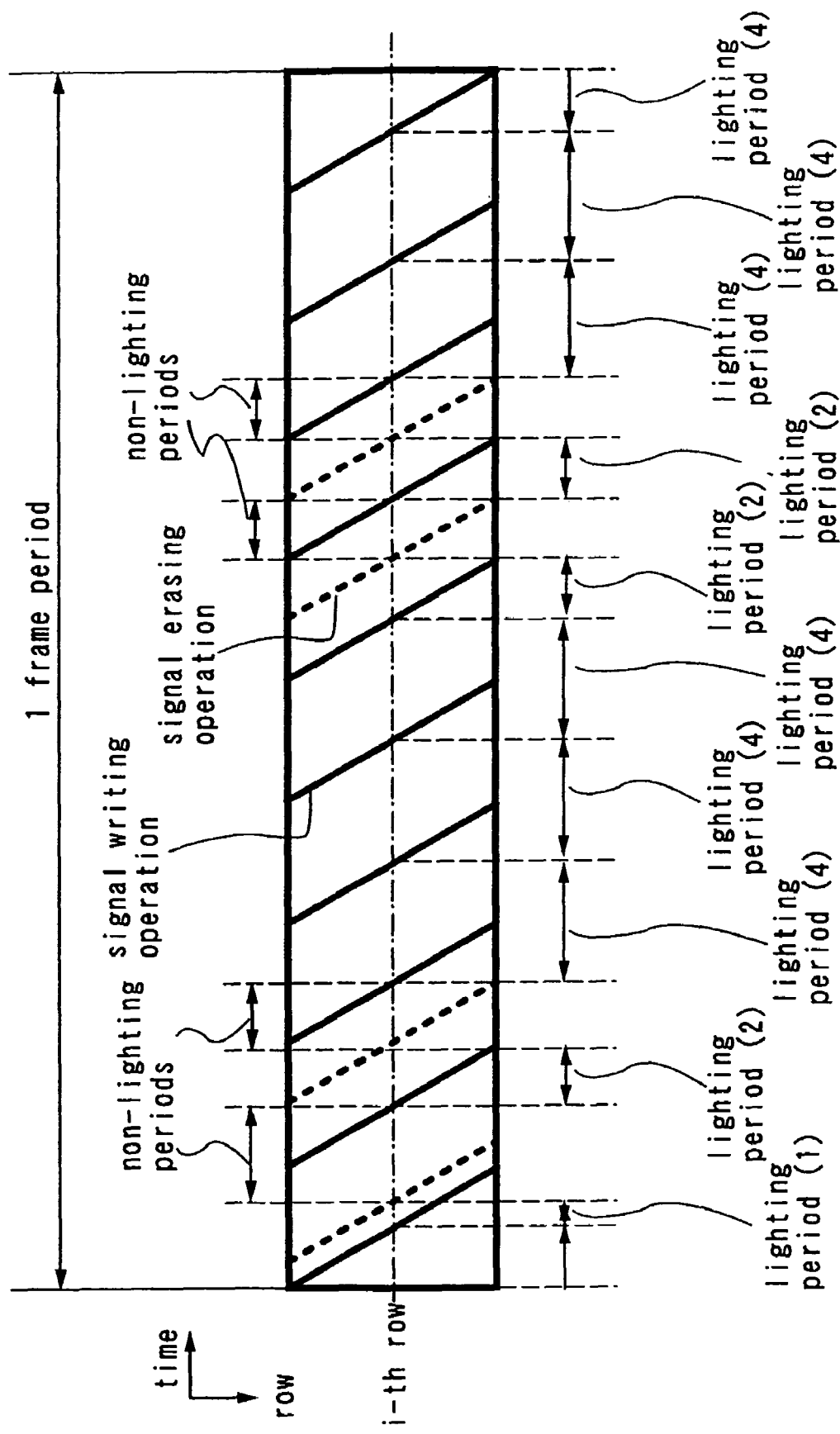
FIG. 32 shows an exemplary timing chart in the case of performing an operation to erase signals in pixels.

FIG. 32 shows a timing chart in the case of performing an operation for erasing signals in pixels. Signal writing operation is performed to each row, and signals in the pixels are erased before a subsequent signal writing operation starts. Accordingly, the length of each lighting period can be easily controlled.

When signal writing is completed and a predetermined lighting period has terminated in a certain row, signal writing of a subsequent subframe starts. If a lighting period is short, a signal erasing operation is performed to forcibly turn the pixel into a non-lighting state. By repeating such operations, lighting periods are arranged in the following order of length: 1, 2, 4, 4, 4, 2, 2, 4, 4, and 4.

Note that although FIG. 32 shows an example where the signal erasing operation is performed after the lighting periods as long as 1 and 2, the invention is not limited to this. The erasing operation may be performed after other lighting periods.

By performing such operations, a large number of subframes can be provided in one frame even if the signal writing speed is slow. Further, in the case of performing the erasing operation, data used for erasing operation is not required to be obtained in a similar manner to video signals; therefore, the driving frequency of a source driver can be suppressed.

Such a driving method can be preferably applied to a plasma display. Note that in the case of using the driving method for a plasma display, an initialization operation or the like is required. However, such an operation is omitted in FIG. 32 for simplicity of description.

Furthermore, the driving method can be preferably applied to an EL display, a field emission display, a display using a digital micromirror device (DMD), or the like.

Figure 33:
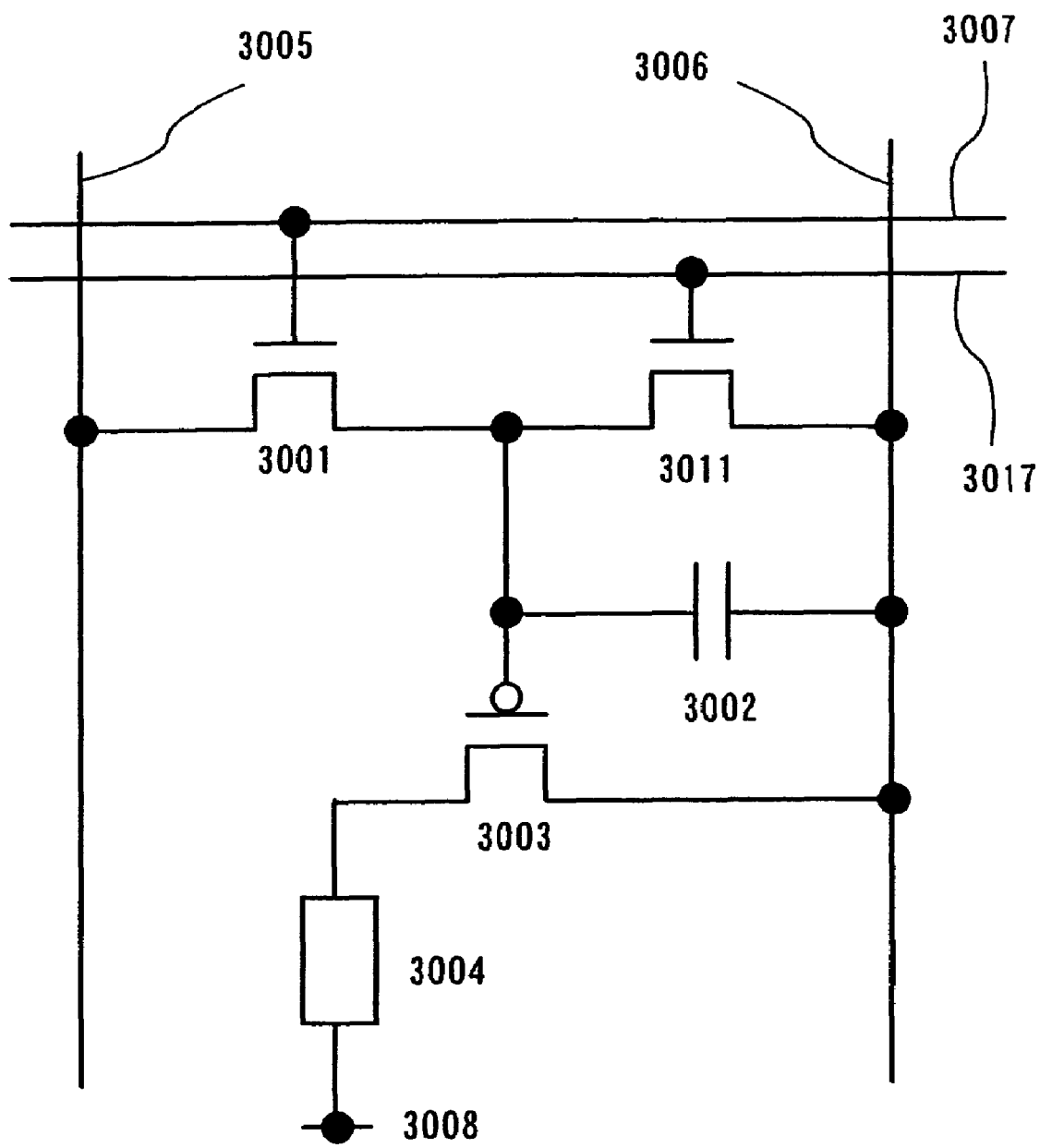
FIG. 33 shows an exemplary pixel configuration in the case of performing an operation to erase signals in pixels.

FIG. 33 shows a pixel configuration in such a case. A pixel shown in FIG. 33 includes a first transistor 3001, a second transistor 3011, a third transistor 3003, a holding capacitor 3002, a display element 3004, a signal line 3005, a first gate line 3007, a second gate line 3017, a first power supply line 3006, and a second power supply line 3008.

A gate electrode of the first transistor 3001 is connected to the first gate line 3007, a first electrode thereof is connected to the signal line 3005, and a second electrode thereof is connected to a second electrode of the holding capacitor 3002, a second electrode of the second transistor 3011, and a gate electrode of the third transistor 3003. A gate electrode of the second transistor 3011 is connected to the second gate line 3017, and a first electrode thereof is connected to the first power supply line 3006. A first electrode of the third transistor 3003 is connected to the first power supply line 3006, and a second electrode thereof is connected to a first electrode of the display element 3004. A first electrode of the holding capacitor 3002 is connected to the first power supply line 3006. A second electrode of the display element 3004 is connected to the second power supply line 3008.

Note that the first transistor 3001 functions as a switch for connecting the signal line 3005 to the second electrode of the holding capacitor 3002 in order to input into the holding capacitor 3002 a signal which is inputted to the signal line 3005. Since the first transistor 3001 can select the pixel to be in a selection state or a holding state, the first transistor 3001 functions as a selection transistor.

Note also that the second transistor 3011 functions as a switch for connecting the gate electrode of the third transistor 3003 to the first power supply line 3006 in order to turn off the third transistor.

The third transistor 3003 has a function to supply a current to the display element 3004. Thus, the third transistor 3003 functions as a driving transistor.

Next, the operation of the pixel configuration shown in FIG. 33 is described. First, in order to write a signal into the pixel, a potential of the first gate line 3007 is set higher than the highest potential of the signal line 3005 or a potential of the first power supply line 3006 to select the first gate line 3007, so that the first transistor 3001 is turned on and a signal is inputted from the signal line 3005 to the holding capacitor 3002. Accordingly, a current of the third transistor 3003 is controlled in accordance with the signal which has been held in the holding capacitor 3002, so that a current flows from the first power supply line 3006 to the second power supply line 3008 through the display element 3004. As a result, the display element 3004 emits light.

In order to erase a signal, a potential of the second gate line 3017 is set higher than the highest potential of the signal line 3005 or the potential of the first power supply line 3006 to select the second gate line 3017, so that the second transistor 3011 is turned on and the third transistor 3003 is turned off. Accordingly, a current is prevented from flowing from the first power supply line 3006 to the second power supply line 3008 through the display element 3004. As a result, a non-lighting period can be provided so that the length of each lighting period can be freely controlled.

Although the second transistor 3011 is used to provide a non-lighting period in FIG. 33, other methods can be used as well. This is because, in order to forcibly provide a non-lighting period, it is only required that a current be prevented from being supplied to the display element 3004. Therefore, a non-lighting period may be provided by disposing a switch in a path where a current flows from the first power supply line 3006 to the second power supply line 3008 through the display element 3004 and by controlling on/off of the switch. Alternatively, a gate-source voltage of the third transistor 3003 may be controlled to forcibly turn off the third transistor 3003.

Figure 34:
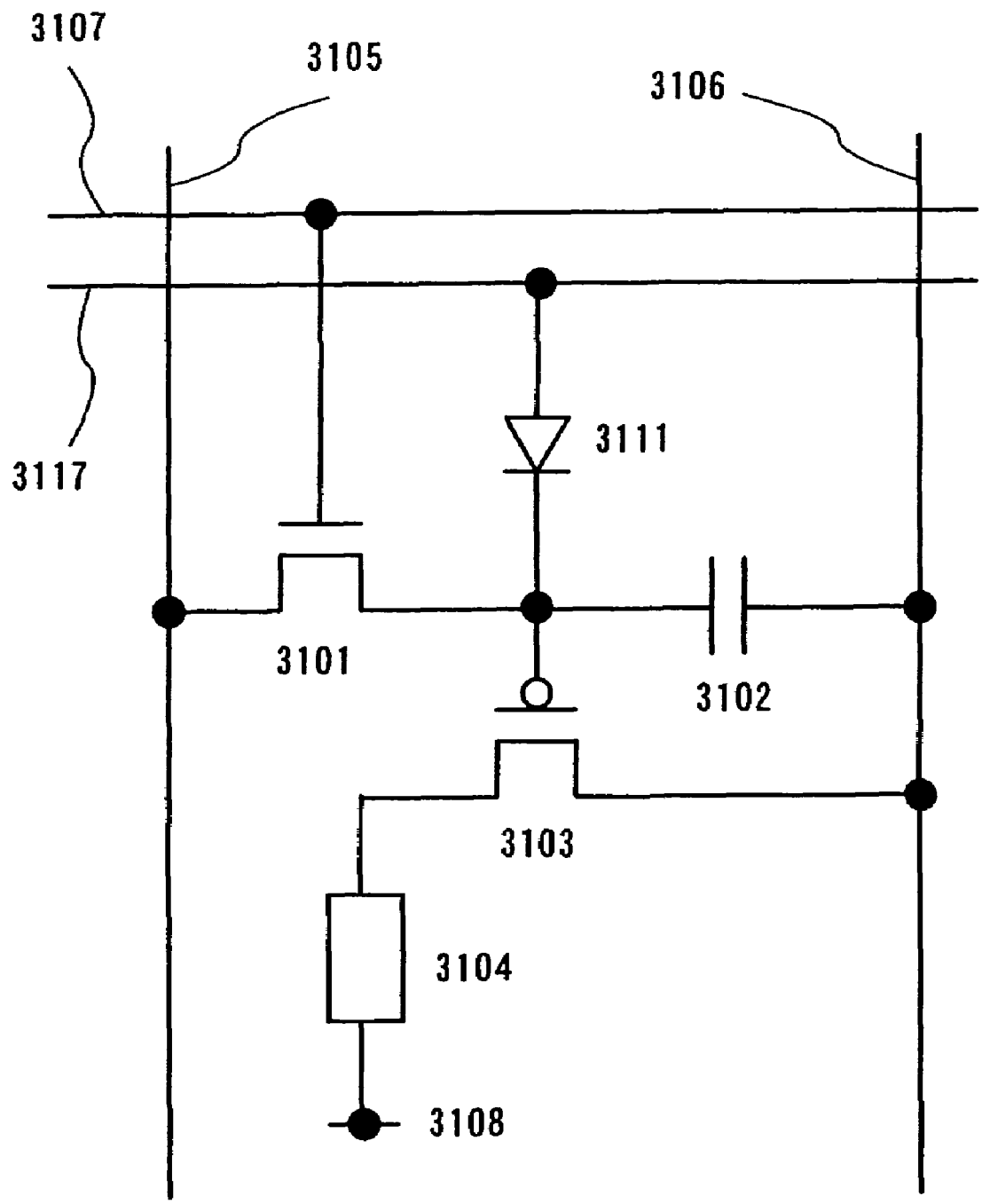
FIG. 34 shows an exemplary pixel configuration in the case of performing an operation to erase signals in pixels.

FIG. 34 shows an exemplary pixel configuration in the case where the third transistor 3003 in FIG. 33 is forcibly turned off. A pixel shown in FIG. 34 includes a first transistor 3101, a second transistor 3103, a holding capacitor 3102, a display element 3104, a signal line 3105, a first gate line 3107, a second gate line 3117, a first power supply line 3106, a second power supply line 3108, and a diode 3111. Here, the second transistor 3103 corresponds to the third transistor 3003 in FIG. 33.

A gate electrode of the first transistor 3101 is connected to the first gate line 3107, a first electrode thereof is connected to the signal line 3105, and a second electrode thereof is connected to a second electrode of the holding capacitor 3102, a gate electrode of the second transistor 3103, and a second electrode of the diode 3111. A first electrode of the second transistor 3103 is connected to the first power supply line 3106, and a second electrode thereof is connected to a first electrode of the display element 3104. A first electrode of the holding capacitor 3102 is connected to the first power supply line 3106. A second electrode of the display element 3104 is connected to the second power supply line 3108. A first electrode of the diode 3111 is connected to the second gate line 3117.

Note that the first transistor 3101 functions as a switch for connecting the signal line 3105 to the second electrode of the holding capacitor 3102 in order to input into the holding capacitor 3102 a signal which is inputted to the signal line 3105. Since the first transistor 3101 can select the pixel to be in a selection state or a holding state, the first transistor 3101 functions as a selection transistor.

Note also that the second transistor 3103 has a function to supply a current to the display element 3104. Thus, the second transistor 3103 functions as a driving transistor.

The holding capacitor 3102 has a function to hold a gate potential of the second transistor 3103. Therefore, it is connected between the gate of the second transistor 3103 and the first power supply line 3106; however, the invention is not limited to this as long as the gate potential of the second transistor 3103 can be held. Further, in the case where the gate potential of the second transistor 3103 can be held by using a gate capacitance of the second transistor 3103 or the like, the holding capacitor 3102 may be omitted.

Next, the operation of the pixel configuration shown in FIG. 31 is described. First, in order to write a signal into the pixel, a potential of the first gate line 3107 is set higher than the highest potential of the signal line 3105 or a potential of the first power supply line 3106 to select the first gate line 3107, so that the first transistor 3101 is turned on and a signal is inputted from the signal line 3105 to the holding capacitor 3102. Accordingly, a current of the second transistor 3103 is controlled in accordance with the signal which has been held in the holding capacitor 3102, so that a current flows from the first power supply line 3106 to the second power supply line 3108 through the display element 3104. As a result, the display element 3104 emits light.

In order to erase a signal, a potential of the second gate line 3117 is set higher than the highest potential of the signal line 3105 or the potential of the first power supply line 3106 to select the second gate line 3117, so that the diode 3111 is turned on and a current flows from the second gate line 3117 to the gate electrode of the second transistor 3103. As a result, the second transistor 3103 is turned off. Accordingly, a current is prevented from flowing from the first power supply line 3106 to the second power supply line 3108 through the display element 3104. Thus, a non-lighting period can be provided so that the length of each lighting period can be freely controlled.

In order to hold a signal, the potential of the second gate line 3117 is set lower than the lowest potential of the signal line 3105 so as not to select the second gate line 3177. Accordingly, the diode 3111 is turned off so that the gate potential of the second transistor 3103 is held.

Note that the diode 3111 may be any element as long as it has a rectifying property. It may be a PN diode, a PIN diode, a Schottky diode, or a Zener diode.

Figure 35:
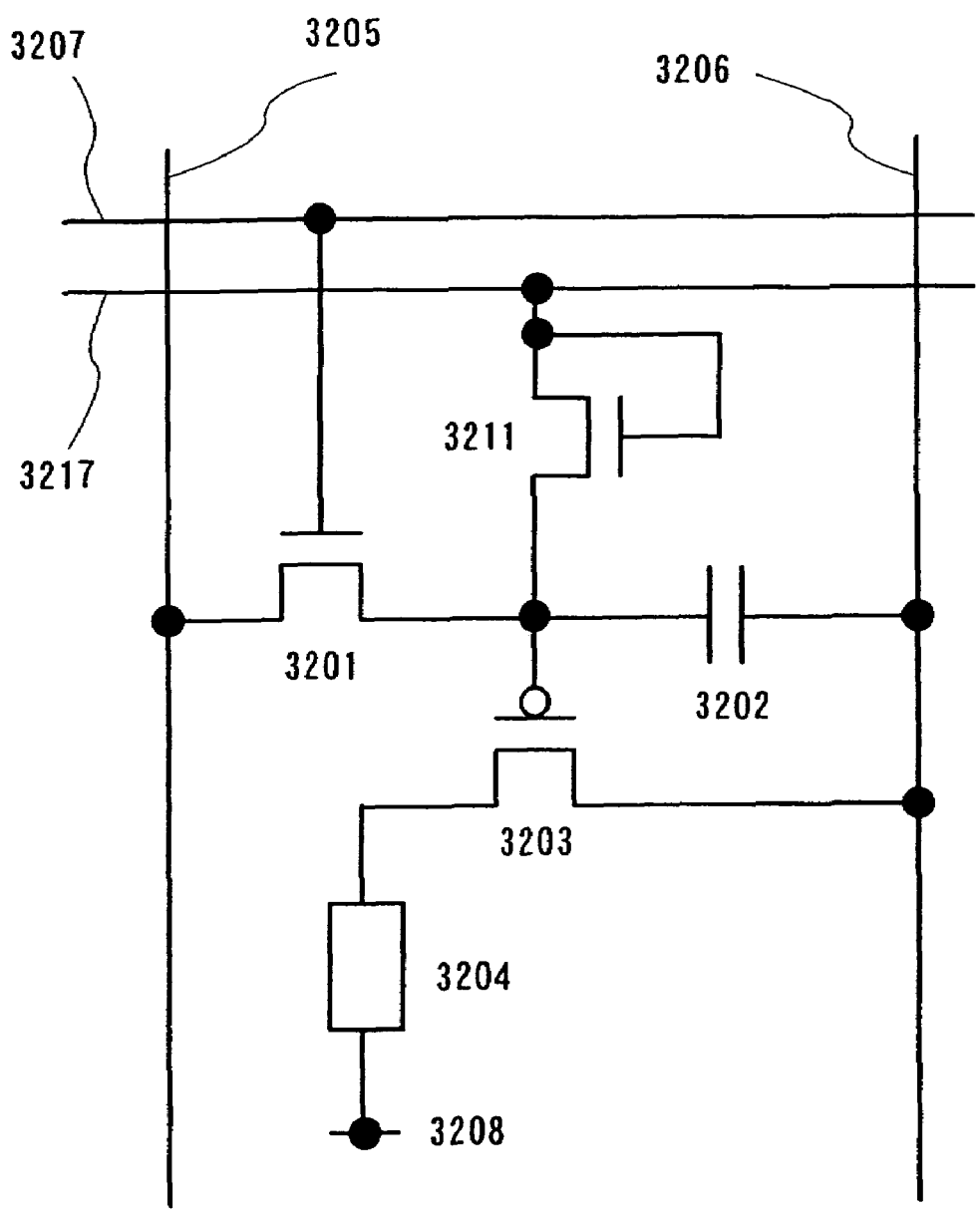
FIG. 35 shows an exemplary pixel configuration in the case of performing an operation to erase signals in pixels.

Alternatively, the diode 3111 may be a diode-connected transistor (i.e., a transistor whose gate and drain are connected to each other). FIG. 35 is a circuit diagram in that case. As the diode 3111, a diode-connected transistor 3211 is used. Note that although an n-channel transistor is used as the transistor 3211 here, the invention is not limited to this. A p-channel transistor may be used as well.

Further alternatively, by using the circuit shown in FIG. 28 as another circuit, the driving method as shown in FIG. 32 can be performed. FIG. 31 shows signal waveforms of gate lines in that case. As shown in FIG. 31, one gate selection period is divided into a plurality of periods (two in FIG. 31). Each gate line is selected by being set at a high potential in each of the divided selection periods, so that signals corresponding to the period (a video signal and an erasing signal) are inputted to the first signal line 2505. For example, in one certain gate selection period, an i-th row is selected in the first half of the period and a j-th row is selected in the second half of the period. When the i-th row is selected, a video signal to be inputted to pixels in the i-th row is inputted whereas when the j-th row is selected, a signal for turning off the selection transistors 2501 in the i-th row is inputted. Accordingly, such an operation can be performed as if two rows are selected at the same time in one gate selection period.

Note that the details of such a driving method are disclosed in Japanese Patent Laid-Open No. 2001-324958 and the like, the content of which can be combined with the invention.

In the driving method of the invention with which the conventional time gray scale method is combined, a bit belonging to the first bit group is divided into four, a bit belonging to the second bit group is divided into two, and a bit belonging to the third bit group is not divided. Accordingly, a higher duty ratio can be obtained as compared to that in the conventional double-speed frame method. This is because, dividing the bit belonging to the first bit group into four will increase the number of subframes having the longest lighting periods, that is the number of subframes which do not require an erasing operation. Thus, the number of the subframes which require an erasing operation is decreased, and an erasing period per frame can be shortened.

Figure 36:
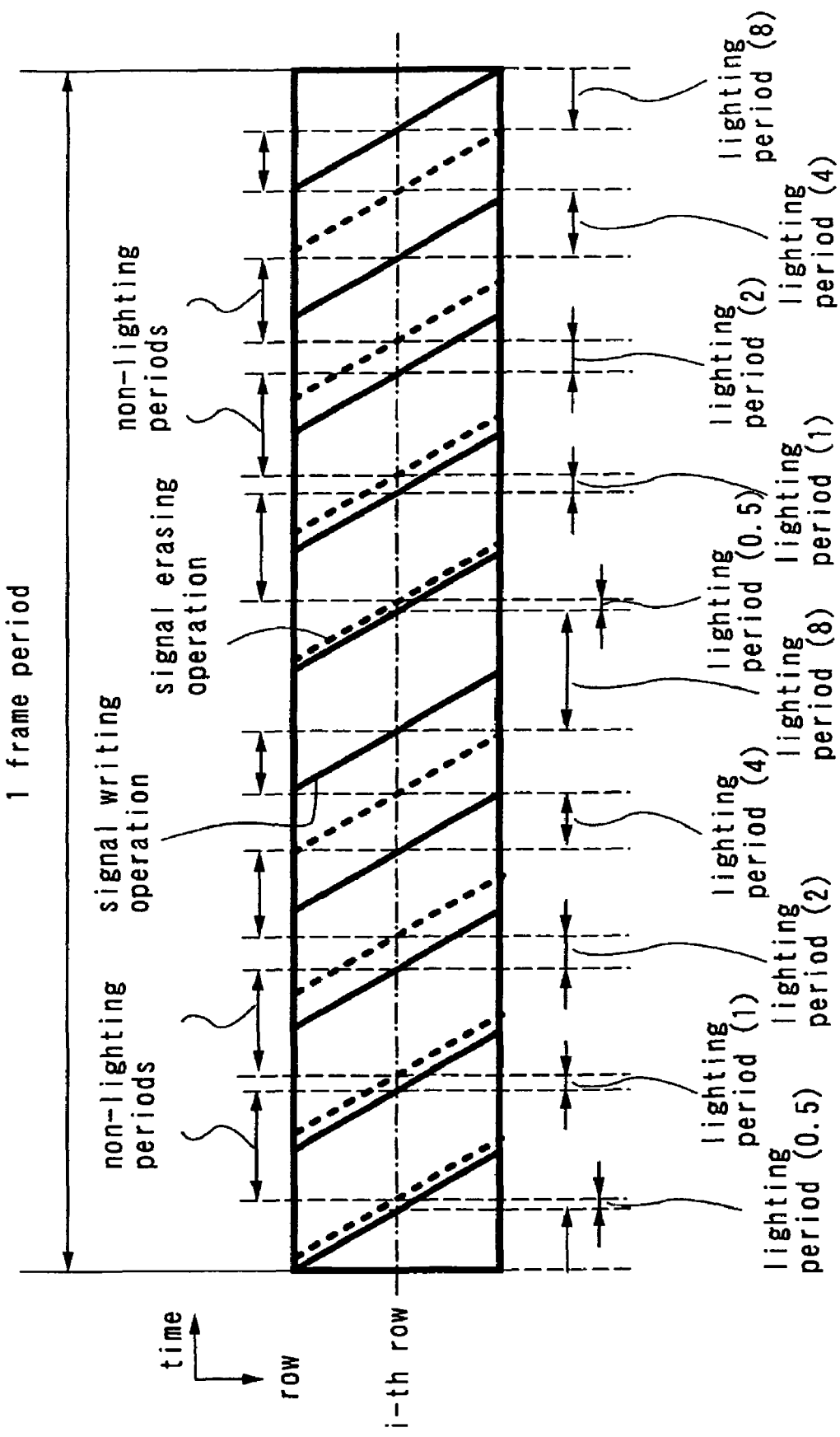
FIG. 36 shows an exemplary timing chart in the case of performing an operation to erase signals in pixels.

For example, FIG. 36 shows a timing chart in the case where an operation of erasing signals in pixels is performed in displaying 5-bit gray scales with the conventional double-speed frame method (FIG. 47). Comparing the conventional double-speed frame method (FIG. 36) with the driving method of the invention (FIG. 32), the number of subframes each having the longest lighting period (the number of subframes which do not require an erasing operation) is two in the conventional double-speed frame method (FIG. 36) whereas it is six in the driving method of the invention (FIG. 32). That is, the total erasing period can be shorter when using the driving method of the invention.

In this manner, according to the driving method of the invention, a higher duty ratio can be obtained as compared to that of the conventional double-speed frame method. As a result, a voltage applied to a display element can be decreased for obtaining the same luminance and thus power consumption can be reduced. In addition, degradation of the display element can be suppressed.

Figure 65:
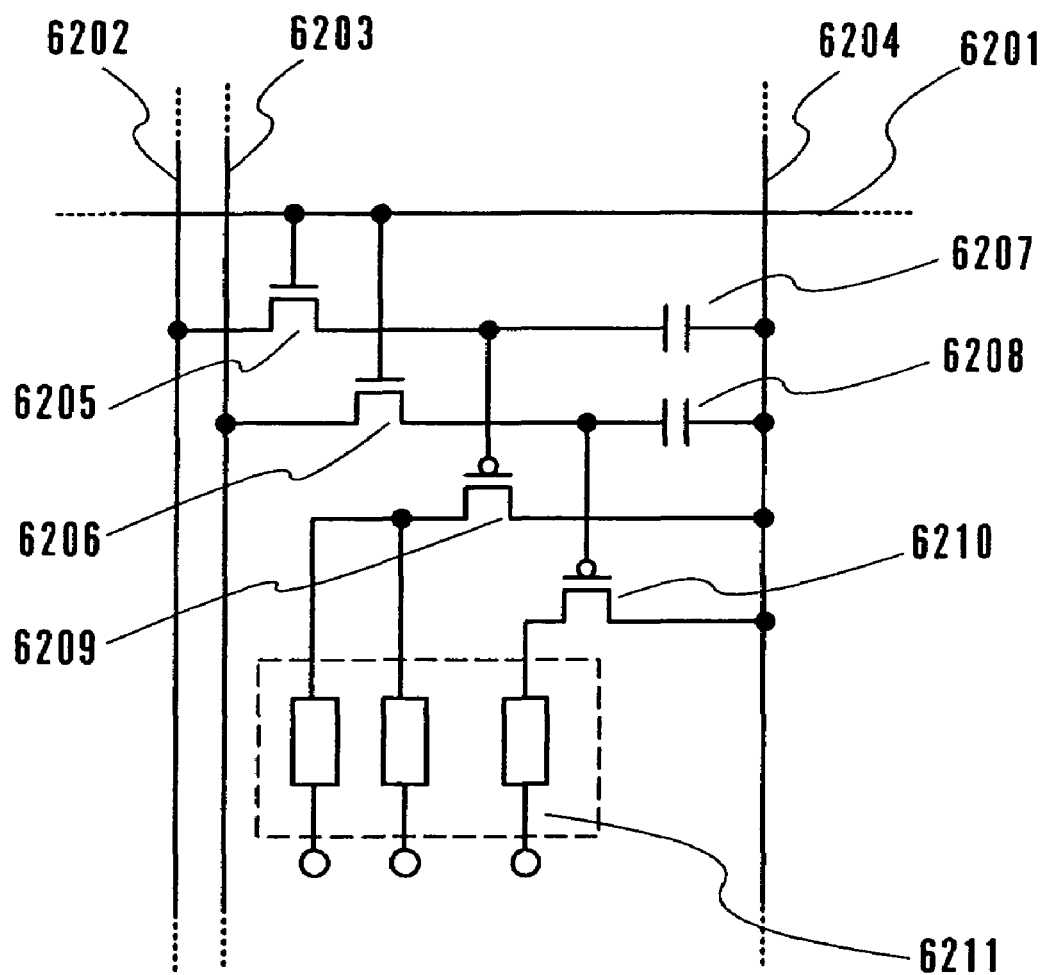
FIG. 65 shows an exemplary pixel circuit in the case of using an area gray scale method.

Furthermore, in the invention, an area gray scale method can be used as the gray scale expression method. FIG. 65 shows an exemplary pixel circuit in using the area gray scale method. The pixel which employs an area gray scale method has a feature that one pixel includes a plurality of display elements which can be controlled independently of each other. A display element 6211 in FIG. 65 includes three display elements, two of which can be controlled independently. One of the two display elements which can be controlled independently can emit light at a luminance of 1 while the other can emit light at a luminance of 2. By forming such a pixel, luminance of 0, 1, 2, and 3 can be expressed in one pixel even when the display elements are driven with binary signals indicative of light emission and non-light emission. When combining this display method with the method described in Embodiment Mode 1 or 2, further multi-gray scales can be expressed with less subframes.

Note that the timing charts, pixel configurations, and driving methods described in this embodiment mode are only illustrative and the invention is not limited to them. The invention can be applied to various timing charts, pixel configurations, and driving methods.

Note also that the arranging order of subframes may be changed depending on time. For example, the arranging order of subframes may be changed between a first frame and a second frame. Alternatively, the arranging order of subframes may be changed in each place as well. For example, the arranging order of subframes may be changed between a pixel A and a pixel B. Further, the arranging order of subframes may be changed depending on both time and place.

Although the lighting period, the signal writing period, and the non-lighting period are provided in one frame in this embodiment mode, the invention is not limited to this. Other operation periods may be provided in the frame. For example, a period in which a voltage is applied to a display element in a reverse direction to the normal direction, that is a reverse bias period may be provided. By providing a reverse bias period, the reliability of the display element may be improved.

Note that the description in this embodiment mode can be appropriately implemented in combination with any of the descriptions in Embodiment Mode 1 and Embodiment Mode 2.

Embodiment Mode 4

In this embodiment mode, description is made on a display device, configuration of a signal line driver circuit (a signal line driver circuit), a gate line driver circuit (a scanning line driver circuit), or the like, and operations thereof.

Figure 37A:
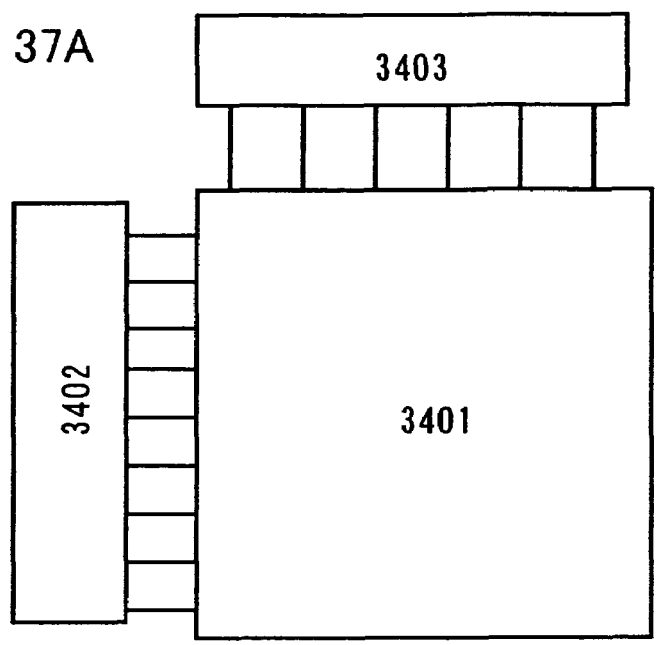
FIGS. 37A to 37C show an exemplary display device using the driving method of the invention.

As shown in FIG. 37A, a display device includes a pixel portion 3401, a gate line driver circuit 3402, and a signal line driver circuit 3403.

Figure 37B:
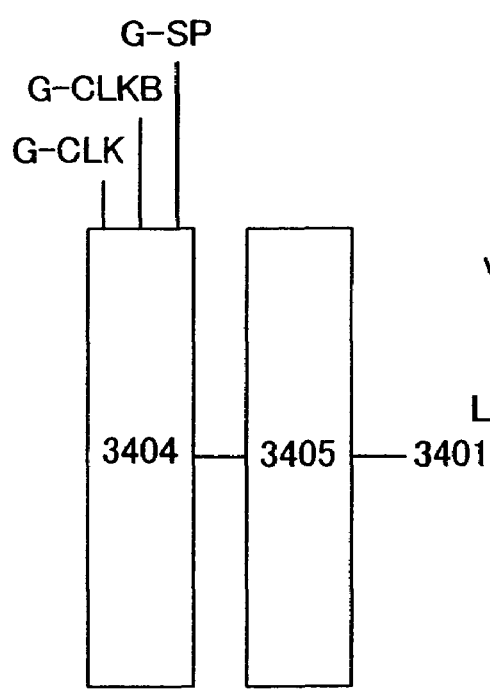

The gate line driver circuit 3402 sequentially outputs selection signals to the pixel portion 3401. FIG. 37B shows an exemplary configuration of the gate line driver circuit 3402. The gate line driver circuit is constructed of a shift register 3404, a buffer circuit 3405, and the like. The shift register 3404 sequentially outputs sampling pulses in accordance with the input timing of clock signals (G-CLK), start pulses (G-SP), and inverted clock signals (G-CLKB). The sampling pulses outputted are amplified in the buffer circuit 3405, and then inputted into the pixel portion 3401 through each gate line. Note that the gate line driver circuit 3402 further includes a level shifter circuit, a pulse width controlling circuit, or the like in addition to the shift register 3404 and the buffer circuit 3405 in many cases.

Figure 37C:
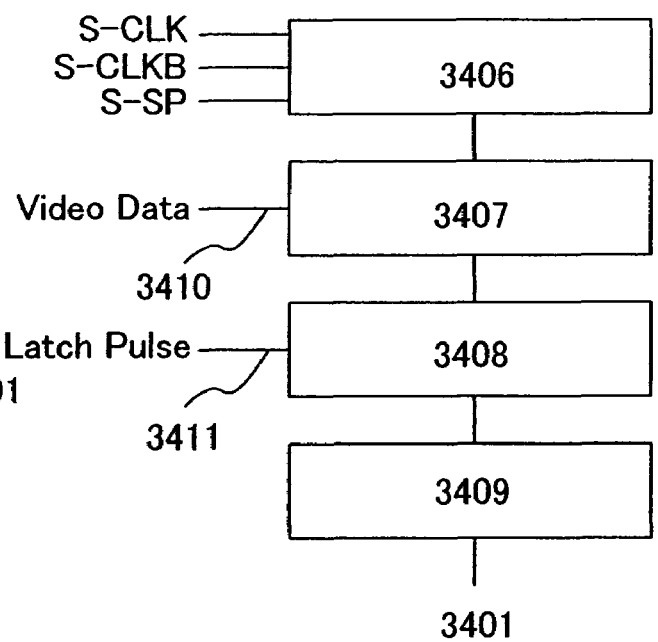

The signal line driver circuit 3403 sequentially outputs video signals to the pixel portion 3401. FIG. 37C shows an exemplary configuration of the signal line driver circuit 3403. The signal line driver circuit 3403 is constructed of a shift register 3406, a first latch circuit (LAT1) 3407, a second latch circuit (LAT2) 3408, and an amplifier circuit 3409. The shift register 3406 sequentially outputs sampling pulses in accordance with the input timing of clock signals (S-CLK), start pulses (S-SP), and inverted clock signals (S-CLKB). In accordance with the sampling pulses outputted, video data is sequentially written into the first latch circuit 3407. The signals written into the first latch circuit 3407 are written into the second latch circuit 3408 all at once in accordance with latch pulses. The pixel portion 3401 displays an image by controlling the state of light in accordance with the video signals. The video signal inputted from the signal line driver circuit 3403 to the pixel portion 3401 is often a voltage. That is, a display element and an element for controlling the display element which are disposed in each pixel are changed in states by a video signal (voltage) inputted from the signal line driver circuit 3403. As an exemplary display element disposed in each pixel, there is an EL element, an element used for an FED (field emission display), a liquid crystal, a DMD (digital micromirror device), or the like.

Note that the number of the gate line driver circuits 3402 and the signal line driver circuits 3403 may be more than one.

In particular, in the case of using the driving method shown in Embodiment Mode 3, where one gate selection period is divided into a plurality of subgate selection periods, gate line driver circuits with a number corresponding to the division number of one gate selection period is usually required. In addition, such a gate line driver circuit may be employed that has a function to select an arbitrary gate line at arbitrary timing as well performing a sequential scan operation, as typified by a gate line driver circuit using decoder.

Figure 60:
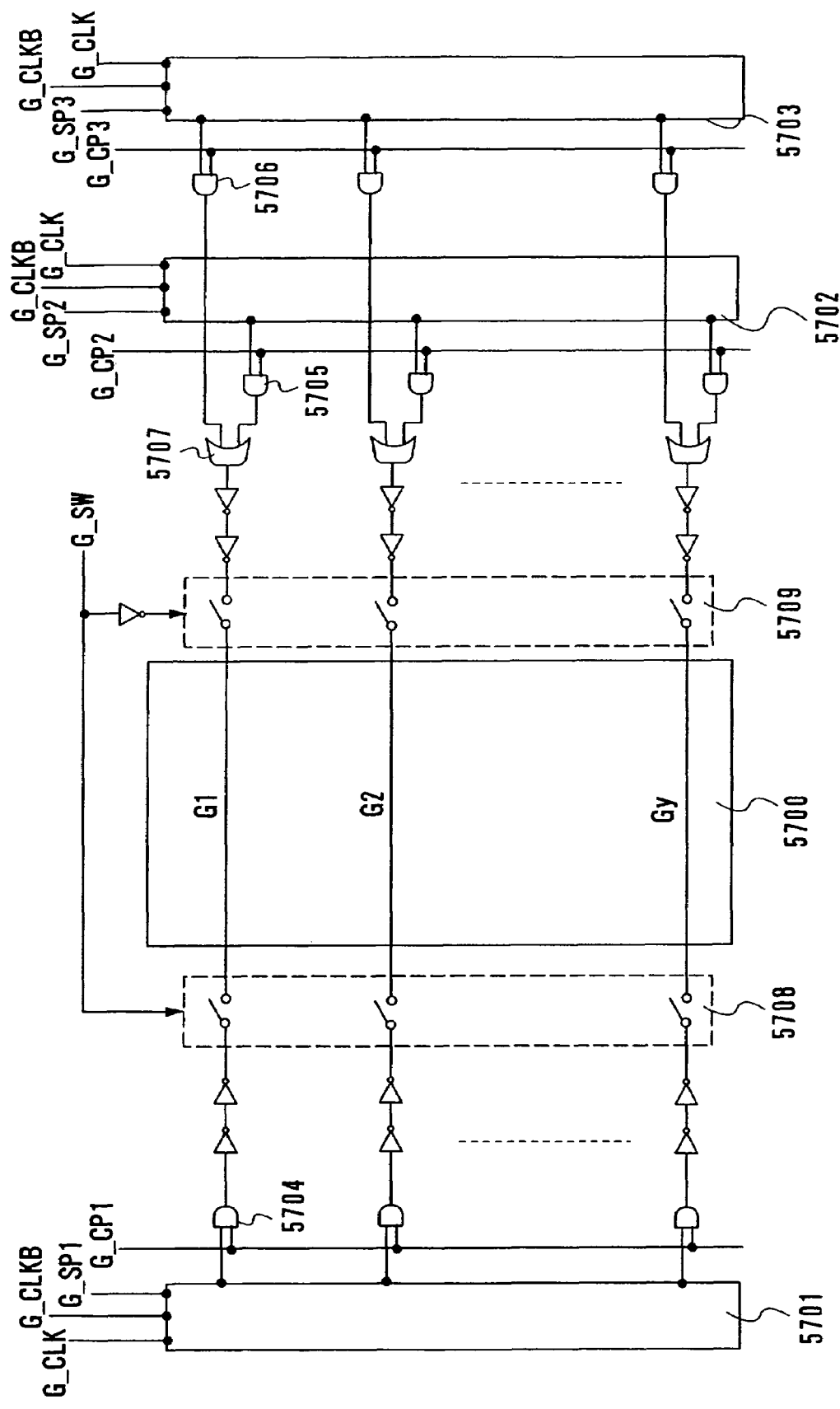
FIG. 60 shows an exemplary configuration of a display device in the case of using gate line driver circuits with a number corresponding to the division number of one gate selection period.

Description is made with reference to FIG. 60 on an exemplary configuration of a display device in the case of using gate line driver circuits with a number corresponding to the division number of one gate selection period. Note that the invention is not limited to this circuit configuration, and any circuit having a similar function may be used. In addition, although FIG. 60 shows a gate line driver circuit in the case of dividing one gate selection period into three as an example, the division number of one gate selection period is not limited to three and it may be any number. For example, in the case of diving one gate selection period into four, a total of four shift registers are required for the gate line driver circuit.

FIG. 60 shows an exemplary gate line driver circuit having three shift registers provided on opposite sides of a pixel portion. The display device shown in FIG. 60 includes a pixel portion 5700, a first shift register 5701, a second shift register 5702, a third shift register 5703, an AND circuit 5704, an AND circuit 5705, an AND circuit 5706, an OR circuit 5707, a switch group 5708, and a switch group 5709. In the case of inputting outputs of these shift registers to a common gate line from its opposite sides, the switch groups 5708 and 5709 are required so that the gate line will not receive an output from one of the shift registers while it receives an output from the other, in order to prevent such a circumstance that the two outputs overlap with each other, which would result in a short circuit of a display element. While the switch group 5708 is on, the switch 5709 is off, and vice versa, while the switch group 5709 is on, the switch 5708 is off. When one of the second shift register 5702 and the third shift register 5703 is selected with an OR circuit, a gate line connected to an end of the shift register is also selected. In this case, since both of the second shift register 5702 and the third shift register 5703 are connected to the respective input terminals of the OR circuit, a short circuit of a display element can be prevented, which would otherwise be caused in the case where two signals are concurrently inputted. Reference symbols G_CP1, G_CP2, and G_CP3 are pulse width control signals. As for a signal width of the shift registers, each of the three shift registers is set to have the same signal width as the width of one gate selection period at the beginning, but it is changed into a pulse width which is to be actually outputted to a gate line (divided into three in this case) by using a pulse width control signal, thereby such a driving method can be performed that one gate selection period is divided into a plurality of subgate selection periods.

Figure 64:
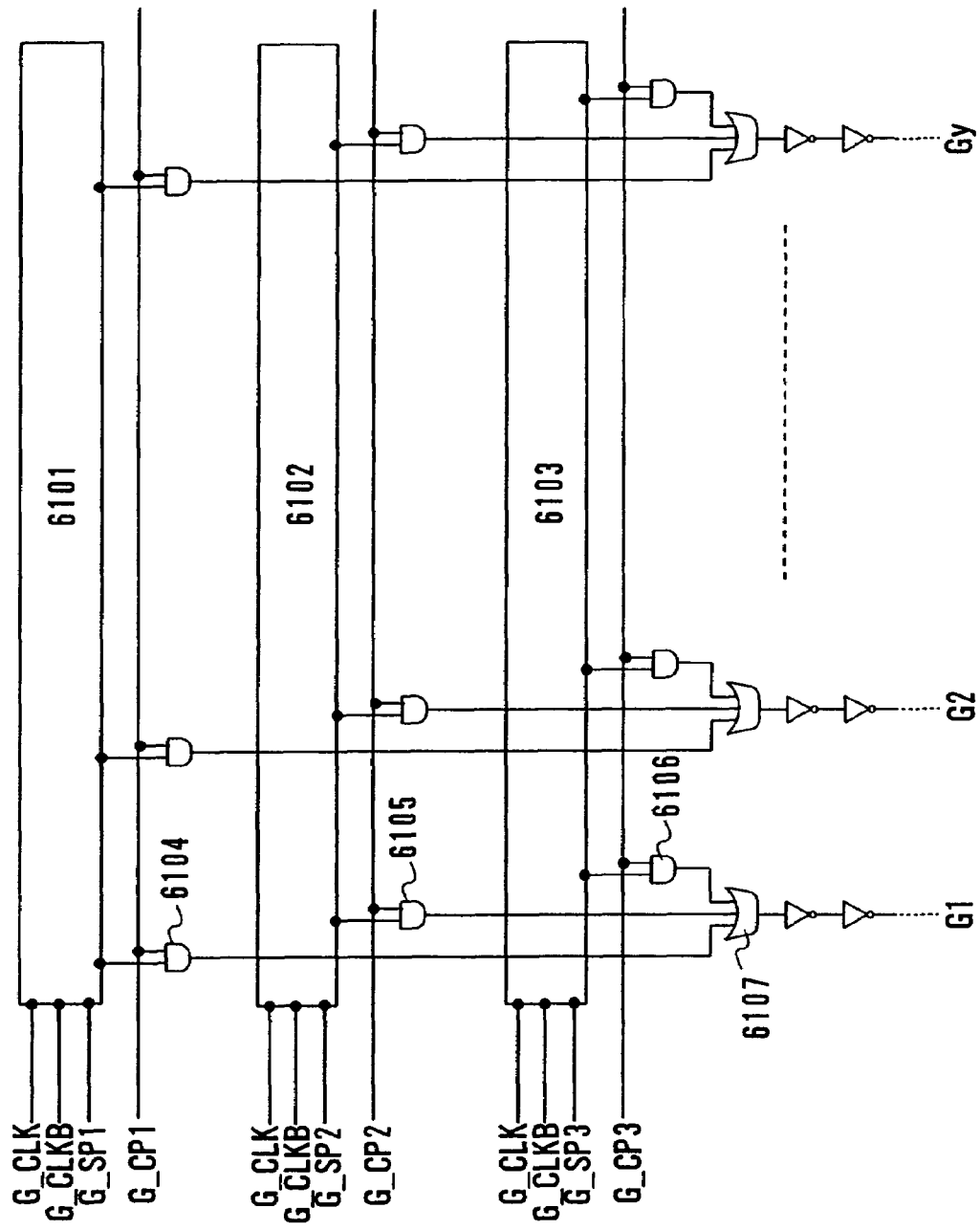
FIG. 64 shows a gate line driver circuit in the case of dividing one gate selection period into three periods.

FIG. 64 shows a gate line driver circuit with a configuration where shift registers are provided on one side of a pixel portion, with the condition that one gate selection period is divided into three. Since no switch for preventing a short circuit of a display element is provided on opposite sides of the pixel portion in the configuration in FIG. 64, more stable operation can be expected as compared to the operation of a gate line driver circuit with a configuration where shift registers are provided on opposite sides of the pixel portion. Further, whereas the second shift register and the third shift register are connected to an OR circuit in the gate line driver circuit with a configuration where shift registers are provided on opposite sides of the pixel portion, in this configuration of providing each shift register on one side, the first shift register, the second shift register, and the third shift register are each connected to an OR circuit having three input terminals, which can select one of the pulses from the three shift registers. Note that the division number of one gate selection period is not limited, and it may be any number.

Note that the details of such a driving method are disclosed in Japanese Patent Laid-Open No. 2002-215092, Japanese Patent Laid-Open No. 2002-297094, and the like, the content of which can be combined with the invention.

Description is made below on an exemplary configuration of a display device which has a gate line driver circuit using a decoder.

Figure 61:
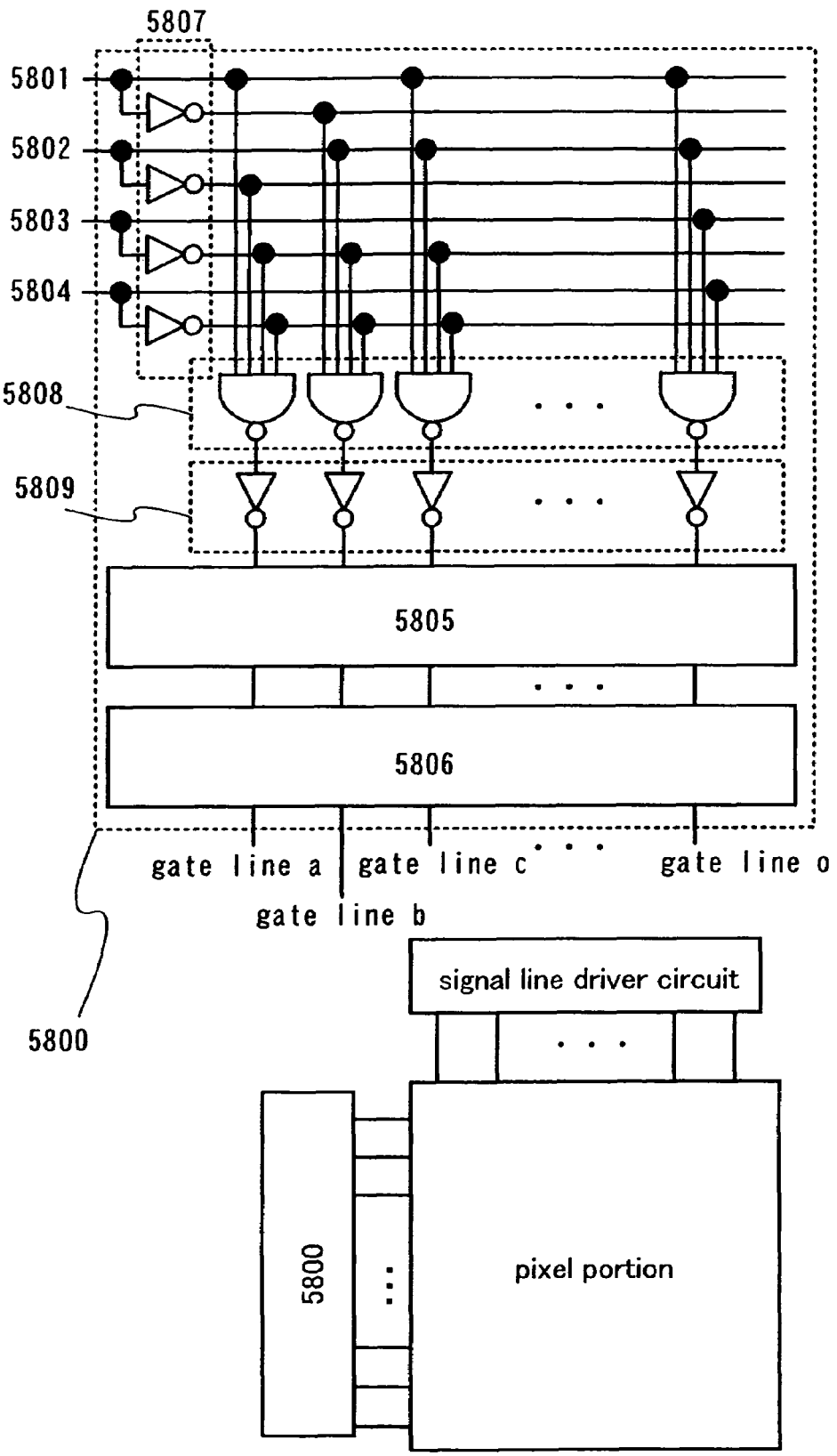
FIG. 61 shows an exemplary gate line driver circuit using a decoder.

FIG. 61 shows an exemplary gate line driver circuit using a decoder. A gate line driver circuit shown in FIG. 61 includes a first input terminal 5801, a second input terminal 5802, a third input terminal 5803, a fourth input terminal 5804, a level shifter 5805, a buffer circuit 5806, a NOT circuit group 5807, a NAND circuit group 5808, and a NOT circuit group 5809. Here, description is made on the case where 15 gate lines are driven with a 40-bit decoder. The number of bits of a decoder is appropriately determined in accordance with the number of bit lines of a display device. For example, provided the number of gate lines is 60, it is effective to select a 6-bit decoder since $2^6=64$. Similarly, provided that the number of gate lines is 240, it is effective to select an 8-bit decoder since $2^8=256$. In this manner, it is effective to select a decoder having a larger number of bits than the number obtained by extracting a square root of the number of gate lines; however, the invention is not limited to this. The signal line driver circuit in FIG. 63 may be constructed in combination with various circuits including those described in this specification.

As the operation of the decoder shown in FIG. 61, there are the following operations. In the case of selecting a gate line a, (1, 0, 0, 0) are inputted to a first input terminal 5801 to a fourth input terminal 5804 respectively. In the case of selecting a gate line b, (0, 1, 0, 0) are inputted to the respective input terminals. In the case of selecting a gate line c, (1, 1, 0, 0) are inputted to the respective input terminals. In this manner, by assigning one combination of digital signals to one gate line, an arbitrary gate line can be selected at arbitrary timing.

Figure 62:
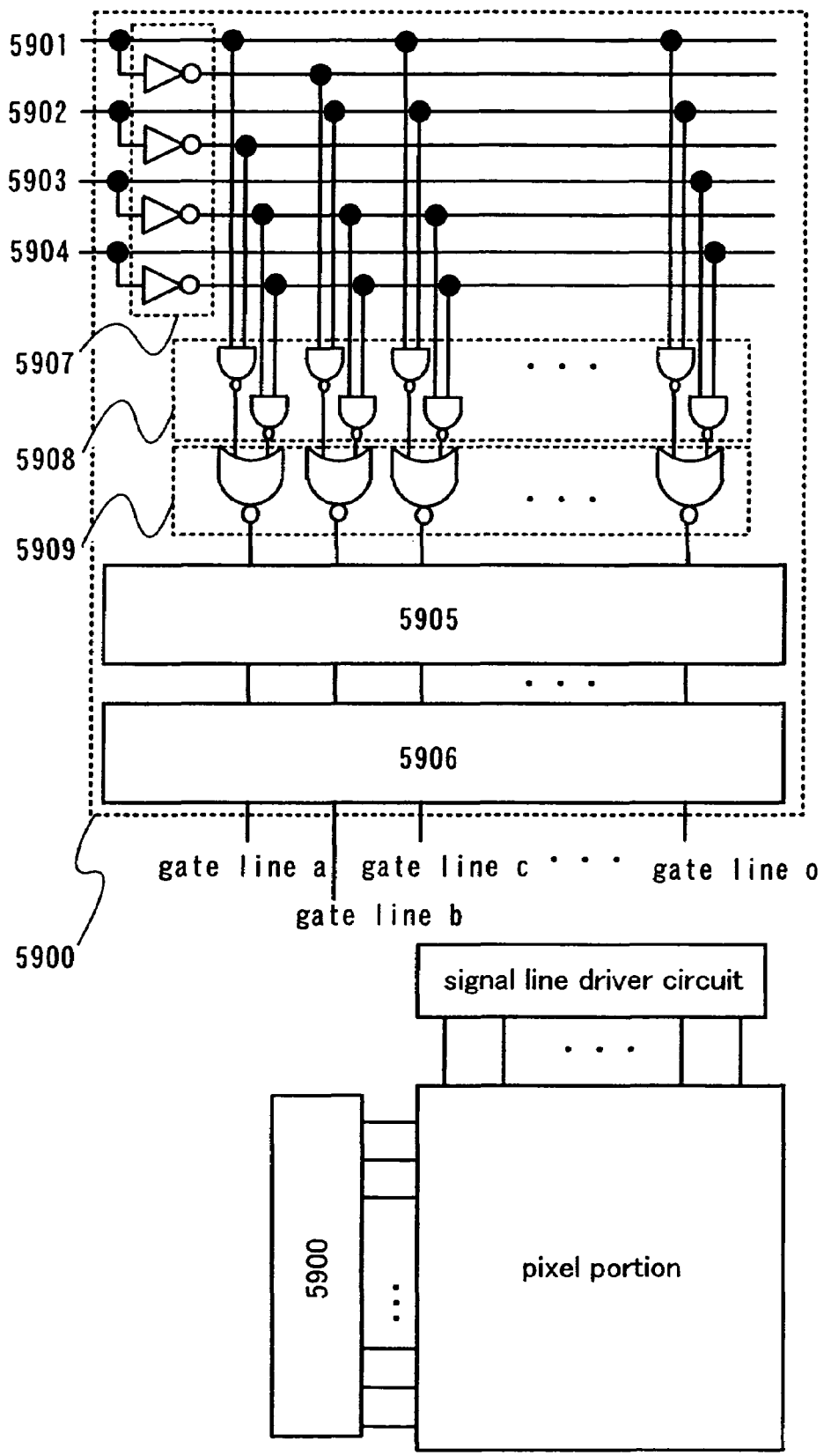
FIG. 62 shows an exemplary gate line driver circuit using a decoder.

In the case where the number of input terminals of a NAND circuit is large, the operation might be adversely affected by the resistance of a transistor or the like. In such a case, the NAND circuit having a large number of terminals may be replaced by a digital circuit having a similar function and having less input terminals as shown in FIG. 62. The gate line driver circuit shown in FIG. 62 is constructed of a first input terminal 5901, a second input terminal 5902, a third input terminal 5903, a fourth input terminal 5904, a levels shifter 5905, a buffer circuit 5906, a NOT circuit group 5907, a NAND circuit group 5908, and a NOR circuit group 5909.

Each of FIGS. 61 and 62 shows an example where a level shifter and a buffer for impedance matching are used at the output portion of the decoder. Note that the gate line driver circuit using a decoder is not limited to this configuration as long as similar function can be accomplished.

Next, description is made with reference to FIGS. 37A to 37C. FIG. 37C shows an exemplary configuration of a signal line driver circuit 3403. The signal line driver circuit 3403 includes a shift register 3406, a first latch circuit (LAT1) 3407, a second latch circuit (LAT2) 3408, an amplifier circuit 3409, and the like. The amplifier circuit 3409 may have a function to convert digital signals to analog signals. That is, the amplifier circuit 3409 may have a buffer circuit, a level shifter, or a D/A converter. In addition, the signal line driver circuit 3403 may have a gamma correction function.

Each pixel has a display element such as an EL element. There may be a case where a circuit for outputting a current (video signal) to the display element, namely a current source circuit is provided.

Next, the operation of the signal line driver circuit 3403 is described briefly. Clock signals (S-CLK), start pulses (S-SP), and inverted clock signals (S-CLKB) are inputted to the shift register 3406, and in accordance with the input timing of these signals, the shift register 3406 sequentially outputs sampling pulses.

The sampling pulses outputted from the shift register 3406 are inputted to the first latch circuit (LAT1) 3407. Video signals are inputted from a video signal line 3410 to the first latch circuit (LAT1) 3407, and these video signals are held in each column in accordance with the input timing of the sampling pulses.

After holding of video signals is completed up to the last column in the first latch circuit (LAT1) 3407, latch pulses are inputted from a latch control line 3411, and the video signals which have been held in the first latch circuit (LAT1) 3407 are transferred to the second latch circuit (LAT2) 3408 all at once in a horizontal flyback period. After that, the video signals of one row, which have been held in the second latch circuit (LAT2) 3408, are inputted to the amplifier circuit 3409 all at once. A signal which is outputted from the amplifier circuit 3409 is inputted to the pixel portion 3401.

While video signals held in the second latch circuit (LAT2) 3408 are inputted to the amplifier circuit 3409, and subsequently inputted to the pixel portion 3401, the shift register 3406 outputs sampling pulses again. That is, two operations are performed at the same time. Accordingly, line sequential driving can be performed. Hereafter, such operations are repeated hereafter.

Next, description is made on a signal line driver circuit in the case of using a timing chart where address periods and lighting periods are not separated from each other as described in Embodiment Mode 3. Here, two examples are described. The first example is a method of increasing the drive frequency of the signal line driver circuit 3403 without changing the configuration of the signal line driver circuit 3403 shown in FIG. 37C. If address periods and lighting periods are not separated from each other, the signal line driver circuit 3403 performs writing of one line in each sub-gate selection period in FIG. 31. That is, in the case of dividing one gate selection period into two, such driving that address periods and lighting periods are not separated from each other can be performed by increasing the driving frequency of the signal line driver circuit 3403 to be twice as large, compared to that in the pre-divided gate selection period. Similarly, in the case of dividing one gate selection period into three, the aforementioned operation can be performed by increasing the driving frequency to be three times as large, and in the case of dividing one gate selection period into n, the aforementioned operation can be performed by increasing the driving frequency to be n times as large. This method is advantageous in that the configuration of the signal line driver circuit is not particularly modified.

Next, the second example is described. FIG. 63 shows a configuration of a signal line driver circuit of the second example. First, an output of a shift register 6006 is inputted to both of a first latch circuit A6007 and a first latch circuit B6012. Note that although the output is inputted to both of the first latch circuit A6007 and the first latch circuit B6012 in this example, the number is not limited to two, and any number of first latch circuits may be provided. In addition, although an output of one shift register is inputted to a plurality of the first latch circuits in order to suppress an increase in the circuit scale, the number of the shift registers is not limited to one, and any number of shift registers may be provided.

Video Data A and Vide Data B are respectively inputted to the first latch circuit A6007 and the first latch circuit B6012 as video signals. The video signals are latched with an output of the shift register, and then the signals are outputted to second latch circuits. In each of second latch circuits A6008 and B6013, video signals for one line are stored, and the data held therein is updated at the timing specified by Latch Pulses A and B. Outputs of the second latch circuits A6008 and B6013 are each connected to a switch 6014 which can select one of a signal from the second latch circuit A6008 and a signal from the second latch circuit B6013 to be inputted to a pixel portion. That is, in the case of writing video signals to pixels by dividing one gate selection period into two, such driving that one gate selection period is divided into two can be performed by outputting signals from the second latch circuit A6008 in the first half of the one gate selection period, and outputting signals from the second latch circuit B6013 in the second half of the one gate selection period. In this case, the driving frequency of the signal line driver circuit can be kept about the same as compared to the configuration shown in FIG. 37 where the first and second latch circuits are provided one by one. In addition, in the case of performing driving, for example, such that one gate selection period is divided into four with the configuration in FIG. 37, the driving frequency of the signal line driver circuit is increased to be four times as large, compared to the case where the gate selection period is not divided, whereas in the configuration in FIG. 63, the driving frequency of the signal line driver circuit is only required to be increased twice as large. That is, the configuration of the signal line driver circuit in FIG. 63 is advantageous as compared to the configuration in FIG. 37 in power consumption, yield, and reliability.

Note that the signal line driver circuit or a part of it (e.g., a current source circuit, a level shifter, or the like) is not necessarily provided over the same substrate as the pixel portion 3401, but may be constructed with an external IC chip.

Figure 38:
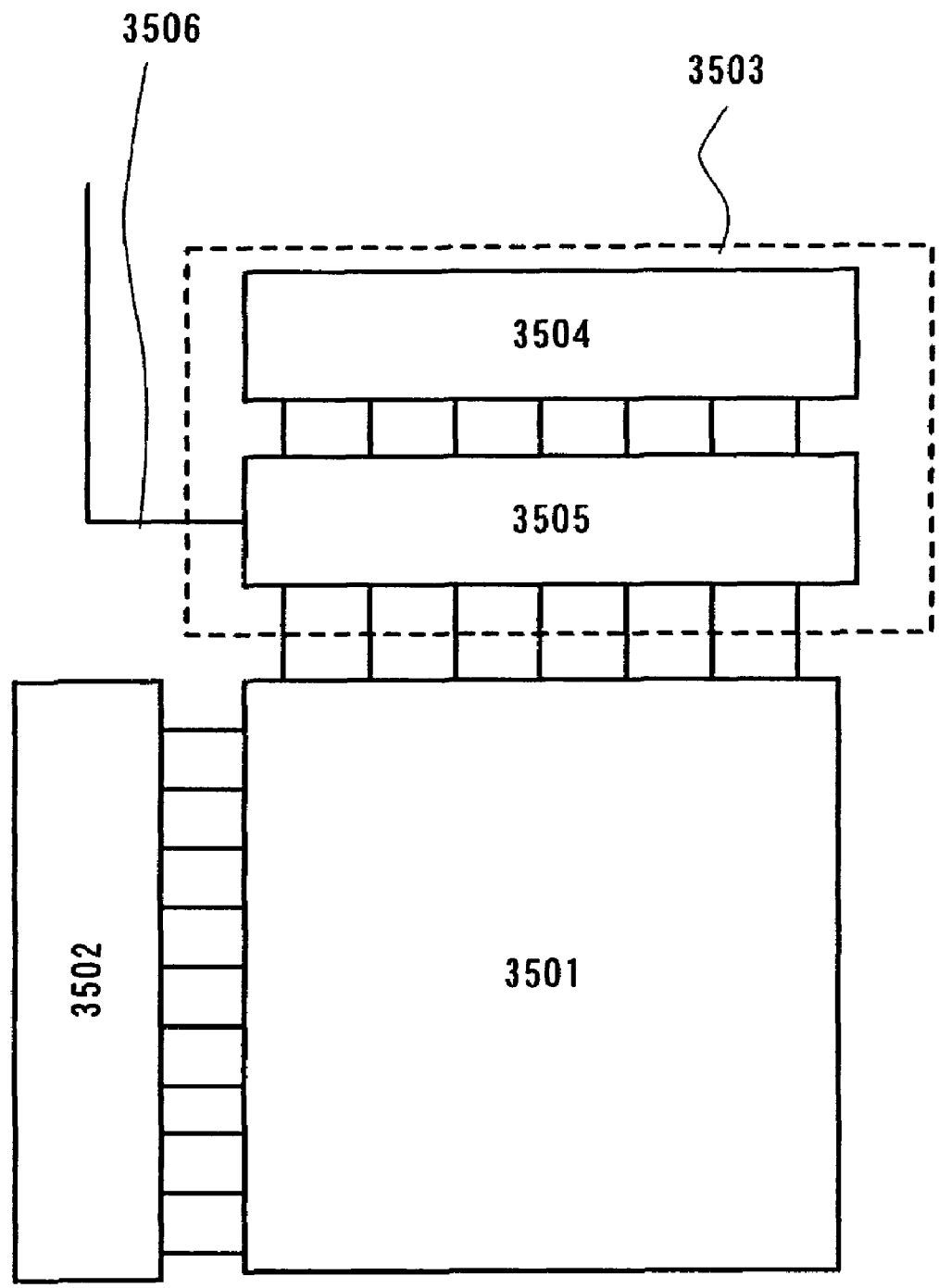
FIG. 38 shows an exemplary display device using the driving method of the invention.

Note also that the gate line driver circuit in FIG. 63 may be constructed in n combination with various circuits including those described in this specification. Further, the configurations of the signal line driver circuit and the gate line driver circuit are not limited to those in FIGS. 37A to 37C and FIG. 63. For example, there may be a case where signals are supplied to pixels by a dot sequential driving method. FIG. 38 shows an example of that case. A signal line driver circuit 3503 is constructed of a shift register 3504 and a sampling circuit 3505. The shift register 3504 outputs sampling pulses to the sampling circuit 3505. Video signals, which are inputted form a video signal line 3506 to the sampling circuit 3505, are inputted to a pixel portion 3501 in accordance with the sampling pulses. Then, signals are sequentially inputted to pixels of a row selected by a gate line driver circuit 3502.

Note that as is described already, transistors of the invention may be any type of transistors, and formed over any substrate. Therefore, all the circuits as shown in FIGS. 37A to 37C, FIG. 38, and FIG. 63 may be formed over a glass substrate, a plastic substrate, a single crystalline substrate, or an SOI substrate. Alternatively, a part of the circuits in FIGS. 37A to 37C, FIG. 38, and FIG. 63 may be formed over one substrate, while another part of the circuits may be formed over another substrate. That is, not the whole circuits in 37A to 37C, FIG. 38, and FIG. 63 are required to be formed over the same substrate. For example, in 37A to 37C, FIG. 38, and FIG. 63, the pixel portion and the gate line driver circuit may be formed over a glass substrate using TFTs, while the signal line driver circuit (or a part of it) may be formed over a single crystalline substrate as an IC chip, and then the IC chip may be mounted onto the glass substrate by COG (Chip On Glass) bonding. Alternatively, the IC chip may be connected to the glass substrate by TAB (Tape Auto Bonding) or with a printed substrate.

Note that the descriptions in this embodiment mode correspond to the one utilizing the descriptions in Embodiment Modes 1 to 3. Accordingly, the descriptions in Embodiment Modes 1 to 3 may be applied to this embodiment mode.

Embodiment Mode 5

Figure 39:
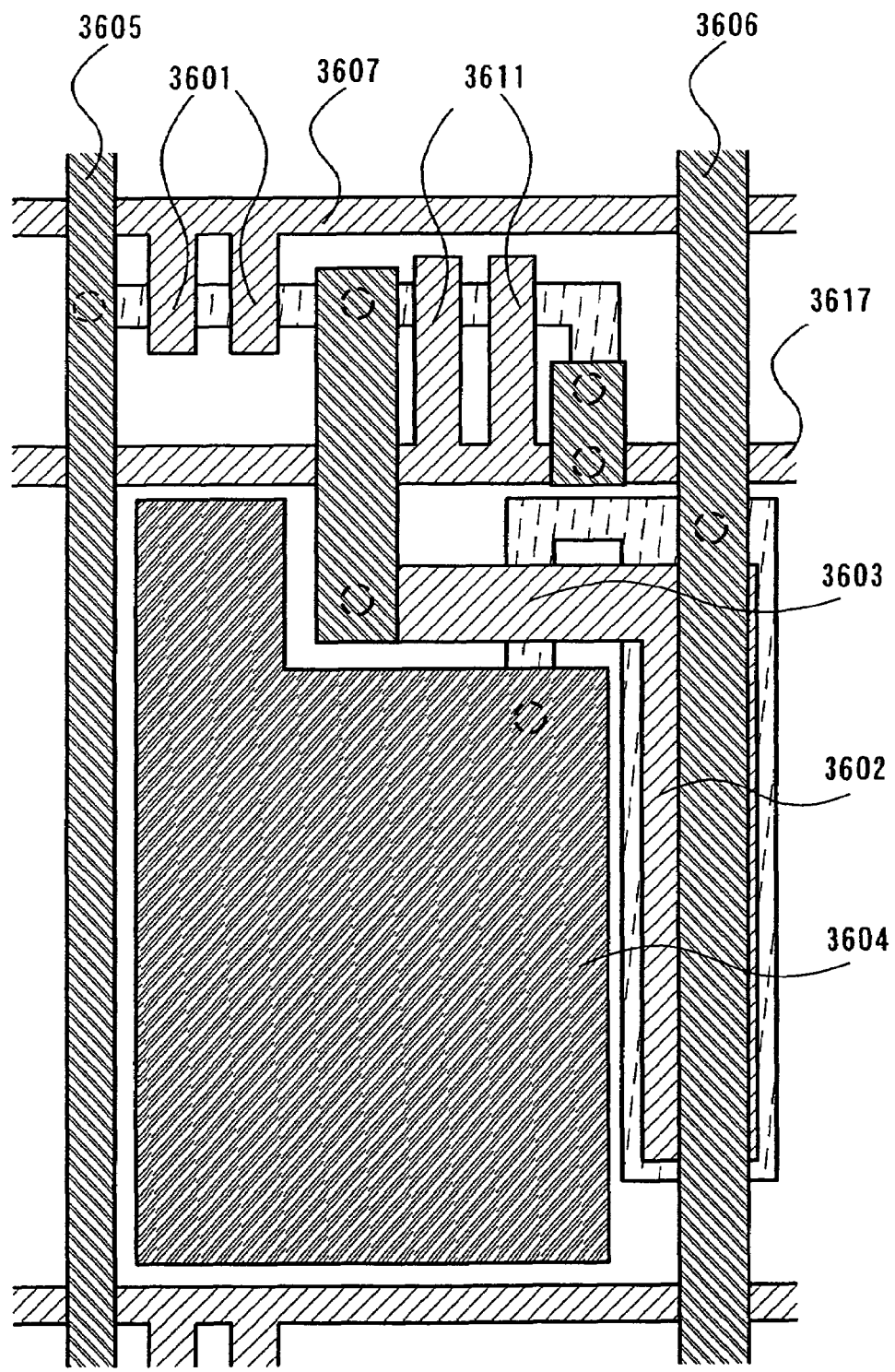
FIG. 39 shows an exemplary layout of a pixel portion in a display device using the driving method of the invention.

In this embodiment mode, description is made on a pixel layout of a display device of the invention. As an example, FIG. 39 shows a layout of a circuit diagram shown in FIG. 35. Note that the reference numerals used in FIG. 39 correspond to those in FIG. 35. Note also that the circuit diagram and the layout are not limited to those in FIGS. 35 and 39.

A pixel shown in FIG. 39 includes the first transistor 3101, the second transistor 3103, the holding capacitor 3102, the display element 3104, the signal line 3105, the first gate line 3107, the second gate line 3117, the first power supply line 3106, the second power supply line 3108, and a diode-connected transistor 3211.

A gate electrode of the first transistor 3101 is connected to the first gate line 3107, a first electrode thereof is connected to the signal line 3105, and a second electrode thereof is connected to a second electrode of the holding capacitor 3102, a gate electrode of the second transistor 3103, and a second electrode of the diode-connected transistor 3211. A first electrode of the second transistor 3103 is connected to the first power supply line 3106, and a second electrode thereof is connected to a first electrode of the display element 3104. A first electrode of the holding capacitor 3102 is connected to the first power supply line 3106. A second electrode of the display element 3104 is connected to the second power supply line 3108. A gate electrode of the diode-connected transistor 3211 is connected to a second electrode of the diode-connected transistor 3211, and a first electrode thereof is connected to the second gate line 3117.

The signal line 3105 and the first power supply line 3106 are formed of a second wire, while the first gate line 3107 and the second gate line 3117 are formed of a second wire.

In the case where each transistor has a top-gate structure, a substrate, a semiconductor layer, a gate insulating film, a first wire, an interlayer insulating film, and a second wire are formed in this order. On the other hand, in the case where each transistor has a bottom-gate structure, a substrate, a first wire, a gate insulating film, a semiconductor layer, an interlayer insulating film, and a second wire are formed in this order.

Note that the description in this embodiment mode can be appropriately implemented in combination with any of the descriptions in Embodiment Modes 1 to 4.

Embodiment Mode 6

In this embodiment mode, description is made on hardware for controlling the driving methods described in Embodiment Modes 1 to 5.

Figure 40:
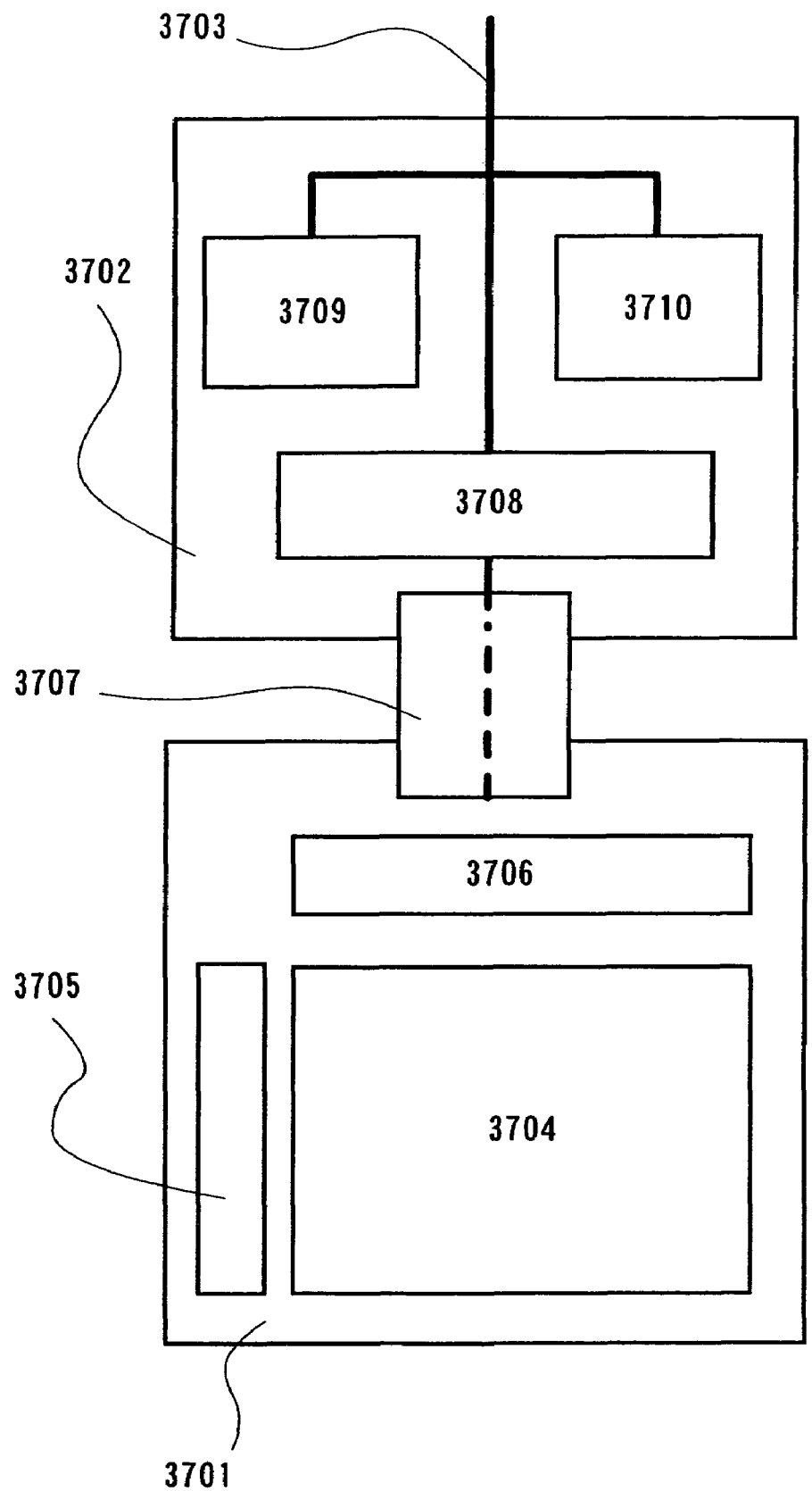
FIG. 40 shows exemplary hardware for controlling the driving method of the invention.

FIG. 40 shows a schematic view thereof. A pixel portion 3704 is disposed over a substrate 3701. In addition, a signal line driver circuit 3706 and a gate line driver circuit 3705 are often disposed over the same substrate. Besides, a power supply circuit, a precharge circuit, a timing generating circuit, or the like may be disposed. There is also a case where the signal line driver circuit 3706 or the gate line driver circuit 3705 is not disposed. In that case, a circuit which is not provided over the substrate 3701 is often formed in an IC. The IC is often mounted on the substrate 3701 by COG (Chip On Glass) bonding. Alternatively, the IC may be mounted on a connecting substrate 3707 for connecting a peripheral circuit substrate 3702 to the substrate 3701.

A signal 3703 is inputted to the peripheral circuit substrate 3702, and a controller 3708 controls the signal to be stored in a memory 3709, a memory 3710, or the like. In the case where the signal 3703 is an analog signal, it is often subjected to analog-digital conversion before being stored in the memory 3709, the memory 3710, or the like. The controller 3708 outputs a signal to the substrate 3701 by using the signal stored in the memory 3709, the memory 3710, or the like.

In order to perform the driving methods described in Embodiment Modes 1 to 5, the controller 3708 controls the arranging order of subframes or the like, and outputs signals to the substrate 3701.

Note that the description in this embodiment mode can be appropriately implemented in combination with any of the descriptions in Embodiment Modes 1 to 5.

Embodiment Mode 7

In this embodiment mode, description is made with reference to FIG. 66 on an exemplary manufacturing process of a thin film transistor which can be used for a display device of the invention. Although this embodiment mode illustrates a manufacturing process of a top-gate thin film transistor formed with a crystalline semiconductor, a thin film transistor which can be used for the invention is not limited to this. For example, a thin film transistor formed with an amorphous semiconductor or a bottom-gate thin film transistor may be used.

First, a base film 11201 is formed over a substrate 11200. The substrate 11200A may be a glass substrate made of barium borosilicate glass, alumino borosilicate glass, or the like, a silicon substrate, a heat-resistant plastic substrate, a heat-resistant resin substrate, or the like. As the plastic substrate or resin substrate, there is polyethylene terephthalate (PET), polyethylene naphthalate (PEN), polyethersulfone (PES), acrylic, polyimide, or the like. The base film 11201 is formed by depositing an oxide or nitride material containing silicon in a single layer or stacked layers by CVD, plasma CVD, sputtering, spin coating, or the like. By forming the base film 11201, a semiconductor film can be prevented from degradation due to contaminants from the substrate 11200.

Figure 66A:
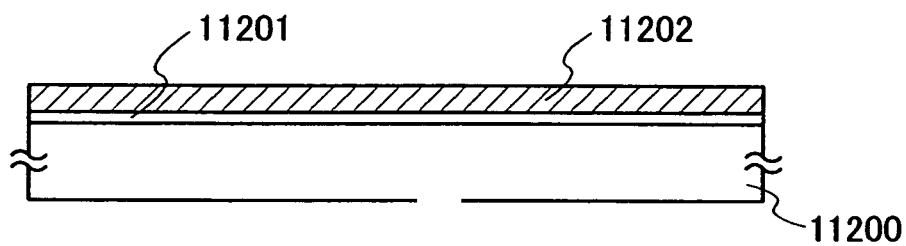
FIGS. 66A to 66E show an exemplary manufacturing process of a thin film transistor applicable to the invention.

Subsequently, a semiconductor film 11202 is formed over the base film 11201 (see FIG. 66A). The semiconductor film 11202 may be formed with a thickness of 25 to 200 nm (preferably, 50 to 150 nm) by sputtering, LPCVD, plasma CVD, or the like. In this embodiment mode, an amorphous semiconductor film is formed and then crystallized. As a material of the semiconductor film 11202, silicon or germanium can be used; however, the material is not limited to these.

The crystallization may be performed by laser crystallization, thermal crystallization, thermal crystallization using elements which promote crystallization such as nickel, or the like. In the case of not adding elements which promote crystallization, heat treatment is applied to the amorphous silicon film at 500° C. for one hour under a nitrogen atmosphere before irradiating the amorphous silicon film with laser light, so as to discharge hydrogen until the concentration of hydrogen contained in the amorphous silicon film becomes $1 \times 10^{20}$ atoms/cm$^3$ or less. This is because the amorphous silicon film containing a large amount of hydrogen is damaged when being irradiated with laser light.

There is no particular limitation on the method of adding elements serving as catalysts into the amorphous semiconductor film as long as the catalytic elements can exist on the surface of or inside the amorphous semiconductor film. For example, sputtering, CVD, plasma treatment (including plasma CVD), adsorption, or a method of applying a metal salt solution can be employed. Above all, the method of using a solution is advantageous in that it is simple, and easy in terms of controlling the concentration of the metal element. In order to spread an aqueous solution over the entire surface of the amorphous semiconductor film, it is preferable to form an oxide film by UV light irradiation in an oxygen atmosphere, thermal oxidation, treatment with ozone water or hydrogen peroxide containing a hydroxyl radical, or the like.

Crystallization of the amorphous semiconductor film may be performed by a combination of heat treatment and laser light irradiation, or by independently performing heat treatment or laser light irradiation more than once. Alternatively, laser crystallization and crystallization using metal elements may be used in combination.

Subsequently, a resist mask is formed using a photolithography step over the crystalline semiconductor film 11202 which is formed by crystallizing the amorphous semiconductor film, and etching is performed using the mask to form a semiconductor region 11203. As for the mask, a commercial resist material including a photosensitizing agent may be used. For example, there are a novolac resin which is a typical positive resist, a naphthoquinone diazide compound which is a photosensitizing agent, a base resin which is a negative resist, diphenylsilanediol, an acid generating agent, and the like. In using any of such materials, the surface tension and the viscosity can be appropriately controlled by adjusting the concentration of a solvent, adding a surfactant, or the like.

Note that an insulating film with a thickness of about a few nanometers may be formed over the surface of the semiconductor film before applying a resist in the photolithography step of this embodiment mode. This step can avoid a direct contact between the semiconductor film and the resist, thereby preventing impurities from entering the semiconductor film.

Subsequently, a gate insulating film 11204 is formed over the semiconductor region 11203. Note that the gate insulating film has a single-layer structure in this embodiment mode; however, it may have a stacked structure of two or more layers. In the case of forming a stacked structure, the insulating film is preferably formed continuously in the same chamber at the same temperature while keeping a vacuum and changing a reactive gas. When the insulating film is continuously formed while keeping a vacuum, an interface between the stacked layers can be prevented from being contaminated.

As a material of the gate insulating film 11204, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used appropriately. Note that in order to form a dense insulating film with low gate leakage current at low film deposition temperature, it is preferable to mix a rare gas element such as argon into a reactive gas so that it is mixed into an insulating film to be formed. In this embodiment mode, a silicon oxide film is formed as the gate insulating film 11204 by using $SiH_4$ and $N_2O$ as a reactive gas to have a thickness of 10 to 100 nm (preferably, 20 to 80 nm), and for example, 60 nm. Note that the thickness of the gate insulating film 11204 is not limited to this range.

Figure 66B:
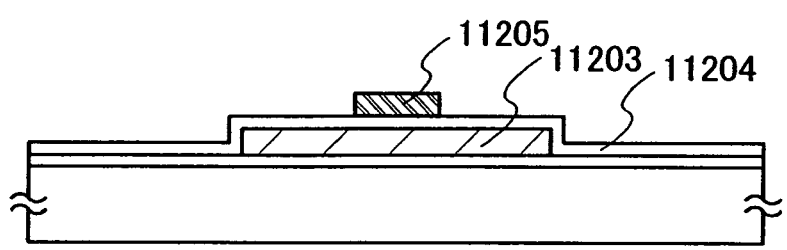

Next, a gate electrode 11205 is formed over the gate insulating film 11204 (see FIG. 66B). The thickness of the gate electrode 11205 is preferably in the range of 10 to 200 nm. Although this embodiment mode illustrates a method of manufacturing a TFT with a single-gate structure, a multi-gate structure with two or more gate electrodes may be employed as well. By employing the multi-gate structure, a TFT with a reduced off-state leakage current can be manufactured. The material of the gate electrode 11205 may be selected depending on the application, and the following can be used, for example: a conductive element such as silver (Ag), gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), an alloy or compound material containing such elements as its main component, or the like. Alternatively, the gate electrode 11205 may be formed by using indium tin oxide (ITO) obtained by mixing tin oxide with indium oxide; indium tin silicon oxide (ITSO) obtained by mixing silicon oxide with indium tin oxide (ITO); indium zinc oxide (IZO) obtained by mixing zinc oxide with indium oxide; zinc oxide (ZnO); tin oxide ($SnO_2$); or the like. Note that indium zinc oxide (IZO) is a light-transmissive conductive material which is formed by sputtering with a target where indium tin oxide (ITO) is mixed with 2 wt % to 20 wt % of zinc oxide (ZnO).

Next, impurity elements are added into the semiconductor region 11203 using the gate electrode 11205 as a mask. Here, a semiconductor region which imparts n-type conductivity can be formed by adding, for example, phosphorus (P) as the impurity elements so as to be contained at a concentration of about $5 \times 10^{19}$ to $5 \times 10^{20}/cm^3$. Alternatively, a semiconductor region having p-type conductivity may be formed by adding impurity elements which impart p-type conductivity. As the impurity elements which impart n-type conductivity, phosphorus (P), arsenic (As), or the like can be used. As the impurity elements which impart p-type conductivity, boron (B), aluminum (Al), gallium (Ga), or the like can be used. Note that an LDD (Lightly Doped Drain) region to which impurity elements are added at a low concentration may also be formed. By forming an LDD region, a TFT with a reduced off-state leakage current can be manufactured.

Figure 66C:
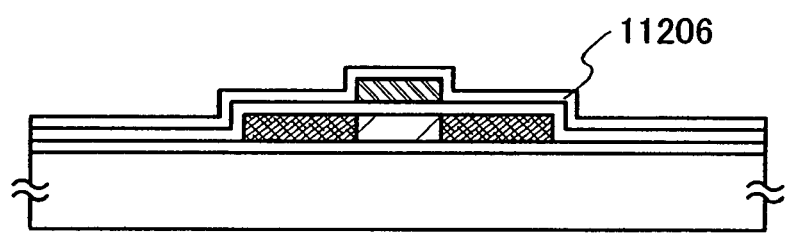
Figure 66D:
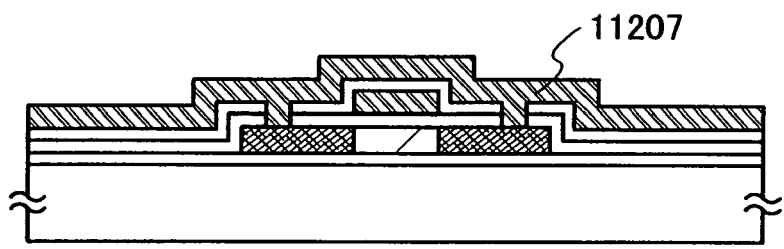

Then, an insulating film 11206 is formed to cover the gate insulating film 11204 and the gate electrode 11205 (see FIG. 66C). As a material of the insulating film 11206, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used appropriately. Although the insulating film 11206 has a single-layer structure in this embodiment mode, it may have a stacked structure of two or more layers. Further, one or more interlayer insulating films may be provided over the insulating film 11206.

Next, a resist mask is formed using a photolithography step and the gate insulating film 11204 and the insulating film 11206 are etched to form openings which expose portions of the semiconductor region 11203 doped with the impurity elements. Then, a conductive film 11207 to serve as an electrode is formed to be electrically connected to the semiconductor region 11203 (see FIG. 66D). As a material of the conductive film, the same material as that of the gate electrode 11205 can be used.

Figure 66E:
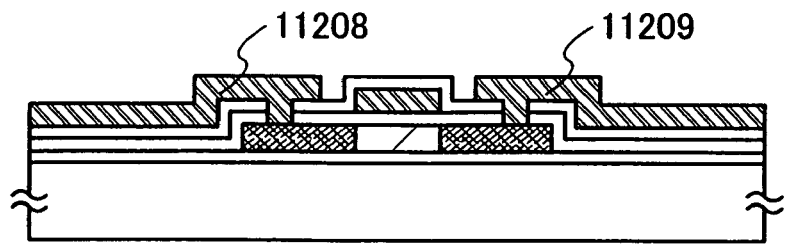

Next, a resist mask (not shown) is formed using a photolithography step and the conductive film 11207 is processed into a desired shape with the mask, thereby forming source and drain electrodes 11208 and 11209 (see FIG. 66E).

Note that etching in this embodiment mode may be performed by either plasma etching (dry etching) or wet etching; however, plasma etching is suitable for treating a substrate with a large area. As an etching gas, a fluorine source gas such as $CF_4$, $NF_3$, $SF_6$, or $CHF_3$, a chlorine source gas such as $Cl_2$, $BCl_3$, $SiCl_4$, or $CCl_4$, or an $O_2$ gas is used, to which an inert gas such as He or Ar may be appropriately added.

Through the aforementioned process, a top-gate thin film transistor formed with a crystalline semiconductor can be manufactured.

Note that the description in this embodiment mode can be appropriately implemented in combination with any of the descriptions in Embodiment Modes 1 to 6.

Embodiment Mode 8

In this embodiment mode, description is made with reference to FIGS. 67A and 67B on a display panel of the invention. Note that FIG. 67A is a top view showing a display panel, and FIG. 67B is a cross-sectional view taken along a line A-A' of FIG. 67A. The display panel includes a signal line driver circuit (Data line) 1101, a pixel portion 1102, a first gate line driver circuit (G1 line) 1103, and a second gate line driver circuit (G2 line) 1106 which are indicated by dashed lines. The display panel also includes a sealing substrate 1104 and a sealant 1105, and the interior side of the sealant 1105 is a space 1107.

Note that a wire 1108 is a wire for transmitting signals to the first gate line driver circuit 1103, the second gate line driver circuit 1106, and the signal line driver circuit 1101, and receives video signals, clock signals, start signals, and the like from an FPC (Flexible Printed Circuit) 1109 which serves as an external input terminal. An IC chip (a semiconductor chip constructed of a memory circuit, a buffer circuit, or the like) is mounted on a connecting portion of the FPC 1109 and the display panel by COG (Chip On Glass) bonding or the like. Although only the FPC is shown here, a printed wiring board (PWB) may be attached to the FPC. The display device in this specification includes not only a display panel itself but also a display panel with an FPC or a PWB attached. In addition, it also includes a display panel on which an IC chip or the like is mounted.

Next, a cross-sectional structure is described with reference to FIG. 67B. Although the pixel portion 1102 and its peripheral driver circuits (the first gate line driver circuit 1103, the second gate line driver circuit 1106, and the signal line driver circuit 1102) are formed over a substrate 1110, only the signal line driver circuit 1101 and the pixel portion 1102 are shown in this drawing.

Note that the signal line driver circuit 1101 is constructed of unipolar transistors such as an n-channel transistor 1120 and an n-channel TFT 1121. Similarly, the first gate line driver circuit 1103 and the second gate line driver circuit 1106 are preferably constructed of n-channel transistors. In addition, by using the pixel configuration of the invention for the pixel configuration, construction with unipolar transistors can be enabled; therefore, a unipolar display panel can be manufactured. Although this embodiment mode illustrates a display panel where the peripheral driver circuits are formed over a common substrate, all or part of the peripheral driver circuits may be formed in an IC chip or the like and mounted onto the substrate by COG bonding or the like. In such a case, the driver circuit is not required to have unipolarity, and thus p-channel transistors may be used in combination.

The pixel portion 1102 has a plurality of circuits each of which constitutes a pixel including a switching TFT 1111 and a driving TFT 1112. Note that a source electrode of the driving TFT 1112 is connected to a first electrode 1113. In addition, an insulator 1114 is formed covering end portions of the first electrode 1113. Here, a positive photosensitive acrylic resin film is used.

In order to obtain an excellent coverage, the insulator 1114 is formed with a curved surface at its upper end portion or lower end portion. For example, in the case of using positive photosensitive acrylic as a material of the insulator 1114, the insulator 1114 is preferably formed to have a curved surface with a curvature radius (0.2 to 3 μm) only at an upper end portion. The insulator 1114 may be formed with either a negative resist which becomes insoluble in etchant by light irradiation or a positive resist which becomes soluble in etchant by light irradiation.

A layer 1116 containing an organic compound and a second electrode 1117 are formed in this order over the first electrode 1113. Here, a material with a high work function is desirably used as a material of the first electrode 1113 functioning as an anode. For example, the first electrode 1113 can be formed with a single-layer film such as an ITO (indium tin oxide) film, an indium zinc oxide (IZO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like. When the first electrode 1113 is formed with a stacked structure, low resistance as a wire can be obtained, a favorable ohmic contact can be formed, and further a function of an anode can be obtained.

In addition, the layer 1116 containing an organic compound is formed by vapor deposition with a vapor-deposition mask or ink-jet deposition. The layer 1116 containing an organic compound is partially formed with a metal complex of Group 4 in the periodic table. Besides, a low molecular material or a high molecular material may be used in combination. Although the layer containing an organic compound is generally formed with an organic compound in a single layer or stacked layers, this embodiment mode includes such a structure that a film made of an organic compound partially includes an inorganic compound, and further, a known triplet material can be used.

As a material of the second electrode (cathode) 1117 which is formed over the layer 1116 containing an organic compound, a material with a low work function (Al, Ag, Li, or Ca, or an alloy thereof such as MgAg, MgIn, AlLi, $CaF_2$, or CaN) may be used. In the case of forming the second electrode 1117 to transmit light generated in the layer 1116 containing an organic compound, it is preferable to form the second electrode 1117 with a stacked layer of a thin metal film and a light-transmissive conductive film (e.g., indium tin oxide (ITO), an alloy of indium oxide and zinc oxide ($In_2O_3$—ZnO), zinc oxide (ZnO), or the like).

By attaching the sealing substrate 1104 to the substrate 1110 with the sealant 1105, such a structure is obtained that a light-emitting element 1118 is provided in the space 1107 surrounded by the substrate 1110, the sealing substrate 1104, and the sealant 1105. Note that there is also a case where the space 1107 is filled with the sealant 1105 as well as an inert gas (e.g., nitrogen, argon, or the like).

Note that the sealant 1105 is preferably formed with an epoxy resin. In addition, it is desirable that such material transmit as little moisture and oxygen as possible. The sealing substrate 1104 may be formed with a glass substrate or a quartz substrate as well as a plastic substrate formed of FRP (Fiberglass-Reinforced Plastics), PVF (polyvinyl fluoride), mylar, polyester, acrylic, or the like.

In this manner, a display panel having the pixel configuration of the invention can be obtained.

By forming the signal line driver circuit 1101, the pixel portion 1102, the first gate line driver circuit 1103, and the second gate line driver circuit 1106 over a common substrate as shown in FIGS. 67A and 67B, cost reduction of a display device can be achieved. In addition, in this case, by using unipolar transistors for the signal line driver circuit 1101, the pixel portion 1102, the first gate line driver circuit 1103, and the second gate line driver circuit 1106, the manufacturing process can be simplified to allow further cost reduction. Further, by using amorphous silicon for semiconductor layers of the transistors used for the signal line driver circuit 1101, the pixel portion 1102, the first gate line driver circuit 1103, and the second gate line driver circuit 1106, even more cost reduction can be achieved.

Note that the configuration of the display panel is not limited to the configuration where the signal line driver circuit 1101, the pixel portion 1102, the first gate line driver circuit 1103, and the second gate line driver circuit 1106 are formed over a common substrate as shown in FIG. 67A. For example, a signal line driver circuit corresponding to the signal line driver circuit 1101 may be formed in an IC chip and mounted on the display panel by COG bonding or the like.

That is, only a signal line driver circuit which requires high speed operation is formed in an IC chip using a CMOS or the like to reduce power consumption. In addition, by forming the IC chip with a semiconductor chip such as a silicon wafer, a higher-speed operation and lower power consumption can be achieved.

In addition, by forming the gate line driver circuit over the same substrate as the pixel portion, cost reduction can be achieved. Further, by forming the gate line driver circuit and the pixel portion with unipolar transistors, further cost reduction can be achieved. As the pixel configuration of the pixel portion, n-channel transistors may be used as shown in Embodiment Mode 3. Moreover, by using amorphous silicon for semiconductor layers of the transistors, the manufacturing process can be simplified to allow further cost reduction.

Accordingly, cost reduction of a high-resolution display device can be achieved. In addition, a substrate area can be efficiently used by mounting an IC chip constructed of a functional circuit (e.g., a memory or a buffer) on a connecting portion of the FPC 1109 and the substrate 1110.

Furthermore, such a structure may also be employed that a signal line driver circuit, a first gate line driver circuit, and a second gate line driver circuit which respectively correspond to the signal line driver circuit 1101, the first gate line driver circuit 1103, and the second gate line driver circuit 1106 in FIG. 67A are formed in IC chips and mounted on a display panel by COG bonding or the like. In this case, power consumption of the high-resolution display device can be further reduced. Thus, in order to obtain a display device with lower power consumption, polysilicon is desirably used for semiconductor layers of the transistors used in the pixel portion.

In addition, by using amorphous silicon for semiconductor layers of the transistors in the pixel portion 1102, further cost reduction can be achieved. Further, a display panel with a large area can be manufactured.

Note that the gate line driver circuit and the signal line driver circuit are not necessarily provided in the row direction and the column direction of the pixels.

Figure 68:
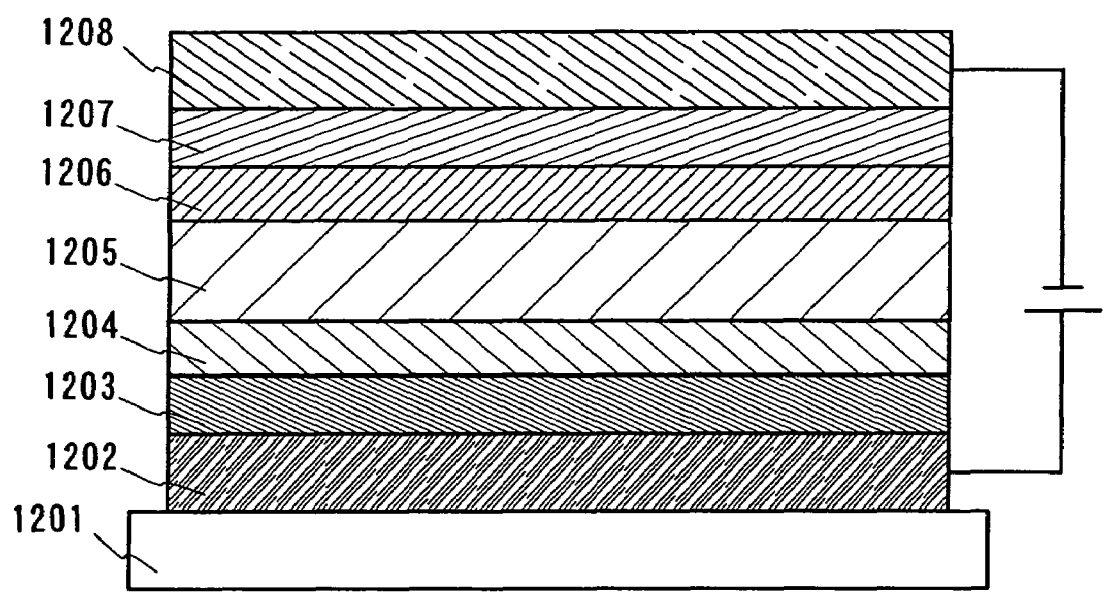
FIG. 68 shows an exemplary light-emitting element applicable to a display device having the pixel structure of the invention.

Next, FIG. 68 shows an exemplary light-emitting element which can be used as the light-emitting element 1118.

The light-emitting element has such an element structure that an anode 1202, a hole injecting layer 1203 formed of a hole injecting material, a hole transporting layer 1204 formed of a hole transporting material, a light-emitting layer 1205, an electron transporting layer 1206 formed of an electron transporting material, an electron injecting layer 1207 formed of an electron injecting material, and a cathode 1208 are stacked in this order over a substrate 1201. Here, the light-emitting layer 1205 may be formed of only one kind of a light-emitting material in some cases; however, it may be formed of two or more kinds of materials. In addition, the element structure of the invention is not limited to this structure.

In addition to the stacked structure of the functional layers shown in FIG. 68, a variety of other element structures may be employed, such as an element using a high molecular material, a high-efficiency element whose light-emitting layer is formed with a triplet light-emitting material which emits light in returning from a triplet excited state to a ground state. In addition, the invention can be applied to a white-light-emitting element which is obtained by providing a hole blocking layer to control a region where carriers are recombined and to divide a light-emitting region.

According to a manufacturing method of the element of the invention shown in FIG. 68, a hole injecting material, a hole transporting material, and a light-emitting material are vapor-deposited in this order over the substrate 1201 having an anode (ITO: Indium Tin Oxide) 1202. Then, an electron transporting material and an electron injecting material are vapor-deposited, and the cathode 1208 is lastly vapor-deposited.

Materials suitable for the hole injecting material, the hole transporting material, the electron transporting material, the electron injecting material, and the light-emitting material are described below.

As the hole injecting material, a porphyrin compound, phthalocyanine (hereinafter referred to as "$H_2Pc$"), copper phthalocyanine (hereinafter referred to as "CuPc"), or the like can be effectively used among organic compounds. In addition, a material which has a smaller value of an ionization potential than the hole transporting material and has a hole transporting function can also be used as the hole injecting material. There is also a conductive high molecular compound doped with chemicals, such as polyethylenedioxythiophene (hereinafter referred to as "PEDOT") doped with polystyrene sulfonate (hereinafter referred to as "PSS"), polyaniline, and the like. In addition, an insulating high molecular compound is also effective in planarization of an anode, and polyimide (hereinafter referred to as "PI") is often used. Further, an inorganic compound is also used, such as an ultrathin film of aluminum oxide (hereinafter referred to as "alumina") as well as a thin metal film such as gold or platinum.

A material which is most widely used as the hole transporting material is an aromatic amine compound (i.e., a compound having benzene ring-nitrogen bonds). As a material which is widely used, there are 4,4'-bis(diphenylamino)-biphenyl (hereinafter referred to as "TAD"), a derivative thereof such as 4,4'-bis[N-(3-methylphenyl)-N-phenyl-amino]-biphenyl (hereinafter referred to as "TPD"), and 4,4'-bis[N-(1-naphthyl)-N-phenyl-amino]-biphenyl (hereinafter referred to as "a-NPD"), and besides, a star burst aromatic amine compound can be used, such as 4,4',4''-tris(N,N-diphenyl-amino)-triphenylamine (hereinafter referred to as "TDATA") or 4,4',4''-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as tris(8-quinolinolato)aluminum (hereinafter referred to as "$Alq_3$"), BAlq, tris(4-methyl-8-quinolinolato)aluminum (hereinafter referred to as "Almq"), or bis(10-hydroxybenzo[h]-quinolinato)beryllium (hereinafter referred to as "Bebq"), and besides, there is a metal complex having an oxazole-based or thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, other than the metal complex, the following materials have an electron transporting property: an oxadiazole derivative such as 2-(4-biphenylyl)-5-(4-tert-butylphenyl)-1,3,4-oxadiazole (hereinafter referred to as "PBD") or OXD-7, a triazole derivative such as TAZ or 3-(4-tert-butylphenyl)-4-(4-ethylphenyl)-5-(4-biphenylyl)-1,2,4-triazole (hereinafter referred to as "p-EtTAZ"), and a phenanthroline derivative such as bathophenanthroline (hereinafter referred to as "BPhen") or BCP.

As the electron injecting material, the aforementioned electron transporting materials can be used. In addition, an ultrathin film of an insulator such as metal halide including calcium fluoride, lithium fluoride, or cesium fluoride, is often used as well as alkali metal oxide such as lithium oxide. Further, an alkali metal complex such as lithium acetyl acetonate (hereinafter referred to as "Li(acac)") or 8-quinolinolato-lithium (hereinafter referred to as "Liq") is also effective.

As the light-emitting material, various fluorescent pigments can be effectively used in addition to the aforementioned metal complex such as $Alq_3$, Almq, BeBq, BAlq, $Zn(BOX)_2$, or $Zn(BTZ)_2$. As the fluorescent pigments, there are 4,4'-bis(2,2-diphenyl-vinyl)-biphenyl for blue emission, 4-(dicyanomethylene)-2-methyl-6-(p-dimethylamino-nostyryl)-4H-pyran for red-orange emission, and the like. In addition, a triplet light-emitting material can be also used, which is mainly a complex having platinum or iridium as central metal. As the triplet light-emitting material, the following materials are known: tris(2-phenylpyridine)iridium, bis(2-(4'-tryl)pyridinato-N,$C^{2'}$)acetylacetonato iridium (hereinafter referred to as "acaclr$(tpy)_2$"), 2,3,7,8,12,13,17,18-octaethyl-21H,23H-porphyrin-platinum, and the like.

By combining the aforementioned materials having each function, a highly reliable light-emitting element can be manufactured.

In addition, such a light-emitting element can be employed that has layers stacked in reverse order of that in FIG. 68. That is, the light-emitting element has an element structure where the cathode 1208, the electron injecting layer 1207 formed of an electron injecting material, the electron transporting layer 1206 formed of an electron transporting material, the light-emitting layer 1205, the hole transporting layer 1204 formed of a hole transporting material, the hole injecting layer 1203 formed of a hole injecting material, and the anode 1202 are stacked in this order over the substrate 1201.

In addition, in order to extract light emitted from the light-emitting element, at least one of the anode and the cathode is required to transmit light. A TFT and the light-emitting element are formed over a substrate. As a structure of a light-emitting element, there are a top-emission structure where light is extracted through the opposite side of the substrate, a bottom-emission structure where light is extracted through the substrate side, and a dual-emission structure where light is emitted through both sides. The pixel structure of the invention can be applied to a light-emitting element having any of the aforementioned emission structures.

A light-emitting element with a top-emission structure is described with reference to FIG. 69A.

A driving TFT 1301 is formed over a substrate 1300, and a first electrode 1302 is formed in contact with a source electrode of the driving TFT 1301. A layer 1303 containing an organic compound and a second electrode 1304 are formed thereover.

Note that the first electrode 1302 is an anode of the light-emitting element, while the second electrode 1304 is a cathode of the light-emitting element. That is, the light-emitting element corresponds to a region where the layer 1303 containing an organic compound is sandwiched between the first electrode 1302 and the second electrode 1304.

The first electrode 1302 functioning as an anode is desirably formed with a material having a high work function. For example, the first electrode 1302 can be formed with a single-layer film such as a titanium nitride film, a chromium film, a tungsten film, a Zn film, or a Pt film, a stacked layer of a titanium nitride film and a film containing aluminum as its main component, or a three-layer structure of a titanium nitride film, a film containing aluminum as its main component, and a titanium nitride film, or the like. When the first electrode 1302 is formed with a stacked structure, low resistance as a wire can be obtained, a favorable ohmic contact can be formed, and further a function of an anode can be obtained. By using a light-reflective metal film, an anode which does not transmit light can be formed.

The second electrode 1304 functioning as a cathode is preferably formed with a stacked layer of a thin metal film which is formed of a material with a low work function (Al, Ag, Li, or Ca, or an alloy thereof such as MgAg, MgIn, AlLi, $CaF_2$, or CaN) and a light-transmissive conductive film (indium tin oxide (ITO), indium zinc oxide (IZO), zinc oxide (ZnO), or the like). By using the thin metal film and the light-transmissive conductive film in this manner, a cathode which can transmit light can be formed.

Figure 69A:
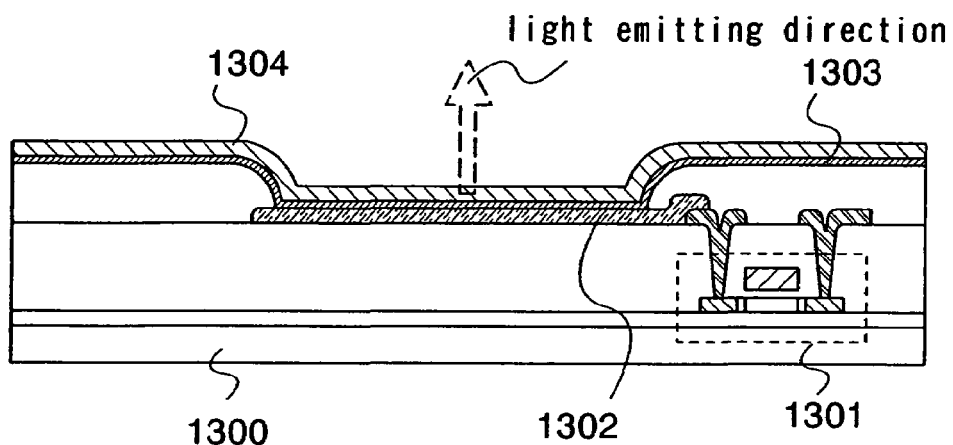
FIGS. 69A to 69C illustrate emission structures of a light-emitting element.

Thus, light emitted from the light-emitting element can be extracted through the top surface as shown by the arrow in FIG. 69A. That is, in the case of using such a light-emitting element for the display panel shown in FIGS. 67A and 67B, light is emitted to the sealing substrate 1104 side. Therefore, when a light-emitting element with a top-emission structure is used for the display device, a light-transmissive substrate is used for the sealing substrate 1104.

In addition, in the case of providing an optical film, the optical film may be provided below the sealing substrate 1104;

Note that the first electrode 1302 may be formed with a metal film formed of a material having a low work function such as MgAg, MgIn, or AlLi to function as a cathode. In this case, the second electrode 1304 may be formed with a light-transmissive conductive film such as an indium tin oxide (ITO) film or an indium zinc oxide (IZO) film. Accordingly, this structure can increase the transmissivity of light to be emitted topside.

A light-emitting element with a bottom-emission structure is described with reference to FIG. 69B. Since the overall structure except the emission structure is the same as that of FIG. 69A, the same reference numerals as those in FIG. 69A are used.

The first electrode 1302 functioning as an anode is desirably formed with a material having a high work function. For example, the first electrode 1302 may be formed with a light-transmissive conductive film such as an indium tin oxide (ITO) film or an indium zinc oxide (IZO) film. By using a light-transmissive conductive film, an anode which can transmit light can be formed.

The second electrode 1304 functioning as a cathode can be formed with a metal film formed of a material having a low work function (Al, Ag, Li, or Ca, or an alloy thereof such as MgAg, MgIn, AlLi, $CaF_2$, or CaN). By using a light-reflective metal film in this manner, a cathode which does not transmit light can be formed.

Figure 69B:
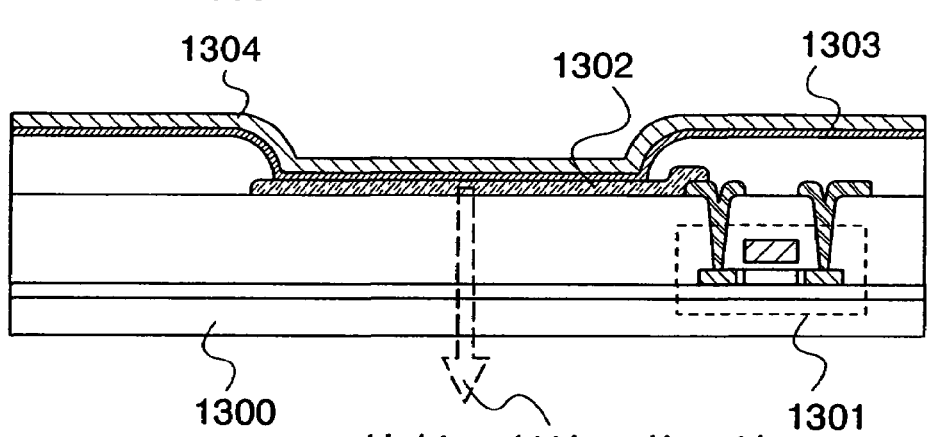

Thus, light emitted from a light-emitting element can be extracted through the bottom surface as shown by the arrow in FIG. 69B. That is, in the case of using such a light-emitting element for the display panel shown in FIGS. 67A and 67B, light is emitted to the substrate 1110 side. Thus, when a light-emitting element with a bottom-emission structure is used for the display device, a light-transmissive substrate is used as the substrate 1110.

In addition, in the case of providing an optical film, the optical film may be provided over the substrate 1110.

A light-emitting element with a dual-emission structure is described with reference to FIG. 69C. Since the overall structure except the emission structure is the same as that of FIG. 69A, the same reference numerals as those in FIG. 69A are used.

The first electrode 1302 functioning as an anode is desirably formed with a material having a high work function. For example, the first electrode 1302 can be formed with a light-transmissive conductive film such as an indium tin oxide (ITO) film or an indium zinc oxide (IZO) film. By using a light-transmissive conductive film, an anode which can transmit light can be formed.

The second electrode 1304 functioning as a cathode is preferably formed with a stacked layer of a thin metal film which is formed of a material having a low work function (Al, Ag, Li, or Ca, or an alloy thereof such as MgAg, MgIn, AlLi, $CaF_2$, or CaN) and a light-transmissive conductive film (indium tin oxide (ITO), an alloy of indium oxide and zinc oxide ($In_2O_3$—ZnO), zinc oxide (ZnO), or the like). By using the thin metal film and the light-transmissive conductive film in this manner, a cathode which can transmit light can be formed.

Figure 69C:
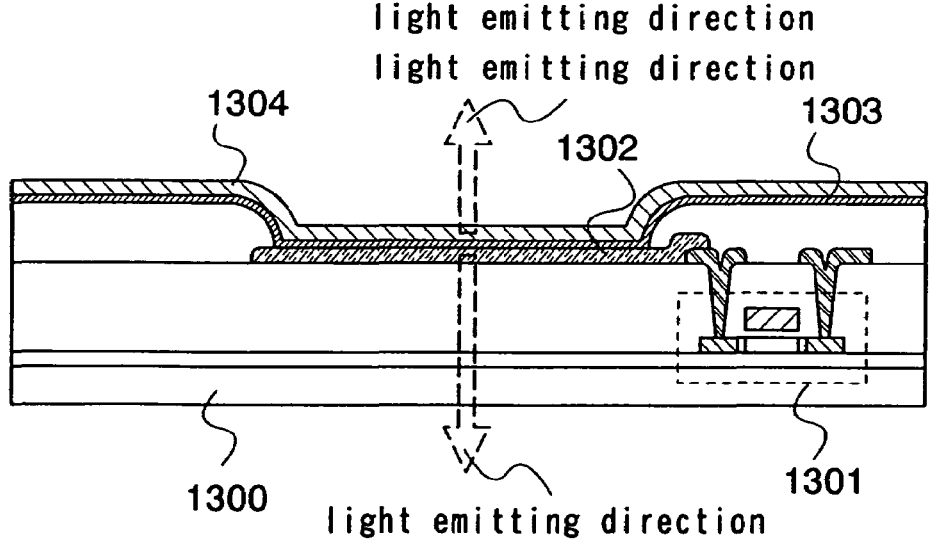

Thus, light emitted from the light-emitting element can be extracted through both sides as shown by the arrows in FIG. 69C. That is, in the case of using such a light-emitting element in the display panel shown in FIGS. 67A and 67B, light is emitted to both the substrate 1110 side and the sealing substrate 1104 side. Thus, when a light-emitting element with a dual-emission structure is used for the display device, both the substrate 1110 and the sealing substrate 1104 are formed with light-transmissive substrates.

In addition, in the case of providing an optical film, optical films may be provided over both the substrate 1110 and below the sealing substrate 1104.

In addition, the invention can be applied to a display device which performs full-color display by using white light-emitting elements and color filters.

Figure 70:
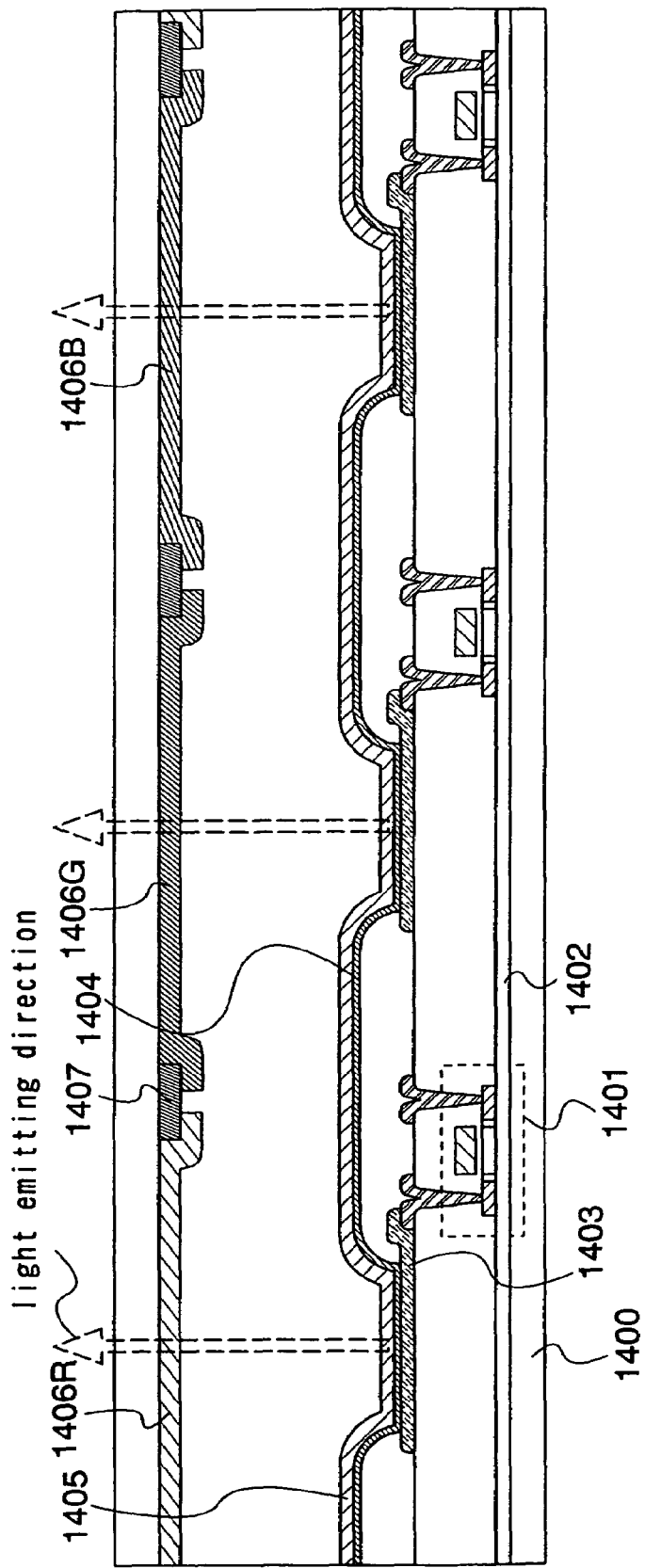
FIG. 70 shows a cross section of a display panel for performing a full color display with a color filter.

As shown in FIG. 70, a driving TFT 1401 is formed over a substrate 1400, and a first electrode 1403 is formed in contact with a source electrode of the driving TFT 1401.

Note that the first electrode 1403 is an anode of the light-emitting element, while the second electrode 1405 is a cathode of the light-emitting element. That is, the light-emitting element corresponds to a region where the layer 1404 containing an organic compound is sandwiched between the first electrode 1403 and the second electrode 1405. White light emission is obtained with the structure shown in FIG. 70. A red color filter 1406R, a green color filter 1406G, and a blue color filter 1406B are provided above the light-emitting elements, thereby full-color display can be performed. In addition, a black matrix (also called a "BM") 1407 is provided to separate these color filters.

The aforementioned structures of the light-emitting element can be used in combination and can be appropriately applied to a display device having the pixel configuration of the invention. Note that the structure of the display panel, and the light-emitting element described above are only illustrative, and it is needles to mention that the pixel configuration of the invention can be applied to a display device having other structures.

Next, a partial cross-sectional view of a pixel portion of a display panel is described.

First, description is made with reference to FIGS. 71A, 71B, 72A, and 72B on the case of using a polysilicon (p-Si: H) film as a semiconductor layer of a transistor.

Here, the semiconductor layer is obtained by, for example forming an amorphous silicon (a-Si) film over a substrate by a known film deposition method. Note that the semiconductor film is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by laser crystallization, thermal crystallization using RTA or an annealing furnace, thermal crystallization using metal elements which promote crystallization, or the like. Needless to say, such crystallization may be performed in combination.

As a result of the aforementioned crystallization, a crystallized region is formed in a part of the amorphous semiconductor film.

Next, the crystalline semiconductor film having a partially increased crystallinity is patterned into a desired shape, and an island-shaped semiconductor film is formed with the crystallized region. This semiconductor film is used as the semiconductor layer of the transistor.

Figure 71A:
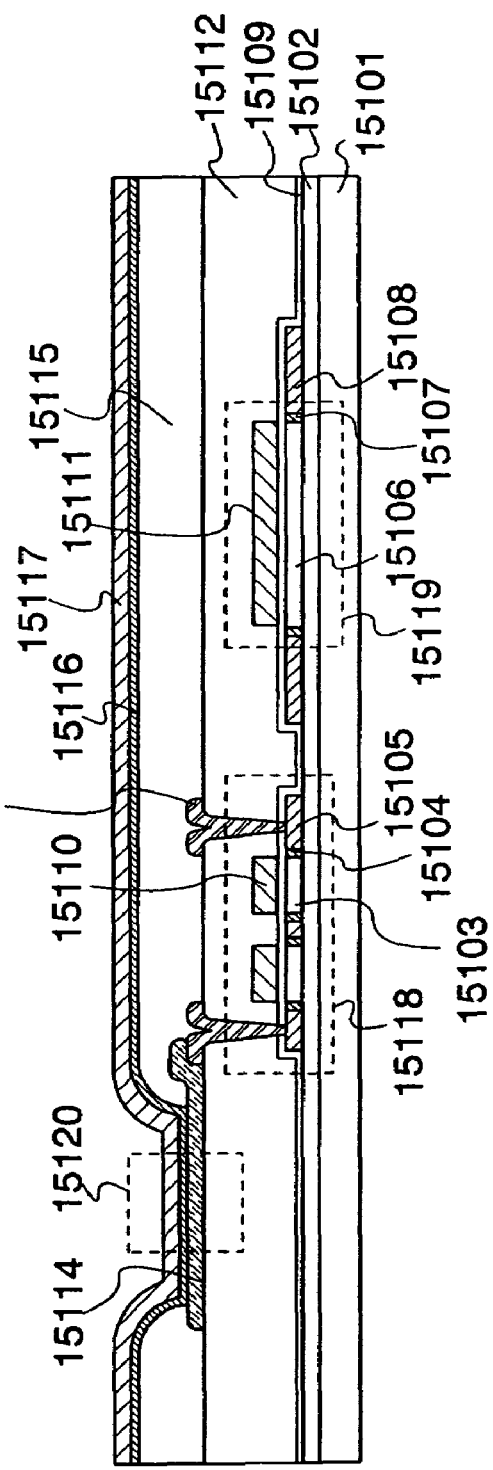
FIGS. 71A and 71B show partial cross sections of a display panel.
Figure 71B:
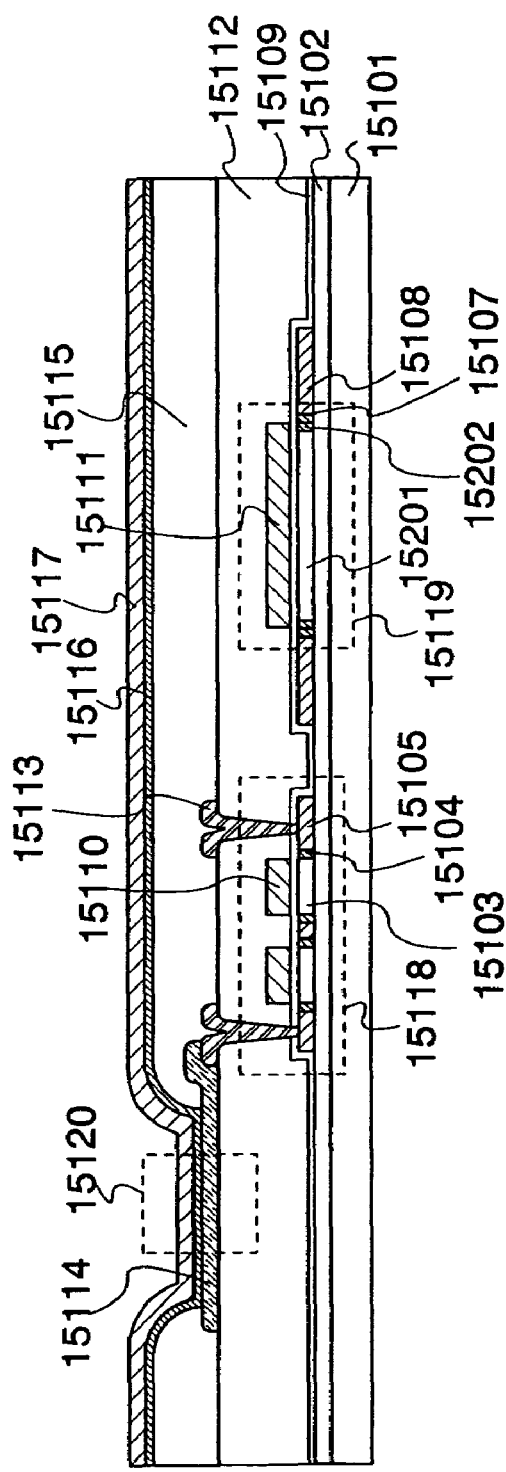

As shown in FIGS. 71A and 71B, a base film 15102 is formed over a substrate 15101, and a semiconductor layer is formed thereover. The semiconductor layer includes a channel formation region 15103, an LDD region 15104, and an impurity region 15105 which serves as a source or drain region of a driving transistor 15118, and also includes a channel formation region 15106, an LDD region 15107, and an impurity region 15108 which jointly serve as a lower electrode of a capacitor 15119. Note that channel doping may be performed to the channel formation region 15103 and the channel formation region 15106.

As the substrate, a glass substrate, a quartz substrate, a ceramic substrate, or the like can be used. The base film 15102 can be formed using a single layer of aluminum nitride (AlN), silicon oxide ($SiO_2$), silicon oxynitride ($SiO_xN_y$), or the like, or stacked layers thereof.

A gate electrode 15110 and an upper electrode 15111 of the capacitor are formed over the semiconductor layer with a gate insulating film 15109 sandwiched therebetween.

An interlayer insulating film 15112 is formed to cover the driving transistor 15118 and the capacitor 15119. Then, a contact hole is formed in the interlayer insulating film 15112, through which a wire 15113 is in contact with the impurity region 15105. A pixel electrode 15114 is formed in contact with the wire 15113, and an insulator 15115 is formed to cover end portions of the pixel electrode 15114 and the wire 15113. Here, the pixel electrode 15114 is formed with a positive photosensitive acrylic resin film. Then, a layer 15116 containing an organic compound and a counter electrode 15117 are formed over the pixel electrode 15114. Thus, a light-emitting element 15120 is formed in a region where the layer 15116 containing an organic compound is sandwiched between the pixel electrode 15114 and the counter electrode 15117.

In addition, as shown in FIG. 71B, a region 15202 may be provided to overlap the upper electrode 15111, by extending the LDD region which forms a part of the lower electrode of the capacitor 15109. Note that common portions to those in FIG. 71A are denoted by the same reference numerals, and description thereon is omitted.

Figure 72A:
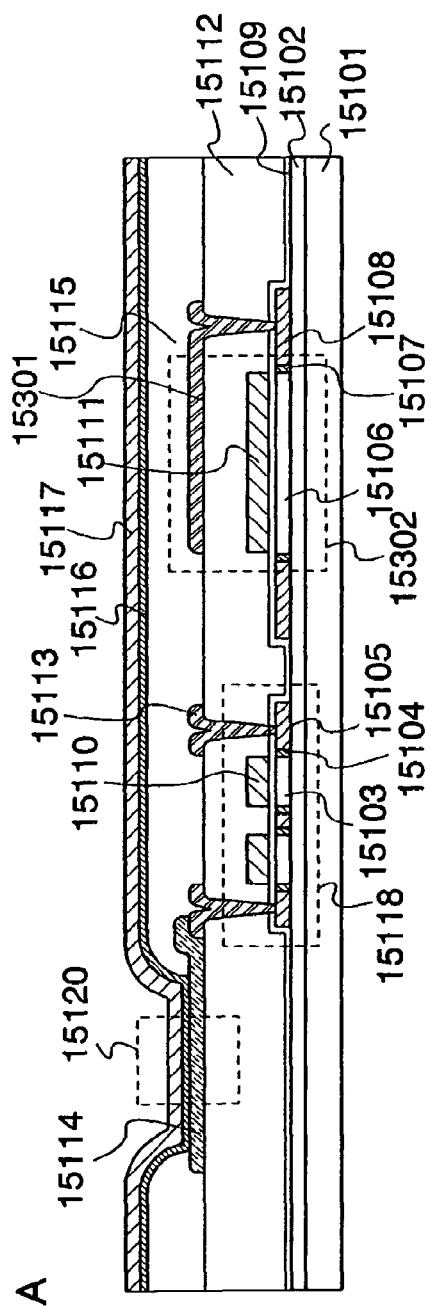
FIGS. 72A and 72B show partial cross sections of a display panel.

In addition, as shown in FIG. 72A, a second upper electrode 15301 may be provided, which is formed in the same layer as the wire 15113 in contact with the impurity region 15105 of the driving transistor 15118. A second capacitor is formed in a region where the interlayer insulating film 15112 is sandwiched between the second upper electrode 15301 and the upper electrode 15111. In addition, since the second upper electrode 15301 is in contact with the impurity region 15108, a first capacitor having such a structure that the gate insulating film 15102 is sandwiched between the upper electrode 15111 and the channel formation region 15106, and the second capacitor having such a structure that the interlayer insulating film 15112 is sandwiched between the upper electrode 15111 and the second upper electrode 15301 are connected in parallel with each other, so that a capacitor 15302 having the first capacitor and the second capacitor is obtained. Since the capacitor 15302 has a total capacitance of the first capacitor and the second capacitor, the capacitor having a large capacitance can be formed in a small area. That is, using the capacitor in the pixel configuration of the invention will lead to a further improved aperture ratio.

Figure 72B:
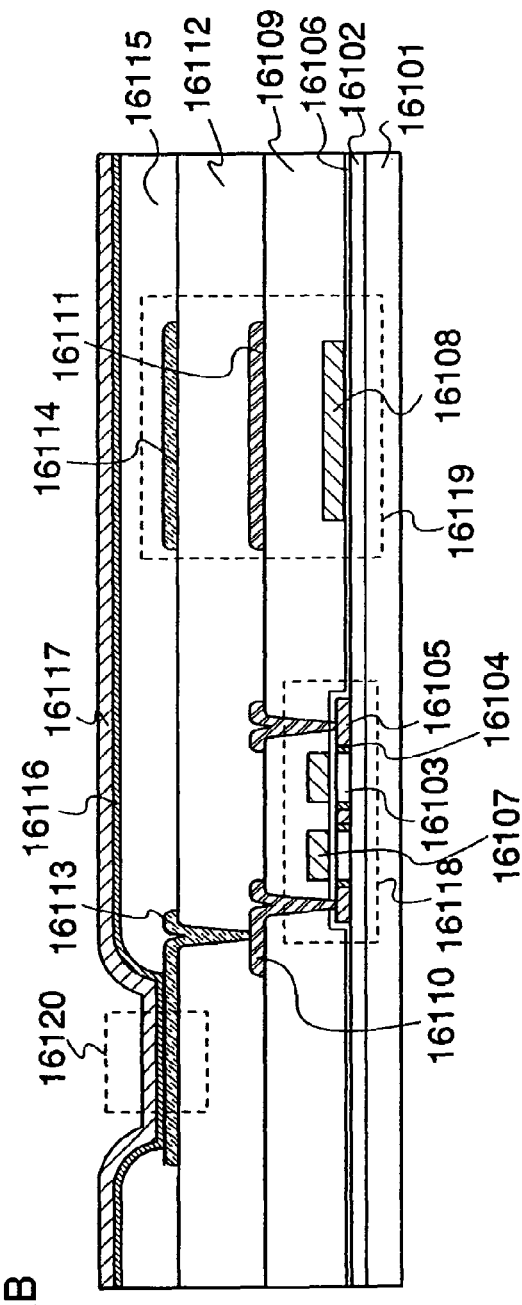

Alternatively, a structure of a capacitor as shown in FIG. 72B may be adopted. A base film 16102 is formed over a substrate 16101, and a semiconductor layer is formed thereover. The semiconductor layer includes a channel formation region 16103, an LDD region 16104, and an impurity region 16105 to serve as a source or drain region of a driving transistor 16118. Note that channel doping may be performed to the channel formation region 16103.

As the substrate, a glass substrate, a quartz substrate, a ceramic substrate, or the like can be used. The base film 16102 can be formed using a single layer of aluminum nitride (AlN), silicon oxide ($SiO_2$), silicon oxynitride ($SiO_xN_y$), or the like or stacked layers thereof.

A gate electrode 16107 and a first electrode 16108 are formed over the semiconductor layer with a gate insulating film 16106 therebetween.

A first interlayer insulating film 16109 is formed to cover the driving transistor 16118 and the first electrode 16108. Then, a contact hole is formed in the first interlayer insulating film 16109, through which a wire 16110 is in contact with the impurity region 16105. In addition, a second electrode 16111 is formed in the same layer and with the same material as the wire 16110.

Furthermore, a second interlayer insulating film 16112 is formed to cover the wire 16110 and the second electrode 16111. Then, a contact hole is formed in the second interlayer insulating film 16112, through which a pixel electrode 16113 is formed in contact with the wire 16110. A third electrode 16114 is formed in the same layer and with the same material as the pixel electrode 16113. Accordingly, a capacitor 16119 is formed with the first electrode 16108, the second electrode 16111, and the third electrode 16114.

A layer 16116 containing an organic compound and a counter electrode 16117 are formed over the pixel electrode 16113. Thus, a light-emitting element 16120 is formed in a region where the layer 16116 containing an organic compound is sandwiched between the pixel electrode 16113 and the counter electrode 16117.

As described above, each of the structures shown in FIGS. 71A, 71B, 72A, and 72B can be given as an exemplary structure of a transistor using a crystalline semiconductor film as its semiconductor layer. Note that the transistors having the structures shown in FIGS. 71A, 71B, 72A, and 72B are exemplary transistors with a top-gate structure. That is, the LDD region may be formed either to overlap the gate electrode or not overlap, and also a part of the LDD region may be formed to overlap the gate electrode. Further, the gate electrode may have a tapered shape and the LDD region may be provided below the tapered portion of the gate electrode in a self-aligned manner. In addition, the number of gate electrodes is not limited to two, and a multi-gate structure with three or more gate electrodes may be employed, or a single-gate structure may also be employed.

By using a crystalline semiconductor film as a semiconductor layer (e.g., a channel formation region, a source region, a drain region, and the like) of a transistor included in the pixel of the invention, it becomes easier to form the gate line driver circuit and the signal line driver circuit over the same substrate as the pixel portion. In addition, such a structure may also be employed that a part of the signal line driver circuit is formed over the same substrate as the pixel portion, while another part of the circuit is formed in an IC chip to be mounted by COG bonding or the like as shown in the display panel of FIGS. 67A and 67B. With this structure, the manufacturing cost can be reduced.

Figure 73A:
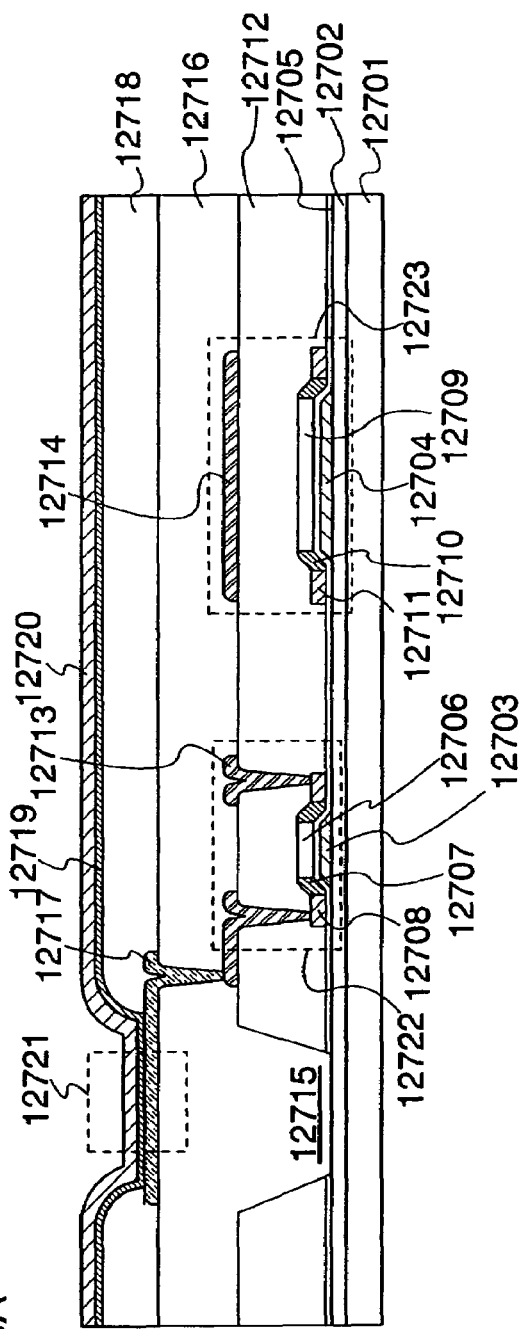
FIGS. 73A and 73B show partial cross sections of a display panel.
Figure 73B:
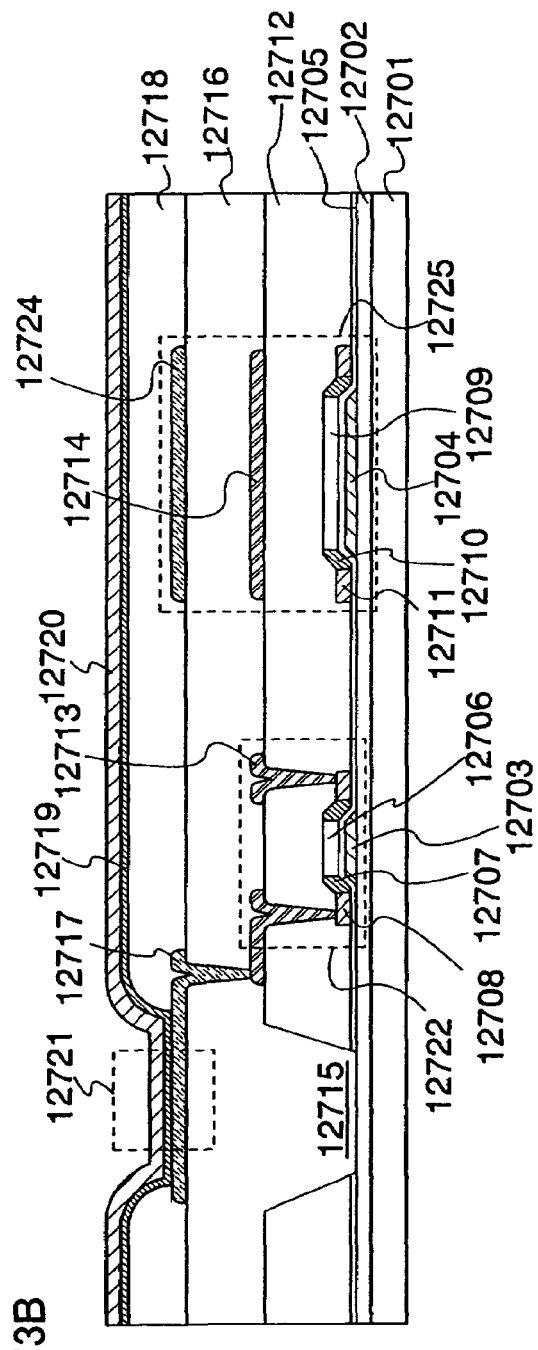

Next, as an exemplary structure of a transistor which uses polysilicon (p-Si: H) as its semiconductor layer, FIGS. 73A and 73B show partial cross sections of a display panel using a transistor which has a structure where a gate electrode is sandwiched between a substrate and a semiconductor layer, that is, a transistor with a bottom-gate structure where a gate electrode is located below a semiconductor layer.

A base film 12702 is formed over a substrate 12701. Then, a gate electrode 12703 is formed over the base film 12702. A first electrode 12704 is formed in the same layer and with the same material as the gate electrode. As a material of the gate electrode 12703, polycrystalline silicon doped with phosphorus can be used. Not only polycrystalline silicon, but also silicide which is a compound of metal and silicon may be used.

Then, a gate insulating film 12705 is formed to cover the gate electrode 12703 and the first electrode 12704. The gate insulating film 12705 is formed using a silicon oxide film, a silicon nitride film, or the like.

Over the gate insulating film 12705, a semiconductor layer is formed. The semiconductor layer includes a channel formation region 12706, an LDD region 12707, and an impurity region 12708 to serve as a source or drain region of a driving transistor 12722, and also includes a channel formation region 12709, an LDD region 12710, and an impurity region 12711 which jointly serve as a second electrode of a capacitor 12723. Note that channel doping may be performed to the channel formation region 12706 and the channel formation region 12709.

As the substrate, a glass substrate, a quartz substrate, a ceramic substrate, or the like can be used. The base film 12702 can be formed using a single layer of aluminum nitride (AlN), silicon oxide ($SiO_2$), silicon oxynitride ($SiO_xN_y$), or the like or stacked layers thereof.

A first interlayer insulating film 12712 is formed to cover the semiconductor layer. Then, a contact hole is formed in the first interlayer insulating film 12712, through which a wire 12713 is in contact with the impurity region 12708. A third electrode 12714 is formed in the same layer and with the same material as the wire 12713. The capacitor 12723 is formed with the first electrode 12704, the second electrode, and the third electrode 12714.

In addition, an opening 12715 is formed in the first interlayer insulating film 12712. A second interlayer insulating film 12716 is formed to cover the driving transistor 12722, the capacitor 12723, and the opening 12715. Then, a contact hole is formed in the second interlayer insulating film 12716 to be formed with a pixel electrode 12717. Then, an insulator 12718 is formed to cover end portions of the pixel electrode 12717. For example, a positive photosensitive acrylic resin film can be used. Subsequently, a layer 12719 containing an organic compound and a counter electrode 12720 are formed over the pixel electrode 12717. Thus, a light-emitting element 12721 is formed in a region where the layer 12719 containing an organic compound is sandwiched between the pixel electrode 12717 and the counter electrode 12720. The opening 12715 is located below the light-emitting element 12721.

That is, in the case where light emitted from the light-emitting element 12721 is extracted from the substrate side, the transmissivity can be improved due to the existence of the opening 12715.

Furthermore, a fourth electrode 12724 may be formed in the same layer and with the same material as the pixel electrode 12717 in FIG. 73A so as to obtain a structure shown in FIG. 73B. In that case, a capacitor 12725 can be formed with the first electrode 12704, the second electrode, the third electrode 12714, and the fourth electrode 12724.

Next, description is made on the case of using an amorphous silicon (a-Si: H) film as a semiconductor layer of a transistor. FIGS. 74A and 74B show examples of a top-gate transistor, and FIGS. 75A, 75B, 76A, and 76B show examples of a bottom-gate transistor.

FIG. 74A shows a cross section of a top-gate transistor using amorphous silicon as its semiconductor layer. As shown in FIG. 74A, a base film 12802 is formed over a substrate 12801. Further, a pixel electrode 12803 is formed over the base film 12802. In addition, a first electrode 12804 is formed in the same layer and with the same material as the pixel electrode 12803.

As the substrate, a glass substrate, a quartz substrate, a ceramic substrate, or the like can be used. The base film 12802 can be formed using a single layer of aluminum nitride (AlN), silicon oxide ($SiO_2$), silicon oxynitride ($SiO_xN_y$), or the like or stacked layers thereof.

A wire 12805 and a wire 12806 are formed over the base film 12802, and an end portion of the pixel electrode 12803 is covered with the wire 12805. Over the wire 12805 and the wire 12806, an n-type semiconductor layer 12807 and an n-type semiconductor layer 12808 each having n-type conductivity are formed respectively. In addition, a semiconductor layer 12809 is formed over the base film 12802, between the wire 12805 and the wire 12806, which is partially extended to cover the n-type semiconductor layer 12807 and the n-type semiconductor layer 12808. Note that this semiconductor layer is formed with an amorphous semiconductor film such as amorphous silicon (a-Si:H) film or a microcrystalline semiconductor (μ-Si:H) film. Then, a gate insulating film 12810 is formed over the semiconductor layer 12809, and an insulating film 12811 is formed in the same layer and with the same material as the gate insulating film 12810, over the first electrode 12804. Note that the gate insulating film 12810 is formed using a silicon oxide film, a silicon nitride film, or the like.

Over the gate insulating film 12810, a gate electrode 12812 is formed. In addition, a second electrode 12813 is formed in the same layer and with the same material as the gate electrode, over the first electrode 12804 with the insulating film 12811 sandwiched therebetween. A capacitor 12819 is formed in a region where the insulating film 12811 is sandwiched between the first electrode 12804 and the second electrode 12813. An interlayer insulating film 12814 is formed to cover end portions of the pixel electrode 12803, the driving transistor 12818, and the capacitor 12819.

Over the interlayer insulating film 12814 and the pixel electrode 12803 located in an opening of the interlayer insulating film 12814, a layer 12815 containing an organic compound and a counter electrode 12816 are formed. Thus, a light-emitting element 12817 is formed in a region where the layer 12815 containing an organic compound is sandwiched between the pixel electrode 12803 and the counter electrode 12816.

The first electrode 12804 shown in FIG. 74A may be formed like a first electrode 12820 as shown in FIG. 74B. The first electrode 12820 is formed in the same layer and with the same material as the wires 12805 and 12806.

FIGS. 75A and 75B are partial cross-sectional views of a display panel having a bottom-gate transistor which uses amorphous silicon as its semiconductor layer.

A base film 12902 is formed over a substrate 12901. Over the base film 12902, a gate electrode 12903 is formed. In addition, a first electrode 12904 is formed in the same layer and with the same material as the gate electrode. As a material of the gate electrode 12903, polycrystalline silicon doped with phosphorus can be used. Not only polycrystalline silicon, but also silicide which is a compound of metal and silicon may be used.

Then, a gate insulating film 12905 is formed to cover the gate electrode 12903 and the first electrode 12904. The gate insulating film 12905 is formed using a silicon oxide film, a silicon nitride film, or the like.

A semiconductor layer 12906 is formed over the gate insulating film 12905. In addition, a semiconductor layer 12907 is formed in the same layer and with the same material as the semiconductor layer 12906.

As the substrate, a glass substrate, a quartz substrate, a ceramic substrate, or the like can be used. The base film 12902 can be formed using a single layer of aluminum nitride (AlN), silicon oxide ($SiO_2$), silicon oxynitride ($SiO_xN_y$), or the like or stacked layers thereof.

N-type semiconductor layers 12908 and 12909 having n-type conductivity are formed over the semiconductor layer 12906, and an n-type semiconductor layer 12910 is formed over the semiconductor layer 12907.

Wires 12911 and 12912 are formed over the n-type semiconductor layers 12908 and 12909 respectively, and a conductive layer 12913 is formed in the same layer and with the same material as the wires 12911 and 12912, over the n-type semiconductor layer 12910.

Thus, a second electrode is formed with the semiconductor layer 12907, the n-type semiconductor layer 12910, and the conductive layer 12913. Note that a capacitor 12920 is formed to have such a structure that the gate insulating film 12905 is sandwiched between the second electrode and the first electrode 12904.

One end portion of the wire 12911 is extended, and a pixel electrode 12914 is formed to be in contact with the extended wire 12911.

In addition, an insulator 12915 is formed to cover end portions of the pixel electrode 12914, a driving transistor 12919, and the capacitor 12920.

Then, a layer 12916 containing an organic compound and a counter electrode 12917 are formed over the pixel electrode 12914 and the insulator 12915. Thus, a light-emitting element 12918 is formed in a region where the layer 12916 containing an organic compound is sandwiched between the pixel electrode 12914 and the counter electrode 12917.

The semiconductor layer 12907 and the n-type semiconductor layer 12910 which will serve as a part of the second electrode of the capacitor are not necessarily required. That is, the second electrode may formed with only the conductive layer 12913, so that the capacitor may have such a structure that the gate insulating film is sandwiched between the first electrode 12904 and the conductive layer 12913.

Note that the pixel electrode 12914 may be formed before forming the wire 12911 in FIG. 75A, so that a capacitor 12922 as shown in FIG. 75B can be obtained, which has a structure where the gate insulating film 12905 is sandwiched between a second electrode 12921 formed of the pixel electrode 12914 and the first electrode 12904.

Although FIGS. 67A and 67B show inversely staggered channel-etched transistors, a channel-protective transistor may be used. Description is made below with reference to 76A and 76B on channel-protective transistors.

A channel-protective transistor shown in FIG. 76A is different from the channel-etched driving transistor 12919 shown in FIG. 75A in that an insulator 13001 serving as an etching mask is provided over the channel formation region in the semiconductor layer 12906. Common portions except that point are denoted by the same reference numerals.

Similarly, a channel-protective transistor shown in FIG. 76B is different from the channel-etched driving transistor 12919 shown in FIG. 75B in that the insulator 13001 serving as an etching mask is provided over the channel formation region in the semiconductor layer 12906. Common portions except that point are denoted by the same reference numerals.

By using an amorphous semiconductor film as a semiconductor layer (e.g., a channel formation region, a source region, a drain region, and the like) of a transistor included in the pixel of the invention, the manufacturing cost can be reduced.

Note that the pixel structure of the invention is not limited to the aforementioned structures of the transistors and capacitors, and various structures of transistors and capacitors can be used.

Note also that the description in this embodiment mode can be appropriately implemented in combination with any of the descriptions in Embodiment Modes 1 to 7.

Embodiment Mode 9

Figure 41:
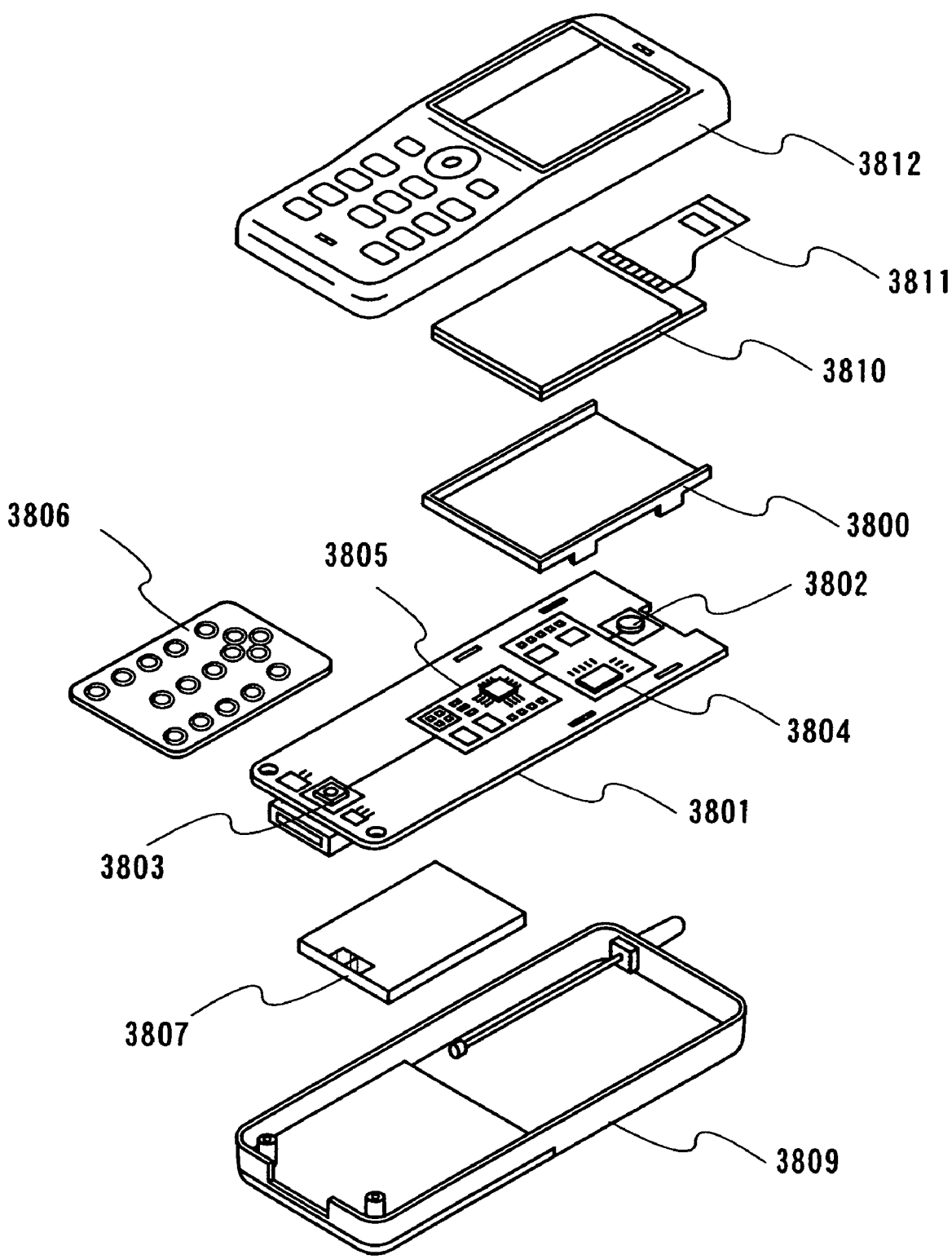
FIG. 41 shows an exemplary portable phone using the driving method of the invention.

Description is made with reference to FIG. 41 on an exemplary structure of a portable phone having a display portion, which employs the display device and the driving method thereof in accordance with the invention.

A display panel 3810 is incorporated in a housing 3800 in a freely attachable/detachable manner. The shape and size of the housing 3800 can be appropriately changed in accordance with the size of the display panel 3810. The housing 3800 to which the display panel 3810 is fixed is fitted into a printed circuit board 3801, thereby assembling a module.

The display panel 3810 is connected to the printed circuit board 3801 through an FPC 3811. Over the printed circuit board 3801, a speaker 3802, a microphone 3803, a transmission/reception circuit 3804, and a signal processing circuit 3805 including a CPU, a controller, and the like are formed. Such a module, an input means 3806, and a buttery 3807 are combined and stored in chassis 3809 and 3812. A pixel portion of the display panel 3810 is disposed so as to be seen from a window formed in the chassis 3809.

The display panel 3810 may be constructed in such a manner that a part of peripheral driver circuits (e.g., a driver circuit having a low operating frequency among a plurality of driver circuits) is formed over the same substrate as a pixel portion by using TFTs, while another part of the peripheral driver circuits (a driver circuit having a high operating frequency among the plurality of driver circuits) is formed in an IC chip. That IC chip may be mounted on the display panel 3810 by COG (Chip On Glass) bonding. Alternatively, the IC chip may be connected to a glass substrate by TAB (Tape Automated Bonding) or with a printed circuit board. FIG. 42A shows an exemplary structure of such a display panel where a part of peripheral driver circuits is formed over the same substrate as a pixel portion, while another part of the peripheral driver circuits is formed in an IC chip to be mounted onto the substrate by COG bonding or the like. Note that the display panel in FIG. 42A includes a substrate 3900, a signal line driver circuit 3901, a pixel portion 3902, a gate line driver circuit 3903, a gate line driver circuit 3904, an FPC 3905, an IC chip 3906, an IC chip 3907, a sealing substrate 3908, and a sealant 3909. By employing such a structure, power consumption of a display device can be reduced and an operating time per charge of a portable phone can be lengthened. In addition, cost reduction of a portable phone can be achieved.

In addition, by impedance-converting a signal to be set on a gate line or a signal line by using a buffer, a writing period of pixels in each row can be shortened. Accordingly, a high-resolution display device can be provided.

Alternatively, a structure as shown in FIG. 42B may be employed in order to further reduce power consumption, where a pixel portion is formed using TFTs over a substrate, while all of peripheral driver circuits are formed in IC chips, to be mounted on a display panel by COG (Chip On Glass) bonding or the like. Note that the display panel in FIG. 42B includes a substrate 3910, a signal line driver circuit 3911, a pixel portion 3912, a gate line driver circuit 3913, a gate line driver circuit 3914, an FPC 3915, an IC chip 3916, an IC chip 3917, a sealing substrate 3918, and a sealant 3919.

By using the display device and the driving method thereof in accordance with the invention, clear images can be displayed with reduced pseudo contours. Accordingly, even an image having subtle changes in gray scales such as human skin can be displayed clearly.

Note that the structure described in this embodiment mode is only an exemplary portable phone, and the display device of the invention can be applied not only to a portable phone with such a structure but also to portable phones with various kinds of structures.

Note that the description in this embodiment mode can be appropriately implemented in combination with any of the descriptions in Embodiment Modes 1 to 8.

Embodiment Mode 10

Figure 43:
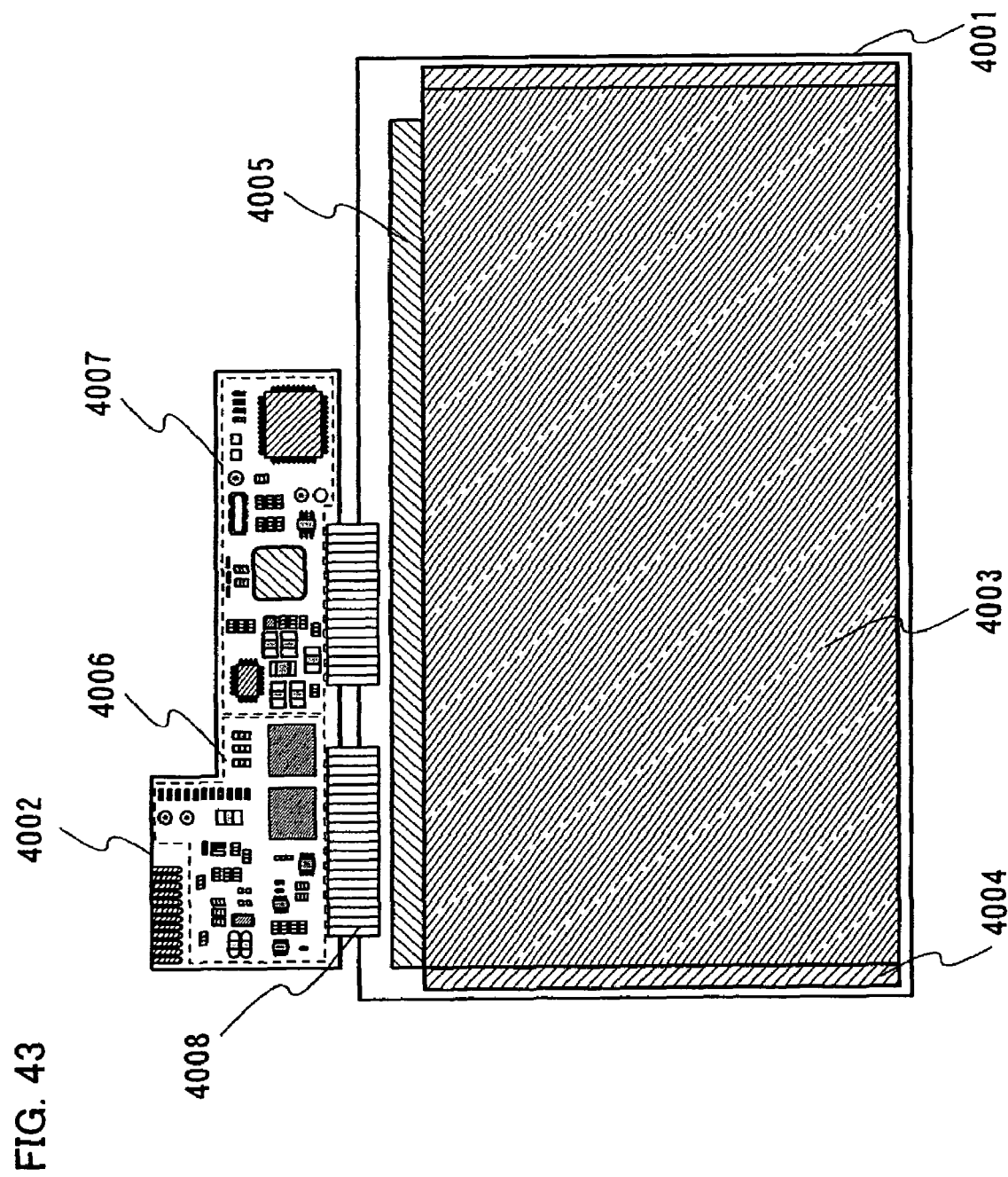
FIG. 43 shows an exemplary EL module using the driving method of the invention.

FIG. 43 shows an EL module formed by combining a display panel 4001 with a circuit board 4002. The display panel 4001 includes a pixel portion 4003, a gate line driver circuit 4004, and a signal line driver circuit 4005. Over the circuit board 4002, a control circuit 4006, a signal dividing circuit 4007, and the like are formed, for example. The display panel 4001 and the circuit board 4002 are connected to each other with a connecting wire 4008. The connecting wire can be formed with an FPC or the like.

The control circuit 4006 corresponds to the controller 3708, the memory 3709, the memory 3710, or the like in Embodiment Mode 6. The control circuit 4006 mainly controls the arranging order of subframes or the like.

The display panel 4001 may be constructed in such a manner that a part of peripheral driver circuits (e.g., a driver circuit having a low operating frequency among a plurality of driver circuits) is formed over the same substrate with a pixel portion by using TFTs, while another part of the peripheral driver circuits (a driver circuit having a high operating frequency among the plurality of driver circuits) is formed in an IC chip. The IC chip may be mounted on the display panel 4001 by COG (Chip On Glass) bonding or the like. Alternatively, the IC chip may be mounted on the display panel 4001 by TAB (Tape Automated Bonding) or with a printed circuit board.

In addition, by impedance-converting a signal to be set on a gate line or a signal line by using a buffer, a writing period of pixels in each row can be shortened. Accordingly, a high-resolution display device can be provided.

Alternatively, in order to further reduce power consumption, a pixel portion may be formed using TFTs over a substrate, while all of peripheral driver circuits may be formed in IC chips, to be mounted on a display panel by COG (Chip On Glass) bonding or the like.

Figure 44:
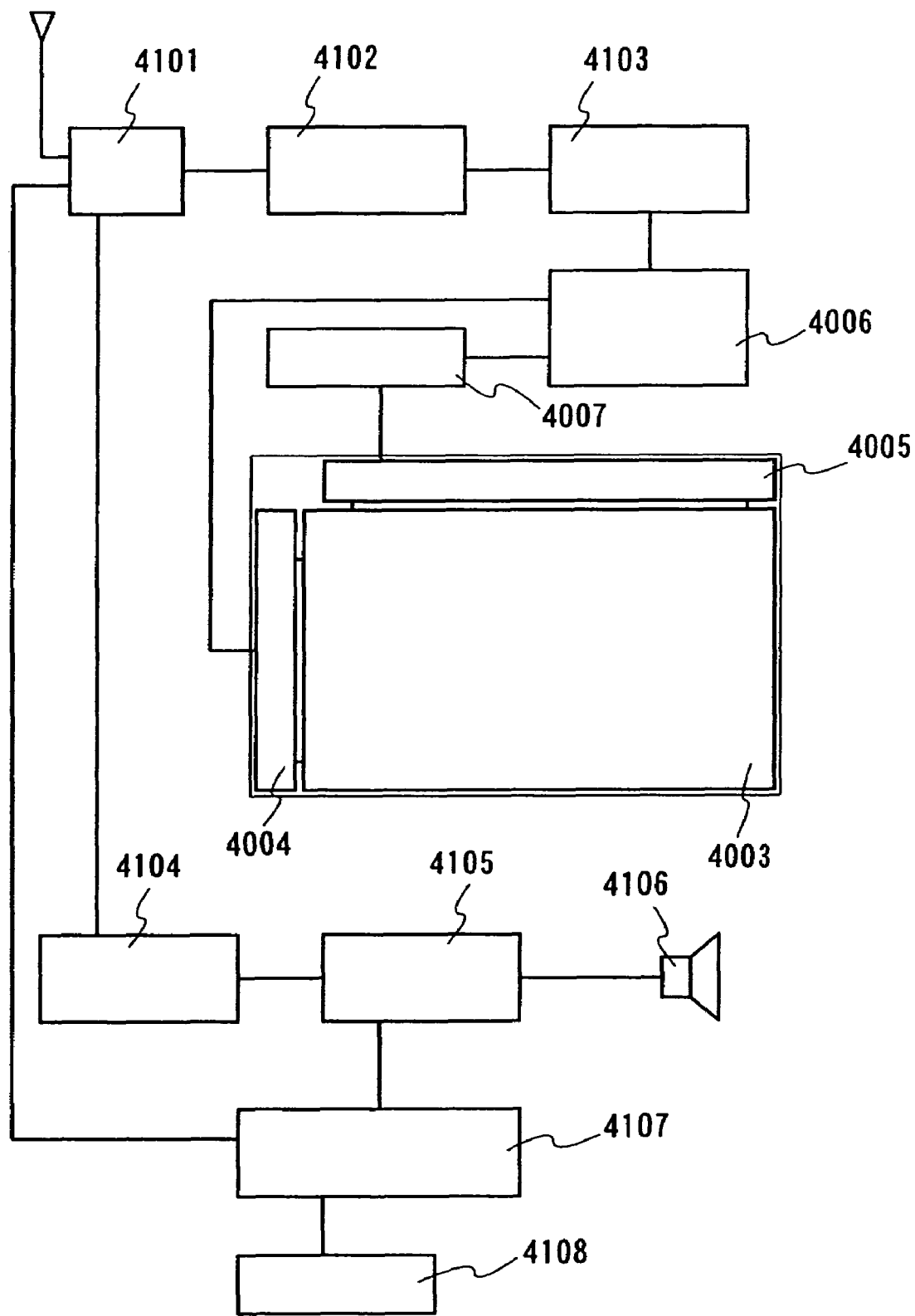
FIG. 44 shows an exemplary EL television receiver using the driving method of the invention.

With such an EL module, an EL television receiver can be completed. FIG. 44 is a block diagram showing the main configuration of an EL Television receiver. A tuner 4101 receives video signals and audio signals. The video signals are processed by a video signal amplifier circuit 4102, a video signal processing circuit 4103 for converting a signal outputted from the video signal amplifier circuit 4102 into a color signal corresponding to each color of red, green, and blue, and a control circuit 4006 for converting the video signal to be inputted into a driver circuit. The control circuit 4006 outputs signals to each of the gate line side and the signal line side. In the case of performing digital drive, the signal dividing circuit 4007 may be provided on the signal line side, so as to divide an input digital signal into m signals before being supplied to a pixel portion.

Among the signals received at the tuner 4101, audio signals are transmitted to an audio signal amplifier circuit 4104, and an output thereof is supplied to a speaker 4106 through an audio signal processing circuit 4105. A control circuit 4107 receives control data on a receiving station (reception frequency) or sound volume from an input portion 4108 and transmits signals to the tuner 4101 as well as the audio signal processing circuit 4105.

By incorporating the EL module into a chassis, a TV receiver can be completed. A display portion of the TV receiver is formed with such an EL module. In addition, a speaker, a video input terminal, and the like are appropriately provided.

It is needless to mention that the invention is not limited to the TV receiver, and can be applied to various objects as a display medium such as a monitor of a personal computer, an information display board at the train station, airport, or the like, or an advertisement display board on the street.

By using the display device and the driving method thereof in accordance with the invention, clear images can be displayed with reduced pseudo contours. Accordingly, even an image having subtle changes in gray scales such as human skin can be displayed clearly.

Note that the description in this embodiment mode can be appropriately implemented in combination with any of the descriptions in Embodiment Modes 1 to 9.

Embodiment Mode 11

As an exemplary electronic apparatus using the display device of the invention, there is a camera (e.g., video camera or digital camera), a goggle display (a head-mounted display), a navigation system, an audio reproducing device (e.g., car audio set, audio component set, or the like), a personal computer, a game machine, a portable information terminal (e.g., mobile computer, portable phone, portable game machine, electronic book, or the like), an image reproducing device provided with a recording medium reading portion (specifically, a device which can reproduce a recording medium such as a digital versatile disc (DVD) and includes a display capable of displaying the reproduced image), or the like. Specific examples of such electronic apparatuses are shown in FIGS. 45A to 45H.

Figure 45A:
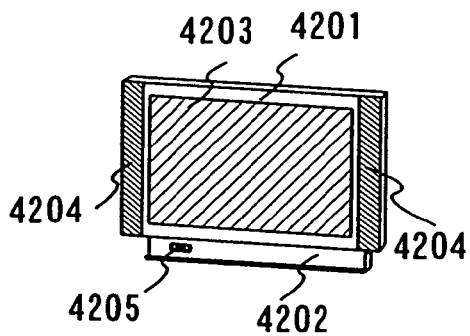
FIGS. 45A to 45H show exemplary electronic apparatuses each using the driving method of the invention.

FIG. 45A shows a self-luminous display, which includes a chassis 4201, a support 4202, a display portion 4203, a speaker portion 4204, a video input terminal 4205, and the like. The invention can be used for a display device which constitutes the display portion 4203. In addition, according to the invention, clear images can be displayed with reduced pseudo contours, and the display as shown in FIG. 45A is completed. Since the display is a self-luminous type, no backlight is required, and a display portion thinner than a liquid crystal display can be obtained. Note that the display includes all display devices for information display, for example, for a personal computer, for TV broadcast reception, or for advertisement display.

Figure 45B:
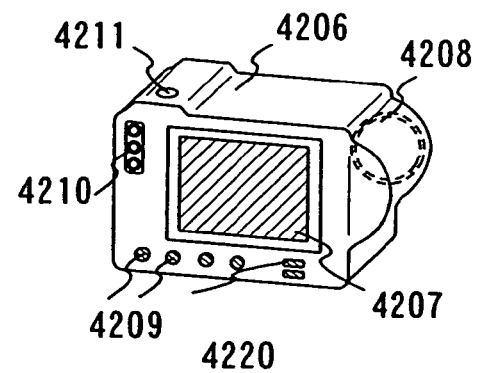

FIG. 45B shows a digital still camera, which includes a main body 4206, a display portion 4207, an image receiving portion 4208, operation keys 4209, an external connecting port 4210, a shutter 4211, and the like. The invention can be used for a display device which constitutes the display portion 4207. In addition, according to the invention, clear images can be displayed with reduced pseudo contours, and the display as shown in FIG. 45B is completed.

Figure 45C:
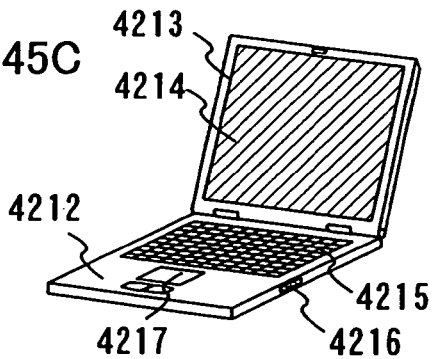

FIG. 45C shows a personal computer, which includes a main body 4212, a chassis 4213, a display portion 4214, a keyboard 4215, an external connecting port 4216, a pointing mouse 4217, and the like. The invention can be used for a display device which constitutes the display portion 4214. In addition, according to the invention, clear images can be displayed with reduced pseudo contours, and the personal computer as shown in FIG. 42C is completed.

Figure 45D:
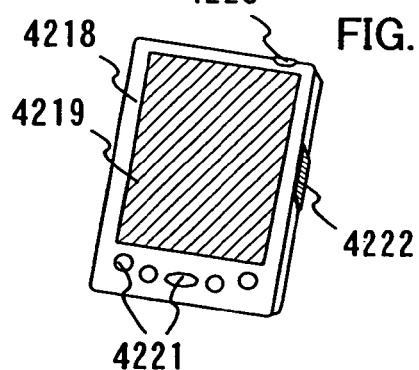

FIG. 42D shows a mobile computer, which includes a main body 4218, a display portion 4219, a switch 4220, operation keys 4221, an infrared port 4222, and the like. The invention can be used for a display device which constitutes the display portion 4219. In addition, according to the invention, clear images can be displayed with reduced pseudo contours, and the mobile computer as shown in FIG. 45D is completed.

Figure 45E:
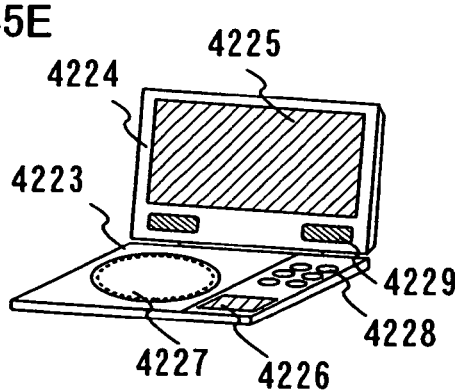

FIG. 45E shows an image reproducing device provided with a recording medium reading portion (specifically, a DVD reproducing device, for example), which includes a main body 4223, a chassis 4224, a display portion A4225, a display portion B4226, a recording medium (DVD or the like) reading portion 4227, an operation key 4228, a speaker portion 4229, and the like. The display portion A4225 mainly displays image data, while the display portion B4226 mainly displays text data. The invention can be used for display devices which constitute the display portion A4225 and the display portion B4226. Note that the image reproducing device provided with a recording medium reading portion also includes a home-use game machine and the like. In addition, according to the invention, clear images can be displayed with reduced pseudo contours, and the image reproducing device as shown in FIG. 45E is completed.

Figure 45F:
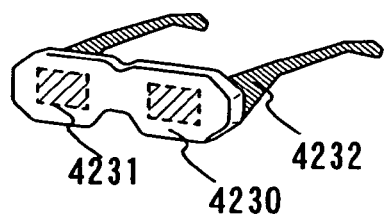

FIG. 42F shows a goggle display (head-mounted display), which includes a main body 4230, a display portion 4231, an arm portion 4232, and the like. The invention can be used for a display device which constitutes the display portion 4231. In addition, according to the invention, clear images can be displayed with reduced pseudo contours, and the goggle display as shown in FIG. 45F is completed.

Figure 45G:
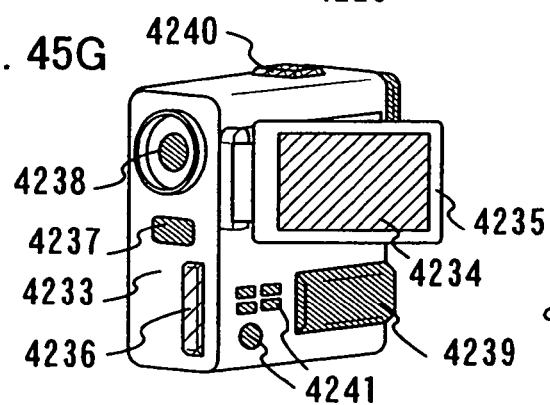

FIG. 45G shows a video camera, which includes a main body 4233, a display portion 4234, a housing 4235, an external connecting port 4236, a remote control receiving portion 4237, an image receiving portion 4238, a battery 4239, an audio input portion 4240, operation keys 4241, and the like. The invention can be used for a display device which constitutes the display portion 4234. In addition, according to the invention, clear images can be displayed with reduced pseudo contours, and the video camera as shown in FIG. 45G is completed.

Figure 45H:
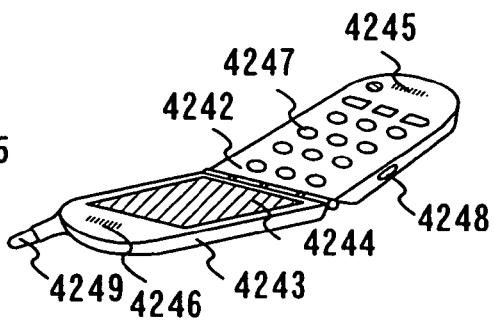
Figure 50A:
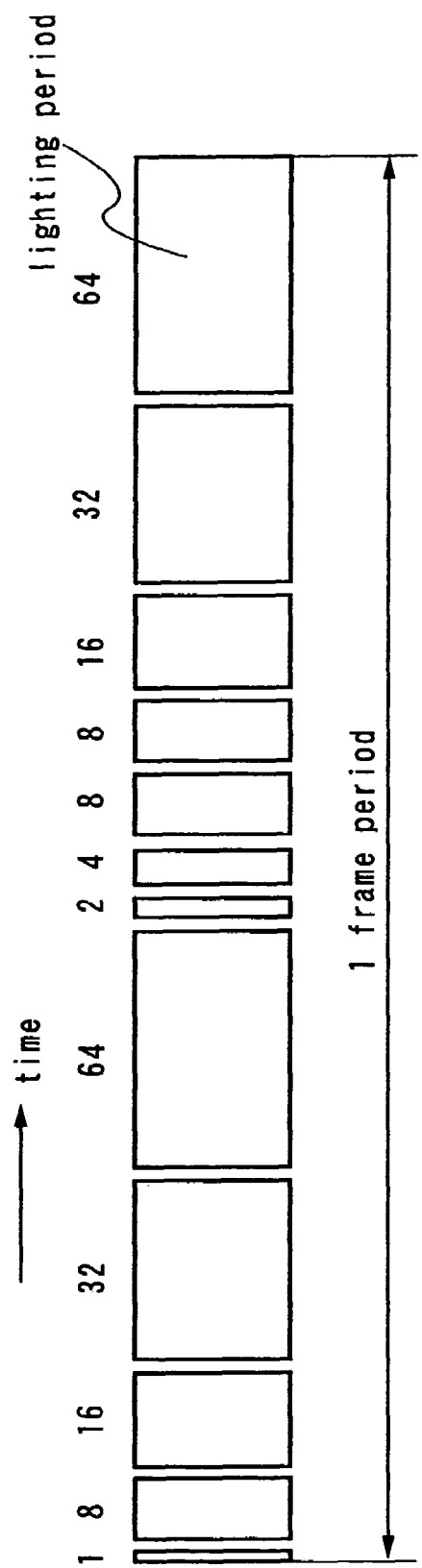
FIGS. 50A and 50B show an exemplary selection method of subframes by a conventional double-speed frame method.
Figure 50B:
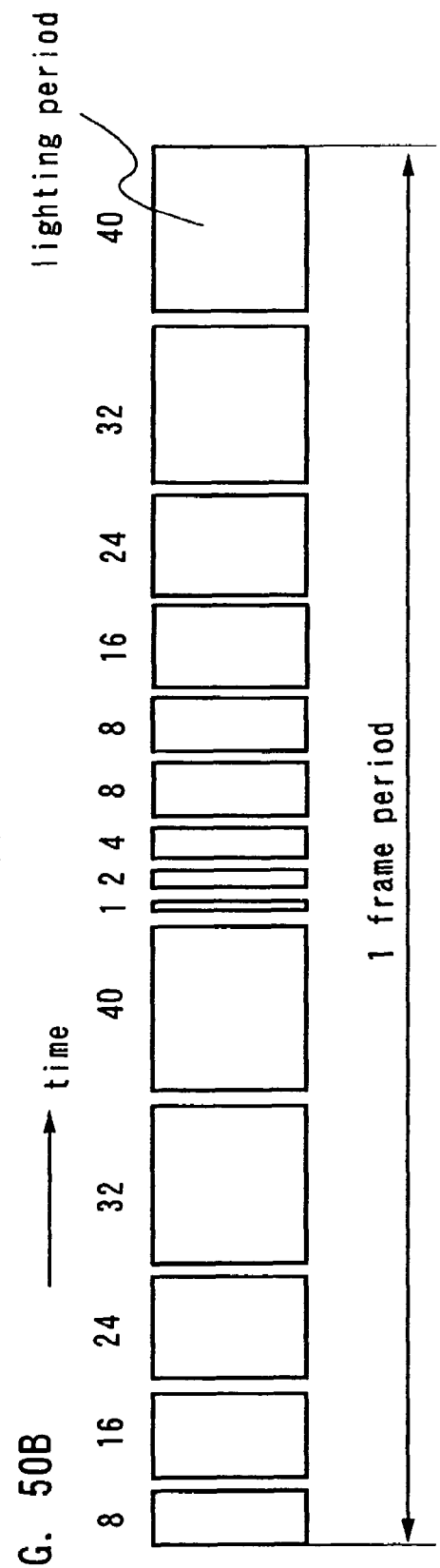
Figure 52:
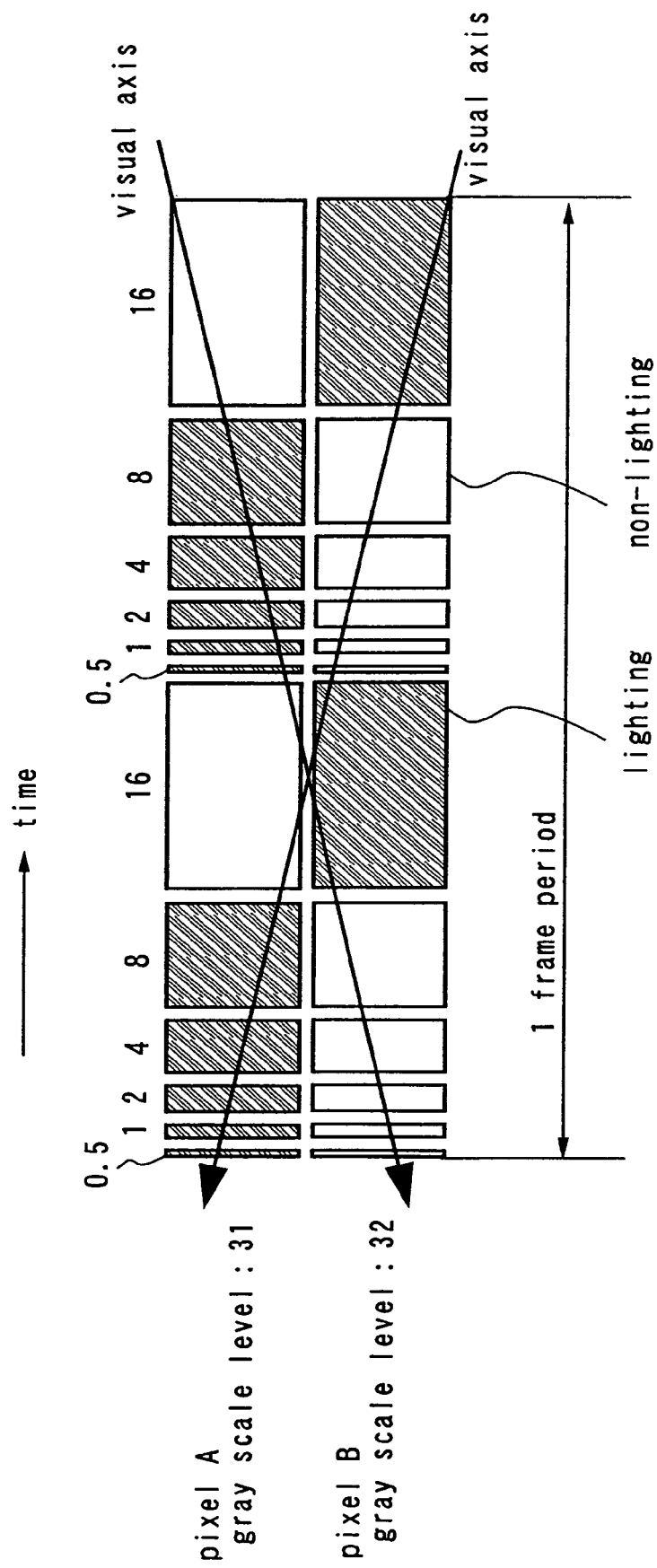
FIG. 52 shows the reason by which pseudo contours are caused when using a conventional double-speed frame method.

FIG. 45H shows a portable phone, which includes a main body 4242, a chassis 4243, a display portion 4244, an audio input portion 4245, an audio output portion 4246, an operation key 4247, an external connecting port 4248, an antenna 4249, and the like. The invention can be used for a display device which constitutes the display portion 4244. Note that the current consumption of the portable phone can be reduced if white text is displayed with a black background on the display portion 4244. In addition, according to the invention, clear images can be displayed with reduced pseudo contours, and the portable phone as shown in FIG. 45H is completed.

Note that, if a light-emitting material with high luminance is used, the invention can be applied to a front or rear projector which projects an image by magnifying the output image data with a lens or the like.

Furthermore, the aforementioned electronic apparatuses have often been used for displaying data distributed through telecommunication lines such as the Internet or a CATV (CAble TV), and in particular for displaying moving image data. Since a light-emitting material has quite a high response speed, a light-emitting device is suitable for displaying moving images.

Since a light-emitting display device consumes power in its light-emitting portion, it is desirable to display data by utilizing as small a light-emitting portion as possible. Thus, in the case of using a light-emitting display device for a display portion of a portable information terminal which mainly displays text data, such as a portable phone or an audio reproducing device in particular, it is preferable to drive the light-emitting display device in such a manner that text data is displayed with a light-emitting portion while using a non-light-emitting portion as a background.

As described above, the applicable range of the invention is so wide that the invention can be applied to electronic apparatuses of various fields. In addition, the electronic apparatuses in this embodiment mode may employ a display device having any of the structures described in Embodiment Modes 1 to 10.

The present application is based on Japanese Priority application No. 2005-133820 filed on May 2, 2005 with the Japanese Patent Office, the entire contents of which are hereby incorporated by reference.

What is claimed is:

1. A driving method of a display device for expressing gray scales with n bits (n is an integer) by dividing one frame into a plurality of subframes, comprising the steps of:

classifying bits which represent the binary digits of gray scales into at least three kinds of bit groups comprising a first bit group, a second bit group, and a third bit group;

dividing the one frame into two subframe groups;

dividing a (a is an integer, where 0<a<n) subframes corresponding to the bits belonging to the first bit group into three or more;

arranging the divided a subframes in the two subframe groups in roughly equal ratio;

dividing b (b is an integer, where 0<b<n) subframes corresponding to the bits belonging to the second bit group into two;

arranging the divided b subframes in the respective subframe groups one by one; and arranging c (c is an integer, where 0=c<n, and a+b+c=n) subframes corresponding to the bits belonging to the third bit group in at least one of the two subframe groups in one frame, wherein the arranging order of a plurality of subframes corresponding to the bits belonging to the first bit group, and the arranging order of a plurality of subframes corresponding to the bits belonging to the second bit group are about equal between the two subframe groups in one frame;

wherein an overlapped time gray scale method is used for expressing gray scales in a part or all of the plurality of subframes corresponding to the bits belonging to the first bit group and the plurality of subframes corresponding to the bits belonging to the second bit group, in each of the two subframe groups in one frame; and wherein one gate selection period is divided into m (m is an integer, where m>1) periods or more, so that gate lines are independently scanned in each of the m divided gate selection periods.

2. The driving method of a display device according to claim 1, wherein luminance is changed linearly in a region to express a low gray scale, while luminance is changed nonlinearly in other regions.

3. The driving method of a display device according to claim 1, wherein in at least one of the plurality of subframe groups in one frame, pixels are lighted in all the subframes corresponding to the bits belonging to the first bit group, followed by lighting of pixels in all the subframes corresponding to the bits belonging to the second bit group or the third bit group.

4. The driving method of a display device according to claim 1, wherein in at least one of the plurality of subframe groups in one frame, pixels are lighted in all the subframes corresponding to the bits belonging to the second bit group or the third bit group, followed by lighting of pixels in all the subframes corresponding to the bits belonging to the first bit group.

5. The driving method of a display device according to claim 1, wherein in at least one of the plurality of subframe groups in one frame, pixels are lighted in at least one of the subframes corresponding to the bits belonging to the first bit group, followed by lighting of pixels in at least one of the subframes corresponding to the bits belonging to the second bit group or the third bit group, and further followed by lighting of pixels in another subframe among the plurality of subframes corresponding to the bits belonging to the first bit group.

6. The driving method of a display device according to claim 1, wherein in at least one of the plurality of subframe groups in one frame, pixels are lighted in at least one of the subframes corresponding to the bits belonging to the second bit group or the third bit group, followed by lighting of pixels in at least one of the subframes corresponding to the bits belonging to the first bit group, and further followed by lighting of pixels in another subframe among the plurality of subframes corresponding to the bits belonging to the second bit group or the third bit group.

7. An electronic apparatus using the driving method according to claim 1.

8. A driving method of a display device for expressing gray scales with n bits (n is an integer) by dividing one frame into a plurality of subframes, comprising the steps of:

classifying bits which represent the binary digits of gray scales into three kinds of bit groups comprising a first bit group, a second bit group, and a third bit group;

dividing the one frame into k (k is an integer, where k=3) subframe groups;

dividing a (a is an integer, where 0<a<n) subframes corresponding to the bits belonging to the first bit group into (k+1) or more;

arranging the divided a subframes in the k subframe groups in roughly equal ratio;

dividing b (b is an integer, where 0<b<n) subframes corresponding to the bits belonging to the second bit group into k;

arranging the divided b subframes in the respective subframe groups one by one; and dividing c (c is an integer, where 0=c<n, and a+b+c=n) subframes corresponding to the bits belonging to the third bit group into (k−1) or less or not dividing, and arranging the divided or undivided c subframes in at least one of the k subframe groups in one frame, wherein the arranging order of a plurality of subframes corresponding to the bits belonging to the first bit group, and the arranging order of a plurality of subframes corresponding to the bits belonging to the second bit group are about equal between the k subframe groups in one frame;

wherein an overlapped time gray scale method is used for expressing gray scales in a part or all of the plurality of subframes corresponding to the bits belonging to the first bit group and the plurality of subframes corresponding to the bits belonging to the second bit group, in each of the k subframe groups in one frame; and wherein one gate selection period is divided into m (m is an integer, where m>1) periods or more, so that gate lines are independently scanned in each of the m divided gate selection periods.

9. The driving method of a display device according to claim 8, wherein luminance is changed linearly in a region to express a low gray scale, while luminance is changed nonlinearly in other regions.

10. The driving method of a display device according to claim 8, wherein in at least one of the plurality of subframe groups in one frame, pixels are lighted in all the subframes corresponding to the bits belonging to the first bit group, followed by lighting of pixels in all the subframes corresponding to the bits belonging to the second bit group or the third bit group.

11. The driving method of a display device according to claim 8, wherein in at least one of the plurality of subframe groups in one frame, pixels are lighted in all the subframes corresponding to the bits belonging to the second bit group or the third bit group, followed by lighting of pixels in all the subframes corresponding to the bits belonging to the first bit group.

12. The driving method of a display device according to claim 8, wherein in at least one of the plurality of subframe groups in one frame, pixels are lighted in at least one of the subframes corresponding to the bits belonging to the first bit group, followed by lighting of pixels in at least one of the subframes corresponding to the bits belonging to the second bit group or the third bit group, and further followed by lighting of pixels in another subframe among the plurality of subframes corresponding to the bits belonging to the first bit group.

13. The driving method of a display device according to claim 8, wherein in at least one of the plurality of subframe groups in one frame, pixels are lighted in at least one of the subframes corresponding to the bits belonging to the second bit group or the third bit group, followed by lighting of pixels in at least one of the subframes corresponding to the bits belonging to the first bit group, and further followed by lighting of pixels in another subframe among the plurality of subframes corresponding to the bits belonging to the second bit group or the third bit group.

14. An electronic apparatus using the driving method according to claim 8.

* * * * *

UNITED STATES PATENT AND TRADEMARK OFFICE
CERTIFICATE OF CORRECTION

PATENT NO.        : 7,623,091 B2                             Page 1 of 1
APPLICATION NO. : 11/410198
DATED             : November 24, 2009
INVENTOR(S)       : Shishido It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 869 days.

Signed and Sealed this

Ninth Day of November, 2010

David J. Kappos
*Director of the United States Patent and Trademark Office*